US012753195B2

(12) United States Patent
Nagayama et al.

(10) Patent No.: US 12,753,195 B2
(45) Date of Patent: Oct. 6, 2026

(54) IRIDIUM COMPLEX COMPOUND, IRIDIUM-COMPLEX-COMPOUND-CONTAINING COMPOSITION, ORGANIC ELECTROLUMINESCENT ELEMENT AND METHOD FOR PRODUCING SAME, ORGANIC EL DISPLAY DEVICE, AND ORGANIC EL ILLUMINATOR

(71) Applicant: Mitsubishi Chemical Corporation, Tokyo (JP)

(72) Inventors: Kazuhiro Nagayama, Tokyo (JP); Akane Kato, Tokyo (JP); Mami Yamashita, Tokyo (JP); Tomohiro Abe, Tokyo (JP); Daisuke Hiro, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 962 days.

(21) Appl. No.: 17/885,259

(22) Filed: Aug. 10, 2022

(65) Prior Publication Data

US 2023/0002428 A1 Jan. 5, 2023

Related U.S. Application Data

(63) Continuation of application No. PCT/JP2021/004685, filed on Feb. 8, 2021.

(30) Foreign Application Priority Data

Feb. 12, 2020 (JP) ................................ 2020-021319

(51) Int. Cl.
*H01L 51/00* (2006.01)
*C07F 15/00* (2006.01)
*H10K 71/10* (2023.01)
*H10K 85/30* (2023.01)

(52) U.S. Cl.
CPC ......... *C07F 15/0033* (2013.01); *H10K 71/10* (2023.02); *H10K 85/342* (2023.02)

(58) Field of Classification Search
CPC ....................... C07F 15/0033; C09K 2211/185
See application file for complete search history.

(56) References Cited

U.S. PATENT DOCUMENTS

2008/0030125 A1 2/2008 Boerner et al.
2010/0019669 A1 1/2010 Akino et al.
(Continued)

FOREIGN PATENT DOCUMENTS

CN 103329619 A 9/2013
CN 105899523 A 8/2016
(Continued)

OTHER PUBLICATIONS

Office Action issued in corresponding Chinese Patent Application No. 202180013901.2, dated Nov. 8, 2024.
(Continued)

*Primary Examiner* — Alexander C Kollias
(74) *Attorney, Agent, or Firm* — Morgan, Lewis & Bockius LLP

(57) ABSTRACT

The present invention relates to an iridium complex compound represented by the following formula (1):
(Continued)

(1),

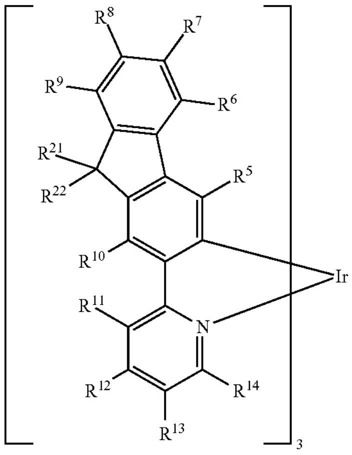

(2)

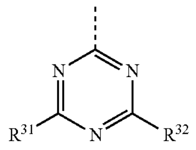

in the formula (1), Ir represents an iridium atom, $R^5$ to $R^{14}$, $R^{21}$, and $R^{22}$ each independently represent a hydrogen atom, D, F, Cl, Br, I, or a substituent group, the groups adjacent to each other may be further bonded to each other to form a ring, and any one of $R^{12}$ and $R^{13}$ is a substituent group represented by the formula (2).

17 Claims, 1 Drawing Sheet

(56) References Cited

U.S. PATENT DOCUMENTS

| | | | |
|---|---|---|---|
| 2016/0043325 | A1 | 2/2016 | Gorohmaru et al. |
| 2016/0056396 | A1 | 2/2016 | Sugino et al. |
| 2016/0329508 | A1 | 11/2016 | Saito et al. |
| 2016/0359122 | A1 | 12/2016 | Boudreault et al. |
| 2017/0250353 | A1 | 8/2017 | Koenen et al. |
| 2018/0123054 | A1 | 5/2018 | Gorohmaru et al. |
| 2019/0002488 | A1 | 1/2019 | Humphries et al. |
| 2019/0002629 | A1 | 1/2019 | Islam et al. |
| 2020/0066990 | A1 | 2/2020 | Bealle et al. |
| 2024/0373739 | A1 * | 11/2024 | Nagayama ........... H10K 85/346 |

FOREIGN PATENT DOCUMENTS

| | | | |
|---|---|---|---|
| CN | 108290915 | A | 7/2018 |
| EP | 3093292 | A1 | 11/2016 |
| EP | 3297051 | A1 | 3/2018 |
| EP | 3539959 | A1 | 9/2019 |
| EP | 3390418 | B1 | 8/2020 |
| EP | 4006022 | A1 | 6/2022 |
| JP | 2008-179617 | A | 8/2008 |
| JP | 2011-105676 | A | 6/2011 |
| JP | 2016-104722 | A | 6/2016 |
| JP | 2018-046273 | A | 3/2018 |
| JP | 2019-501906 | A | 1/2019 |
| JP | 2019-163239 | A | 9/2019 |
| KR | 10-2018-0091089 | A | 8/2018 |
| TW | 201042002 | A | 12/2010 |
| WO | 2012/096263 | A1 | 7/2012 |
| WO | 2015/105014 | A1 | 7/2015 |
| WO | 2016/015815 | A1 | 2/2016 |
| WO | 2017/103584 | A1 | 6/2017 |
| WO | 2020/235562 | A1 | 11/2020 |
| WO | 2021/019884 | A1 | 2/2021 |

OTHER PUBLICATIONS

Extended European Search Report issued in related European Patent Application No. 21753502.0 dated Jun. 15, 2023.

Office Action issued in corresponding Taiwanese Patent Application No. 110105063 dated Jul. 15, 2024.

Office Action issued in corresponding Japanese Patent Application No. 2022-500410, dated Nov. 26, 2024.

International Search Report issued in related International Patent Application No. PCT/JP2021/004685 dated Mar. 23, 2021.

Office Action issued in corresponding Korean Patent Application No. 10-2022-7027679, dated Dec. 5, 2025.

* cited by examiner

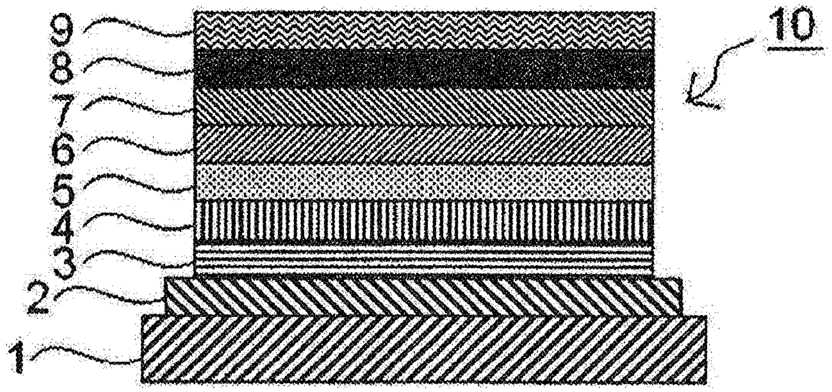
9
8
7
6
5
4
3
2
1
10

IRIDIUM COMPLEX COMPOUND, IRIDIUM-COMPLEX-COMPOUND-CONTAINING COMPOSITION, ORGANIC ELECTROLUMINESCENT ELEMENT AND METHOD FOR PRODUCING SAME, ORGANIC EL DISPLAY DEVICE, AND ORGANIC EL ILLUMINATOR

TECHNICAL FIELD

The present invention relates to an iridium complex compound, and more particularly, to an iridium complex compound useful as a material of an emission layer of an organic electroluminescent (hereinafter, sometimes referred to as "organic EL") element, an iridium-complex-compound-containing composition containing the compound and a solvent, an organic electroluminescent element containing the compound and a method for producing the same, and an organic EL display device and an organic EL illuminator having the organic electroluminescent element.

BACKGROUND ART

Various electronic devices using an organic EL element, such as an organic EL illumination and an organic EL display (display device), are being put to practical use. Organic electroluminescent elements are low in applied voltage and in power consumption, and are capable of emitting light of three primary colors, and therefore have started to be applied not only to large-sized display monitors but also to medium-sized displays represented by mobile phones and smartphones.

The organic electroluminescent element is manufactured by superposing a plurality of layers such as an emission layer, a charge injection layer, and a charge transport layer. Currently, most of organic electroluminescent elements are manufactured by depositing an organic material under vacuum, but the vacuum deposition method has a complicated deposition process and is inferior in productivity. In an organic electroluminescent element manufactured by a vacuum deposition method, it is extremely difficult to increase the size of a panel of an illumination or a display. Therefore, in recent years, as a process for efficiently manufacturing an organic electroluminescent element that can be used for a large-sized display or illumination, a wet-process film formation method, which is a coating method, has been actively studied. The wet-process film formation method has an advantage of being able to easily form a stable layer as compared with the vacuum deposition method, and thus is expected to be applied to mass production of displays and illuminators and large devices.

In order to manufacture an organic electroluminescent element by a wet-process film formation method, all materials to be used must be dissolved in an organic solvent to be used as an ink. When a material to be used is poor in solvent solubility, the material may be deteriorated before use because an operation such as heating for a long time is required. Furthermore, when a uniform state cannot be maintained for a long period of time in a solution state, precipitation of a material from the solution occurs, and film formation by an inkjet device or the like becomes impossible. In other words, materials used in the wet-process film formation method must be soluble in two ways: the materials must dissolve quickly in organic solvents, and the materials must maintain a uniform state without precipitation after dissolution.

In the organic EL display, high luminescent efficiency is required to be realized in addition to a long driving life and a wide color gamut, that is, a high color reproduction rate. In particular, a considerably deep red color having an x coordinate of 0.68 to 0.71 in XYZ color system coordinates of CIE (International Commission on Illumination) is required for a red region. In order to develop deep red color, it is necessary to set the maximum emission wavelength of a luminescent material to a longer wavelength, for example, a wavelength of 615 mn or more. Since human visibility also decreases greatly as the wavelength becomes longer in the red region, a larger emission intensity is required in the deep red region.

As a multilayer structure for an organic EL display, there are two types that differ in a direction of light extraction. A bottom emission type in which the manufacturing process is relatively simple is a type in which light of organic molecules is extracted from below a thin film transistor (TFT) substrate side, but has a drawback that the light use efficiency of the organic molecules is low. On the other hand, in a top emission type, since light is extracted from above a sealing glass having no pixel circuit or the like, it is possible to efficiently extract emitted light to the outside. However, in the case where the top emission type is used, light having a wavelength other than a specific wavelength is reflected, cancelled, and quenched in the multilayer structure, so that the light does not go out of the laminated structure. Therefore, when a half width of the luminescence spectrum of the luminescent material is large, light having a wavelength other than the specific wavelength does not go out of the multilayer structure, and as a result, the luminescent efficiency decreases. Therefore, it is preferable to narrow the half width of the luminescence spectrum as much as possible in order to widen the color gamut and increase the luminance of the display, which is a target of extremely important technology development.

As described above, a red luminescent material is required to have the following properties: 1. high solubility in solvents, 2. high luminescent efficiency, and 3. narrow half width of the luminescent spectrum. With regard to the above 1, there has been known techniques in which a relatively long-chain alkyl group is introduced without making the structure excessively rigid such as increasing the number of condensed rings in a ligand. With regard to the above 2, since a so-called "energy gap law" is dominant in the red region, a ratio of dissipation to heat increases as the wavelength becomes longer, and thus there is an upper limit in a quantum yield at a specific wavelength. On the other hand, in recent years, techniques such as using a phosphorescent material which is originally high in efficiency, eliminating a substituent which impairs the quantum yield of these materials, increasing the symmetry of the structure, increasing the metal to ligand charge transfer (MLCT) property and increasing the phosphorescence emission rate have become clear.

As a red luminescent material, an iridium complex compound utilizing phosphorescence emission has been used. In particular, there has been known an iridium complex compound having a ligand in which a triazine-type substituent is introduced into phenyl-pyridine as disclosed in Patent Literatures 1 to 3. Patent Literature 1 discloses an iridium complex compound having a specific structure. Similarly, Patent Literatures 2 and 3 also disclose an iridium complex compound having a specific structure.

CITATION LIST

Patent Literature

Patent Literature 1: WO2015/105014

Patent Literature 2: US Patent Application Publication No. 2016/359122 specification Patent Literature 3: WO2016/015815

SUMMARY OF INVENTION

Technical Problem

On the other hand, it cannot be said that the knowledge on the problem of narrowing the half width of the luminescence spectrum of above 3. is still sufficient.

For example, Patent Literature 1 discloses an iridium complex compound having a structure in which two aromatic rings are bonded to triazine, but there is room for improvement in the half width.

A so-called heteroleptic iridium complex disclosed in Patent Literature 2, in which the ligand is asymmetric, also has a problem that the half width is widened.

Patent Literature 3 discloses an iridium complex compound emitting red light having a relatively narrow half width, but it is considered that improvement is still required.

An object of the present invention is to provide an iridium complex compound in which a half width is as narrow as possible, and at the same time, high solubility in a solvent and high luminescent efficiency are not impaired.

Solution to Problem

An iridium complex compound that solves the above problems is, for example, as follows.

[1] An iridium complex compound represented by the following formula (1).

(I)

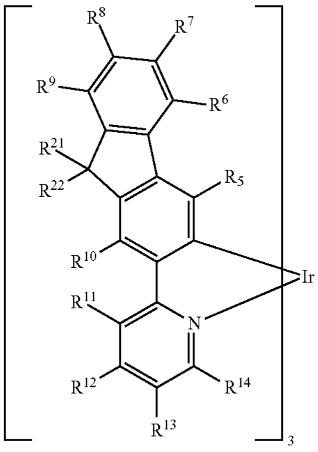

[In formula (1), Ir represents an iridium atom, $R^5$ to $R^{14}$, $R^{21}$, and $R^{22}$ each independently represent a hydrogen atom, D, F, Cl, Br, I, or a substituent, the groups adjacent to each other may be further bonded to each other to form a ring, and any one of $R^{12}$ and $R^{13}$ is a substituent represented by the following formula (2).

(2)

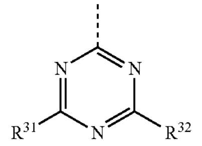

[In formula (2), a broken line represents a bond to formula (1). $R^{31}$ represents a hydrogen atom, D, an alkyl group, an aralkyl group, or a heteroaralkyl group, and $R^{32}$ represents a hydrogen atom, D, an alkyl group, an aralkyl group, a heteroaralkyl group, an aromatic group, or a heteroaromatic group. $R^{31}$ and $R^{32}$ may be further substituted.]].

[2] The iridium complex compound according to [1], in which $R^5$ to $R^{14}$, $R^{21}$, and $R^{22}$ in formula (1) are as follows.

[$R^5$ to $R^{14}$, $R^{21}$, and $R^{22}$ each independently represent a hydrogen atom, D, F, Cl, Br, I, —N(R')$_2$, —CN, —$NO_2$, —OH, —COOR', —C(═O)R', —C(═O)NR', P(═O)(R')$_2$, —S(═O)R', —S(═O)$_2$R', —OS(═O)$_2$R', a linear or branched alkyl group having 1 or more and 30 or less carbon atoms, a cyclic alkyl group having 3 or more and 30 or less carbon atoms, a linear or branched alkoxy group having 1 or more and 30 or less carbon atoms, a cyclic alkoxy group having 2 or more and 30 or less carbon atoms, a linear or branched alkylthio group having 1 or more and 30 or less carbon atoms, a cyclic alkylthio group having 2 or more and 30 or less carbon atoms, a linear or branched alkenyl group having 2 or more and 30 or less carbon atoms, a cyclic alkenyl group having 3 or more and 30 or less carbon atoms, a linear or branched alkynyl group having 2 or more and 30 or less carbon atoms, a cyclic alkynyl group having 3 or more and 30 or less carbon atoms, an aromatic group having 5 or more and 60 or less carbon atoms, a heteroaromatic group having 1 or more and 60 or less carbon atoms, an aryloxy group having or more and 40 or less carbon atoms, an arylthio group having 5 or more and 40 or less carbon atoms, an aralkyl group having 5 or more and 60 or less carbon atoms, a heteroaralkyl group having 2 or more and 60 or less carbon atoms, a diarylamino group having 10 or more and 40 or less carbon atoms, an arylheteroarylamino group having 10 or more and 40 or less carbon atoms, or a diheteroarylamino group having 10 or more and 40 or less carbon atoms.

At least one hydrogen atoms of the alkyl group, the alkoxy group, the alkylthio group, the alkenyl group and the alkynyl group may be further substituted with R' (excluding a hydrogen atom), and one —$CH_2$— group or two or more non-adjacent —$CH_2$— groups in these groups may be substituted with —C(—R')═C(—R')—, —C≡C—, —Si(R')$_2$, —C(═O)—, —NR'—, —O—, —S—, —CONR'—, or a divalent aromatic group, one or more hydrogen atoms in these groups may be substituted with D, F, Cl, Br, I or —CN.

At least one hydrogen atoms of the aromatic group, the heteroaromatic group, the aryloxy group, the arylthio group, the aralkyl group, the heteroaralkyl group, the diarylamino group, the arylheteroarylamino group, and the diheteroarylamino group may be each independently further substituted with R' (excluding a hydrogen atom).

R's are each independently selected from a hydrogen atom, D, F, Cl, Br, I, —N(R")$_2$, —CN, —$NO_2$, —Si(R")$_3$, —B(OR")$_2$, —C(═O)R", —P(═O)(R")$_2$, —S(═O)$_2$R", —$OSO_2$R", a linear or branched alkyl group having 1 or more and 30 or less carbon atoms, a cyclic alkyl group having 3 or more and 30 or less carbon atoms, a linear or branched alkoxy group having 1 or more and or less carbon atoms, a cyclic alkoxy group having 2 or more and 30 or less carbon atoms, a linear or branched alkylthio group having 1 or more and 30 or less carbon atoms, a cyclic alkylthio group having 2 or more and 30 or less carbon atoms, a linear or branched alkenyl group having 2 or more and 30 or less carbon atoms, a cyclic alkenyl group having 3 or more and 30 or less carbon atoms, a linear or branched alkynyl group having 2 or more and 30 or less carbon atoms, a cyclic alkynyl group having 3 or more and 30 or less carbon atoms, an aromatic group having 5 or more and 60 or less carbon atoms, a heteroaromatic group having 1 or more and 60 or less carbon atoms, an aryloxy group having 5 or more and 40 or less carbon atoms, an arylthio group having 5 or more and 40 or less carbon atoms, an aralkyl group having 5 or more and 60 or less carbon atoms, a heteroaralkyl group having 2 or more and 60 or less carbon atoms, a diarylamino group having 10 or more and 40 or less carbon atoms, an arylheteroarylamino group having 10 or more and 40 or less carbon atoms or a diheteroarylamino group having 10 or more and 40 or less carbon atoms.

At least one hydrogen atoms of the alkyl group, the alkoxy group, the alkylthio group, the alkenyl group and the alkynyl group may be further substituted with R" (excluding a hydrogen atom), and one —$CH_2$— group or two or more non-adjacent —$CH_2$— groups in these groups may be substituted with —C(—R")═C(—R")—, —C≡C, —Si(—R")$_2$—, —C(═O)—, —NR"—, —O—, —S—, —CONR" or a divalent aromatic group, one or more hydrogen atoms in these groups may be substituted with D, F, Cl, Br, I or —CN.

At least one hydrogen atoms of the aromatic group, the heteroaromatic group, the aryloxy group, the arylthio group, the aralkyl group, the heteroaralkyl group, the diarylamino group, the arylheteroarylamino group, and the diheteroarylamino group may be each independently further substituted with R" (excluding a hydrogen atom), two or more adjacent R"s may be bonded to each other to form an aliphatic, aromatic, or heteroaromatic monocyclic ring or condensed ring.

R"s are each independently selected from a hydrogen atom, D, F, —CN, an aliphatic hydrocarbon group having 1 or more and 20 or less carbon atoms, an aromatic group having 5 or more and 20 or less carbon atoms, and a heteroaromatic group having 1 or more and 20 or less carbon atoms.

Two or more adjacent R"s may be bonded to each other to form an aliphatic, aromatic, or heteroaromatic monocyclic ring or condensed ring.]

[3] The iridium complex compound according to [1] or [2], in which $R^{31}$ in the formula (2) is as follows.

[$R^{31}$ is selected from a hydrogen atom, D, a linear or branched alkyl group having 1 or more and 30 or less carbon atoms, a cyclic alkyl group having 3 or more and 30 or less carbon atoms, an aralkyl group having 5 or more and 60 or less carbon atoms, and a heteroaralkyl group having 2 or more and 60 or less carbon atoms.

At least one hydrogen atoms of the alkyl group, the aralkyl group, and the heteroaralkyl group may be further substituted with R' (excluding a hydrogen atom), and one —$CH_2$— group or two or more non-adjacent —$CH_2$— groups in these groups may be substituted with —C(—R')═C(—R')—, —C≡C—, —Si(R')$_2$, —C(═O)—, —NR'—, —O—, —S—, —CONR'—, or a divalent aromatic group, one or more hydrogen atoms in these groups may be substituted with D, F, Cl, Br, I or —CN.

R' have the same meanings as R' of the above [2].]

[4] The iridium complex compound according to any one of [1] to [3], in which $R^{32}$ in the formula (2) is as follows.

[$R^{32}$ is selected from a hydrogen atom, D, a linear or branched alkyl group having 1 or more and 30 or less carbon atoms, a cyclic alkyl group having 3 or more and 30 or less carbon atoms, an aralkyl group having 5 or more and 60 or less carbon atoms, a heteroaralkyl group having 2 or more and 60 or less carbon atoms, an aromatic group having 5 or more and 60 or less carbon atoms, or a heteroaromatic group having 1 or more and 60 or less carbon atoms. At least one hydrogen atoms of the alkyl group, the aralkyl group, and the heteroaralkyl group may be further substituted with R' (excluding a hydrogen atom), and one —$CH_2$— group or two or more non-adjacent —$CH_2$— groups in these groups may be substituted with —C(—R')═C(—R')—, —C≡C—, —Si(R')$_2$, —C(═O)—, —NR'—, —O—, —S—, —CONR'—, or a divalent aromatic group, one or more hydrogen atoms in these groups may be substituted with D, F, Cl, Br, I or —CN.

At least one hydrogen atoms of the aromatic group and the heteroaromatic group may be further substituted with R' (excluding a hydrogen atom).

R' have the same meanings as R' of the above [2].]

[5] The iridium complex compound according to any one of [1] to [4], in which at least one of $R^{21}$ and $R^{22}$ in the formula (1) is a linear or branched alkyl group having 1 or more and 30 or less carbon atoms.

[6] The iridium complex compound according to any one of [1] to [5], in which $R^{13}$ in the formula (1) is a substituent represented by the formula (2).

[7] The iridium complex compound according to any one of [1] to [6], in which at least one of $R^6$ to $R^9$ in the formula (1) has, as a substituent, a linear or branched alkyl group having 1 or more and 30 or less carbon atoms, a cyclic alkyl group having 3 or more and 30 or less carbon atoms, an aromatic group having 5 or more and 60 or less carbon atoms, or an aralkyl group having 5 or more and 60 or less carbon atoms.

[8] The iridium complex compound according to any one of [1] to [6], in which adjacent groups among $R^6$ to $R^9$ in the formula (1) are bonded to each other to form a ring.

Further, related to the above iridium complex compound, the following are exemplified.

[9] An iridium-complex-compound-containing composition, including:

the iridium complex compound according to any one of [1] to [8]; and an organic solvent.

[10] The iridium-complex-compound-containing composition according to [9], further including a compound represented by the following formula (3) and having a maximum emission wavelength shorter than a maximum emission wavelength of the iridium complex compound.

(3)

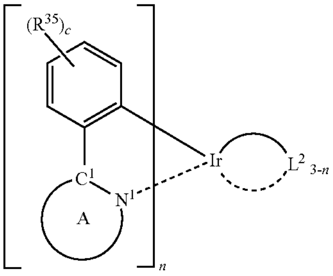

[In formula (3), $R^{35}$ is an alkyl group having 1 or more and 20 or less carbon atoms, a (hetero)aralkyl group having 7 or more and 40 or less carbon atoms, an alkoxy group having 1 or more and 20 or less carbon atoms, a (hetero) aryloxy group having 3 or more and 20 or less carbon atoms, an alkylsilyl group having 1 or more and 20 or less carbon atoms, an arylsilyl group having 6 or more and 20 or less carbon atoms, an alkylcarbonyl group having 2 or more and 20 or less carbon atoms, an arylcarbonyl group having 7 or more and 20 or less carbon atoms, an alkylamino group having 1 or more and 20 or less carbon atoms, an arylamino group having 6 or more and 20 or less carbon atoms, or a (hetero)aryl group having 3 or more and 30 or less carbon atoms, these groups may further have substituents, when there are a plurality of $R^{35}$s, $R^{35}$s may be the same as or different from each other.

C is an integer of 0 or more and 4 or less,

A ring A is any one of a pyridine ring, a pyrazine ring, a pyrimidine ring, an imidazole ring, an oxazole ring, a thiazole ring, a quinoline ring, an isoquinoline ring, a quinazoline ring, a quinoxaline ring, an azatriphenylene ring, a carboline ring, a benzothiazole ring, and a benzoxazole ring.

The ring A may have a substituent, and the substituent is F, Cl, Br, an alkyl group having 1 or more and 20 or less carbon atoms, a (hetero)aralkyl group having 7 or more and 40 or less carbon atoms, an alkoxy group having 1 or more and 20 or less carbon atoms, a (hetero)aryloxy group having 3 or more and 20 or less carbon atoms, an alkylsilyl group having 1 or more and 20 or less carbon atoms, an arylsilyl group having 6 or more and 20 or less carbon atoms, an alkylcarbonyl group having 2 or more and 20 or less carbon atoms, an arylcarbonyl group having 7 or more and 20 or less carbon atoms, an alkylamino group having 2 or more and 20 or less carbon atoms, an arylamino group having 6 or more and 20 or less carbon atoms, or a (hetero)aryl group having 3 or more and 20 or less carbon atoms, adjacent substituents bonded to the ring A may be bonded to each other to form a ring, when there are a plurality of rings A, the rings A may be the same as or different from each other.

$L^2$ represents an organic ligand, and n is an integer of 1 or more and 3 or less.]

[11] The iridium-complex-compound-containing composition according to [9] or [10], further including a compound represented by the following formula (20).

(20)

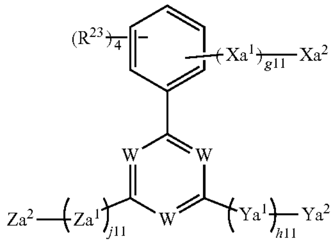

[In formula (20), each W independently represents CH or N, and at least one W is N, $Xa^1$, $Ya^1$, and $Za^1$ each independently represent a divalent aromatic hydrocarbon group having 6 or more and 30 or less carbon atoms, which may have a substituent, or a divalent aromatic heterocyclic group having 3 or more and 30 or less carbon atoms, which may have a substituent, $Xa^2$, $Ya^2$, and $Za^2$ each independently represent a hydrogen atom, an aromatic hydrocarbon group having 6 or more and 30 or less carbon atoms, which may have a substituent, or an aromatic heterocyclic group having 3 or more and 30 or less carbon atoms, which may have a substituent, g11, h11, and j11 each independently represent an integer of 0 or more and 6 or less, at least one of g11, h11, and j11 is an integer of 1 or more, when g11 is 2 or more, a plurality of $Xa^1$s may be the same as or different from each other, when h11 is 2 or more, a plurality of $Ya^1$s may be the same as or different from each other, when j11 is 2 or more, a plurality of $Za^1$s may be the same or different from each other, $R^{23}$ represents a hydrogen atom or a substituent, and four of $R^{23}$ may be the same as or different from each other, and when g11, h11, or j11 is 0, the corresponding $Xa^2$, $Ya^2$, or $Za^2$ is not a hydrogen atom.]

[12]A method for producing an organic electroluminescent element, the organic electroluminescent element including, an anode, a cathode, and at least one organic layer located between the anode and the cathode, on a substrate, the method including, forming the at least one organic layer by a wet-process film formation method using the iridium-complex-compound-containing composition according to any one of [9] to [11].

[13] An organic electroluminescent element, including an anode, a cathode, and at least one organic layer located between the anode and the cathode, on a substrate, wherein at least one organic layer is an emission layer containing the iridium complex compound according to any one of [1] to [8].

[14] The organic electroluminescent element according to [13], further including a compound represented by the following formula (3) and having a maximum emission wavelength shorter than a maximum emission wavelength of the iridium complex compound.

(3)

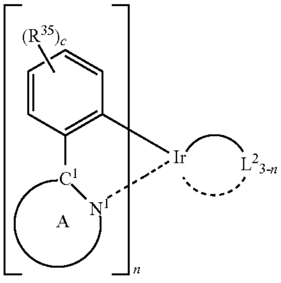

[In formula (3), $R^{35}$ is an alkyl group having 1 or more and 20 or less carbon atoms, a (hetero)aralkyl group having 7 or more and 40 or less carbon atoms, an alkoxy group having 1 or more and 20 or less carbon atoms, a (hetero)aryloxy group having 3 or more and 20 or less carbon atoms, an alkylsilyl group having 1 or more and 20 or less carbon atoms, an arylsilyl group having 6 or more and 20 or less carbon atoms, an alkylcarbonyl group having 2 or more and 20 or less carbon atoms, an arylcarbonyl group having 7 or more and 20 or less carbon atoms, an alkylamino group having 1 or more and 20 or less carbon atoms, an arylamino group having 6 or more and 20 or less carbon atoms, or a (hetero)aryl group having 3 or more and 30 or less carbon atoms, these groups may further have substituents. When there are a plurality of $R^{35}$s, $R^{35}$s may be the same as or different from each other.

C is an integer of 0 or more and 4 or less.

A ring A is any one of a pyridine ring, a pyrazine ring, a pyrimidine ring, an imidazole ring, an oxazole ring, a thiazole ring, a quinoline ring, an isoquinoline ring, a quinazoline ring, a quinoxaline ring, an azatriphenylene ring, a carboline ring, a benzothiazole ring, and a benzoxazole ring.

The ring A may have a substituent, and the substituent is F, Cl, Br, an alkyl group having 1 or more and 20 or less carbon atoms, a (hetero)aralkyl group having 7 or more and 40 or less carbon atoms, an alkoxy group having 1 or more and 20 or less carbon atoms, a (hetero)aryloxy group having 3 or more and 20 or less carbon atoms, an alkylsilyl group having 1 or more and 20 or less carbon atoms, an arylsilyl group having 6 or more and 20 or less carbon atoms, an alkylcarbonyl group having 2 or more and 20 or less carbon atoms, an arylcarbonyl group having 7 or more and 20 or less carbon atoms, an alkylamino group having 2 or more and 20 or less carbon atoms, an arylamino group having 6 or more and 20 or less carbon atoms, or a (hetero)aryl group having 3 or more and 20 or less carbon atoms, adjacent substituents bonded to the ring A may be bonded to each other to form a ring, when there are a plurality of rings A, the rings A may be the same as or different from each other.

$L^2$ represents an organic ligand, and n is an integer of 1 or more and 3 or less.]

[15] The organic electroluminescent element according to [13] or [14], in which the emission layer further includes a compound represented by the following formula (20).

(20)

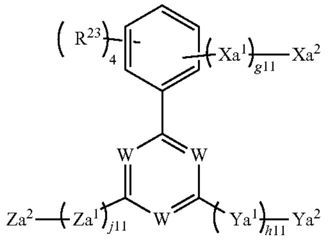

[In formula (20), each W independently represents CH or N, and at least one W is N, $Xa^1$, $Ya^1$, and $Za^1$ each independently represent a divalent aromatic hydrocarbon group having 6 or more and 30 or less carbon atoms, which may have a substituent, or a divalent aromatic heterocyclic group having 3 or more and 30 or less carbon atoms, which may have a substituent, $Xa^2$, $Ya^2$, and $Za^2$ each independently represent a hydrogen atom, an aromatic hydrocarbon group having 6 or more and 30 or less carbon atoms, which may have a substituent, or an aromatic heterocyclic group having 3 or more and 30 or less carbon atoms, which may have a substituent, g11, h11, and j11 each independently represent an integer of 0 or more and 6 or less, at least one of g11, h11, and j11 is an integer of 1 or more, when g11 is 2 or more, a plurality of $Xa^1$s may be the same as or different from each other, when h11 is 2 or more, a plurality of $Ya^1$s may be the same as or different from each other, when j11 is 2 or more, a plurality of $Za^1$s may be the same or different from each other, $R^{23}$ represents a hydrogen atom or a substituent, and four of $R^{23}$ may be the same as or different from each other, and when g11, h11, or j11 is 0, the corresponding $Xa^2$, $Ya^2$, or $Za^2$ is not a hydrogen atom.].

[16] An organic EL display device, including the organic electroluminescent element according to any one of [13] to [15].

[17] An organic EL illuminator, including the organic electroluminescent element according to any one of [13] to [15].

Advantageous Effects of Invention

According to the above configuration, it is possible to provide an iridium complex compound having a narrow half width, a high solubility in a solvent, and a luminescent efficiency equal to or higher than that of a common one.

BRIEF DESCRIPTION OF DRAWINGS

The FIG. 1*s* a cross-sectional view schematically showing an example of a structure of an organic electroluminescent element according to the present invention.

DESCRIPTION OF EMBODIMENTS

Hereinafter, embodiments of the present invention will be described in detail, but the present invention is not limited to the following embodiments, and various modifications can be made within the scope of the gist of the present invention.

In the present specification, an "aromatic ring" refers to an "aromatic hydrocarbon ring" and is distinguished from a "heteroaromatic ring" containing a heteroatom as a ring-constituting atom. Similarly, an "aromatic group" refers to an "aromatic hydrocarbon group" or an "aromatic hydrocarbon ring group", and a "heteroaromatic group" refers to a "heteroaromatic ring group".

In addition, "D" refers to deuterium. Of the substituents, a (hetero)aralkyl group refers to an aralkyl group which may be substituted with a hetero atom, a (hetero)aryloxy group refers to an aryloxy group which may be substituted with a hetero atom, and a "(hetero)aryl group" refers to an aryl group which may be substituted with a hetero atom.

In the structural formula, Me represents a methyl group, Et represents an ethyl group, but represents a tertiary butyl group, Ph represents a phenyl group, Tf represents a trifluoromethylsulfonyl group, and Ac represents an acetyl group.

As a result of intensive studies to solve the above problems, the present inventors have found that an iridium complex compound having a specific chemical structure exhibits an extremely narrow half width as a red luminescent material as compared with common materials, and at the same time, exhibits high solubility and PL quantum yield, thereby completing the present invention.

[Iridium Complex Compound]

The iridium complex compound according to the present embodiment is a compound represented by formula (1).

(I)

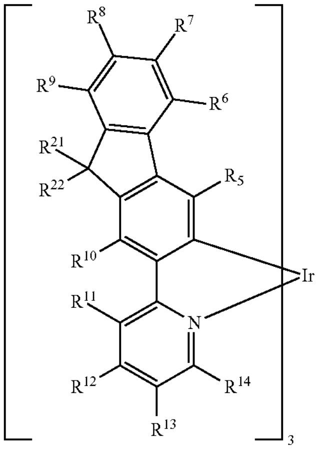

[In formula (1), Ir represents an iridium atom. $R^5$ to $R^{14}$, $R^{21}$, and $R^{22}$ each independently represent a hydrogen atom, D, F, Cl, Br, I, or a substituent. The groups adjacent to each other may be further bonded to each other to form a ring. Any one of $R^{12}$ and $R^{13}$ is a substituent represented by the following formula (2).

(2)

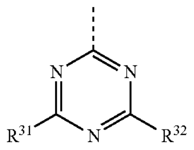

[In formula (2), a broken line represents a bond to formula (1). $R^{31}$ represents a hydrogen atom, D, an alkyl group, an aralkyl group, or a heteroaralkyl group, and $R^{32}$ represents a hydrogen atom, D, an alkyl group, an aralkyl group, a heteroaralkyl group, an aromatic group, or a heteroaromatic group. $R^{31}$ and $R^{32}$ may be further substituted.]]

The iridium complex compound according to the present embodiment exhibits an extremely narrow half width as a red luminescent material as compared with a common material, and at the same time, exhibits a high solubility and solution PL quantum yield. The reason for this is presumed as follows.

Patent Literature 1 discloses an iridium complex having a structure in which a triazine ring is bonded to a fluorene-pyridine ligand and two aromatic rings are bonded to the triazine ring. It is considered that since two aromatic rings are bonded to triazine, a rotational motion between these rings and LUMO also expand to an aromatic ring site, and thus the half width tends to increase. Meanwhile, for the iridium complex compound according to formula (1), it is limited to $R^{32}$ when the aromatic ring is bonded to the triazine, which is thought to have allowed the narrowing of the half width.

The LUMO is located on the triazine ring, but the LUMO spreads on the aromatic ring as well when the aromatic ring is bonded so that a π-electron system is conjugated, so that the rotational motion of the bond between the triazine ring and the aromatic ring has a considerable influence on a shape of the spectrum and widens the half width. This effect is remarkable when the triazine ring is substituted with two aromatic rings. Meanwhile, when the triazine ring is substituted with one or more alkyl groups or (hetero)aralkyl groups, in which the π-electron conjugated system does not spread, an effect of effectively blocking an interaction with a solvent molecule in the case of an external environment, that is, in a solution state, or with a host molecule in the case of an emission layer of an organic EL element is also produced, and thus the half width can be further narrowed.

A ligand structure of the complex in the present embodiment is obtained by substituting a specific site of the pyridine ring with the triazine ring represented by formula (2) with respect to a main framework of fluorene-pyridine. It is considered that the LUMO is localized on the triazine ring, and a decrease in MLCT property due to a decrease in involvement of an iridium atom is compensated by the fact that the fluorene-pyridine has a linear structure and an overlap between HOMO and the LUMO on a ligand is considerably large, so that the quantum yield does not decrease.

When the involvement of iridium atoms is reduced, the contribution of ligand centered (LC) luminescence increases, so that the spectrum is not widened, and a main peak having a relatively narrow half width is strongly observed although the spectrum is accompanied by a vibrating structure. (See: Photochemistry of Metal Complexes in Society of Complex Chemistry Library 2 edited byYoichi Sasaki and Osamu Ishitani, pp. 83-98, published by Sankyo Shuppan Co., Ltd., 2007)

It is not easy to synthesize a so-called heteroleptic iridium complex in which ligands are asymmetric as disclosed in Patent Literature 2. Since the ligands are asymmetric, the heteroleptic iridium complex has more vibration modes than those of a homoleptic iridium complex having high symmetry, and further, the distributions of the HOMO and the LUMO are spread between the ligands different from each other, or a sub-ligand interferes with a main ligand involved in luminescence, and as a result, the half width is widened.

Meanwhile, in the iridium complex compound represented by formula (1) according to the present embodiment, the half width can be narrowed by forming a homoleptic complex ($L_3Ir$) in which all three ligands are the same for trivalent iridium. Since different ligands do not affect each other unlike heteroleptic complexes ($L^1{}_2L^2Ir$, $L^1L^2{}_2Ir$, or $L^1L^2L^3Ir$) having different ligands to iridium, the quantum yield tends to be improved also in this respect.

<$R^5$ to $R^{14}$, $R^{21}$, and $R^{22}$>

$R^5$ to $R^{14}$ in formula (1) represent a hydrogen atom, D, F, Cl, Br, I, or a substituent. $R^5$ to $R^{14}$, $R^{21}$, and $R^{22}$ are independent of each other, and may be the same as or different from each other.

When $R^5$ to $R^{14}$, $R^{21}$, and $R^{22}$ are substituents, the type thereof is not particularly limited, and an optimal substituent can be selected in consideration of precise control of a target emission wavelength, compatibility with a solvent to be used, compatibility with a host compound in the case of forming an organic electroluminescent element, and the like. In the study of the optimization, preferred substituents are in the ranges described below.

$R^5$ to $R^{14}$, $R^{21}$, and $R^{22}$ each independently represent a hydrogen atom, D, F, Cl, Br, I, —$N(R')_2$, —CN, —$NO_2$, —OH, —COOR', —C(=O)R', —C(=O)NR', P(=O)$(R')_2$, —S(=O)R', —$S(=O)_2R'$, —$OS(=O)_2R'$, a linear or branched alkyl group having 1 or more and 30 or less carbon atoms, a cyclic alkyl group having 3 or more and 30 or less carbon atoms, a linear or branched alkoxy group having 1 or more and 30 or less carbon atoms, a cyclic alkoxy group having 2 or more and 30 or less carbon atoms, a linear or branched alkylthio group having 1 or more and 30 or less carbon atoms, a cyclic alkylthio group having 2 or more and 30 or less carbon atoms, a linear or branched alkenyl group having 2 or more and 30 or less carbon atoms, a cyclic alkenyl group having 3 or more and 30 or less carbon atoms, a linear or branched alkynyl group having 2 or more and 30 or less carbon atoms, a cyclic alkynyl group having 3 or more and 30 or less carbon atoms, an aromatic group having 5 or more and 60 or less carbon atoms, a heteroaromatic group having 1 or more and 60 or less carbon atoms, an aryloxy group having or more and 40 or less carbon atoms, an arylthio group having 5 or more and 40 or less carbon atoms, an aralkyl group having 5 or more and 60 or less carbon atoms, a heteroaralkyl group having 2 or more and 60 or less carbon atoms, a diarylamino group having 10 or more and 40 or less carbon atoms, an arylheteroarylamino group having 10 or more and 40 or less carbon atoms, or a diheteroarylamino group having 10 or more and 40 or less carbon atoms.

At least one hydrogen atoms of the alkyl group, the alkoxy group, the alkylthio group, the alkenyl group, and the alkynyl group may be further substituted with R' (excluding a hydrogen atom). One —$CH_2$— group or two or more non-adjacent —$CH_2$— groups in these groups, that is, the alkyl group, the alkoxy group, the alkylthio group, the alkenyl group, the alkynyl group, and R' (excluding a hydrogen atom) may be substituted with —C(—R')=C(—R')—, —C≡C—, —$Si(R')_2$, —C(=O)—, —NR'—, —O—, —S—, —CONR'—, or a divalent aromatic group. One or more hydrogen atoms in these groups may be substituted with D, F, Cl, Br, I or —CN.

At least one hydrogen atoms of the aromatic group, the heteroaromatic group, the aryloxy group, the arylthio group, the aralkyl group, the heteroaralkyl group, the diarylamino group, the arylheteroarylamino group, and the diheteroarylamino group may be each independently further substituted with R' (excluding a hydrogen atom).

R' will be described later.

Examples of the linear or branched alkyl group having 1 or more and 30 or less carbon atoms or the cyclic alkyl group having 3 or more and 30 or less carbon atoms include a methyl group, an ethyl group, an n-propyl group, an isopropyl group, an n-butyl group, an n-pentyl group, an n-hexyl group, an n-octyl group, a 2-ethylhexyl group, an isopropyl group, an isobutyl group, a tert-butyl group, a cyclopentyl group, a cyclohexyl group, an n-octyl group, a norbornyl group, and an adamantyl group. In the case of an alkyl group, the number of carbon atoms is preferably 1 or more, and is preferably 30 or less, more preferably 20 or less, still more preferably 12 or less, because when the number of carbon atoms is too large, the complex is highly shielded and durability is impaired. In the case of a branched alkyl group, the number of carbon atoms is most preferably 7 or less, because the shielding effect is larger than that of a linear alkyl group or a cyclic alkyl group. In the case of a cyclic alkyl group, the number of carbon atoms is 3 or more.

Examples of the linear or branched alkoxy group having 1 or more and 30 or less carbon atoms or the cyclic alkoxy group having 2 or more and 30 or less carbon atoms include a methoxy group, an ethoxy group, an n-propyloxy group, an n-butoxy group, an n-hexyloxy group, an isopropyloxy group, a cyclohexyloxy group, a 2-ethoxyethoxy group, and a 2-ethoxyethoxyethoxy group. From the viewpoint of durability, the number of carbon atoms is preferably 1 or more, and is preferably 30 or less, more preferably 20 or less, most preferably 12 or less. In the case of a cyclic alkoxy group, the number of carbon atoms is 2 or more.

Examples of the linear or branched alkylthio group having 1 or more and 30 or less carbon atoms or the cyclic alkylthio group having 2 or more and 30 or less carbon atoms include a methylthio group, an ethylthio group, an n-propylthio group, an n-butylthio group, an n-hexylthio group, an isopropylthio group, a cyclohexylthio group, a 2-methylbutylthio group, and an n-hexylthio group. From the viewpoint of durability, the number of carbon atoms is preferably 1 or more, and is preferably 30 or less, more preferably 20 or less, most preferably 12 or less. In the case of a cyclic alkylthio group, the number of carbon atoms is 2 or more.

Examples of the linear or branched alkenyl group having 2 or more and 30 or less carbon atoms or the cyclic alkenyl group having 3 or more and 30 or less carbon atoms include a vinyl group, an allyl group, a propenyl group, a heptenyl group, a cyclopentenyl group, a cyclohexenyl group, and a cyclooctenyl group. From the viewpoint of durability, the number of carbon atoms is preferably 2 or more, and is preferably 30 or less, more preferably 20 or less, most preferably 12 or less. In the case of a cyclic alkenyl group, the number of carbon atoms is 3 or more.

Examples of the linear or branched alkynyl group having 2 or more and 30 or less carbon atoms or the cyclic alkynyl group having 3 or more and 30 or less carbon atoms include an ethynyl group, a propionyl group, a butynyl group, a pentynyl group, a hexynyl group, a heptynyl group, and an octynyl group. From the viewpoint of durability, the number of carbon atoms is preferably 2 or more, and is preferably 30 or less, more preferably 20 or less, most preferably 12 or less. In the case of a cyclic alkynyl group, the number of carbon atoms is 3 or more.

The aromatic group having 5 or more and 60 or less carbon atoms and the heteroaromatic group having 1 or more and 60 or less carbon atoms may be present as a single ring or a condensed ring, or may be a group formed by bonding or condensing another type of aromatic group or heteroaromatic group to one ring.

Examples thereof include a phenyl group, a naphthyl group, an anthracenyl group, a benzoanthracenyl group, a phenanthrenyl group, a benzophenanthrenyl group, a pyrenyl group, a chrysenyl group, a fluoranthenyl group, a perylenyl group, a benzopyrenyl group, a benzofluoranthenyl group, a naphthacenyl group, a pentacenyl group, a biphenyl group, a terphenyl group, a fluorenyl group, a spirobifluorenyl group, a dihydrophenanthrenyl group, a dihydropyrenyl group, a tetrahydropyrenyl group, an indenofluorenyl group, a furyl group, a benzofuryl group, an isobenzofuryl group, a dibenzofuranyl group, a thiophene group, a benzothiophenyl group, a dibenzothiophenyl group, a pyrrolyl group, an indolyl group, an isoindolyl group, a carbazolyl group, a benzocarbazolyl group, an indolocarbazolyl group, an indenocarbazolyl group, a pyridyl group, a cinnolyl group, an isocinnolyl group, an acridyl group, a phenanthryl group, a phenothiazinyl group, a phenoxazyl group, a pyrazolyl group, an indazolyl group, an imidazolyl group, a benzimidazolyl group, a naphthoimidazolyl group, a phenanthroimidazolyl group, a pyridinimidazolyl group, an oxazolyl group, a benzoxazolyl group, a naphthooxazolyl group, a thiazolyl group, a benzothiazolyl group, a pyrimidyl group, a benzopyrimidyl group, a pyridazinyl group, a quinoxalinyl group, a diazaanthracenyl group, a diazapyrenyl group, a pyrazinyl group, a naphthyridinyl group, an azacarbazolyl group, a benzocarbolinyl group, a phenanthrolinyl group, a triazolyl group, a benzotriazolyl group, an oxadiazolyl group, a thiadiazolyl group, a triazinyl group, a 2,6-diphenyl-1,3,5-triazine-4-yl group, a tetrazolyl group, a purinyl group, and a benzothiadiazolyl group.

From the viewpoint of the balance between solubility and durability, the number of carbon atoms of these groups is preferably 3 or more, more preferably 5 or more, and is preferably 50 or less, more preferably 40 or less, most preferably 30 or less.

Examples of the aryloxy group having 5 or more and 40 or less carbon atoms include a phenoxy group, a methylphenoxy group, a naphthoxy group, and a methoxyphenoxy group. From the viewpoint of the balance between solubility and durability, the number of carbon atoms of these aryloxy groups is preferably 5 or more, and is preferably 30 or less, more preferably 25 or less, most preferably 20 or less.

Examples of the arylthio group having 5 or more and 40 or less carbon atoms include a phenylthio group, a methylphenylthio group, a naphthylthio group, and a methoxyphenylthio group. From the viewpoint of the balance between solubility and durability, the number of carbon atoms of these arylthio groups is preferably 5 or more, and is preferably 30 or less, more preferably 25 or less, most preferably 20 or less.

Examples of the aralkyl group having 5 or more and 60 or less carbon atoms include a 1,1-dimethyl-1-phenylmethyl group, a 1,1-di(n-butyl)-1-phenylmethyl group, a 1,1-di(n-hexyl)-1-phenylmethyl group, a 1,1-di(n-octyl)-1-phenylmethyl group, a phenylmethyl group, a phenylethyl group, a 3-phenyl-1-propyl group, a 4-phenyl-1-n-butyl group, a 1-methyl-1-phenylethyl group, a 5-phenyl-1-n-propyl group, a 6-phenyl-1-n-hexyl group, a 6-naphthyl-1-n-hexyl group, a 7-phenyl-1-n-heptyl group, an 8-phenyl-1-n-octyl group, and a 4-phenylcyclohexyl group. From the viewpoint of the balance between solubility and durability, the number of carbon atoms of these aralkyl groups is preferably 5 or more, and more preferably or less.

Examples of the heteroaralkyl group having 2 or more and 60 or less carbon atoms include a 1,1-dimethyl-1-(2-pyridyl) methyl group, a 1,1-di(n-hexyl)-1-(2-pyridyl)methyl group, a (2-pyridyl)methyl group, a (2-pyridyl)ethyl group, a 3-(2-pyridyl)-1-propyl group, a 4-(2-pyridyl)-1-n-butyl group, a 1-methyl-1-(2-pyridyl)ethyl group, a 5-(2-pyridyl)-1-n-propyl group, a 6-(2-pyridyl)-1-n-hexyl group, a 6-(2-pyrimidyl)-1-n-hexyl group, a 6-(2,6-diphenyl-1,3,5-triazine-4-yl)-1-n-hexyl group, a 7-(2-pyridyl)-1-n-heptyl group, an 8-(2-pyridyl)-1-n-octyl group, and a 4-(2-pyridyl)cyclohexyl group. From the viewpoint of the balance between solubility and durability, the number of carbon atoms of these heteroaralkyl groups is preferably or more, and is preferably 50 or less, more preferably 40 or less, most preferably 30 or less.

Examples of the diarylamino group having 10 or more and 40 or less carbon atoms include a diphenylamino group, a phenyl(naphthyl)amino group, a di(biphenyl)amino group, and a di(p-terphenyl)amino group. From the viewpoint of the balance between solubility and durability, the number of carbon atoms of these diarylamino groups is preferably 10 or more, and is preferably 36 or less, more preferably 30 or less, most preferably 25 or less.

Examples of the arylheteroarylamino group having 10 or more and 40 or less carbon atoms include a phenyl(2-pyridyl)amino group and a phenyl(2,6-diphenyl-1,3,5-triazine-4-yl)amino group. From the viewpoint of the balance between solubility and durability, the number of carbon atoms of these arylheteroarylamino groups is preferably 10 or more, and is preferably 36 or less, more preferably 30 or less, most preferably 25 or less.

Examples of the diheteroarylamino group having 10 or more and 40 or less carbon atoms include a di(2-pyridyl) amino group and a di(2,6-diphenyl-1,3,5-triazine-4-yl) amino group. From the viewpoint of the balance between solubility and durability, the number of carbon atoms of these diheteroarylamino groups is preferably 10 or more, and is preferably 36 or less, more preferably 30 or less, most preferably 25 or less.

$R^5$ to $R^{14}$ are each independently preferably a hydrogen atom, F, or —CN, a linear or branched alkyl group having 1 or more and 30 or less carbon atoms, a cyclic alkyl group having 3 or more and 30 or less carbon atoms, an aryloxy group having 5 or more and 40 or less carbon atoms, an arylthio group having 5 or more and 40 or less carbon atoms, a diarylamino group having 10 or more and 40 or less carbon atoms, an aralkyl group having 5 or more and 60 or less carbon atoms, an aromatic group having 5 or more and 60 or less carbon atoms, or a heteroaromatic group having 1 or more and 60 or less carbon atoms, particularly preferably a hydrogen atom, F, or —CN, an alkyl group, an aralkyl group, an aromatic group, or a heteroaromatic group, and most preferably a hydrogen atom, F, or —CN, an alkyl group, an aromatic group, or a heteroaromatic group, from the viewpoint of not impairing durability as a luminescent material in an organic electroluminescent element.

For the same reasons as those of $R^5$ to $R^{14}$, $R^{21}$ and $R^{22}$ are each independently preferably a hydrogen atom, F, —CN, a linear or branched alkyl group having 1 or more and 30 or less carbon atoms, a cyclic alkyl group having 3 or more and 30 or less carbon atoms, an aryloxy group having 5 or more and 40 or less carbon atoms, an arylthio group having 5 or more and 40 or less carbon atoms, a diarylamino group having 10 or more and 40 or less carbon atoms, an aralkyl group having 5 or more and 60 or less carbon atoms, an aromatic group having or more and 60 or less carbon atoms, or a heteroaromatic group having 1 or more and 60 or less carbon atoms, and particularly preferably F, —CN, an alkyl group, an aralkyl group, an aromatic group, or a heteroaromatic group. It is particularly preferable that $R^{21}$ and $R^{22}$ are a linear or branched alkyl group having 1 or more and 30 or less carbon atoms, and it is most preferable that at least one of $R^{21}$ and $R^{22}$ is a linear or branched alkyl group having 1 or more and 30 or less carbon atoms. This is because, in the case of being used as a emission layer of an organic EL element, appropriate solubility is imparted, and a process of quenching by interaction with adjacent host molecules or the like in the layer can be prevented by appropriately shielding a fluorene portion in which the HOMO is distributed.

From the viewpoint of improving the life, it is preferable that at least one of $R^6$ to $R^9$ is the substituent, or that adjacent groups of $R^6$ to $R^9$ are bonded to each other to form a ring.

When $R^6$ to $R^9$ are the substituents or when adjacent groups of $R^6$ to $R^9$ are further bonded to each other to form a ring, the probability that fluorene captures holes can be increased.

For the iridium complex compound according to formula (1), it is limited to $R^{32}$ when the aromatic ring is bonded to the triazine, so that the half width can be narrowed, but the range of conjugation is narrowed, the electron resistance of triazine is reduced, and the lifetime of triazine may be shortened. When the probability that fluorene captures holes is increased, a ratio of electrons of triazine consumed for recombination with holes is increased, and thus it is considered that a decrease in life can be prevented and improved.

From the viewpoint of improving the luminescent efficiency, any one of $R^6$ to $R^9$ is preferably a substituent selected from a linear or branched alkyl group having 1 or more and 30 or less carbon atoms, a cyclic alkyl group having 3 or more and 30 or less carbon atoms, an aromatic group having 5 or more and 60 or less carbon atoms, and an aralkyl group having 5 or more and 60 or less carbon atoms. Specific examples thereof are the same as those described in the above description of $R^5$ to $R^{14}$. These substituents may further have R' as a substituent.

The linear or branched alkyl group having 1 or more and 30 or less carbon atoms is particularly preferably a methyl group, an ethyl group, an n-propyl group, an isopropyl group, an n-butyl group, an n-pentyl group, an n-hexyl group, an isopropyl group, an isobutyl group, or a tert-butyl group.

The aromatic group having 5 or more and 60 or less carbon atoms is particularly preferably a phenyl group, a biphenyl group, a terphenyl group, a quaterphenyl group, a naphthyl group, a phenanthrenyl group, a fluorenyl group, a dibenzofuranyl group, a dibenzothiophenyl group, or a carbasol group, and more preferably a phenyl group, a biphenyl group, or a naphthyl group.

The aralkyl group having 5 or more and 60 or less carbon atoms is particularly preferably a 1,1-dimethyl-1-phenylmethyl group, a 1,1-di(n-butyl)-1-phenylmethyl group, a 1,1-di(n-hexyl)-1-phenylnethyl group, a 3-phenyl-1-propyl group, a 4-phenyl-1-n-butyl group, a 5-phenyl-1-n-propyl group, or a 6-phenyl-1-n-hexyl group.

The aromatic group having 5 or more and 60 or less carbon atoms preferably further has an aralkyl group having 5 or more and 60 or less carbon atoms as a substituent R', and specific examples thereof include a 1,1-dimethyl-1-phenylmethylphenyl group, a 1,1-di(n-butyl)-1-phenylmethylphenyl group, a 1,1-di(n-hexyl)-1-phenylmethylphenyl group, a 3-phenyl-1-propylphenyl group, a 4-phenyl-1-n-butylphenyl group, a 5-phenyl-1-n-propylphenyl group, and a 6-phenyl-1-n-hexylphenyl group.

From the viewpoint of improving the life and the luminescent efficiency, $R^8$ among $R^6$ to $R^9$ is particularly preferably a substituent, and $R^6$, $R^7$, and $R^9$ are most preferably hydrogen, and only $R^8$ is a substituent.

Preferred as those in which adjacent groups of $R^6$ to $R^9$ are bonded to each other to form a ring are 7H-benzo[c]fluorene or 2,3,4,7-tetrahydro-1H-benzo[c]fluorene in which $R^6$ and $R^7$ form a ring, 11H-benzo[b]fluorene or 7,8,9,11-tetrahydro-6H-benzo[b]fluorene in which $R^7$ and $R^8$ form a ring, or 11H-benzo[a]fluorene or 2,3,4,11-tetrahydro-1H-benzo[a]fluorene in which $R^8$ and $R^9$ form a ring. Among these, 7H-benzo[c]fluorene is particularly preferable.

<R'>

In the present specification, R' is selected from a hydrogen atom, D, F, Cl, Br, I, —N(R")$_2$, —CN, —NO$_2$, —Si(R")$_3$, —B(OR")$_2$, —C(=O)R", —P(=O)(R")$_2$, —S(=O)$_2$R", —OSO$_2$R", a linear or branched alkyl group having 1 or more and 30 or less carbon atoms, a cyclic alkyl group having 3 or more and 30 or less carbon atoms, a linear or branched alkoxy group having 1 or more and 30 or less carbon atoms, a cyclic alkoxy group having 2 or more and 30 or less carbon atoms, a linear or branched alkylthio group having 1 or more and 30 or less carbon atoms, a cyclic alkylthio group having 2 or more and 30 or less carbon atoms, a linear or branched alkenyl group having 2 or more and 30 or less carbon atoms, a cyclic alkenyl group having 3 or more and 30 or less carbon atoms, a linear or branched alkynyl group having 2 or more and or less carbon atoms, a cyclic alkynyl group having 3 or more and 30 or less carbon atoms, an aromatic group having 5 or more and 60 or less carbon atoms, a heteroaromatic group having 1 or more and 60 or less carbon atoms, an aryloxy group having 5 or more and 40 or less carbon atoms, an arylthio group having 5 or more and 40 or less carbon atoms, an aralkyl group having or more and 60 or less carbon atoms, a heteroaralkyl group having 2 or more and 60 or less carbon atoms, a diarylamino group having 10 or more and 40 or less carbon atoms, an arylheteroarylamino group having 10 or more and 40 or less carbon atoms, or a diheteroarylamino group having 10 or more and 40 or less carbon atoms. When there are a plurality of R's, R's may be the same as or different from each other.

At least one hydrogen atoms of the alkyl group, the alkoxy group, the alkylthio group, the alkenyl group, and the alkynyl group may be further substituted with R" (excluding a hydrogen atom). One —CH$_2$— group or two or more non-adjacent —CH$_2$— groups in these groups, that is, the alkyl group, the alkoxy group, the alkylthio group, the alkenyl group, and the alkynyl group may be substituted with —C(—R")=C(—R")—, —C≡C, —Si(—R")$_2$—, —C(=O)—, —NR"—, —O—, —S—, —CONR"—, or a divalent aromatic group. One or more hydrogen atoms in these groups may be substituted with D, F, Cl, Br, I or —CN.

At least one hydrogen atoms of the aromatic group, the heteroaromatic group, the aryloxy group, the arylthio group, the aralkyl group, the heteroaralkyl group, the diarylamino group, the arylheteroarylamino group, and the diheteroarylamino group may be each independently further substituted with R" (excluding a hydrogen atom). R" will be described later.

Two or more adjacent R's may be bonded to each other to form an aliphatic, aromatic, or heteroaromatic monocyclic ring or condensed ring.

Examples of the groups described above are the same as those described in the description of $R^5$ to $R'^4$.

<R">

R" is selected from a hydrogen atom, D, F, —CN, an aliphatic hydrocarbon group having 1 or more and 20 or less carbon atoms, an aromatic group having 5 or more and 20 or less carbon atoms, and a heteroaromatic group having 1 or more and 20 or less carbon atoms.

Two or more adjacent R"s may be bonded to each other to form an aliphatic, aromatic, or heteroaromatic monocyclic ring or condensed ring. When there are a plurality of R"s, R"s may be the same as or different from each other.

<Formula (2)>

Any one of $R^{12}$ and $R^{13}$ in formula (1) is a substituent represented by formula (2). A portion where formula (2) is provided may be either $R^{12}$ or $R^{13}$, but $R^{13}$ is preferable from the viewpoint that the durability and the half width can be further narrowed.

<$R^{31}$ and $R^{32}$>

$R^{31}$ is a hydrogen atom, D, or a substituent, and the substituent is selected from a linear or branched alkyl group having 1 or more and 30 or less carbon atoms, a cyclic alkyl group having 3 or more and 30 or less carbon atoms, an aralkyl group having 5 or more and 60 or less carbon atoms, and a heteroaralkyl group having 2 or more and 60 or less carbon atoms.

At least one hydrogen atoms of the alkyl group, the aralkyl group and the heteroaralkyl group may be further substituted with R' (excluding a hydrogen atom). One $—CH_2—$ group or two or more non-adjacent —CH2- groups in these groups, that is, the alkyl group, the aralkyl group, the heteroaralkyl group, and R' (excluding a hydrogen atom) may be substituted with —C(—R')═C(—R')—, —C≡C—, $—Si(—R')_2$, —C(═O)—, —NR'—, —O—, —S—, —CONR'—, or a divalent aromatic group. One or more hydrogen atoms in these groups may be substituted with D, F, Cl, Br, I or —CN.

Preferable structures of these substituents are the same as those of $R^5$ to $R^{14}$, and R' is also the same as that described above. From the viewpoint of solubility and durability, an alkyl group is more preferable, a linear or branched alkyl group having 7 or less carbon atoms is particularly preferable, and for example, a t-butyl group is preferable.

$R^{32}$ is a hydrogen atom, D, or a substituent, and the substituent is selected from a linear or branched alkyl group having 1 or more and 30 or less carbon atoms, a cyclic alkyl group having 3 or more and 30 or less carbon atoms, an aralkyl group having 5 or more and 60 or less carbon atoms, a heteroaralkyl group having 2 or more and 60 or less carbon atoms, an aromatic group having 5 or more and 60 or less carbon atoms, or a heteroaromatic group having 1 or more and 60 or less carbon atoms.

At least one hydrogen atoms of the alkyl group, the aralkyl group and the heteroaralkyl group may be further substituted with R' (excluding a hydrogen atom). One $—CH_2—$ group or two or more non-adjacent —CH2- groups in these groups, that is, the alkyl group, the aralkyl group, the heteroaralkyl group, and R' (excluding a hydrogen atom) may be substituted with —C(—R')═C(—R')—, —C≡C—, $—Si(—R')_2$, —C(═O)—, —NR'—, —O—, —S—, —CONR'—, or a divalent aromatic group. One or more hydrogen atoms in these groups may be substituted with D, F, Cl, Br, I or —CN.

At least one hydrogen atoms of the aromatic group and the heteroaromatic group may be further substituted with R' (excluding a hydrogen atom).

Preferable structures of these substituents are the same as those of $R^5$ to $R^{14}$, and R' is also the same as that described above. From the viewpoint of solubility and durability, an aromatic group or an alkyl group which may have a substituent is more preferable. Particularly preferred are a linear or branched alkyl group having 7 or less carbon atoms, an aromatic group having 6 to 30 carbon atoms, an aromatic group having 6 to 30 carbon atoms and having a linear or branched alkyl group having 7 or less carbon atoms, and an aromatic group having 6 to 30 carbon atoms and having an aralkyl group having 7 or more and 30 or less carbon atoms.

Specific examples of the linear or branched alkyl group having 7 or less carbon atoms include a t-butyl group.

The aromatic group having 6 to 30 carbon atoms is preferably an aromatic hydrocarbon group, and specific examples thereof include a phenyl group, a naphthyl group, and a biphenyl group. It is preferable that the aromatic hydrocarbon group further has a substituent or is a condensed ring. The aromatic hydrocarbon group having a substituent is preferably an aromatic group having 6 to 30 carbon atoms and having a linear or branched alkyl group having 7 or less carbon atoms, or an aromatic group having 6 to 30 carbon atoms and having an aralkyl group having 7 or more and 30 or less carbon atoms, and the condensed ring is preferably a naphthyl group.

Specific examples of the aromatic group having 6 to 30 carbon atoms and having a linear or branched alkyl group having 7 or less carbon atoms include a 4-t-butylphenyl group. Specific examples of the aromatic group having 6 to 30 carbon atoms and having an aralkyl group having 7 or more and 30 or less carbon atoms include a 1,1-dimethyl-1-phenylmethylphenyl group, a 1,1-di(n-butyl)-1-phenylmethylphenyl group, a 1,1-di(n-hexyl)-1-phenylmethylphenyl group, a 3-phenyl-1-propylphenyl group, a 4-phenyl-1-n-butylphenyl group, a 5-phenyl-1-n-propylphenyl group, and a 6-phenyl-1-n-hexylphenyl group.

From the viewpoint of the half width, each of $R^{31}$ and $R^{32}$ is preferably an alkyl group. Meanwhile, when the alkyl group is a branched alkyl group, electron access to triazine may be hindered. Therefore, $R^{32}$ is preferably an aromatic group from the viewpoint of durability, and is particularly preferably an aromatic group having 6 to 30 carbon atoms and having a linear or branched alkyl group having 7 or less carbon atoms, or an aromatic group having 6 to 30 carbon atoms and having an aralkyl group having 7 to 30 carbon atoms.

Specific Example

Hereinafter, preferred specific examples of the iridium complex compound according to the present embodiment other than those described in Examples below will be described, but the present invention is not limited thereto.

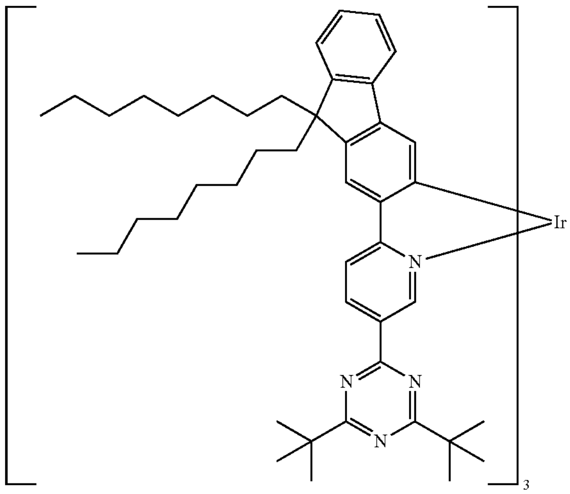

-continued
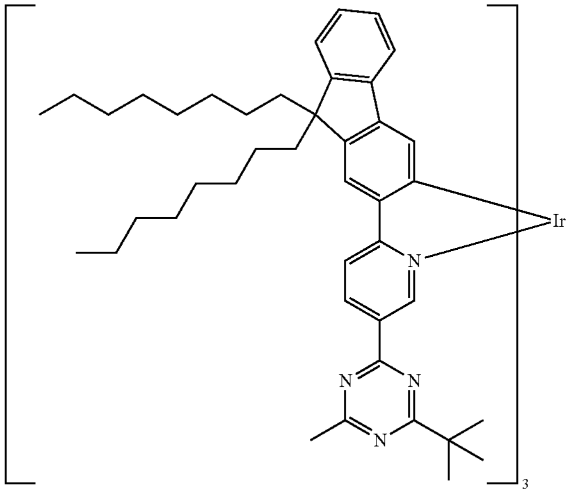
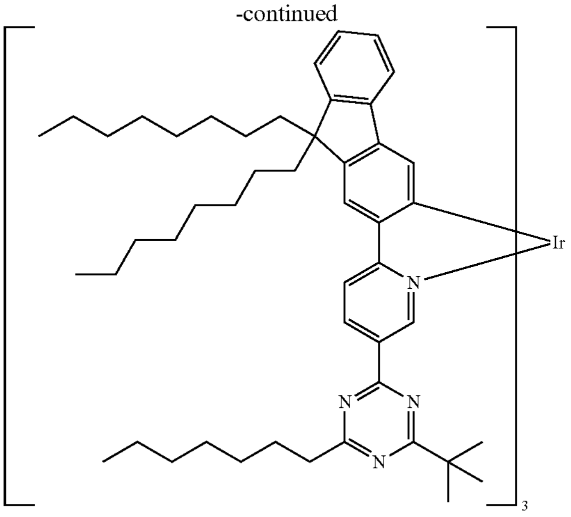
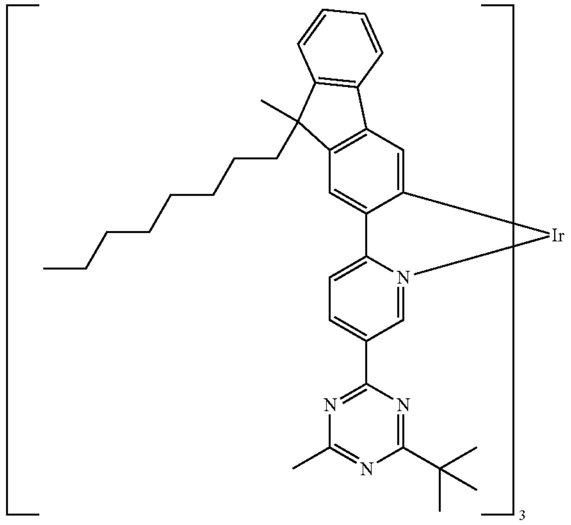
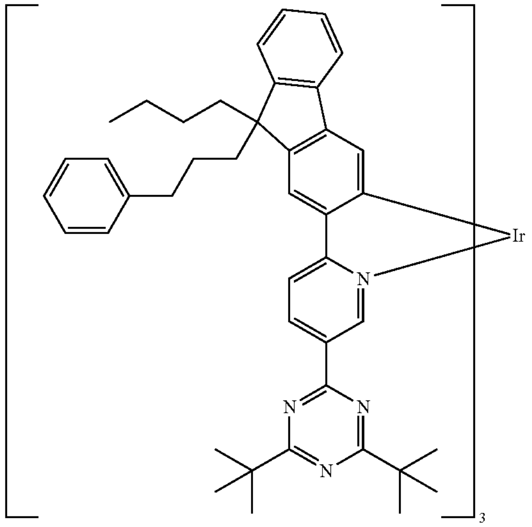
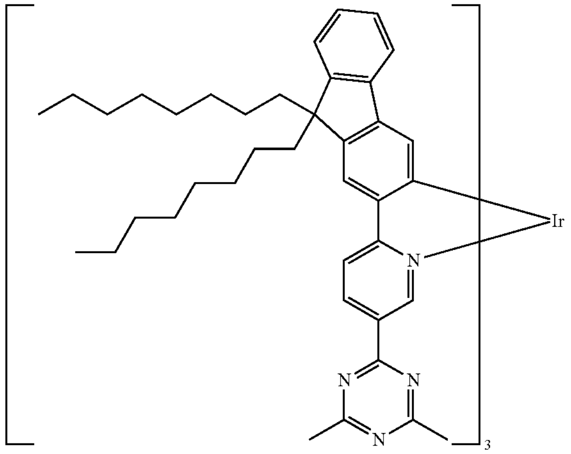
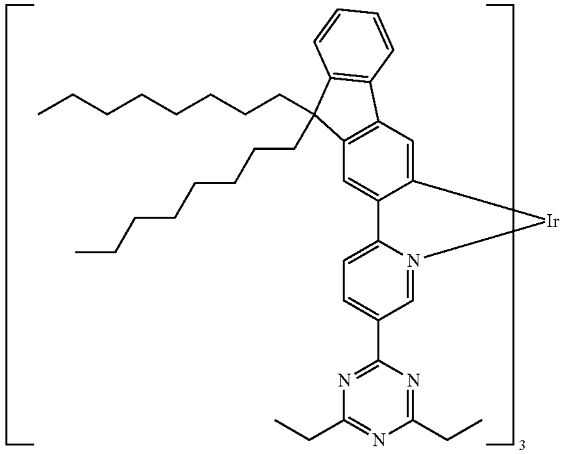
-continued -continued
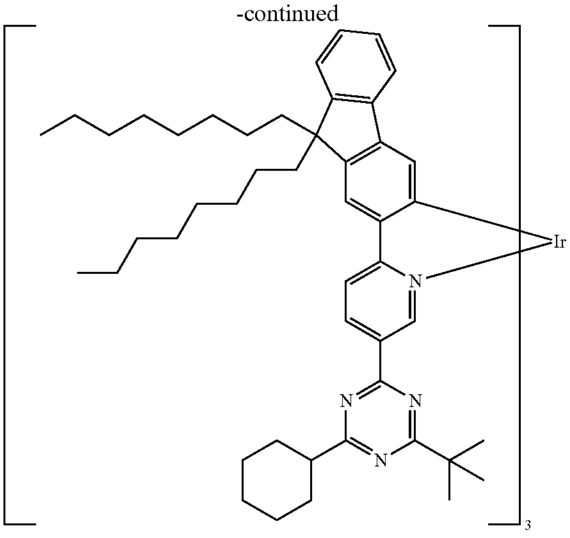
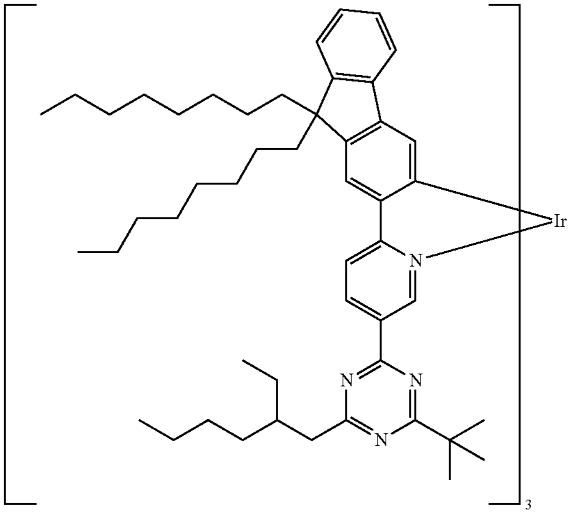
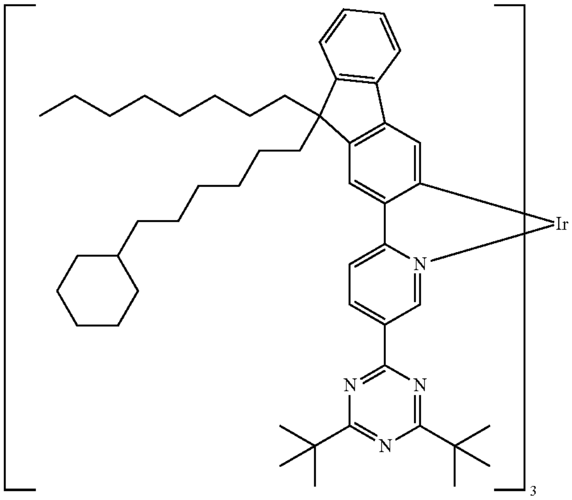
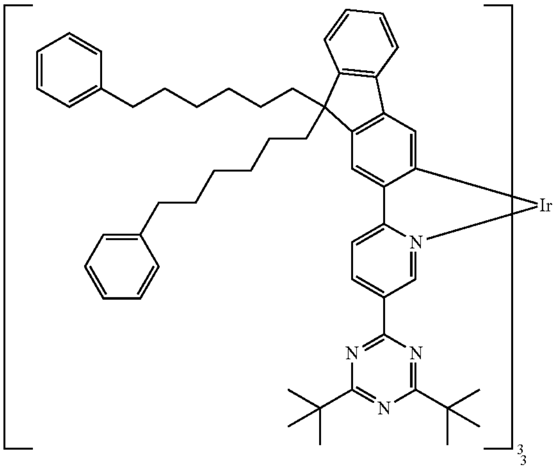
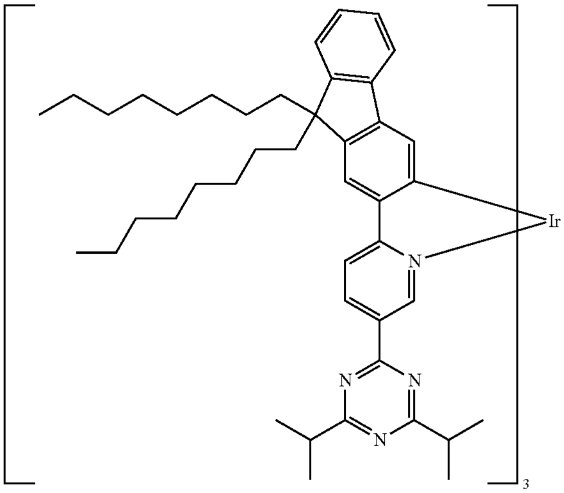
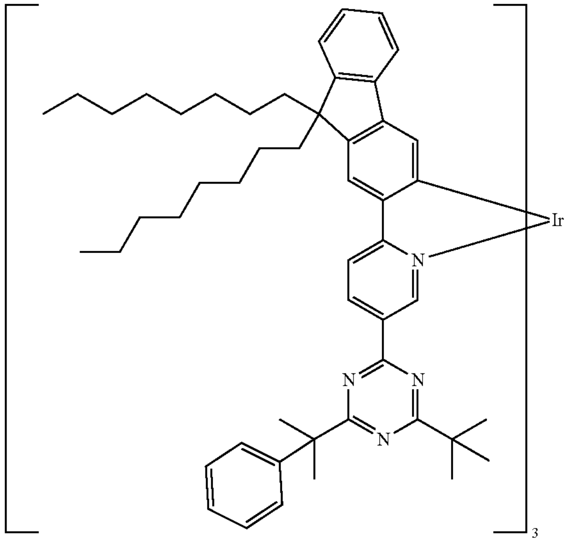
-continued -continued
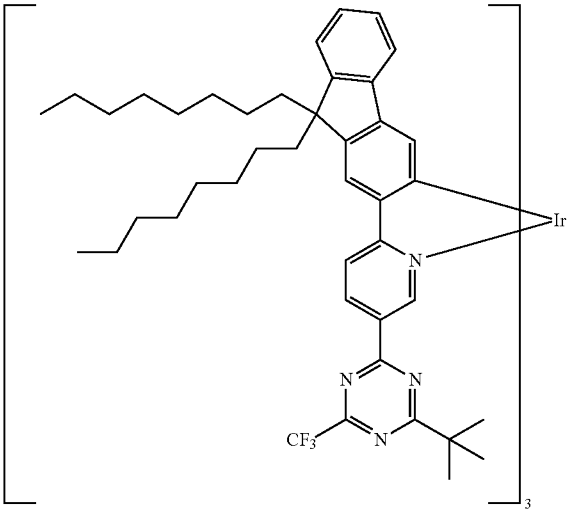
-continued
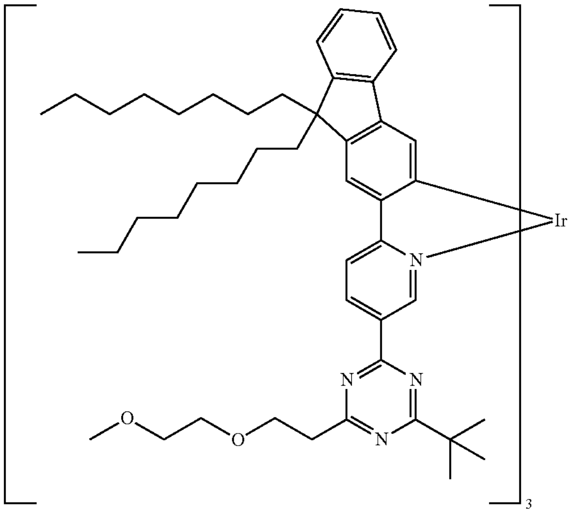
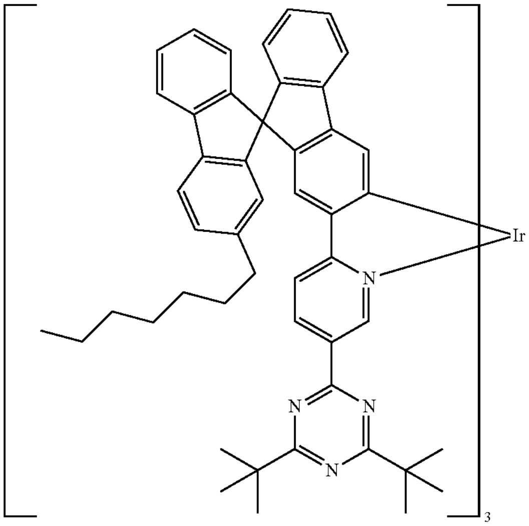
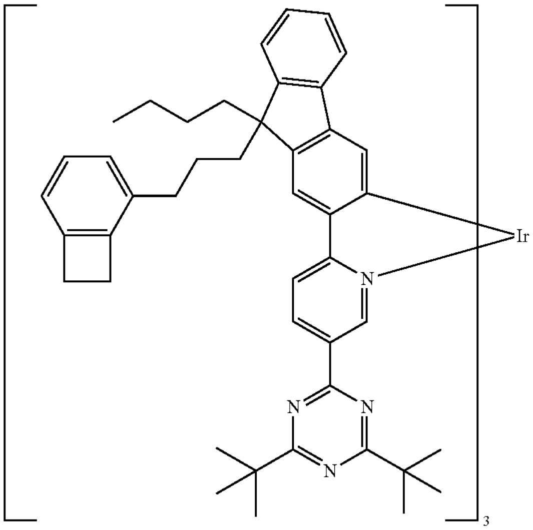
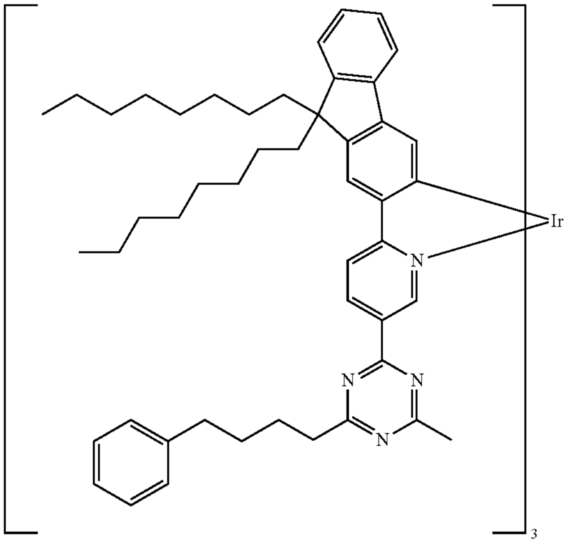
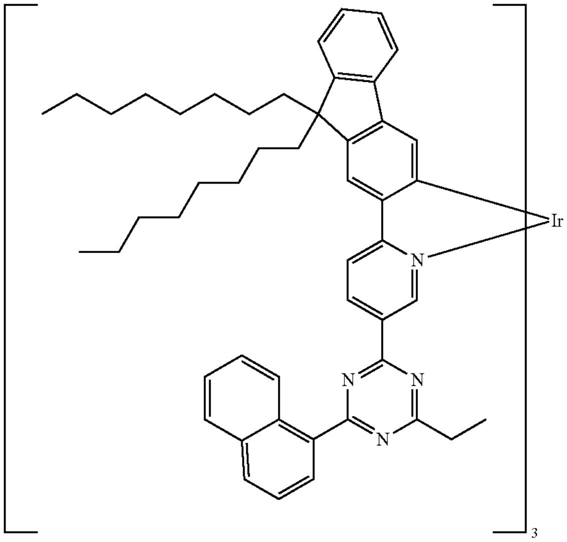

-continued
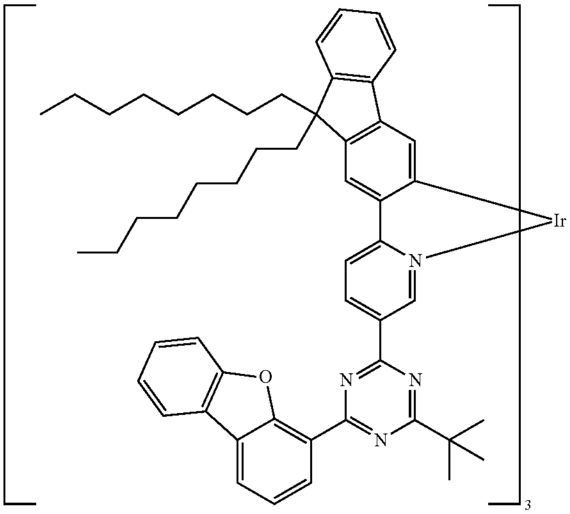
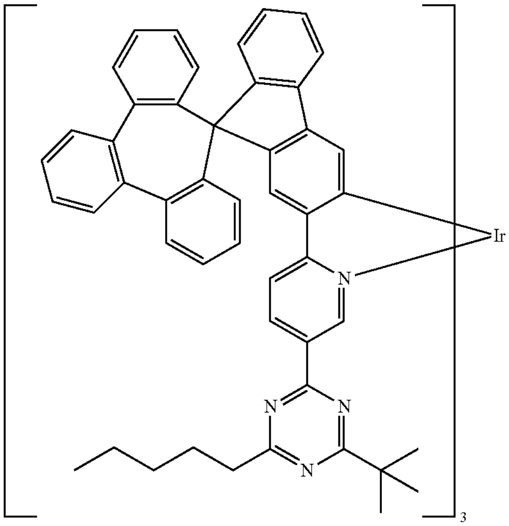
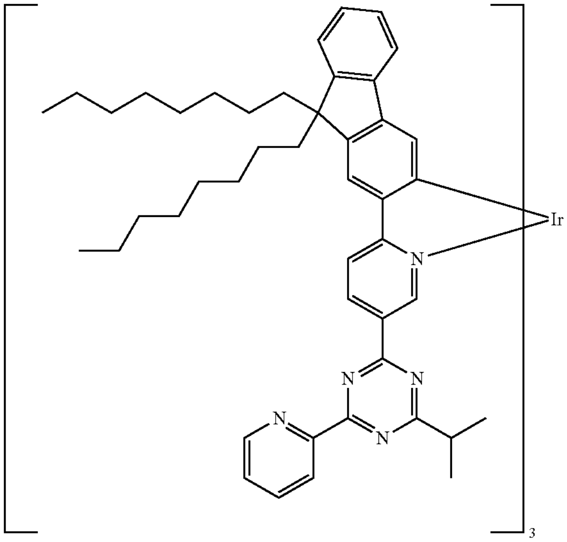
-continued
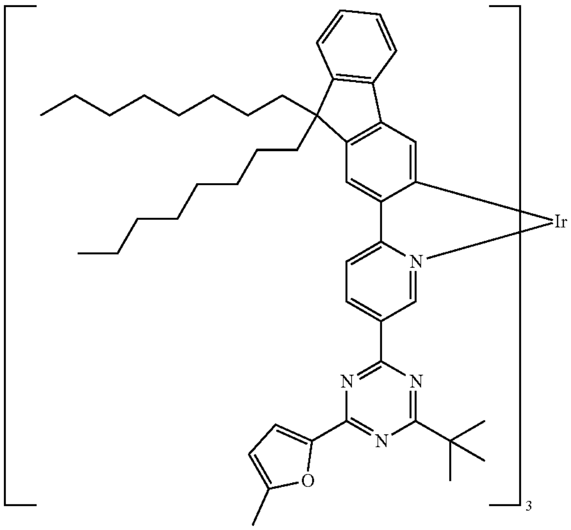
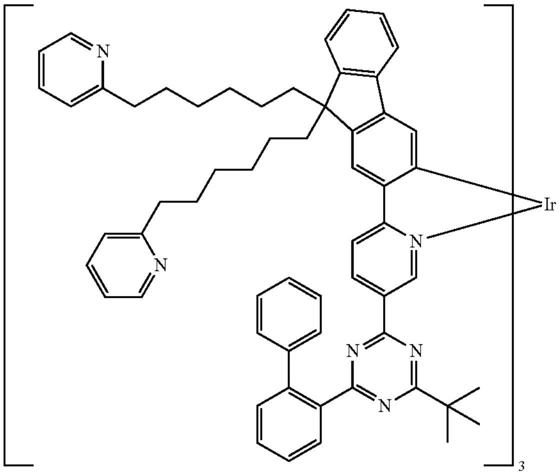
Specific examples of further preferred embodiments are shown below.
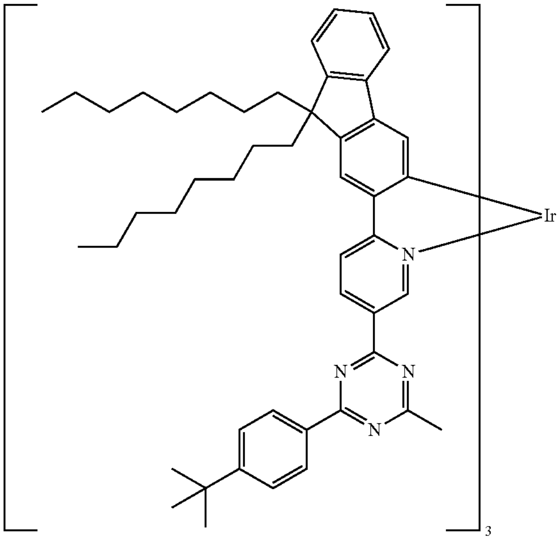

-continued
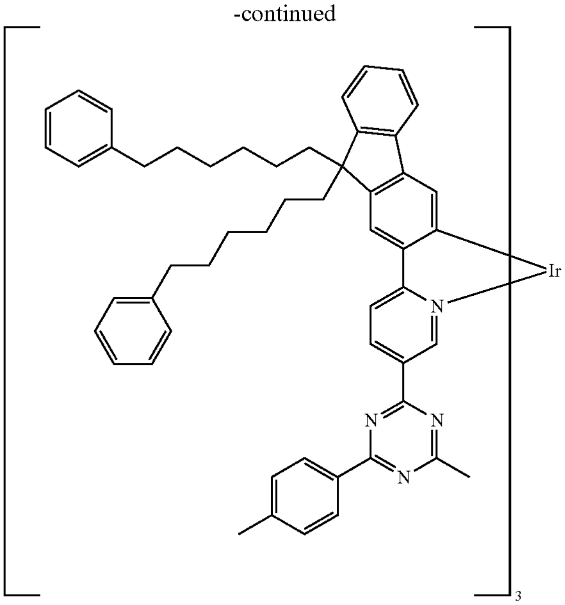
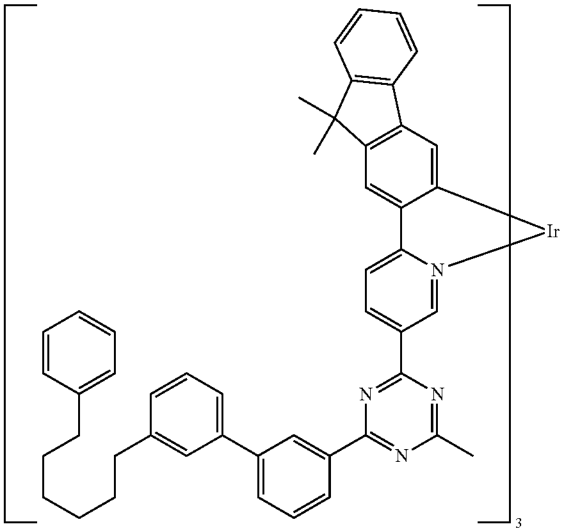
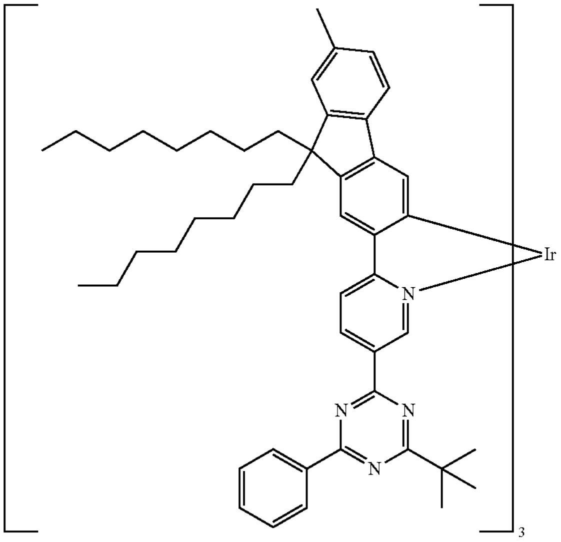
-continued
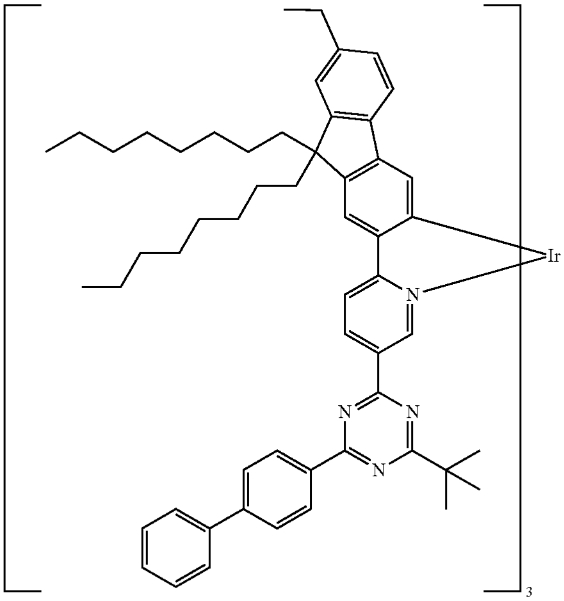
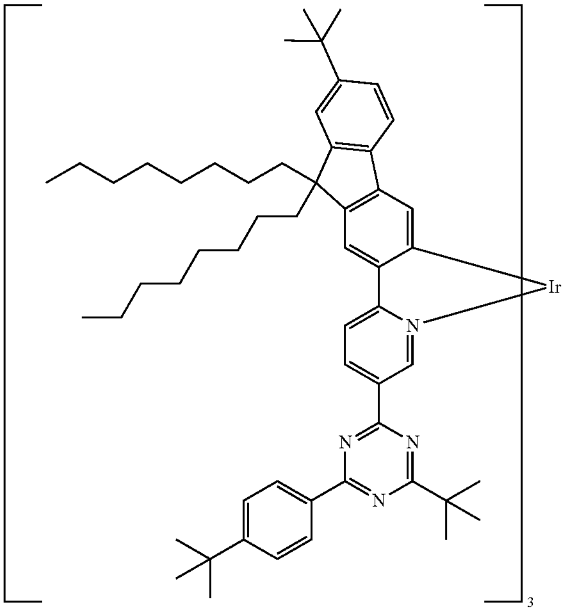

-continued
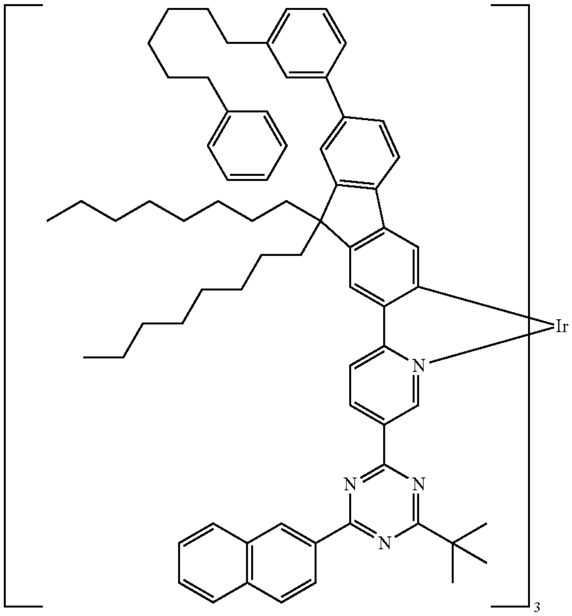
-continued
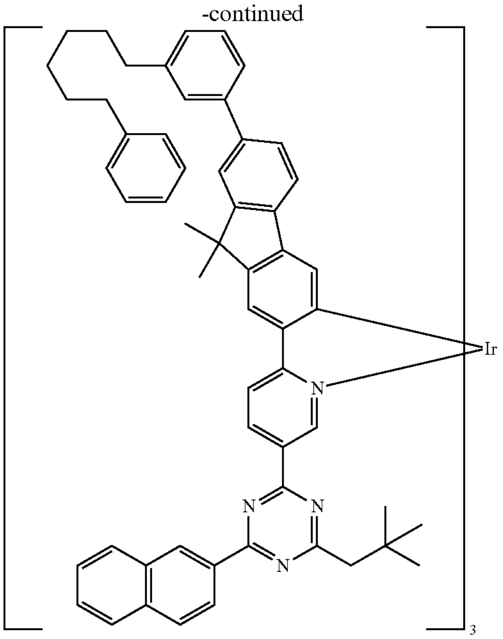
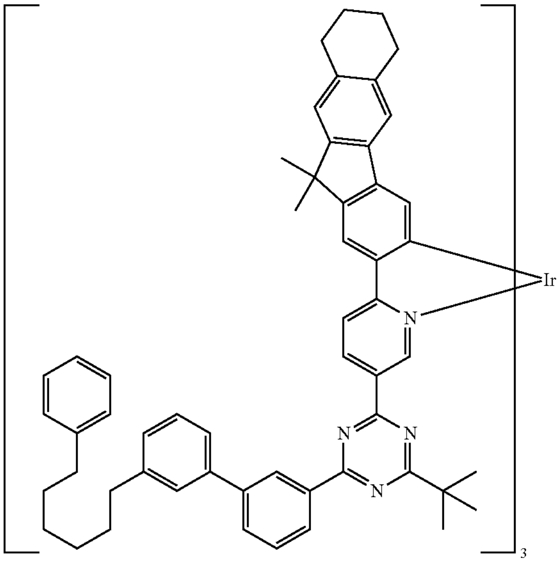
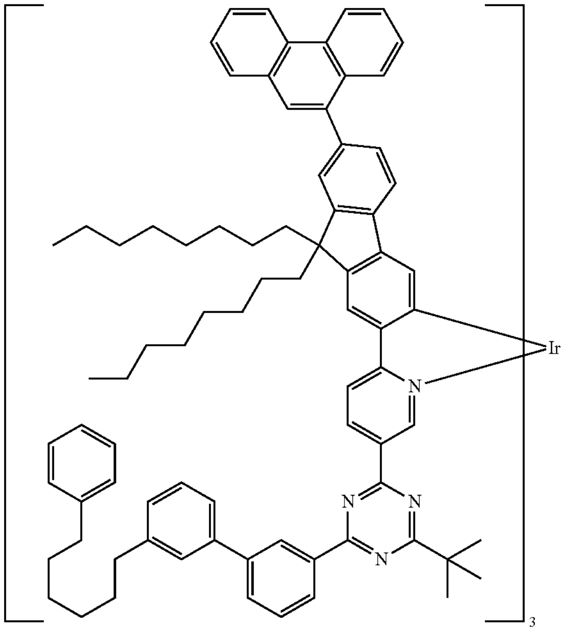

-continued
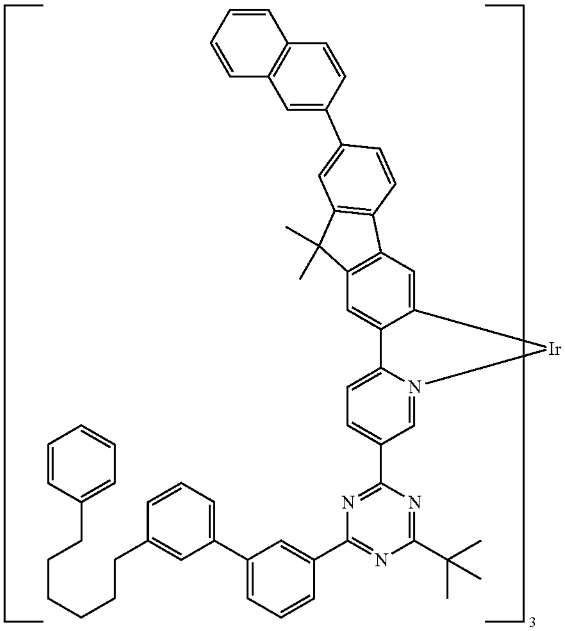
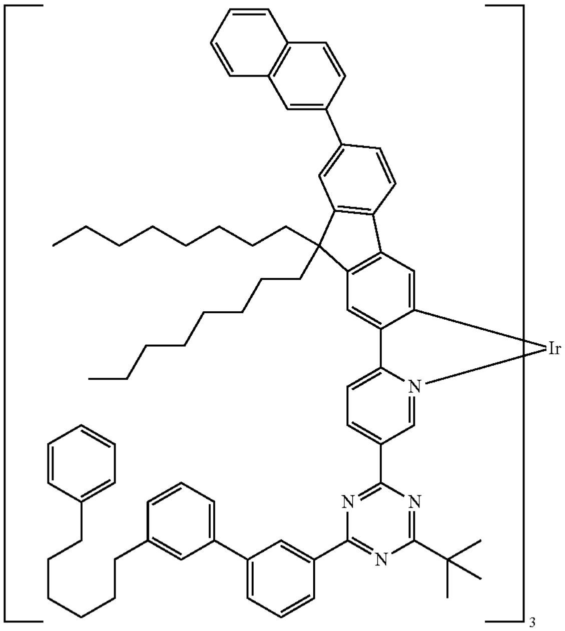
-continued
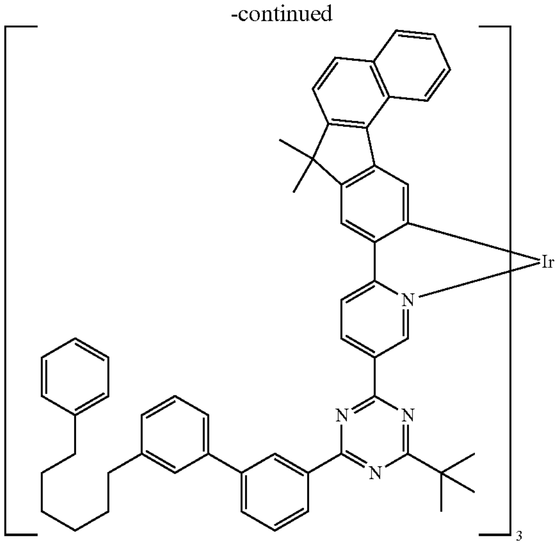
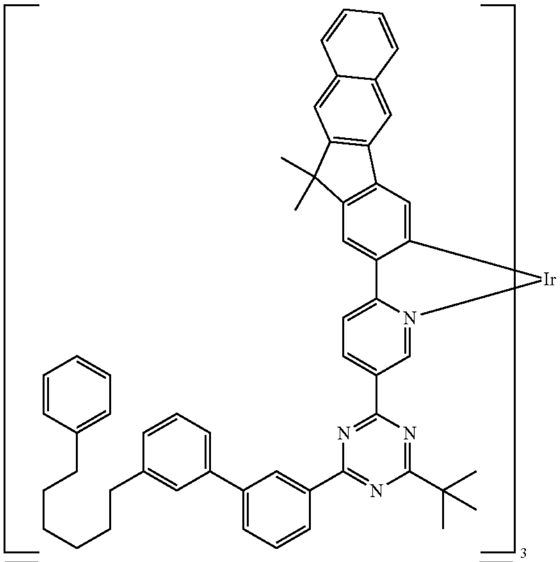
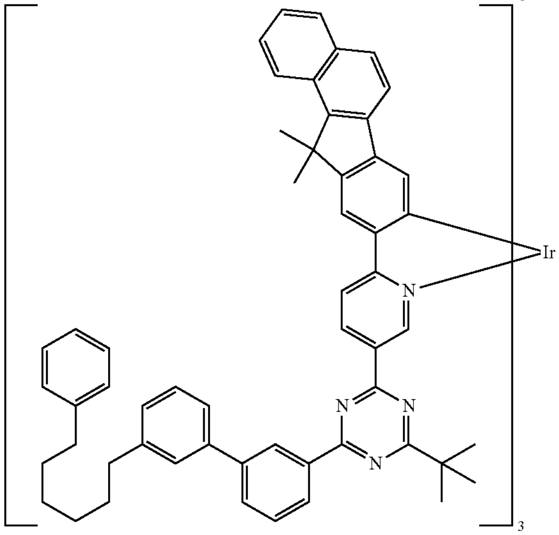
<Maximum Emission Wavelength>
The iridium complex compound according to the present embodiment can have a longer emission wavelength. As an index indicating the length of the emission wavelength, the maximum emission wavelength measured by the following procedure is preferably 600 rn or longer, more preferably 610 nm or longer, and still more preferably 615 nm or longer. The maximum emission wavelength is preferably 650 nm or shorter, more preferably 640 nm or shorter, and still more preferably 635 nm or shorter. Within these ranges, a preferred color of a red luminescent material suitable for an organic electroluminescent element tends to be exhibited.

(Method of Measuring Maximum Emission Wavelength)

At room temperature, a solution obtained by dissolving the iridium complex compound in a solvent such as toluene or 2-methyltetrahydrofuran at a concentration of $1\times10^{-4}$ mol/L or less is measured for phosphorescence spectrum with a spectrophotometer (organic EL quantum yield measurement device C9920-02 manufactured by Hamamatsu Photonics K.K.). The wavelength indicating the maximum value of the obtained phosphorescence spectrum intensity is regarded as the maximum emission wavelength in the present embodiment.

<Method for Synthesizing Iridium Complex Compound>

<Method for Synthesis of Ligand>

The ligand of the iridium complex compound according to the present embodiment can be synthesized by a combination of known methods or the like. The fluorene ring can be easily introduced by using, for example, a compound having bromine, —$B(OH)_2$ group, acetyl group or carboxy group at the 2-position of the fluorene ring as a raw material. The fluorene-pyridine ligand can be synthesized by further subjecting these raw materials to a Suzuki-Miyaura coupling reaction with halogenated pyridines. When the halogenated pyridine to be used is, for example, 5-bromo-2-iodopyridine, the obtained intermediate becomes fluorene-pyridine in which pyridine is substituted with bromine, and is further led to a boronic acid ester, and a final ligand can be synthesized by a next Suzuki-Miyaura coupling reaction between a disubstituted chlorotriazine compound and the boronic acid ester.

There are various known methods for synthesizing the disubstituted chlorotriazine compound. When two same substituents are introduced into the triazine ring, the disubstituted chlorotriazine compound can be synthesized by reacting two equivalents of Grignard reagent with cyanuric chloride as described in, for example, JP-A-2016-160180.

When an asymmetric substituent is introduced into the triazine ring, it is preferable to introduce the substituent stepwise by using Grignard reaction and Suzuki-Miyaura coupling reaction. Examples thereof include a method described in the specification of Chinese Patent Application Publication No. 101544613.

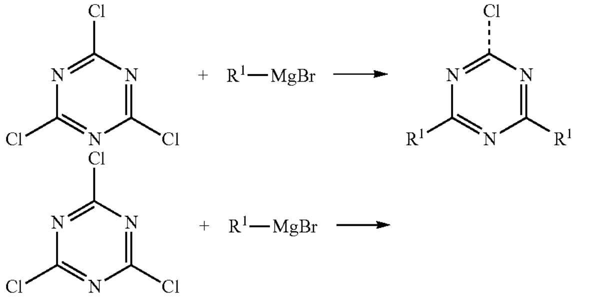

-continued

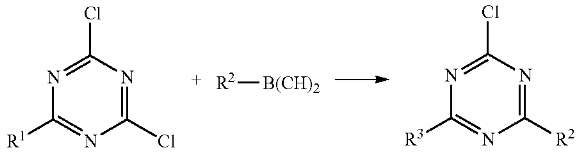

<Method for Synthesizing Iridium Complex Compound>

The iridium complex compound according to the present embodiment can be synthesized by a combination of known methods or the like. This will be described in detail below.

Examples of the method for synthesizing the iridium complex compound include, but are not limited to, for the sake of clarity, a method via a chlorine-crosslinked iridium dinuclear complex represented by the following formula [A], using a phenylpyridine ligand as an example (M. G. Colombo, T. C. Brunold, T. Riedener, H. U. Gudel, Inorg. Chem., 1994, 33, 545-550), and a method of converting a dinuclear complex represented by the following formula [B] into a mononuclear complex by further exchanging chlorine crosslinking with acetylacetonate to obtain a target product (S. Lamansky, P. Djurovich, D. Murphy, F. abdel-Razzaq, R. Kwong, I. Tsyba, M. Borz, B. Mui, R. Bau, M. Thompson, Inorg. Chem., 2001, 40, 1704, 1711).

For example, typical reaction conditions represented by the following formula [A] are as follows.

As a first stage, a chlorine-crosslinked iridium dinuclear complex is synthesized by a reaction of two equivalents of a ligand and one equivalent of iridium chloride n-hydrate. As the solvent, a mixed solvent of 2-ethoxyethanol and water is generally used, but no solvent or other solvents may be used. The reaction can be promoted by using an excessive amount of a ligand or by using an additive such as a base. Other crosslinkable anionic ligands such as bromine may be used instead of chlorine.

A reaction temperature is not particularly limited, but is usually preferably 0° C. or higher, and more preferably 50° C. or higher. The reaction temperature is preferably 250° C. or lower, and more preferably 150° C. or lower. When the content is within these ranges, only the target reaction proceeds without causing by-products or decomposition reaction, and high selectivity tends to be obtained.

(A)

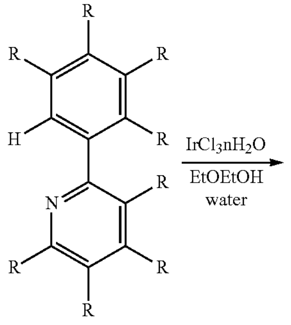

-continued

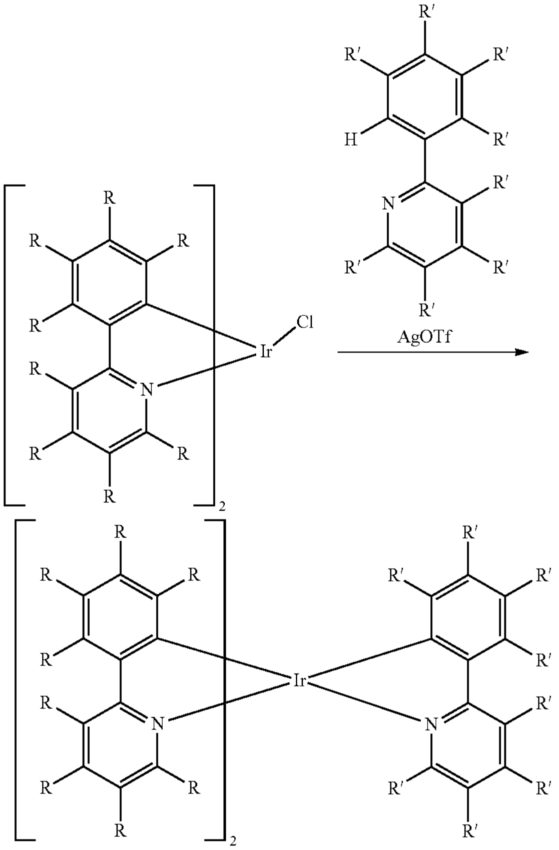

In a second stage, a halogen ion scavenger such as silver trifluoromethane sulfonate is added and brought into contact with a newly added ligand to obtain a target complex. As the solvent, ethoxyethanol or diglyme is usually used, but depending on the type of the ligand, no solvent or other solvents can be used, and a mixture of a plurality of solvents also can be used. The addition of the halogen ion scavenger is not always necessary because the reaction may proceed without the addition of the halogen ion scavenger. However, the addition of the halogen ion scavenger is advantageous in increasing the reaction yield and selectively synthesizing a facial isomer having a higher quantum yield. A reaction temperature is not particularly limited, but is usually in the range of 0° C. to 250° C.

In addition, typical reaction conditions represented by the following formula [B] will be described.

A binuclear complex in the first stage can be synthesized in the same manner as in formula [A]. In the second step, the dinuclear complex is reacted with one equivalent or more of a 1,3-dicarbonyl compound such as acetylacetone and one equivalent or more of a basic compound capable of extracting active hydrogen of the 1,3-dicarbonyl compound such as sodium carbonate to convert the dinuclear complex to a mononuclear complex in which a 1,3-diketonato ligand is coordinated. In general, a solvent such as ethoxyethanol or dichloromethane capable of dissolving the dinuclear complex as a raw material is used, but when the ligand is in a liquid state, the second step can be carried out without a solvent. A reaction temperature is not particularly limited, but is usually in the range of 0° C. to 200° C.

(B)

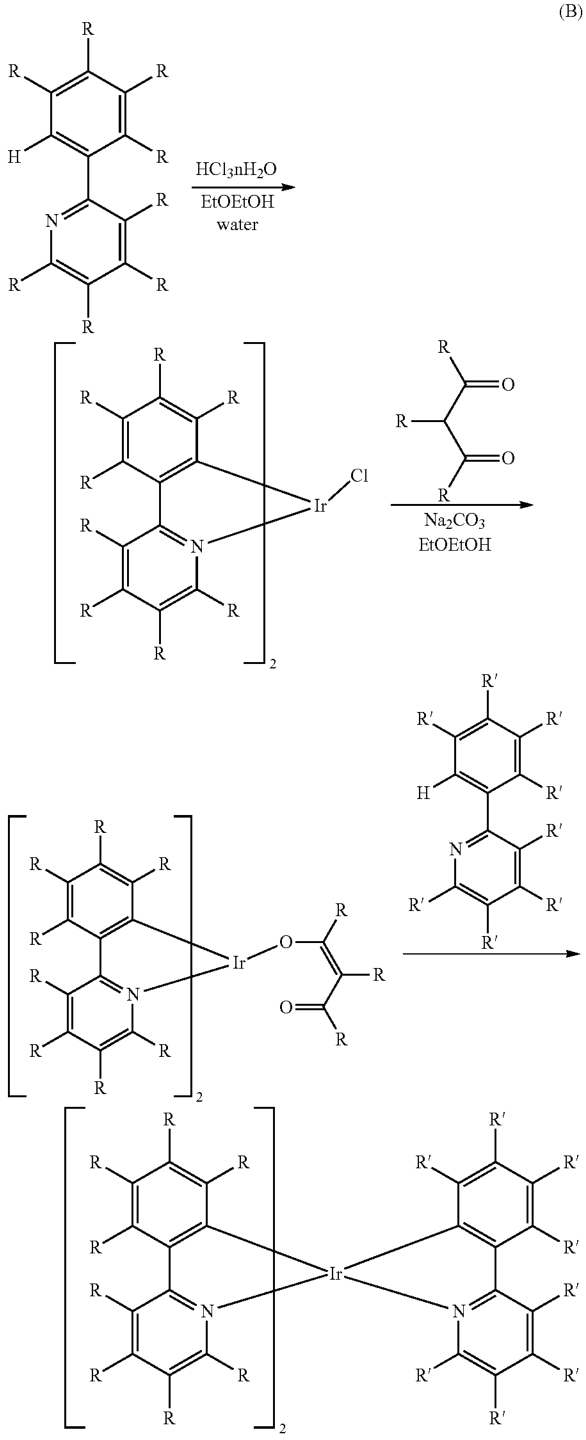

In a third stage, the ligand is usually reacted with a diketonato complex in an amount of one equivalent or more. The type and amount of the solvent are not particularly limited, and when the ligand is liquid at the reaction temperature, no solvent may be used. The reaction temperature is also not particularly limited, but the reaction is often performed at a relatively high temperature of 100° C. to 300° C. because the reactivity is slightly poor. Therefore, a solvent having a high boiling point such as glycerin is preferably used.

After the final reaction, purification is performed to remove unreacted raw materials, reaction by-products, and solvents. Purification operation in ordinary organic synthetic chemistry can be applied, but purification mainly by normal phase silica gel column chromatography is performed as described in the Non-Patent Literature described above. As an eluent, a single or mixed solution of hexane, heptane, dichloromethane, chloroform, ethyl acetate, toluene, methyl ethyl ketone, and methanol can be used. The purification may be performed a plurality of times under different conditions. Other chromatography techniques, for example, purification operations such as reversed phase silica gel chromatography, size exclusion chromatography, paper chromatography, liquid separation cleaning, reprecipitation, recrystallization, suspension cleaning of powder, and drying under reduced pressure can be performed as necessary.

<Use of Iridium Complex Compound>

The iridium complex compound according to the present embodiment can be suitably used as a material for an organic electroluminescent element, that is, a red luminescent material of an organic electroluminescent element, and can also be suitably used as a luminescent material of an organic electroluminescent element, other luminescent materials, and the like.

[Composition Containing Iridium Complex Compound]

Since the iridium complex compound according to the present embodiment has excellent solubility, it is preferred to use the compound together with a solvent. A composition containing the iridium complex compound according to the present embodiment and a solvent according to the present embodiment (hereinafter often referred to as "iridium-complex-compound-containing composition") is explained below.

The iridium-complex-compound-containing composition according to the present embodiment contains the iridium complex compound described above and a solvent. The iridium-complex-compound-containing composition according to the present embodiment is usually used for forming a layer or a film by a wet-process film formation method, and it is especially preferable that the composition is used for forming an organic layer of an organic electroluminescent element. It is especially preferable that the organic layer should be an emission layer. That is, the iridium-complex-compound-containing composition is preferably a composition for an organic electroluminescent element, and is particularly preferably used as a composition for forming an emission layer.

A content of the iridium complex compound according to the present embodiment in the iridium-complex-compound-containing composition is usually 0.001 mass % or more, preferably 0.01 mass % or more, and is usually 99.9 mass % or less, preferably 99 mass % or less. By regulating the content of the iridium complex compound in the iridium-complex-compound-containing composition so as to be within that range, holes and electrons are efficiently injected into the emission layer from adjoining layers (for example, a hole transport layer and a hole blocking layer), and operating voltage can be reduced. Only one iridium complex compound according to the present embodiment may be contained in the iridium-complex-compound-containing composition or two or more iridium complex compounds according to the present embodiment may be contained in combination in the composition.

In the case where the iridium-complex-compound-containing composition according to the present embodiment is to be used, for example, for an organic electroluminescent element, this composition can contain a charge-transporting compound for use in organic electroluminescent elements, in particular, in emission layers, besides the iridium complex compound described above and the solvent.

In the case where the iridium-complex-compound-containing composition according to the present embodiment is to be used for forming an emission layer of an organic electroluminescent element, it is preferable that this composition should contain the iridium complex compound according to the present embodiment as a luminescent material and another charge-transporting compound as a charge-transporting host material.

(Solvent)

The solvent contained in the iridium-complex-compound-containing composition according to the present embodiment is a liquid ingredient which has volatility and is used in order to form, by a wet-process film formation method, a layer which contains the iridium complex compound, and is preferably an organic solvent.

Since the iridium complex compound according to the present embodiment, which is a solute, has high solubility, the solvent is not particularly limited so long as the charge-transporting compound which will be described later dissolves therein satisfactorily. Preferred examples of the solvent include: alkanes such as n-decane, cyclohexane, ethyleyclohexane, decaline, and bicyclohexane; aromatic hydrocarbons such as toluene, xylene, mesitylene, phenylcyclohexane, and tetralin; halogenated aromatic hydrocarbons such as chlorobenzene, dichlorobenzene, and trichlorobenzene; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic esters such as phenyl acetate, phenyl propionate, methyl benzoate, ethyl benzoate, propyl benzoate, and n-butyl benzoate; alicyclic ketones such as cyclohexanone, cyclooctanone, and fenchone; alicyclic alcohols such as cyclohexanol and cyclooctanol; aliphatic ketones such as methyl ethyl ketone and dibutyl ketone; aliphatic alcohols such as butanol and hexanol; and aliphatic ethers such as ethylene glycol dimethyl ether, ethylene glycol diethyl ether, and propylene glycol 1-monomethyl ether acetate (PGMEA).

Preferred of these are alkanes and aromatic hydrocarbons. In particular, phenylcyclohexane has a viscosity and a boiling point which are preferred in wet film formation processes.

One of these solvents may be used alone, or any desired two or more thereof may be used in combination in any desired proportion.

The solvent to be used has a boiling point of usually 80° C. or higher, preferably 100° C. or higher, more preferably 120° C. or higher, and is usually 270° C. or lower, preferably 250° C. or lower, more preferably 230° C. or lower. By setting the boiling point thereof within the range of the lower limit, a declease film formation stability during wet-process film formation due to solvent vaporization from the iridium-complex-compound-containing composition can be prevented.

The content of the solvent in the iridium-complex-compound-containing composition is preferably 1 mass % or more, more preferably 10 mass % or more, particularly preferably 50 mass % or more, and is preferably 99.99 mass % or less, more preferably 99.9 mass % or less, particularly preferably 99 mass % or less. The emission layer usually has a thickness of about 3 nm to 200 nm. However, in the case where the content of the solvent is the lower limit or higher, reducing applicability for film formation due to the composition might have too high viscosity can be prevented.

Meanwhile, in the case where the content of the solvent is this upper limit or lower, there is a tendency that film formation is easy from the viewpoint of the thickness of the film obtained by solvent removal after film formation.

As the other charge-transporting compound which can be contained in the iridium-complex-compound-containing composition according to the present embodiment, ones which have hitherto been used as materials for organic electroluminescent elements can be used. Examples thereof include pyridine, carbazole, naphthalene, perylene, pyrene, anthracene, chiysene, naphthacene, phenanthrene, coronene, fluoranthene, benzophenanthrene, fluorene, acetonaphthofluoranthene, coumarin, p-bis(2-phenylethenyl)benzene and derivatives thereof, quinacridone derivatives, 4-(dicyanomethylene)-2-methyl-6-(p-dimethylaminostyryl)-4H-pyran-based (DCM-based) compounds, benzopyran derivatives, rhodamine derivatives, benzothioxanthene derivatives, azabenzothioxanthene, condensed aromatic ring compounds substituted with an arylamino group, and styryl derivatives substituted with an arylamino group.

One of these charge-transporting compounds may be used alone, or any desired two or more thereof may be used in combination in any desired proportion.

The content of the other charge-transporting compound in the iridium-complex-compound-containing composition is usually 1000 parts by mass or less, preferably 100 parts by mass or less, more preferably 50 parts by mass or less, and is usually 0.01 parts by mass or more, preferably 0.1 parts by mass or more, more preferably 1 part by mass or more, with respect to 1 part by mass of the iridium complex compound according to the present embodiment in the iridium-complex-compound-containing composition.

The iridium-complex-compound-containing composition according to the present embodiment may further contain other compounds in addition to the compounds described above and the like as necessary. For example, other solvents may be contained in addition to the solvent described above. Examples of such a solvent include dimethyl sulfoxide, and amides such as N,N-dimethylformamide and N,N-dimethylacetamide. One of these solvents may be used alone, or any desired two or more thereof may be used in combination in any desired proportion.

[Assist Dopant]

The iridium-complex-compound-containing composition according to the present embodiment can further contain a compound represented by the following formula (3).

The compound represented by formula (3) functions as an assist dopant in the emission layer of the organic electroluminescent element. The compound represented by formula (3) has a maximum emission wavelength shorter than that of the iridium complex compound represented by formula (1) serving as a luminescence dopant described above. Therefore, when the assist dopant represented by formula (3) is in an excited state, energy transfer to the luminescence dopant represented by formula (1) having a smaller excitation energy occurs, the luminescence dopant represented by formula (1) is in an excited state, and luminescence from the luminescence dopant represented by formula (1) is observed.

The compound represented by formula (3) may be used alone or in combination of two or more thereof. The compound serving as the assist dopant may contain a compound serving as the assist dopant other than the compound represented by formula (3), but in this case, the total content of the compound represented by formula (3) is preferably 50 mass % or more, and more preferably 100 mass % with respect to the total content of the compound serving as the assist dopant. That is, it is more preferable that only the compound represented by formula (3) is used as the assist dopant.

A composition ratio of the iridium complex compound represented by formula (1) is preferably equal to or higher than a composition ratio of the compound represented by formula (3) in terms of parts by mass. As a result, direct luminescence from the assist dopant represented by formula (3) can be prevented, and energy is transferred from the assist dopant represented by formula (3) to the luminescence dopant represented by formula (1) with high efficiency. Therefore, the luminescence of the luminescence dopant can be obtained with high efficiency.

(3)

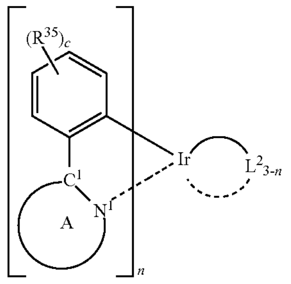

In formula (3), $R^3$s is an alkyl group having 1 to 20 carbon atoms, a (hetero)aralkyl group having 7 to 40 carbon atoms, an alkoxy group having 1 to 20 carbon atoms, a (hetero) aryloxy group having 3 to 20 carbon atoms, an alkylsilyl group having 1 to 20 carbon atoms, an arylsilyl group having 6 to 20 carbon atoms, an alkylcarbonyl group having 2 to 20 carbon atoms, an arylcarbonyl group having 7 to 20 carbon atoms, an alkylamino group having 1 to 20 carbon atoms, an arylamino group having 6 to 20 carbon atoms, or a (hetero) aryl group having 3 to 30 carbon atoms. These groups may further have substituents. When there are a plurality of $R^{35}$s, $R^{35}$s may be the same as or different from each other.

C is an integer of 0 to 4.

A ring A is any one of a pyridine ring, a pyrazine ring, a pyrimidine ring, an imidazole ring, an oxazole ring, a thiazole ring, a quinoline ring, an isoquinoline ring, a quinazoline ring, a quinoxaline ring, an azatriphenylene ring, a carboline ring, a benzothiazole ring, and a benzoxazole ring.

The ring A may have a substituent.

Examples of the substituent include a fluorine atom, a chlorine atom, a bromine atom, an alkyl group having 1 to 20 carbon atoms, a (hetero)aralkyl group having 7 to 40 carbon atoms, an alkoxy group having 1 to 20 carbon atoms, a (hetero)aryloxy group having 3 to 20 carbon atoms, an alkylsilyl group in which each alkyl group has 1 to 20 carbon atoms, an arylsilyl group in which each aryl group has 6 to 20 carbon atoms, an alkylcarbonyl group having 2 to 20 carbon atoms, an arylcarbonyl group having 7 to 20 carbon atoms, an alkylamino group having 2 to 20 carbon atoms, an arylamino group having 6 to 20 carbon atoms, and a (hetero)aryl group having 3 to 20 carbon atoms. Adjacent substituents bonded to the ring A may be bonded to each other to form a ring. When there are a plurality of rings A, the rings A may be the same as or different from each other.

$L^2$ represents an organic ligand, and n is an integer of 1 to 3.

The substituent which $R^{35}$ may further have is preferably a substituent selected from a substituent group Z1 described later.

In terms of durability, $R^{35}$ is more preferably an alkyl group having 1 to 20 carbon atoms, a (hetero)aralkyl group having 7 to 40 carbon atoms, an arylamino group having 6 to 20 carbon atoms, or a (hetero)aryl group having 3 to 30 carbon atoms, and still more preferably an alkyl group having 1 to 20 carbon atoms, a (hetero)aralkyl group having 7 to 40 carbon atoms, or a (hetero)aryl group having 3 to 20 carbon atoms.

$R^{35}$ is preferably a phenyl group which may have a substituent from the viewpoint of durability and solubility, and is preferably bonded to the m-position of the ring A and the p-position of iridium. That is, it is preferable to include a compound represented by the following formula (3-1). The substituent which may be possessed is preferably a substituent selected from the substituent group Z1 described later.

(3-1)

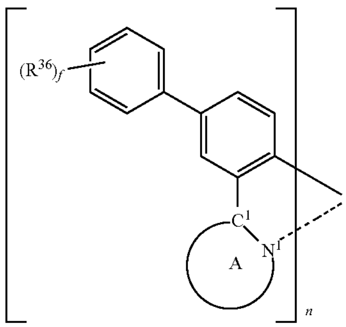

[In formula (3-1), ring A, $L^2$, and n have the same meanings as ring A, $L^2$, and n in formula (3), respectively.

$R^{36}$ is an alkyl group having 1 to 20 carbon atoms, a (hetero)aralkyl group having 7 to 40 carbon atoms, an alkoxy group having 1 to 20 carbon atoms, a (hetero)aryloxy group having 3 to 20 carbon atoms, an alkylsilyl group having 1 to 20 carbon atoms, an arylsilyl group having 6 to 20 carbon atoms, an alkylcarbonyl group having 2 to 20 carbon atoms, an arylcarbonyl group having 7 to 20 carbon atoms, an alkylamino group having 1 to 20 carbon atoms, an arylamino group having 6 to 20 carbon atoms, or a (hetero) aryl group having 3 to 30 carbon atoms. These groups may further have substituents. When there are a plurality of $R^{36}$s, $R^{36}$s may be the same as or different from each other.

f is an integer of 0 to 5.]

The substituent which $R^{36}$ may further have is preferably a substituent selected from the substituent group Z1 described later.

f is preferably 0 from the viewpoint of ease of production, and is preferably 1 or 2, and more preferably 1 from the viewpoint of durability and improvement of solubility.

The ring A is preferably a pyridine ring, a pyrimidine ring, or an imidazole ring, and more preferably a pyridine ring, from the viewpoint of durability.

The hydrogen atom on the ring A is preferably substituted with an alkyl group having 1 to 20 carbon atoms, a (hetero) aralkyl group having 7 to 40 carbon atoms, or a (hetero)aryl group having 3 to 20 carbon atoms, from the viewpoint of durability and improvement of solubility. The hydrogen atom on the ring A is preferably not substituted from the viewpoint of easy production. The hydrogen atom on the ring A is preferably substituted with a phenyl group or a naphthyl group, which may have a substituent, from the viewpoint of enhancing the luminescent efficiency, because excitons are easily generated when the ring A is used as an organic electroluminescent element.

The ring A is preferably a quinoline ring, an isoquinoline ring, a quinazoline ring, a quinoxaline ring, an azatriphenylene ring, or a carboline ring, because excitons are easily generated on the assist dopant and the luminescent efficiency is enhanced. Among these, from the viewpoint of durability, a quinoline ring, an isoquinoline ring, and a quinazoline ring are preferable.

$L^2$ is an organic ligand, and is not particularly limited, but is preferably a monovalent bidentate ligand, and more preferred examples thereof are the same as those shown as preferred examples of $L^1$. When two organic ligands $L^2$ are present, the organic ligands $L^2$ may have structures different from each other. When n is 3, $L^2$ does not exist.

Preferable specific examples of the compound represented by formula (3) which is an assist dopant contained in the composition for an organic electroluminescent element according to the present embodiment other than those shown in Examples are shown below, but the present invention is not limited thereto.

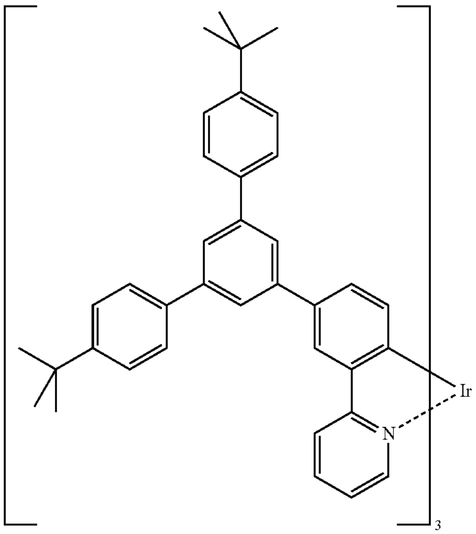

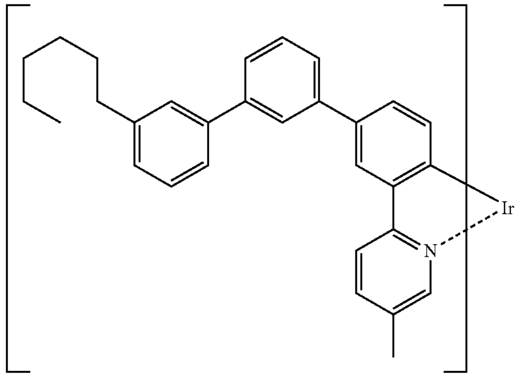

-continued
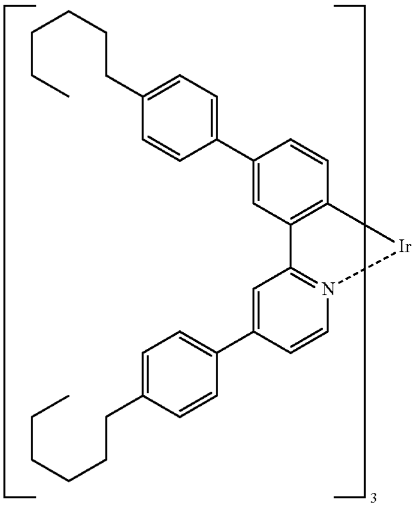
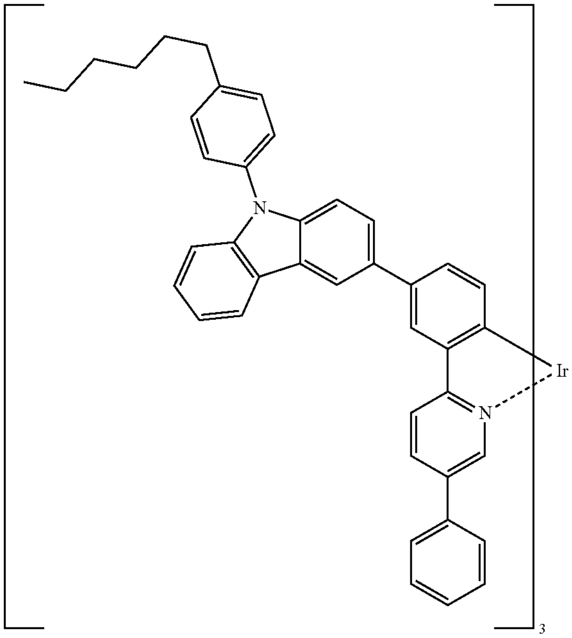
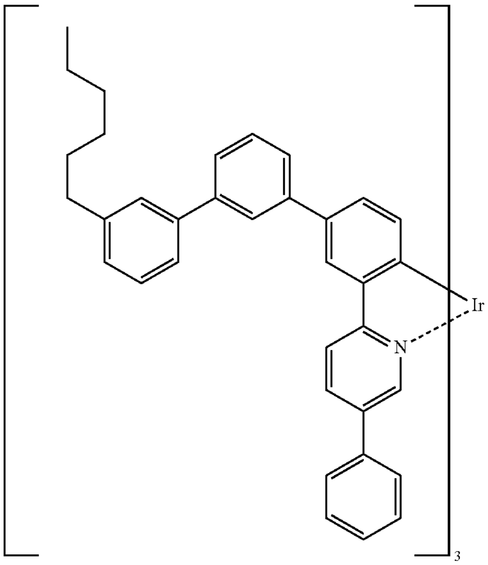
-continued
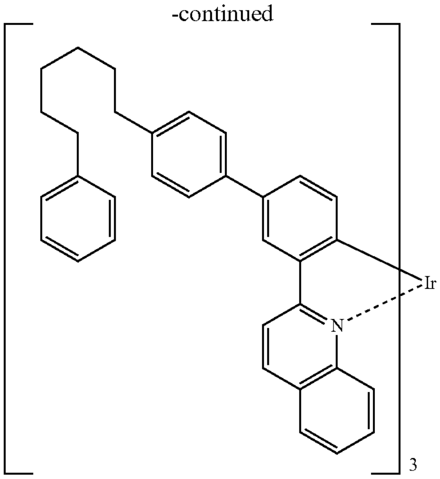
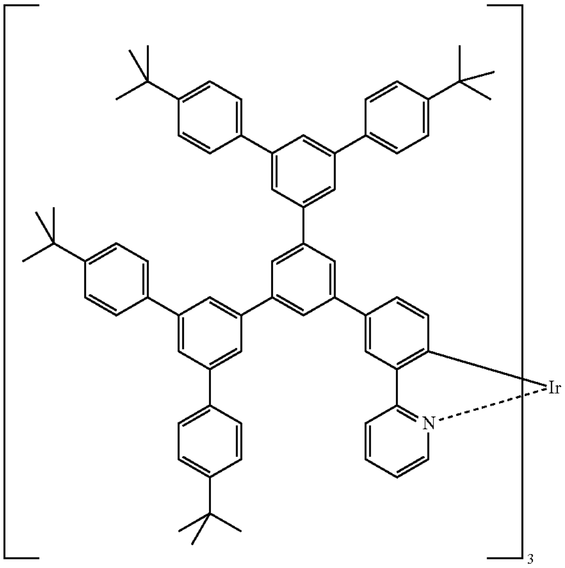
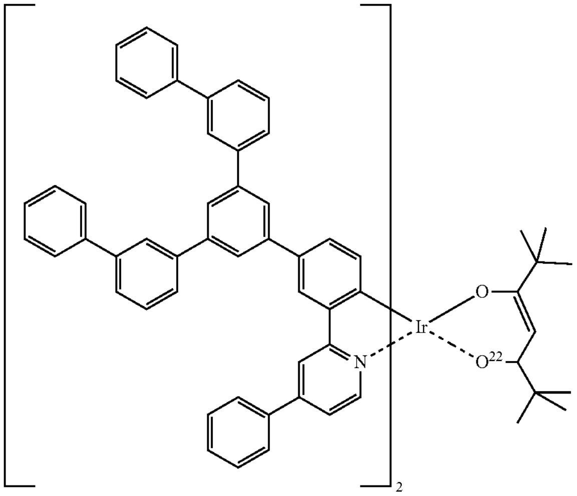
[Substituent Group Z1]
As the substituent, an alkyl group, an aralkyl group, a heteroaralkyl group, an alkoxy group, an aryloxy group, a heteroaryloxy group, an alkylsilyl group, an arylsilyl group, an alkylcarbonyl group, an arylearbonyl group, an alkylamino group, an arylamino group, an aryl group, or a heteroaryl group can be used.

Preferable examples thereof include an alkyl group having 1 to 20 carbon atoms, an aralkyl group having 7 to 40 carbon atoms, a heteroaralkyl group having 7 to 40 carbon atoms, an alkoxy group having 1 to 20 carbon atoms, an aryloxy group having 6 to 20 carbon atoms, a heteroaryloxy group having 3 to 20 carbon atoms, an alkylsilyl group having 1 to 20 carbon atoms, an arylsilyl group having 6 to 20 carbon atoms, an alkylcarbonyl group having 2 to 20 carbon atoms, an arylcarbonyl group having 7 to 20 carbon atoms, an alkylamino group having 1 to 20 carbon atoms, an arylamino group having 6 to 20 carbon atoms, an aryl group having 6 to 30 carbon atoms, and a heteroaryl group having 3 to 30 carbon atoms. More specifically, the substituents are those described in [Specific Examples of Substituents] described later.

More preferred are an alkyl group having 1 to 20 carbon atoms, an aralkyl group having 7 to 40 carbon atoms, an alkoxy group having 1 to 20 carbon atoms, an aryloxy group having 6 to 20 carbon atoms, and an aryl group having 6 to 30 carbon atoms.

Specific Examples of Substituents

Specific examples of the substituent in each compound structure described above and the substituent in the substituent group Z1 are as follows.

The alkyl group having 1 to 20 carbon atoms may be any of a linear, branched or cyclic alkyl group. Specific examples thereof include a methyl group, an ethyl group, an n-propyl group, an n-butyl group, an n-pentyl group, an n-hexyl group, an n-octyl group, an isopropyl group, an isobutyl group, an isopentyl group, a t-butyl group, and a cyclohexyl group. Among these, a linear alkyl group having 1 to 8 carbon atoms, such as a methyl group, an ethyl group, an n-butyl group, an n-hexyl group, and an n-octyl group, is preferable.

The (hetero)aralkyl group having 7 to 40 carbon atoms refers to a group in which a part of hydrogen atoms constituting a linear alkyl group, a branched alkyl group, or a cyclic alkyl group is substituted with an aryl group or a heteroaryl group. Specific examples thereof include a 2-phenyl-1-ethyl group, a cumyl group, a 5-phenyl-1-pentyl group, a 6-phenyl-1-hexyl group, a 7-phenyl-1-heptyl group, and a tetrahydronaphthyl group. Among these, a 5-phenyl-1-pentyl group, a 6-phenyl-1-hexyl group, and a 7-phenyl-1-heptyl group are preferable.

Specific examples of the alkoxy group having 1 to 20 carbon atoms include a methoxy group, an ethoxy group, a propyloxy group, an isopropyloxy group, a hexyloxy group, a cyclohexyloxy group, and an octadecyloxy group. Among these, a hexyloxy group is preferable.

Specific examples of the (hetero)aryloxy group having 3 to 20 carbon atoms include a phenoxy group and a 4-methylphenyloxy group. Among these, a phenoxy group is preferable.

Specific examples of the alkylsilyl group having 1 to 20 carbon atoms include a trimethylsilyl group, a triethylsilyl group, a triisopropylsilyl group, a dimethylphenyl group, a t-butyldimethylsilyl group, and a t-butyldiphenylsilyl group. Among these, a triisopropyl group, a t-butyldimethylsilyl group, and a t-butyldiphenylsilyl group are preferable.

Specific examples of the arylsilyl group having 6 to 20 carbon atoms include a diphenylpyridylsilyl group and a triphenylsilyl group. Among these, a triphenylsilyl group is preferable.

Specific examples of the alkylcarbonyl group having 2 to 20 carbon atoms include an acetyl group, a propionyl group, a pivaloyl group, a caproyl group, a decanoyl group, and a cyclohexylcarbonyl group. Among these, an acetyl group and a pivaloyl group are preferable.

Specific examples of the arylcarbonyl group having 7 to 20 carbon atoms include a benzoyl group, a naphthoyl group, and an anthryl group. Among these, a benzoyl group is preferable.

Specific examples of the alkylamino group having 1 to 20 carbon atoms include a methylamino group, a dimethylamino group, a diethylamino group, an ethylmethylamino group, a dihexylamino group, a dioctylamino group, and a dicyclohexylamino group. Among these, a dimethylamino group and a dicyclohexylamino group are preferable.

Specific examples of the arylamino group having 6 to 20 carbon atoms include a phenylamino group, a diphenylamino group, a di(4-tolyl)amino group, and a di(2,6-dimethylphenyl)amino group. Among these, a diphenylamino group and a di(4-tolyl)amino group are preferable.

The (hetero)aryl group having 3 to 30 carbon atoms means an aromatic hydrocarbon group, an aromatic heterocyclic group, a linked aromatic hydrocarbon group in which a plurality of aromatic hydrocarbons are linked, a linked aromatic heterocyclic group in which a plurality of aromatic heterocyclic groups are linked, or a group in which at least one aromatic hydrocarbon and at least one aromatic heterocyclic ring are linked, each having one free valence. Specific examples thereof include a benzene ring, a naphthalene ring, an anthracene ring, a phenanthrene ring, a perylene ring, a tetracene ring, a pyrene ring, a benzpyrene ring, a chrysene ring, a triphenylene ring, a fluoranthene ring, a furan ring, a benzofuran ring, a dibenzofuran ring, a thiophene ring, a benzothiophene ring, a dibenzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofan ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a perimidine ring, a quinazoline ring, a quinazolinone ring, and an azulene ring, each having one free valence. Examples of the linked aromatic hydrocarbon group in which a plurality of aromatic hydrocarbons are linked include a biphenyl group and a terphenyl group.

Among the (hetero)aryl groups, from the viewpoint of durability, a benzene ring, a naphthalene ring, a dibenzofuran ring, a dibenzothiophene ring, a carbazole ring, a pyridine ring, a pyrimidine ring, and a triazine ring, each having one free valance are preferable. Among them, an aryl group having 6 to 18 carbon atoms, such as a benzene ring, a naphthalene ring, and a phenanthrene ring, which has one free valance and may be substituted with an alkyl group having 1 to 8 carbon atoms, or a pyridine ring which has one free valance and may be substituted with an alkyl group having 1 to 4 carbon atoms is more preferable, and an aryl group having 6 to 18 carbon atoms, such as a benzene ring, a naphthalene ring, and a phenanthrene ring, which has one free valance and may be substituted with an alkyl group having 1 to 8 carbon atoms, is still more preferable.

When the group in the compound has a plurality of substituents, examples of the combination of these substituents include, but are not limited to, a combination of an aryl group and an alkyl group, a combination of an aryl group and an aralkyl group, and a combination of an aryl group and an alkyl group or an aralkyl group. As the combination of an aryl group and an aralkyl group, for example, a combination of a benzene group, a biphenyl group, or a terphenyl group and a 5-phenyl-1-pentyl group or a 6-phenyl-1-hexyl group can be used.

[Maximum Emission Wavelength]

The method for measuring the maximum emission wavelength of the iridium complex compound in the present embodiment will be described below.

The maximum emission wavelength of the iridium complex compound can be determined from a photoluminescence spectrum of a solution obtained by dissolving a material in an organic solvent or a photoluminescence spectrum of a thin film of the material alone.

In the case of photoluminescence of a solution, a photoluminescence spectrum of a solution obtained by dissolving a compound in an organic solvent such as toluene at a concentration of $1\times10^{-4}$ mol/L or less, preferably $1\times10^{-5}$ mol/L, is measured with a spectrophotometer (organic EL quantum yield measurement device C9920-02 manufactured by Hamamatsu Photonics K.K.). The wavelength indicating the maximum value of the obtained spectral intensity is defined as the maximum emission wavelength.

In the case of photoluminescence of a thin film, a thin film is produced by vacuum deposition or solution coating of a material, photoluminescence is measured with the spectrophotometer, and the wavelength indicating the maximum value of the obtained luminescence spectrum intensity is defined as the maximum emission wavelength.

The maximum emission wavelengths of the compound used for the luminescence dopant and the compound used for the assist dopant need to be determined and compared using the same method.

The compound represented by formula (3) as the assist dopant contained in the composition for an organic electroluminescent element according to the present embodiment has a shorter maximum emission wavelength than that of the iridium complex compound represented by formula (1) as the luminescence dopant.

The maximum emission wavelength of the compound serving as the luminescence dopant is preferably 580 nm or longer, more preferably 590 nm or longer, and still more preferably 600 nm or longer, and is preferably 700 nm or shorter, and more preferably 680 nm or shorter. When the maximum emission wavelength is in this range, a preferable color of a red luminescent material suitable for an organic electroluminescent element tends to be exhibited.

The maximum emission wavelength of the compound serving as the assist dopant and the maximum emission wavelength of the compound serving as the luminescence dopant are separated by 10 nm or longer, and are preferably separated by 50 nm or shorter because efficient energy transfer can be performed. The difference thereof is more preferably 40 nm or shorter.

The iridium complex compound represented by formula (1) is preferably the same as or more contained than the compound represented by formula (3). That is, the composition ratio of the iridium complex compound represented by formula (1) is preferably equal to or higher than the composition ratio of the compound represented by formula (3) in terms of parts by mass. The iridium complex compound represented by formula (1) is more preferably contained 1 to 3 times the compound represented by formula (3) in terms of parts by mass.

From the viewpoint of increasing the luminescent efficiency and the lifetime of the element, the iridium complex compound represented by formula (1) is particularly preferably contained 1 to 2 times the compound represented by formula (3). From the viewpoint of obtaining more vivid luminescence, the iridium complex compound represented by formula (1) is more preferably contained 2 times or more the compound represented by formula (3). From the viewpoint of reducing the driving voltage of the element, the iridium complex compound represented by formula (1) is more preferably contained less than 2 times the compound represented by formula (3). Accordingly, the energy from the assist dopant is more efficiently transferred to the luminescent dopant, so that high luminescent efficiency is obtained, and the lifetime of the element is expected to be extended.

[Compound Represented by Formula (20)]

The iridium-complex-compound-containing composition according to the present embodiment preferably further contains a compound represented by the following formula (20).

(20)

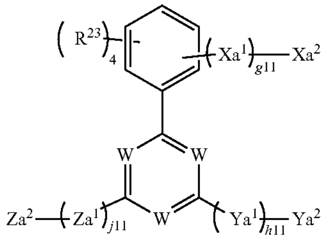

[In formula (20), each W independently represents CH or N, and at least one W is N, $Xa^1$, $Ya^1$, and $Za^1$ each independently represent a divalent aromatic hydrocarbon group having 6 to 30 carbon atoms, which may have a substituent, or a divalent aromatic heterocyclic group having 3 to 30 carbon atoms, which may have a substituent, $Xa^2$, $Ya^2$, and $Za^2$ each independently represent a hydrogen atom, an aromatic hydrocarbon group having 6 to 30 carbon atoms, which may have a substituent, or an aromatic heterocyclic group having 3 to 30 carbon atoms, which may have a substituent, g11, h11, and j11 each independently represent an integer of 0 to 6, At least one of g11, h11, and j11 is an integer of 1 or more, When g11 is 2 or more, a plurality of $Xa^1$s may be the same as or different from each other, When h11 is 2 or more, a plurality of $Ya^1$s may be the same as or different from each other, When j11 is 2 or more, a plurality of $Za^1$s may be the same or different from each other, $R^{23}$ represents a hydrogen atom or a substituent, and four of $R^{23}$ may be the same as or different from each other, and when g11, h11, or j11 is 0, the corresponding $Xa^2$, $Ya^2$, or $Za^2$ is not a hydrogen atom.]

The compound represented by formula (20) is preferably a charge-transporting compound, that is, a charge-transporting host material.

<W>

W in formula (20) represents CH or N, and at least one W is N, but it is preferable that at least two Ws are N, and it is more preferable that all Ws are N, from the viewpoint of electron transportability and electron durability.

<$Xa^1$, $Ya^1$, $Za^1$, $Xa^2$, $Ya^2$, $Za^2$>

In the case where $Xa^1$, $Ya^1$, and $Za^1$ in formula (20) are divalent aromatic hydrocarbon groups having 6 to 30 carbon atoms, which may have a substituent, and in the case where $Xa^2$, $Ya^2$, and $Za^2$ are aromatic hydrocarbon groups having 6 to 30 carbon atoms, which may have a substituent, the aromatic hydrocarbon ring of the aromatic hydrocarbon group having 6 to 30 carbon atoms is preferably a 6-membered monocyclic ring or a 2- to 5-condensed ring. Specific examples thereof include a benzene ring, a naphthalene ring, an anthracene ring, a phenanthrene ring, a fluorene ring, a perylene ring, a tetracene ring, a pyrene ring, a benzpyrene ring, a chrysene ring, a triphenylene ring, a fluoranthene ring, and an indenofluorene ring. Among these, a benzene ring, a naphthalene ring, an anthracene ring, a phenanthrene ring, or a fluorene ring is preferable, a benzene ring, a naphthalene ring, a phenanthrene ring, or a fluorene ring is more preferable, and a benzene ring, a naphthalene ring, or a fluorene ring is still more preferable.

In the case where $Xa^1$, $Ya^1$, and $Za^1$ in formula (20) are divalent aromatic heterocyclic groups having 3 to 30 carbon atoms, which may have a substituent, and in the case where $Xa^2$, $Ya^2$, and $Za^2$ are aromatic heterocyclic groups having 3 to 30 carbon atoms, which may have a substituent, the aromatic heterocyclic group having 3 to 30 carbon atoms is preferably a 5- or 6-membered monocyclic ring or a 2- to 5-membered condensed ring. Specific examples thereof include a furan ring, a benzofuran ring, a dibenzofuran ring, a thiophene ring, a benzothiophene ring, a dibenzothiophene ring, a pyrrole ring, a pyrazole ring, an imidazole ring, an oxadiazole ring, an indole ring, a carbazole ring, an indolocarbazole ring, an indenocarbazole ring, a pyrroloimidazole ring, a pyrrolopyrazole ring, a pyrrolopyrrole ring, a thienopyrrole ring, a thienothiophene ring, a phropyrrole ring, a furofuran ring, a thienofuran ring, a benzisooxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinoline ring, a quinoxaline ring, a perimidine ring, a quinazoline ring, a quinazolinone ring, and a phenanthroline ring. Among these, a thiophene ring, a pyrrole ring, an imidazole ring, a pyridine ring, a pyrimidine ring, a triazine ring, a quinoline ring, a quinazoline ring, a carbazole ring, a dibenzofuran ring, a dibenzothiophene ring, an indolocarbazole ring, a phenanthroline ring, or an indenocarbazole ring is preferable; a pyridine ring, a pyrimidine ring, a triazine ring, a quinoline ring, a quinazoline ring, a carbazole ring, a dibenzofuran ring, or a dibenzothiophene ring is more preferable; and a carbazole ring, a dibenzofuran ring, or a dibenzothiophene ring is still more preferable.

In $Xa^1$, $Ya^1$, $Za^1$, $Xa^2$, $Ya^2$, and $Za^2$ in formula (20), the aromatic hydrocarbon ring is particularly preferably a benzene ring, a naphthalene ring, or a phenanthrene ring, and the aromatic heterocyclic ring is particularly preferably a carbazole ring, a dibenzofuran ring, or a dibenzothiophene ring.

<g11, h11, j11> g11, h11, and j11 each independently represent an integer of 0 to 6, and at least one of g11, h11, and j11 is an integer of 1 or more. From the viewpoint of charge transportability and durability, g11 is preferably 2 or more, or at least one of h11 and j11 is preferably 3 or more.

When g11 is 2 or more, a plurality of $Xa^1$s may be the same as or different from each other. When h11 is 2 or more, a plurality of $Ya^1$s may be the same as or different from each other. When j11 is 2 or more, a plurality of $Za^1$s may be the same as or different from each other.

When g11 is 0, the corresponding $Xa^2$ is not a hydrogen atom means that when g11 is 0, that is, when $Xa^1$ is not present, $Xa^2$ is an aromatic hydrocarbon group having 6 to 30 carbon atoms, which may have a substituent or an aromatic heterocyclic group having 3 to 30 carbon atoms, which may have a substituent. Similarly, when h11 is 0, that is, $Ya^1$ is not present, $Ya^2$ is an aromatic hydrocarbon group having 6 to 30 carbon atoms, which may have a substituent, or an aromatic heterocyclic group having 3 to 30 carbon atoms, which may have a substituent. When j11 is 0, that is, when $Za^1$ is not present, $Za^2$ is an aromatic hydrocarbon group having 6 to 30 carbon atoms, which may have a substituent, or an aromatic heterocyclic group having 3 to 30 carbon atoms, which may have a substituent The compound represented by formula (20) preferably has a total of 8 to 18 of these rings, including rings having three Ws at the center, from the viewpoints of charge transportability, durability, and solubility in an organic solvent.

<$R^{23}$>

$R^{23}$ in the case of a substituent is preferably an aromatic hydrocarbon group having 6 to 30 carbon atoms, which may have a substituent or an aromatic heterocyclic group having 3 to 30 carbon atoms, which may have a substituent. From the viewpoint of improvement in durability and charge transportability, an aromatic hydrocarbon group which may have a substituent is more preferable. When there are a plurality of $R^{23}$s in the case of a substituent, $R^{23}$s may be different from each other.

The substituent which the aromatic hydrocarbon group having 6 to 30 carbon atoms may have, the substituent which the aromatic heterocyclic group having 3 to 30 carbon atoms may have, and the substituent which $R^{23}$ as the substituent may have can be selected from the following substituent group Z2.

<Substituent Group Z2>

The substituent group Z2 includes an alkyl group, an alkoxy group, an aryloxy group, a heteroaryloxy group, an alkoxycarbonyl group, a dialkylamino group, a diarylamino group, an arylalkylamino group, an acyl group, a halogen atom, a haloalkyl group, an alkylthio group, an arylthio group, a silyl group, a siloxy group, a cyano group, an aromatic hydrocarbon group, and an aromatic heterocyclic group. These substituents may have any of linear, branched, and cyclic structures.

More specific examples of the substituent group Z2 include the following structures.

A linear, branched or cyclic alkyl group having usually 1 or more carbon atoms, preferably 4 or more carbon atoms, usually 24 or less carbon atoms, preferably 12 or less carbon atoms, more preferably 8 or less carbon atoms, and still more preferably 6 or less carbon atoms, for example, such as a methyl group, an ethyl group, an n-propyl group, an i-propyl group, an n-butyl group, an i-butyl group, a sec-butyl group, a tert-butyl group, an n-hexyl group, a cyclohexyl group, or a dodecyl group;

An alkoxy group having usually 1 or more carbon atoms, usually 24 or less carbon atoms, and preferably 12 or less carbon atoms, for example, such as a methoxy group, or an ethoxy group;

An aryloxy group or a heteroaryloxy group having usually 4 or more carbon atoms, preferably 5 or more carbon atoms, usually 36 or less carbon atoms, and preferably 24 or less carbon atoms, for example, such as a phenoxy group, a naphthoxy group, or a pyridyloxy group;

An alkoxycarbonyl group having usually 2 or more carbon atoms, usually 24 or less carbon atoms, and preferably 12 or less carbon atoms, for example, such as a methoxycarbonyl group, or an ethoxycarbonyl group;

A dialkylamino group having usually 2 or more carbon atoms, usually 24 or less carbon atoms, and preferably 12 or less carbon atoms, for example, such as a dimethylamino group, or a diethylamino group;

A diarylamino group having usually 10 or more carbon atoms, preferably 12 or more carbon atoms, usually 36 or less carbon atoms, and preferably 24 or less carbon atoms, for example, such as a diphenylamino group, or a ditolylamino group;

An arylalkylamino group having usually 7 or more carbon atoms, usually 36 or less carbon atoms, and preferably 24 or less carbon atoms, for example, such as a phenylmethylamino group;

An acyl group having usually 2 or more carbon atoms, usually 24 or less carbon atoms, and preferably 12 or less carbon atoms, for example, such as an acetyl group, or a benzoyl group;

A halogen atom, for example, such as a fluorine atom or a chlorine atom;

A haloalkyl group having usually 1 or more carbon atoms, usually 12 or less carbon atoms, and preferably 6 or less carbon atoms, for example, such as a trifluoromethyl group;

An alkylthio group having usually 1 or more carbon atoms, usually 24 or less carbon atoms, and preferably 12 or less carbon atoms, for example, such as a methylthio group, or an ethylthio group;

An arylthio group having usually 4 or more carbon atoms, preferably 5 or more carbon atoms, usually 36 or less carbon atoms, and preferably 24 or less carbon atoms, for example, such as a phenylthio group, a naphthylthio group, or a pyridylthio group;

A silyl group having usually 2 or more carbon atoms, preferably 3 or more carbon atoms, usually 36 or less carbon atoms, preferably 24 or less carbon atoms, for example, such as a trimethylsilyl group, or a triphenylsilyl group;

A siloxy group having usually 2 or more carbon atoms, preferably 3 or more carbon atoms, usually 36 or less carbon atoms, and preferably 24 or less carbon atoms, for example, such as a trimethylsiloxy group, or a triphenylsiloxy group;

A cyano group;

An aromatic hydrocarbon group having usually 6 or more carbon atoms, usually 36 or less carbon atoms, and preferably 24 or less carbon atoms, for example, such as a phenyl group, or a naphthyl group;

An aromatic heterocyclic group having usually 3 or more carbon atoms, preferably 4 or more carbon atoms, usually 36 or less carbon atoms, and preferably 24 or less carbon atoms, for example, such as a thienyl group, or a pyridyl group.

Among the substituent group Z2, an alkyl group, an alkoxy group, a diarylamino group, an aromatic hydrocarbon group, or an aromatic heterocyclic group is preferable. From the viewpoint of charge transportability, the substituent is preferably an aromatic hydrocarbon group or an aromatic heterocyclic group, more preferably an aromatic hydrocarbon group, and still more preferably has no substituent. From the viewpoint of improving solubility, the substituent is preferably an alkyl group or an alkoxy group.

Each substituent of the substituent group Z2 may further have a substituent. Examples of the substituent are the same as those of the substituent (substituent group Z2). Each substituent which the substituent group Z2 may have is preferably an alkyl group having 8 or less carbon atoms, an alkoxy group having 8 or less carbon atoms, or a phenyl group, and more preferably an alkyl group having 6 or less carbon atoms, an alkoxy group having 6 or less carbon atoms, or a phenyl group. It is more preferable that each substituent of the substituent group Z2 does not have a further substituent from the viewpoint of charge transportability.

<Molecular Weight>

The compound represented by formula (20) is a low molecular weight material, and has a molecular weight of preferably 3000 or less, more preferably 2500 or less, particularly preferably 2000 or less, and most preferably 1500 or less. A lower limit of the molecular weight is usually 300 or more, preferably 350 or more, and more preferably 400 or more.

Specific Examples of Compound Represented by Formula (20)

The compound represented by formula (20) is not particularly limited, and examples thereof include the following compounds.

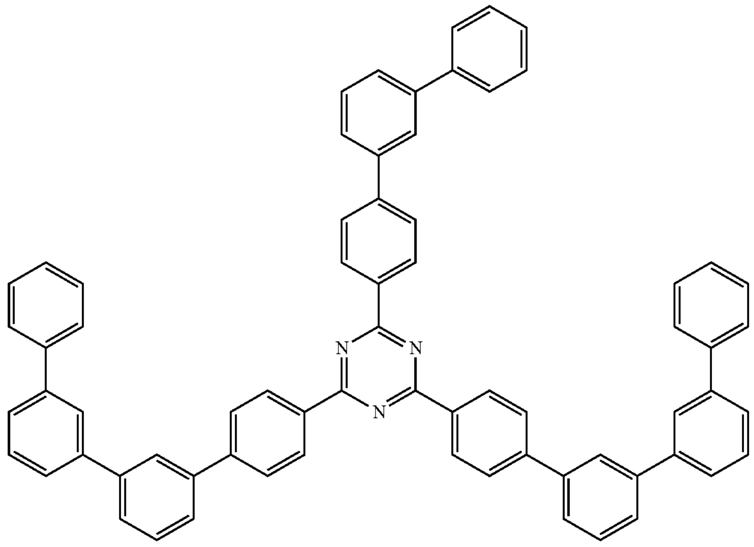

-continued
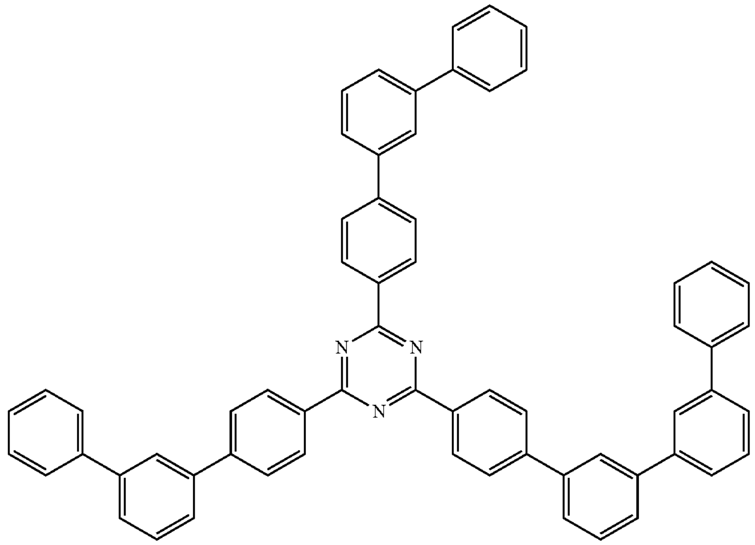
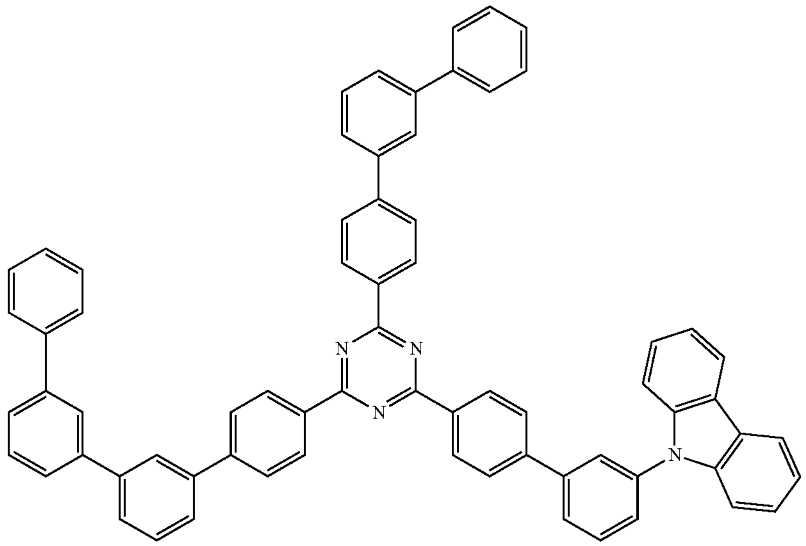
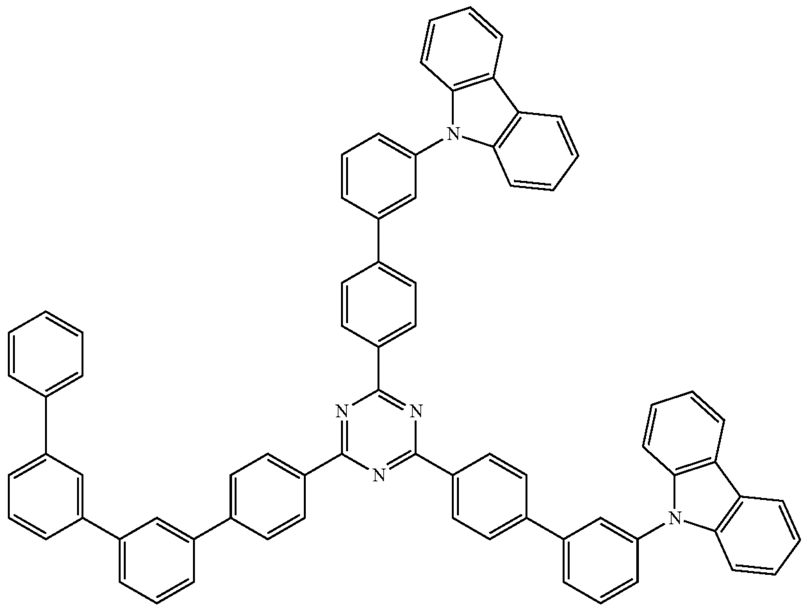

-continued
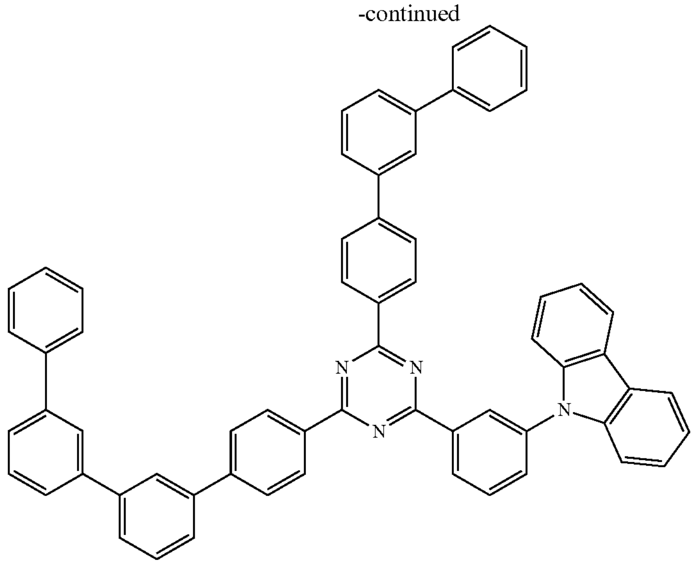
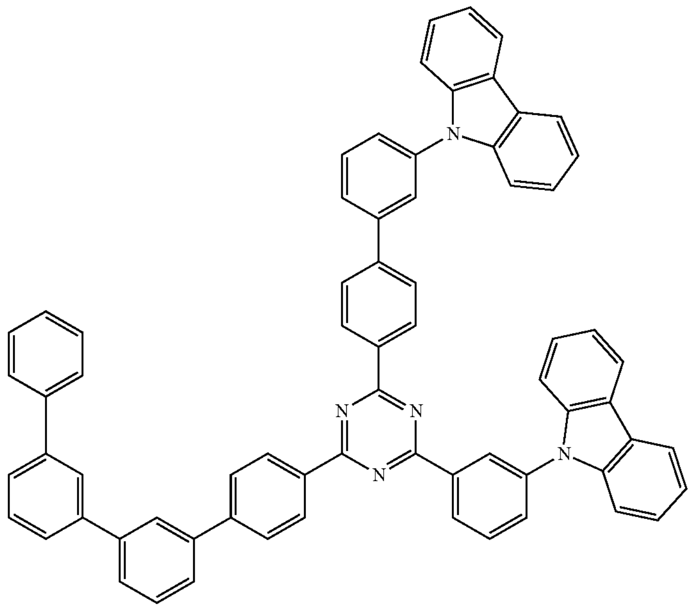
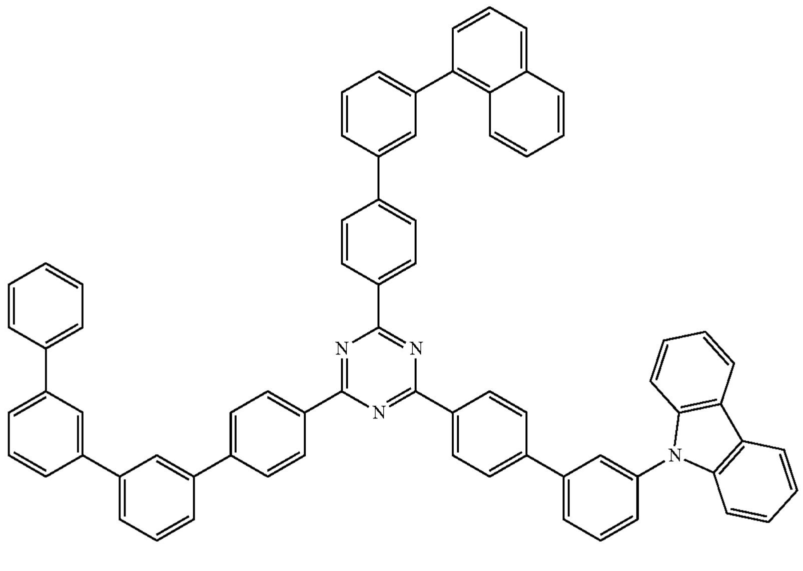

-continued
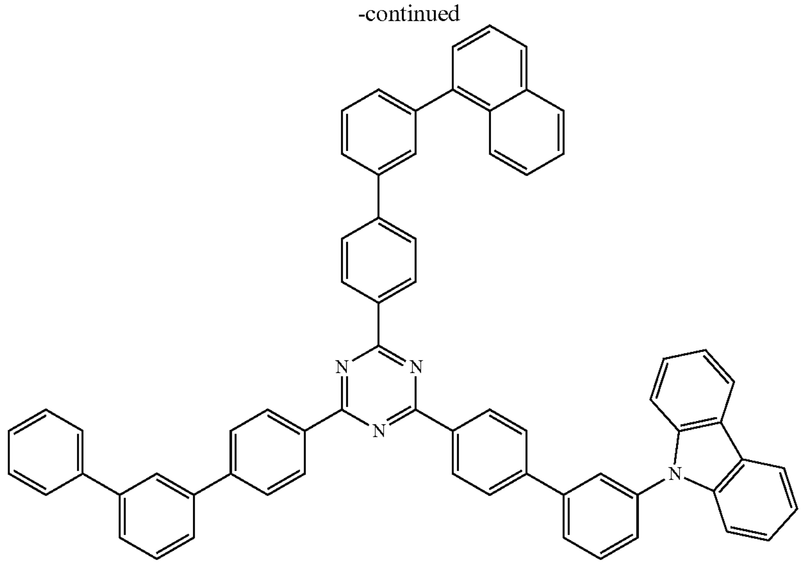
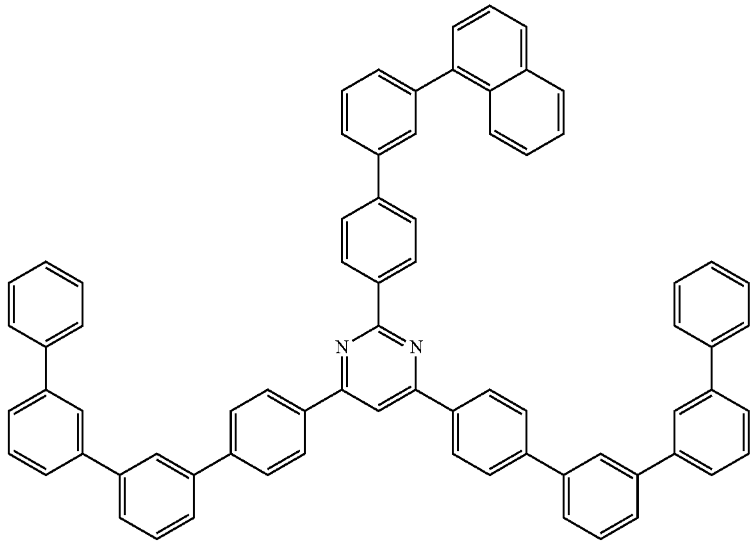
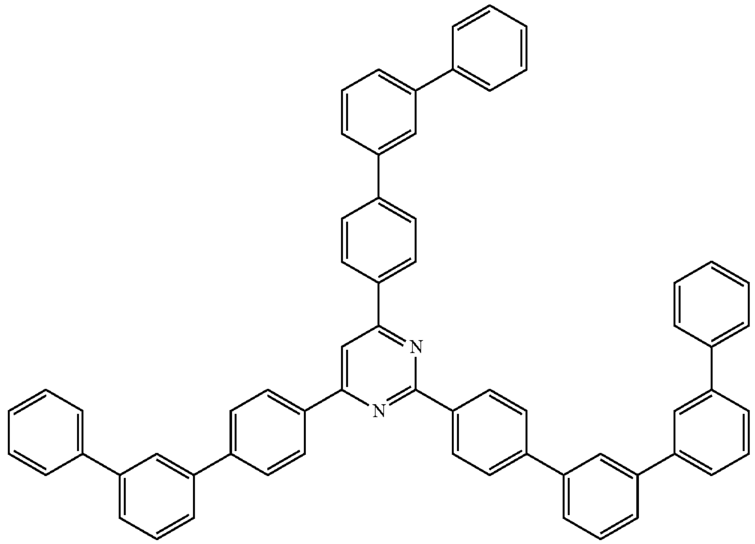

-continued
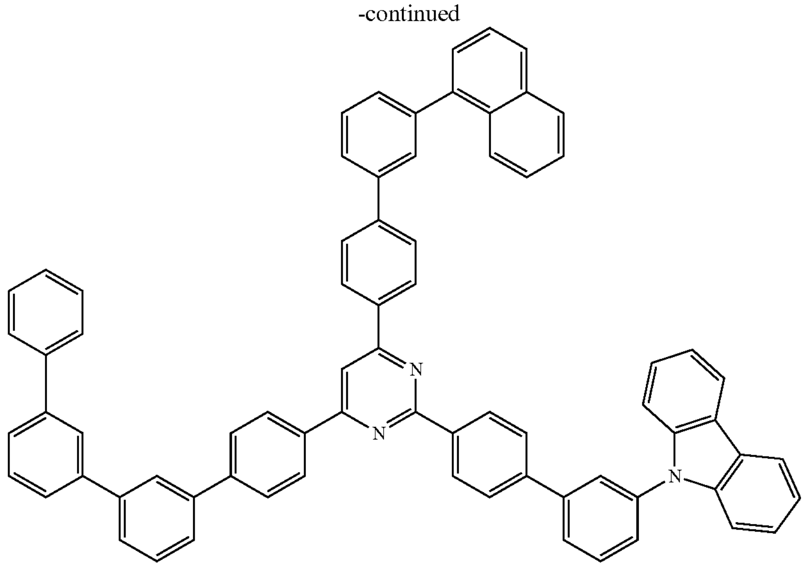
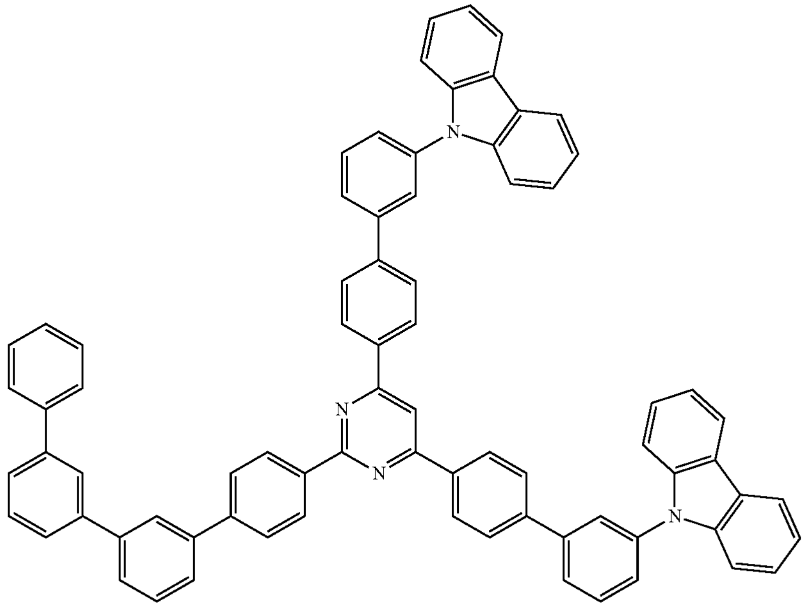
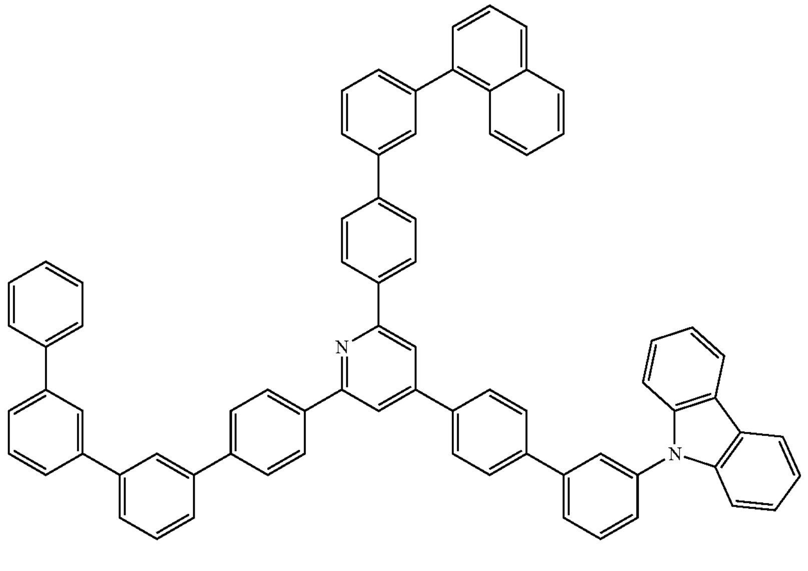

-continued

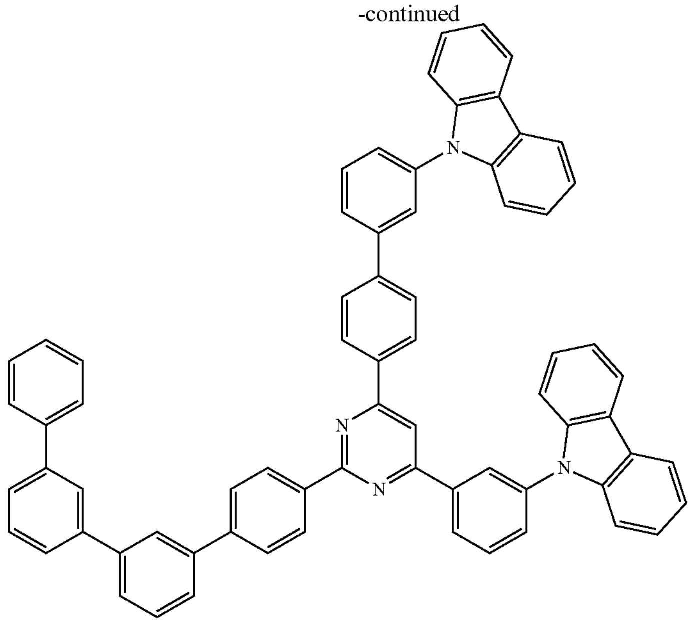

The iridium-complex-compound-containing composition according to the present embodiment may contain only one type of the compound represented by formula (20), or may contain two or more types of the compound represented by formula (20).

[Organic Electroluminescent Element]

The organic electroluminescent element according to the present embodiment includes the iridium complex compound according to the present embodiment.

The organic electroluminescent element according to the present embodiment preferably includes a substrate and, disposed thereover, at least an anode, a cathode, and at least one organic layer interposed between the anode and the cathode, and at least one of the organic layers includes the iridium complex compound according to the present embodiment. The organic layers include an emission layer. In the organic electroluminescent element according to the present embodiment, the emission layer includes the iridium complex compound according to the present embodiment.

The emission layer of the organic electroluminescent element according to the present embodiment preferably includes the assist dopant in addition to the iridium complex compound according to the present embodiment. The reason why the assist dopant is preferably included is as described above.

The emission layer of the organic electroluminescent element according to the present embodiment preferably further includes the compound represented by formula (20) in addition to the iridium complex compound according to the present embodiment. The reason why it is preferable to further include the compound represented by formula (20) is as described above.

The emission layer of the organic electroluminescent element according to the present embodiment preferably includes the compound represented by formula (20) and the assist dopant in addition to the iridium complex compound according to the present embodiment.

The organic layer containing the iridium complex compound according to the present embodiment is more preferably a layer formed using the iridium-complex-compound-containing composition according to the present embodiment, and still more preferably a layer formed by a wet-process film formation method. The layer formed by the wet-process film formation method is preferably the emission layer.

In the present embodiment, the wet-process film formation method employs, as a film forming method, that is, a coating method, a wet-process film formation method such as spin coating, dip coating, die coating, bar coating, blade coating, roll coating, spray coating, capillary coating, an inkjet method, nozzle printing, screen printing, gravure printing, or flexographic printing, and a film formed by these methods is dried to form a film.

The FIG. 1*s* a schematic cross-sectional view which shows an example of a preferred structure of an organic electroluminescent element 10 of the invention. In the FIGURE, numeral 1 denotes a substrate, 2 denotes an anode, 3 denotes a hole injection layer, 4 denotes a hole transport layer, 5 denotes an emission layer, 6 denotes a hole blocking layer, 7 denotes an electron transport layer, 8 denotes an electron injection layer, and 9 denotes a cathode. As materials for constituting these structures, known materials can be applied. Although the materials are not particularly limited, representative materials and methods for formation with respect to each layer are described below as examples. In the case where a patent document, a paper, or the like has been cited, the contents thereof can be suitably applied or used within the range of common knowledge for persons skilled in the art.

<Substrate 1>

The substrate 1 serves as the support of the organic electroluminescent element, and is made of a plate of quartz or glass, a metal sheet, a metal foil, a plastic film or sheet, or the like. Among these, a glass plate and a plate of a transparent synthetic resin such as polyester, polymethacrylate, polycarbonate, and polysulfone are preferable. The substrate 1 is preferably formed of a material having a high gas barrier property because deterioration of the organic electroluminescent element due to the outside air is less likely to occur. Therefore, particularly when a material having low gas barrier properties, such as a synthetic resin substrate, is used, it is preferable to provide a dense silicon oxide film or the like on at least one surface of the substrate 1 to improve the gas barrier properties.

<Anode 2>

The anode 2 has a function of injecting holes into a layer on the emission layer side. The anode 2 is usually formed of a metal such as aluminum, gold, silver, nickel, palladium, or platinum; a metal oxide such as an oxide of at least one of indium and tin; a metal halide such as copper iodide; a conductive polymer such as carbon black, poly(3-methylthiophene), polypyrrole, or polyaniline; or the like.

The anode 2 is frequently formed usually by dry method such as sputtering, vacuum deposition, or the like. In the case where fine particles of a metal such as silver, fine particles of copper iodide or the like, carbon black, fine particles of a conductive metal oxide, a fine powder of a conductive polymer, or the like is used to form the anode 2, such a particulate material is dispersed in an appropriate binder resin solution and the dispersion is applied to the substrate to thereby form the anode 2. Furthermore, in the case of a conductive polymer, a thin film is directly formed on the substrate by electrolytic polymerization or the conductive polymer is applied to the substrate to form the anode 2 (Appl. Phys. Lett., Vol. 60, p. 2711, 1992).

The anode 2 generally has a single-layer structure, but may have a multilayer structure as appropriate. When the anode 2 has a multilayer structure, a different conductive material may be superposed on the anode of a first layer.

A thickness of the anode 2 may be determined according to the required transparency, material, and the like. In particular, when high transparency is required, the thickness at which the transmittance of visible light is 60% or more is preferable, and the thickness at which the transmittance of visible light is 80% or more is more preferable. The thickness of the anode 2 is usually 5 nm or more, preferably 10 nm or more, is usually 1000 nm or less, preferably 500 mn or less. Meanwhile, in the case where transparency is not required, the thickness of the anode 2 may be set to any thickness depending on the required strength or the like, and in this case, the thickness of the anode 2 may be the same as that of the substrate 1.

In the case where a film is formed on the surface of the anode 2, it is preferable to remove impurities on the anode and adjust an ionization potential thereof to improve the hole injection property by performing a treatment such as ultraviolet and ozone, oxygen plasma, or argon plasma before the film formation.

<Hole Injection Layer 3>

A layer having a function of transporting holes from the anode 2 side to the emission layer 5 side is generally referred to as a hole injection and transport layer or a hole transport layer. When there are two or more layers having a function of transporting holes from the anode 2 side to the emission layer 5 side, a layer closer to the anode 2 side may be referred to as the hole injection layer 3. The hole injection layer 3 is preferably used from the viewpoint of enhancing the function of transporting holes from the anode 2 to the emission layer 5 side. When the hole injection layer 3 is used, the hole injection layer 3 is usually formed on the anode 2.

The thickness of the hole injection layer 3 is usually 1 nm or more, preferably 5 nm or more, usually 1000 nm or less, and preferably 500 nm or less.

The hole injection layer 3 may be formed by vacuum deposition or a wet-process film formation method. From the viewpoint of excellent film formability, the film is preferably formed by the wet-process film formation method.

The hole injection layer 3 preferably contains a hole-transporting compound, and more preferably contains a hole-transporting compound and an electron-accepting compound. Furthermore, the hole injection layer 3 preferably contains a cationic radical compound, and particularly preferably contains a cationic radical compound and a hole-transporting compound.

(Hole-transporting Compound)

The composition for forming a hole injection layer usually contains a hole-transporting compound to be the hole injection layer 3. In the case of the wet-process film formation method, a solvent is usually further contained. The composition for forming a hole injection layer preferably has high hole transportability and can efficiently transport injected holes. Therefore, it is preferable that the hole mobility is high, and impurities serving as traps are not easily generated at the time of production, use, or the like. In addition, it is preferable that stability is excellent, the ionization potential is small, and transparency to visible light is high. In particular, when the hole injection layer 3 is in contact with the emission layer 5, it is preferable that the hole injection layer 3 does not quench the luminescence from the emission layer 5 or forms an exciplex with the emission layer 5 so as not to reduce the luminescent efficiency.

The hole-transporting compound is preferably a compound having an ionization potential of 4.5 eV to 6.0 eV, from the viewpoint of a charge injection barrier from the anode 2 to the hole injection layer 3. Examples of the hole-transporting compound include an aromatic amine-based compound, a phthalocyanine-based compound, a porphyrin-based compound, an oligothiophene-based compound, a polythiophene-based compound, a benzylphenyl-based compound, a compound in which a tertiary amine is linked by a fluorene group, a hydrazone-based compound, a silazane-based compound, and a quinacridone-based compound.

Among the exemplified compounds described above, an aromatic amine compound is preferable, and an aromatic tertiary amine compound is particularly preferable, from the viewpoint of amorphous properties and visible light transmittance. Here, the aromatic tertiary amine compound is a compound having an aromatic tertiary amine structure, and also includes a compound having a group derived from an aromatic tertiary amine.

The type of the aromatic tertiary amine compound is not particularly limited, but it is preferable to use a polymer compound having a weight average molecular weight of 1000 or more and 1000000 or less, that is, a polymerization-type compound in which repeating units are continuous, from the viewpoint of easily obtaining uniform luminescence due to a surface smoothing effect. Preferred examples of the aromatic tertiary amine polymer compound include a polymer compound having a repeating unit represented by the following formula (I).

(I)

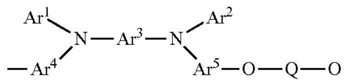

(In formula (I), $Ar^1$ and $Ar^2$ each independently represent an aromatic group which may have a substituent or a heteroaromatic group which may have a substituent. $Ar^3$ to $Ar^5$ each independently represent an aromatic group which may have a substituent or a heteroaromatic group which may have a substituent. Q represents a linking group selected from the group of linking groups shown below. Among $Ar^1$ to $Ar^5$, two groups bonded to the same N atom may be bonded to each other to form a ring.

The linking group is shown below.

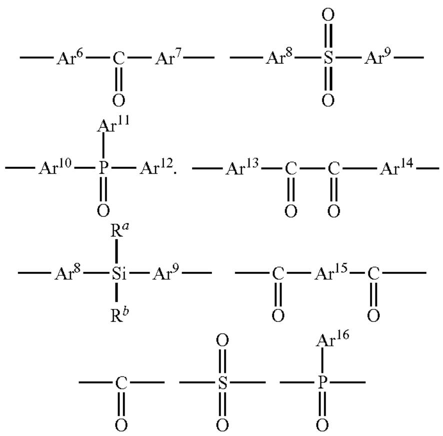

(In the above formulae, $Ar^6$ to $Ar^{16}$ each independently represent an aromatic group which may have a substituent or a heteroaromatic group which may have a substituent. $R^a$ to $R^b$ each independently represent a hydrogen atom or any substituent.

The aromatic group and the heteroaromatic group of $Ar^1$ to $Ar^{16}$ are preferably a group derived from a benzene ring, a naphthalene ring, a phenanthrene ring, a thiophene ring, or a pyridine ring, and more preferably a group derived from a benzene ring or a naphthalene ring, from the viewpoints of solubility, heat resistance, and hole injection and transport properties of the polymer compound.

Specific examples of the aromatic tertiary amine polymer compound having a repeating unit represented by formula (I) include those described in International Publication WO 2005/089024.

(Electron-accepting Compound)

The hole injection layer 3 preferably contains an electron-accepting compound because the conductivity of the hole injection layer 3 can be improved by oxidation of the hole-transporting compound.

As the electron-accepting compound, a compound having an oxidizing power and an ability to accept one electron from the hole-transporting compound described above is preferable, and specifically, a compound having an electron affinity of 4 eV or more is preferable, and a compound having an electron affinity of 5 eV or more is more preferable.

Examples of such an electron-accepting compound include one or more compounds selected from the group consisting of a triaryl boron compound, a metal halide, a Lewis acid, an organic acid, an onium salt, a salt of an arylamine and a metal halide, and a salt of an arylamine and a Lewis acid. Specific examples thereof include onium salts substituted with an organic group, such as 4-isopropyl-4'=methyldiphenyliodonium tetrakis(pentafluorophenyl)borate and triphenylsulfonium tetrafluoroborate (International Publication WO 2005/089024); high-valence inorganic compounds, such as iron (III) chloride (JP-A-11-251067) and ammonium peroxodisulfate; cyano compounds, such as tetracyanoethylene; aromatic boron compounds, such as tris(pentafluorophenyl)borane (JP-A-2003-31365); fullerene derivatives; and iodine.

(Cationic Radical Compound)

The cation radical compound is preferably an ion compound composed of a cation radical, which is a chemical species with one electron removed from a hole-transporting compound, and a counter anion. However, when the cation radical is derived from a hole-transporting polymer compound, the cation radical has a structure in which one electron is removed from a repeating unit of the polymer compound.

The cation radical is preferably a chemical species with one electron removed from the compound described above as the hole-transporting compound. A chemical species with one electron removed from a preferable compound as the hole-transporting compound is preferable in terms of amorphous property, visible light transmittance, heat resistance, solubility, and the like.

The cationic radical compound can be produced by mixing the hole-transporting compound and the electron-accepting compound. That is, when the hole-transporting compound and electron-accepting compound described above are mixed, electron transfer occurs from the hole-transporting compound to the electron-accepting compound, and a cation ion compound formed of a cation radical and a counter anion of the hole-transporting compound is generated.

A cationic radical compound derived from a polymer compound such as PEDOT/PSS (Adv. Mater., 2000, Vol. 12, p. 481) and emeraldine hydrochloride (J. Phys. Chem., 1990, Vol. 94, p. 7716) is also produced by oxidative polymerization, that is, dehydrogenation polymerization.

The oxidation polymerization herein refers to a method in which a monomer is chemically or electrochemically oxidized in an acidic solution using peroxodisulfate or the like. In the case of this oxidative polymerization (dehydrogenation polymerization), a cation radical with one electron removed from a repeating unit of a polymer, which is polymerized by oxidizing a monomer and has an anion derived from an acidic solution as a counter anion, is generated.

(Formation of Hole Injection Layer 3 by Wet-Process Film Formation Method)

When the hole injection layer 3 is formed by a wet-process film formation method, a material for the hole injection layer 3 is usually mixed with a soluble solvent, that is, a solvent for the hole injection layer to prepare a composition for forming a hole injection layer for film formation. The composition for forming a hole injection layer is applied on a layer corresponding to a lower layer of the hole injection layer 3, usually to the anode 2 to form a film by the wet-process film formation method and is dried, to thereby form the hole injection layer 3. Drying of the formed film can be performed in the same manner as the drying method in the formation of the emission layer 5 by the wet-process film formation method.

A concentration of the hole-transporting compound in the composition for forming a hole injection layer is any so long as the effects of the invention are considerably lessened. A lower concentration is preferable in terms of uniformity of thickness, while a higher concentration is preferable in terms of preventing defects in the hole injection layer 3. Specifically, the concentration is preferably 0.01 mass % or more, more preferably 0.1 mass % or more, particularly preferably 0.5 mass % or more, and is preferably 70 mass % or less, more preferably 60 mass % or less, particularly preferably 50 mass % or less.

Examples of the solvent include an ether-based solvent, an ester-based solvent, an aromatic hydrocarbon-based solvent, and an amide-based solvent.

Examples of the ether-based solvent include aliphatic ethers such as ethylene glycol dimethyl ether, ethylene glycol diethyl ether, and propylene glycol-1-monomethyl ether acetate (PGMEA), and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole.

Examples of the ester-based solvent include aromatic esters such as phenyl acetate, phenyl propionate, methyl benzoate, ethyl benzoate, propyl benzoate, and n-butyl benzoate.

Examples of the aromatic hydrocarbon-based solvent include toluene, xylene, cyclohexylbenzene, 3-isopropylbiphenyl, 1,2,3,4-tetramethylbenzene, 1,4-diisopropylbenzene, and methylnaphthalene.

Examples of the amide-based solvent include N,N-dimethylformamide and N,N-dimethylacetamide.

In addition to these, dimethyl sulfoxide or the like can also be used.

The formation of the hole injection layer 3 by the wet-process film formation method is usually performed by, preparing a composition for forming a hole injection layer, then applying the composition to a layer corresponding to a lower layer of the hole injection layer 3, usually to the anode 2 to form a film, and drying the film. In the hole injection layer 3, the coating film is usually dried by heating, vacuum drying, or the like after the film formation.

(Formation of Hole Injection Layer 3 by Vacuum Deposition)

In the case where the hole injection layer 3 is formed by vacuum deposition, one or more constituent materials for the hole injection layer 3, that is, the hole-transporting compound and electron-accepting compound described above are put in a crucible disposed in a vacuum vessel, and the inside of this vacuum vessel is evacuated with an vacuum pump to about 104 Pa. Thereafter, the crucible is heated to vaporize the material(s) in the crucible while controlling the rate(s) of vaporization, and to thereby form the hole injection layer 3 on the anode 2 of a substrate placed so as to face the crucible. Incidentally, in the case of using two or more materials, the constituent materials of the hole injection layer 3 are usually put into separate crucibles, and heating is also performed on the respective crucibles. Further, the vaporization is usually performed while controlling the rates of vaporization independently of each other. Meanwhile, in the case of using two or more materials, a mixture of these materials is put in a crucible, heated, and vaporized to form the hole injection layer 3.

The degree of vacuum during the deposition is not limited so long as the effects of the invention are considerably lessened. The degree of vacuum is usually $0.1\times10^{-6}$ Torr ($0.13\times10^{-4}$ Pa) or higher and is usually $9.0\times10^{-6}$ Torr ($12.0\times10^{-4}$ Pa) or lower. The rate of deposition is not limited so long as the effects of the invention are considerably lessened. The rate of deposition is usually 0.1 Å/sec or higher and is usually 5.0 Å/sec or less. The film formation temperature during the deposition is not limited so long as the effects of the invention are considerably lessened. The film formation temperature is preferably 10° C. or higher, and preferably 50° C. or lower.

<Hole Transport Layer 4>

The hole transport layer 4 is a layer having a function of transporting holes from the anode 2 side to the emission layer 5 side. Although the hole transport layer 4 is not an essential layer in the organic electroluminescent element according to the present invention, it is preferable to provide this layer from the viewpoint of enhancing the function of transporting holes from the anode 2 to the emission layer 5. When the hole transport layer 4 is provided, the hole transport layer 4 is usually formed between the anode 2 and the emission layer 5. When the hole injection layer 3 described above is provided, the hole transport layer 4 is formed between the hole injection layer 3 and the emission layer 5.

The thickness of the hole transport layer 4 is usually 5 nm or more, preferably 10 nm or more, is usually 300 nm or less, preferably 100 nm or less.

The hole transport layer 4 may be formed by vacuum deposition or a wet-process film formation method. From the viewpoint of excellent film formability, the film is preferably formed by the wet-process film formation method.

The hole transport layer 4 usually includes a hole-transporting compound that serves as the hole transport layer 4. Examples of the hole-transporting compound contained in the hole transport layer 4 include aromatic diamines containing two or more tertiary amines and having two or more condensed aromatic rings substituted with nitrogen atoms, such as 4,4'-bis[N-(1-naphthyl)-N-phenylamino]biphenyl (JP-A-5-234681), aromatic amine compounds having a star burst structure, such as 4,4',4"-tris(1-naphthylphenylamino)triphenylamine (J. Lumin., Vol. 72-74, pp. 985, 1997), aromatic amine compounds composed of tetramers of triphenylamine (Chem.Commun., P. 2175, 1996), spiro compounds such as 2,2',7,7'-tetrakis(diphenylamino)-9,9'-spirobifluorene (Synth. Metals, Vol. 91, p. 209, 1997), and carbazole derivatives such as 4,4'-N,N'-dicarbazole biphenyl. In addition, for example, polyvinyl carbazole, polyvinyl triphenylamine (JP-A-7-53953), polyarylene ether sulfone containing tetraphenylbenzidine (Polym.Adv.Tech., Vol. 7, p. 33, 1996) can also be preferably used.

(Formation of Hole Transport Layer 4 by Wet-Process Film Formation Method)

In the case where the hole transport layer 4 is formed by a wet-process film formation method, the hole transport layer 4 is usually formed using a composition for forming a hole transport layer instead of the composition for forming a hole injection layer in the same manner as in the case where the hole injection layer 3 is formed by the wet-process film formation method.

When the hole transport layer 4 is formed by the wet-process film fonnation method, the composition for forming a hole transport layer usually further includes a solvent. The solvent used in the composition for forming a hole transport layer may be the same as the solvent used in the composition for forming a hole injection layer described above.

The concentration of the hole-transporting compound in the composition for forming a hole transport layer may be in the same range as the concentration of the hole-transporting compound in the composition for fonning a hole injection layer.

The formation of the hole transport layer 4 by the wet-process film formation method can be performed in the same manner as the film formation method of the hole injection layer 3 described above.

(Formation of Hole Transport Layer 4 by Vacuum Deposition)

In the case where the hole transport layer 4 is formed by vacuum deposition, the hole transport layer 4 can be formed by using the constituent material of the hole transport layer 4 instead of the constituent material of the hole injection layer 3 in the same manner as in the case where the hole injection layer 3 is formed by vacuum deposition. Film formation conditions such as a degree of vacuum, a rate of deposition, and a temperature at the time of the deposition can be the same as those at the time of vacuum deposition of the hole injection layer 3.

<Emission Layer 5>

The emission layer 5 is a layer having a function of emitting light by being excited by recombination of holes injected from the anode 2 and electrons injected from the cathode 9 when an electric field is applied between the pair of electrodes. The emission layer 5 is a layer formed between the anode 2 and the cathode 9. The emission layer 5 is formed between the hole injection layer 3 and the cathode 9 when the hole injection layer 3 is present on the anode 2, and is formed between the hole transport layer 4 and the cathode 9 when the hole transport layer 4 is present on the anode 2.

The thickness of the emission layer 5 is any so long as the effects of the invention are considerably lessened. A thick layer is preferable in that defects are less likely to occur in the film, while a thin layer is preferable in that a low drive voltage is likely to be obtained. Therefore, the thickness of the emission layer 5 is preferably 3 nm or more, more preferably 5 nm or more, and is usually preferably 200 nm or less, more preferably 100 nm or less.

The emission layer 5 includes at least a material having a luminescence property (luminescent material), and preferably includes a material having a charge transporting property (charge-transporting material). As the luminescent material, any one of the emission layers may contain the iridium complex compound according to the present embodiment, and other luminescent materials may be appropriately used. Hereinafter, luminescent materials other than the iridium complex compound according to the present embodiment will be described in detail.

(Luminescent Material)

The luminescent material emits light at a desired emission wavelength, and is not particularly limited so long as the effect of the present invention is not impaired, and a known luminescent material can be applied. The luminescent material may be a fluorescent material or a phosphorescent material, but a material having good luminescent efficiency is preferable, and a phosphorescent material is preferable from the viewpoint of internal quantum efficiency.

Examples of the fluorescent material include the following materials.

Examples of a fluorescent material that emits blue light (blue fluorescent material) include naphthalene, perylene, pyrene, anthracene, coumarin, chrysene, p-bis(2-phenylethenyl)benzene, and derivatives thereof.

Examples of a fluorescent material that emits green light (green fluorescent material) include quinacridone derivatives, coumarin derivatives, and aluminum complexes such as $Al(C_9H_6NO)_3$.

Examples of a fluorescent material that emits yellow light (yellow fluorescent material) include rubrene and perimidone derivatives.

Examples of a fluorescent material that emits red light (red fluorescent material) include 4-(dicyanomethylene)-2-methyl-6-(p-dimethylaminostyryl)-4H-pyran-based (DCM-based) compounds, benzopyran derivatives, rhodamine derivatives, benzothioxanthene derivatives, and azabenzothioxanthene.

Examples of the phosphorescent material include organometallic complexes containing a metal selected from Groups 7 to 11 of a long-period periodic table (hereinafter, the term "periodic table" refers to a long-period periodic table unless otherwise specified). Preferred examples of the metal selected from Groups 7 to 11 of the periodic table include ruthenium, rhodium, palladium, silver, rhenium, osmium, iridium, platinum, and gold.

The ligand of the organometallic complex is preferably a ligand in which a (hetero)aryl group is linked to pyridine, pyrazole, phenanthroline, or the like, such as a (hetero) arylpyridine ligand, or a (hetero)arylpyrazole ligand, and particularly preferably a phenylpyridine ligand or a phenylpyrazole ligand. Here, (hetero)aryl represents an aryl group or a heteroaryl group.

Specific examples of preferred phosphorescent materials include phenylpyridine complexes such as tris(2-phenylpyridine)iridium, tris(2-phenylpyridine)ruthenium, tris (2-phenylpyridine)palladium, bis(2-phenylpyridine)platinum, tris(2-phenylpyridine)osmium, and tris(2-phenylpyridine)rhenium, and porphyrin complexes such as octaethyl platinum porphyrin, octaphenyl platinum porphyrin, octaethyl palladium porphyrin, and octaphenyl palladium porphyrin.

Examples of polymer-based luminescent materials include polyfluorene-based materials such as poly(9,9-dioctylfluorene-2,7-diyl), poly[(9,9-dioctylfluorene-2,7-diyl)-co-(4,4'-(N-(4-sec-butylphenyl))diphenylamine)], and poly [(9,9-dioctylfluorene-2,7-diyl)-co-(1,4-benzo-2{2,1'-3}-triazole)], and polyphenylene vinylene-based materials such as poly[2-methoxy-5-(2-ethylhexyloxy)-1,4-phenylenevinylene].

(Charge-Transporting Material)

The charge-transporting material is a material having a positive charge, that is, a hole-transporting property, or a negative charge, that is, an electron-transporting property, and is not particularly limited so long as the effect of the present invention is not impaired, and a known material can be applied.

As the charge-transporting material, a compound or the like commonly used for the emission layer 5 of an organic electroluminescent element can be used, and in particular, a compound used as a host material of the emission layer 5 is preferable.

Specific examples of the charge-transporting material include the compounds exemplified as the hole-transporting compound of the hole injection layer 3, such as an aromatic amine-based compound, a phthalocyanine-based compound, a porphyrin-based compound, an oligothiophene-based compound, a polythiophene-based compound, a benzylphenyl-based compound, a compound with a tertiary amine bonded via a fluorene group, a hydrazone-based compound, a silazane-based compound, a silanamine-based compound, a phosphamine-based compound, and a quinacridone-based compound. Other examples include electron-transporting compounds such as an anthracene-based compound, a pyrene-based compound, a carbazole-based compound, a pyridine-based compound, a phenanthroline compound, an oxadiazole-based compound, and a silol-based compound.

In addition, for example, compounds exemplified as the hole-transporting compound of the hole transport layer 4 can also be preferably used, such as aromatic diamines containing two or more tertiary amines and having two or more condensed aromatic rings substituted with nitrogen atoms such as 4,4'-bis[N-(1-naphthyl)-N-phenylamino]biphenyl (JP-A-5-234681), aromatic amine-based compounds having a star burst structure such as 4,4',4"-tris(1-naphthylphenylamino)triphenylamine (J. Lumin., Vol. 72-74, pp. 985, 1997), aromatic amine-based compounds composed of tetramers of triphenylamine (Chem.Commun., P. 2175, 1996), fluorene-based compounds such as 2,2',7,7'-tetrakis-(diphenylamino)-9,9'-spirobifluorene (Synth. Metals, Vol. 91, p. 209, 1997), and carbazole compounds such as 4,4'-N,N'-dicarbazole biphenyl. Other examples include oxadiazole-based compounds such as 2-(4-biphenylyl)-5-(p-tert-butylphenyl)-1,3,4-oxadiazole (tBu-PBD) and 2,5-bis(1-naphthyl)-1,3,4-oxadiazole (BND); silol-based compounds such as 2,5-bis(6'-(2',2"-bipyridyl))-1,1-dimethyl-3,4-diphenylsilole (PyPySPyPy); and phenanthroline-based compounds such as bathophenanthroline (BPhen) and 2,9-dimethyl-4,7-diphenyl-1,10-phenanthroline (BCP, bathocuproin).

(Formation of Emission Layer 5 by Wet-Process Film Formation Method)

The method of forming the emission layer 5 may be vacuum deposition or a wet-process film formation method, but the wet-process film formation method is preferable because of excellent film formation properties.

In the case where the emission layer 5 is formed by the wet-process film formation method, the emission layer 5 is usually formed by using a composition for forming a emission layer prepared by mixing a material to be the emission layer 5 with a solvent capable of dissolving the material, that is, a solvent for a emission layer, instead of the composition for forming a hole injection layer, in the same manner as in the case of forming the hole injection layer 3 by the wet-process film formation method described above. In the present embodiment, it is preferable to use the iridium-complex-compound-containing composition according to the present embodiment described above as the composition for forming an emission layer.

Examples of the solvent include an ether-based solvent, an ester-based solvent, an aromatic hydrocarbon-based solvent, and an amide-based solvent, which are mentioned for the formation of the hole injection layer 3, as well as an alkane-based solvent, a halogenated aromatic hydrocarbon-based solvent, an aliphatic alcohol-based solvent, an alicyclic alcohol-based solvent, an aliphatic ketone-based solvent, and an alicyclic ketone-based solvent. The solvent to be used is as exemplified as the solvent of the iridium-complex-compound-containing composition according to the present embodiment, and specific examples of the solvent are described below, but the solvent is not limited thereto so long as the effects of the present invention are not impaired.

Examples thereof include aliphatic ether-based solvents such as ethylene glycol dimethyl ether, ethylene glycol diethyl ether, and propylene glycol-1-monomethyl ether acetate (PGMEA); aromatic ether-based solvents such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic ester-based solvents such as phenyl acetate, phenyl propionate, methyl benzoate, ethyl benzoate, propyl benzoate, and n-butyl benzoate; aromatic hydrocarbon-based solvents such as toluene, xylene, mesitylene, cyclohexylbenzene, tetralin, 3-isopropylbiphenyl, 1,2,3,4-tetramethylbenzene, 1,4-diisopropylbenzene, and methylnaphthalene; amide-based solvents such as N,N-dimethylformamide, and N,N-dimethylacetamide; alkane-based solvents such as n-decane, cyclohexane, ethylcyclohexane, decalin, and bicyclohexane; halogenated aromatic hydrocarbon-based solvents such as chlorobenzene, dichlorobenzene, and trichlorobenzene; aliphatic alcohol-based solvents such as butanol and hexanol; alicyclic alcohol-based solvents such as cyclohexanol and cyclooctanol; aliphatic ketone-based solvents such as methyl ethyl ketone and dibutyl ketone; and alicyclic ketone-based solvents such as cyclohexanone, cyclooctanone, and fencone. Among these, alkane-based solvents and aromatic hydrocarbon-based solvents are particularly preferable.

In addition, in order to obtain a more uniform film, it is preferable that the solvent is vaporized from the liquid film immediately after the film formation at an appropriate rate. Therefore, as described above, the boiling point of the solvent to be used is usually 80° C. or higher, preferably 100° C. or higher, and more preferably 120° C. or higher, and is usually 270° C. or lower, preferably 250° C. or lower, more preferably 230° C. or lower.

The amount of the solvent to be used is any so long as the effects of the invention are considerably lessened. The total content of the solvent in the composition for forming a emission layer, that is, the iridium-complex-compound-containing composition is preferably large from the viewpoint that the film forming operation is easily performed due to low viscosity, and meanwhile, is preferably low from the viewpoint that the film forning operation is easily performed with a thick film. As described above, the content of the solvent in the iridium-complex-compound-containing composition is preferably 1 mass % or more, more preferably mass % or more, particularly preferably 50 mass % or more, and is preferably 99.99 mass % or less, more preferably 99.9 mass % or less, particularly preferably 99 mass % or less.

As a method of removing the solvent after the wet-process film formation, heating or decompression can be used. As a heating unit used in the heating method, a clean oven and a hot plate are preferable because heat is uniformly applied to an entire film.

The heating temperature in the heating step is any so long as the effects of the invention are considerably lessened. It is preferable that the temperature is high from the viewpoint of shortening the drying time, and it is preferable that the temperature is low from the viewpoint of reducing damage to the material. The upper limit of the heating temperature is usually 250° C. or lower, preferably 200° C. or lower, and more preferably 150° C. or lower. The lower limit of the heating temperature is usually 30° C. or higher, preferably 50° C. or higher, and more preferably 80° C. or higher. By setting the above upper limit temperature, the upper limit temperature is within the range of the heat resistance of the charge-transporting material or the phosphorescent material which is usually used, and decomposition and crystallization are prevented, which is preferable. By setting the above lower limit temperature, it does not take too long to remove the solvent, which is preferable. The heating time in the heating step is appropriately determined depend on the boiling point and vapor pressure of the solvent in the composition for forming an emission layer, the heat resistance of the material, and the heating conditions.

(Formation of Emission Layer 5 by Vacuum Deposition)

In the case where the emission layer 5 is formed by vacuum deposition, one or more constituent materials for the emission layer 5, that is, the luminescent material and charge-transporting compound described above are put in a crucible disposed in a vacuum vessel, and the inside of this vacuum vessel is evacuated with an vacuum pump to about $10^{-4}$ Pa. Thereafter, the crucible is heated to vaporize the material(s) in the crucible while controlling the rate(s) of vaporization, and to thereby form the emission layer 5 on the hole injection layer 3 or hole transport layer 4 placed so as to face the crucible. Incidentally, in the case of using two or more materials, the constituent materials of the emission layer 5 are usually put into separate crucibles, and heating is also performed on the respective crucibles. Further, the vaporization is usually performed while controlling the rates of vaporization independently of each other. Meanwhile, in the case ofusing two or more materials, a mixture of these materials is put in a crucible, heated, and vaporized to form the emission layer 5.

The degree of vacuum during the deposition is not limited so long as the effects of the invention are considerably lessened. The degree of vacuum is usually $0.1\times10^{-6}$ Torr ($0.13\times10^{-4}$ Pa) or higher and is usually $9.0\times10^{-6}$ Torr ($12.0\times10^{-4}$ Pa) or lower. The rate of deposition is not limited so long as the effects of the invention are considerably lessened. However, the rate of deposition is usually 0.1 Å/sec or higher and is usually 5.0 Å/sec or less. The film formation temperature during the deposition is not limited so long as the effects of the invention are considerably lessened. However, the film formation temperature is preferably 10° C. or higher, and preferably 50° C. or lower.

<Hole Blocking Layer 6>

A hole blocking layer 6 may be provided between the emission layer 5 and an electron injection layer 8 to be described later. The hole blocking layer 6 is superposed on the emission layer 5 so as to be in contact with the interface on the cathode 9 side of the emission layer 5.

The hole blocking layer 6 has a function of blocking holes which are moving thereinto from the anode 2 from reaching the cathode 9 and a function of efficiently transporting electrons injected from the cathode 9 toward the emission layer 5. Examples of properties required of the material for constituting the hole blocking layer 6 include: to have a high electron mobility and a low hole mobility; to have a large energy gap, that is, difference between HOMO and LUMO; and to have a high excited triplet level (T1).

Examples of hole blocking layer materials which satisfy such requirements include metal complexes such as mixed-ligand complexes, e.g., bis(2-methyl-8-quinolinolato)(phenolato)aluminum and bis(2-methyl-8-quinolinolato)(triphenylsinolato)aluminum, and dinuclear metal complexes, e.g., bis(2-methyl-8-quinolinolato)aluminum-μ-oxo-bis(2-methyl-8-quinolinolato)aluminum, styryl compounds such as distyrylbiphenyl derivatives (JP-A-11-242996), triazole derivatives such as 3-(4-biphenylyl)-4-phenyl-5-(4-tert-butylphenyl)-1,2,4-triazole (JP-A-7-41759), and phenanthroline derivatives such as bathocuproine (JP-A-10-79297). Furthermore, the compound described in International Publication WO 2005/022962 which has at least one pyridine ring substituted at the 2, 4, and 6 positions is also preferred as the hole blocking material 6.

A method of forming the hole blocking layer 6 is not limited, and the hole blocking layer 6 can be formed in the same manner as the method of forming the emission layer 5.

The thickness of the hole blocking layer 6 is any so long as the effects of the invention are considerably lessened. The film thickness is usually 0.3 nm or more, preferably 0.5 nm or more, and is usually 100 nm or less, preferably 50 nm or less.

<Electron Transport Layer 7>

An electron transport layer 7 is disposed between the emission layer 5 or the hole blocking layer 6 and the electron injection layer 8 for the purpose of further improving the current efficiency of the device.

The electron transport layer 7 is constituted of a compound that, between the electrodes to which an electric field is being applied, is capable of efficiently transporting, toward the emission layer 5, the electrons injected from the cathode 9. The electron-transporting compound to be used in the electron transport layer 7 must be a compound with which the efficiency of electron injection from the cathode 9 or electron injection layer 8 is rendered high and which has a high electron mobility and is capable of efficiently transporting injected electrons.

Specific examples of the electron-transporting compound which satisfy such requirements include metal complexes such as aluminum complexes of 8-hydroxyquinoline (JP-A-59-194393), metal complexes of 10-hydroxybenzo[h]quinoline, oxadiazole derivatives, distyrylbiphenyl derivatives, silole derivatives, 3-hydroxyflavone metal complexes, 5-hydroxyflavone metal complexes, benzoxazole metal complexes, benzothiazole metal complexes, trisbenzimidazolylbenzene (U.S. Pat. No. 5,645,948), quinoxaline compounds (JP-A-6-207169), phenanthroline derivatives (JP-A-5-331459), 2-t-butyl-9,10-N,N'-dicyanoanthraquinone diimine, n-type hydrogenated amorphous silicon carbide, n-type zinc sulfide, and n-type zinc selenide.

The thickness of the electron transport layer 7 is usually 1 nm or more, preferably 5 mn or more, and is usually 300 nm or less, preferably 100 mn or less.

The electron transport layer 7 is formed by being superposed on the emission layer 5 or the hole blocking layer 6 by a wet-process film formation method or vacuum deposition in the same manner as for the emission layer 5. In general, vacuum deposition is used.

<Electron Injection Layer 8>

The electron injection layer 8 plays a role of efficiently injecting electrons injected from the cathode 9 into the electron transport layer 7 or the emission layer 5.

In order to efficiently perform electron injection, a metal having a low work function is preferred as the material constituting the electron injection layer 8. Examples thereof include alkali metals such as sodium and cesium, and alkaline earth metals such as barium and calcium.

The thickness of the electron injection layer 8 is preferably 0.1 nm to 5 nm.

To interpose an ultrathin insulating film of LiF, $MgF_2$, $Li_2O$, $Cs_2CO_3$, or the like as the electron injection layer 8 between the cathode 9 and the electron transport layer 7 is also an effective method for improving the efficiency of the element (Appl. Phys. Lett., Vol. 70, p. 152, 1997; JP-A-10-74586; IEEE Trans. Electron. Devices, Vol. 44, p. 1245, 1997; SID 04 Digest, p. 154). The ultrathin insulating film is an insulating film having a thickness of about 0.1 nm to 5 nm.

Furthermore, to dope an organic electron transport material represented by nitrogen-containing heterocyclic compounds such as bathophenanthroline or by metal complexes such as aluminum complexes of 8-hydroxyquinoline with an alkali metal such as sodium, potassium, cesium, lithium, or rubidium (as described in JP-A-10-270171, JP-A-2002-100478, JP-A-2002-100482, etc.) is preferred because the doping can improve the electron injection/transport properties and further attain excellent film quality. In this case, the thickness of the film is usually 5 nm or larger, preferably 10 nm or larger, and is usually 200 nm or less, preferably 100 nm or less.

The electron injection layer 8 is formed by being superposed on the emission layer 5 or the hole blocking layer 6 or the electron transport layer 7 thereon by a wet-process film formation method or vacuum deposition in the same manner as for the emission layer 5.

Details in the case of the wet-process film formation method are the same as those in the case of the emission layer 5 described above.

<Cathode 9>

The cathode 9 serves to inject electrons into the layer located on the emission layer 5 side, that is, the electron injection layer 8, the emission layer 5, or the like. Although any of the materials usable as the anode 2 can be used as the material for the cathode 9, a metal having a low work function is preferably used from the standpoint of efficient injection of electrons. For example, metals such as tin, magnesium, indium, calcium, aluminum, and silver or alloys of these metals are used. Specific examples thereof include electrodes of alloys having a low work function, such as magnesium-silver alloys, magnesium-indium alloys, and aluminum-lithium alloys.

From the viewpoint of the stability of the element, it is preferable to protect the cathode 9 made of a metal having a low work function by superposing a metal layer having a high work function and being stable to the air on the cathode 9. Examples of the metal to be superposed include metals such as aluminum, silver, copper, nickel, chromium, gold, and platinum.

The thickness of the cathode is usually the same as that of the anode 2.

<Other Constituent Layers>

Explanations were given above mainly on elements of the layer configuration shown in the FIGURE. However, the organic electroluminescent element according to the present embodiment may have any desired layers, besides the layers explained above, between the anode 2 and the emission layer 5 and between the cathode 9 and the emission layer 5, or any of the layers other than the emission layer 5 may be omitted, so long as the performance of the element is not impaired thereby.

It is also effective to dispose an electron blocking layer between the hole transport layer 4 and the emission layer 5 for the same purpose as that of the hole blocking layer 6. The electron blocking layer not only has the function of inhibiting electrons which are moving thereinto from the emission layer 5 from reaching the hole transport layer 4 and of thereby increasing the probability of recombination with holes within the emission layer 5 and confining the resultant excitons in the emission layer 5, but also has the function of efficiently transporting, toward the emission layer 5, the holes injected from the hole transport layer 4.

Examples of properties required of the electron blocking layer include: to have high hole-transporting properties; to have a large energy gap, that is, difference between HOMO and LUMO; and to have a high excited triplet level (T1). It is preferable that in the case where the emission layer 5 is formed by a wet-process film formation method, the electron blocking layer also should be formed by a wet-process film formation method, since element production is facilitated.

Consequently, it is preferable that the electron blocking layer also should have suitability for wet-process film formation. Examples of materials usable as such electron blocking layer include copolymers of dioctylfluorene with triphenylamine which are represented by F8-TFB (International Publication WO 2004/084260).

Incidentally, constituent layers can be superposed in the order reverse to that shown in the FIGURE. Namely, a cathode 9, electron injection layer 8, electron transport layer 7, hole blocking layer 6, emission layer 5, hole transport layer 4, hole injection layer 3, and anode 2 may be superposed in this order on a substrate 1. It is also possible to dispose the organic electroluminescent element of the invention between two substrates, at least one of which is highly transparent.

Furthermore, it is possible to configure a structure made up of a plurality of stacked stages each having the layer configuration shown in the FIGURE, that is, structure obtained by stacking a plurality of luminescent units. In this case, $V_2O_5$ or the like can be used as a charge generation layer in place of each of the interfacial layers located between the luminescent units, for example, in the case where the anode is ITO and the cathode is Al, then the charge generation layer is used in place of these two layers. This configuration brings about a decrease in barrier between the stages, and is more preferred from the standpoints of luminescent efficiency and operating voltage.

The present invention can be applied to any of a single organic electroluminescent element, organic electroluminescent elements configured in an array arrangement, organic electroluminescent elements configured so that the anodes and the cathodes have been disposed in an X-Y matrix arrangement.

[Display Device and Illuminator]

An organic EL display device and an organic EL illuminator according to the present embodiment include the organic electroluminescent element according to the present embodiment as described above. The organic EL display device and organic EL illuminator according to the present embodiment are not particularly limited in the types and structures thereof, and can be assembled using the organic electroluminescent element of the invention in accordance with ordinary methods.

For example, the organic EL display device and the organic EL illuminator according to the present embodiment can be produced by methods such as those described in "Organic EL Display" (Ohmsha, Ltd., published on Aug. 20, 2004, written by TOKITO Shizuo, ADACHI Chihaya, and MURATA Hideyuki).

EXAMPLE

Hereinafter, the present invention will be described in more detail with reference to Examples. However, the present invention is not limited to the following examples, and the present invention can be carried out with any changes without departing from the gist thereof.

In the following synthesis examples, all reactions were carried out under a nitrogen stream. A solvent and solution to be used in the reaction were degassed by an appropriate method such as nitrogen bubbling.

Synthesis of Iridium Complex Compound

Synthesis Example 1: Synthesis of Compound D-1

[Reaction 1]

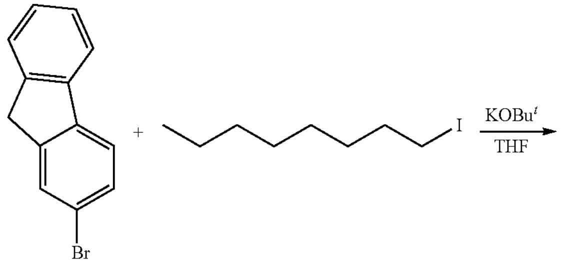

-continued

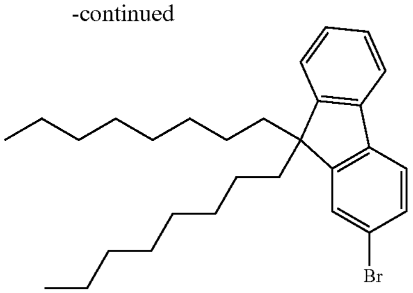

2-bromofluorene (20.4 g) and dehydrated tetrahydrofuran (500 mL) were put into a 1 L eggplant flask, tert-butoxy-potassium (21.1 g) was placed while cooling in an ice water bath, and then 1-iodo-n-octane (50.9 g) was added dropwise over 15 minutes. The mixture was removed from the ice water bath and stirred at room temperature for 3 hours. The solvent was distilled off under reduced pressure, and water (300 mL) and dichloromethane (300 mL) were added, followed by liquid separation and cleaning. The oil phase was recovered and concentrated under reduced pressure to obtain a residue. The residue was purified by silica gel column chromatography (neutral silica gel, dichloromethane/hexane=1/9) to obtain 37.7 g of 2-bromo-9,9-di(n-octyl)fluorene as a thin yellow oily substance.

[Reaction 2]

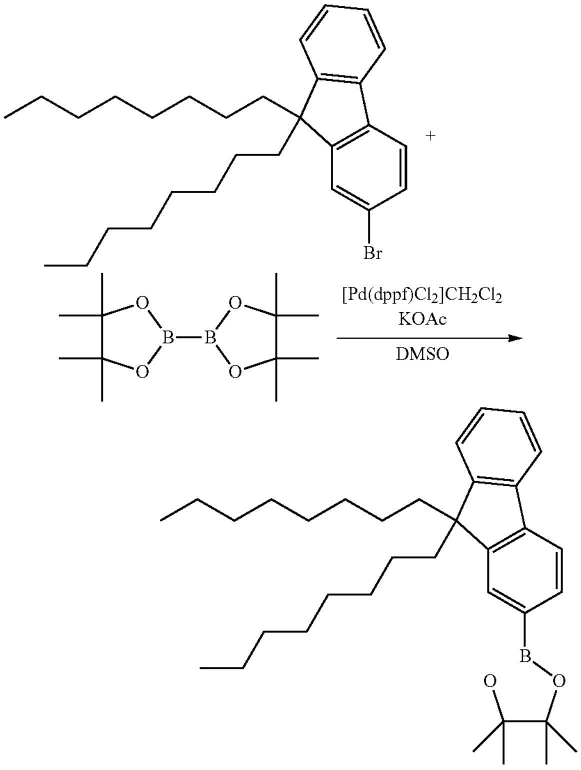

2-bromo-9,9-di(n-octyl)fluorene (37.7 g), bis(pinacolato)diboron (23.7 g), potassium acetate (26.0 g), a dichloro(1,1'-bis(diphenylphosphino)ferrocene)palladium-dichloromethane adduct (3.0 g), and dimethyl sulfoxide (DMSO) (350 mL) were placed into a 1 L eggplant flask, followed by stirring at 85° C. for 10 hours, and then further stirring at 90° C. for 10 hours. After cooling to room temperature, water (350 mL) and dichloromethane (300 mL) were added, followed by liquid separation and cleaning. The oil phase was recovered and concentrated under reduced pressure to obtain a residue. The residue was purified by silica gel column chromatography (neutral silica gel, ethyl acetate/hexane=0/1 to 1/9) to obtain 36.8 g of 2-[9,9-di(n-octyl)fluorene-2-yl]-4,4,5,5-tetramethyl-1,3,2-dioxaborolane as a blackish brown oily substance.

[Reaction 3]

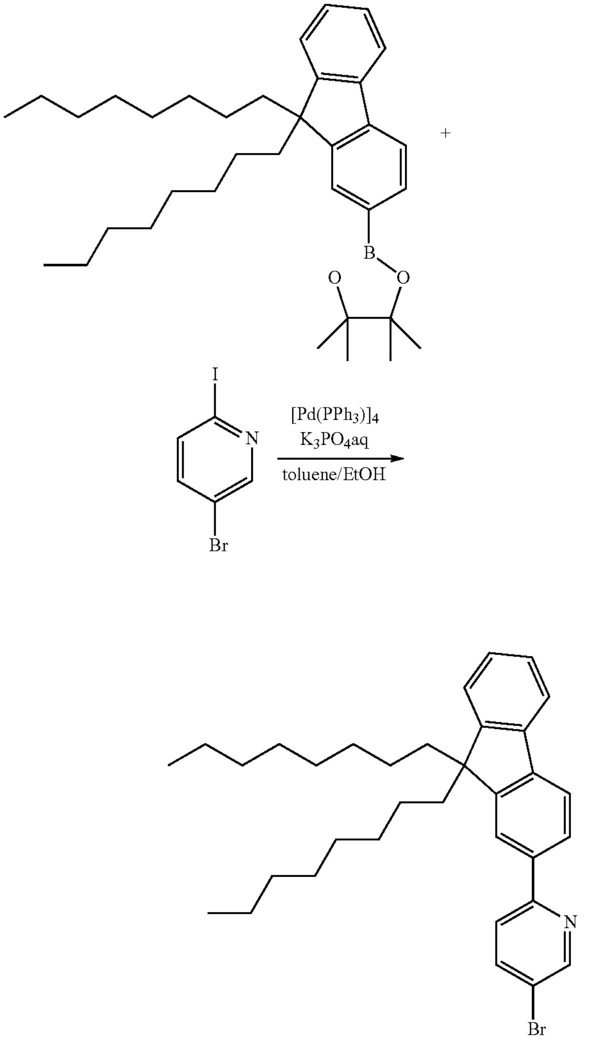

5-bromo-2-iodopyridine (9.0 g), 2-[9,9-di(n-octyl)fluorene-2-yl]-4,4,5,5-tetramethyl-1,3,2-dioxaborolane (15.1 g), [tetrakis(triphenylphosphine)palladium (0)] (1.5 g), a 2M tripotassium phosphate aqueous solution (40 mL), toluene (80 mL), and ethanol (40 mL) were added into a 1 L eggplant flask, followed by stirring in an oil bath at 105° C. for 9 hours. After cooling to room temperature, the aqueous phase was removed, and the remaining liquid was concentrated under reduced pressure to obtain a residue. The residue was purified by silica gel column chromatography (neutral silica gel, ethyl acetate/hexane=1/9) to obtain 9.8 g of 2-(5-bromopyridin-2-yl)-9,9-di(n-octyl)fluorene as a thin green solid.

[Reaction 4]

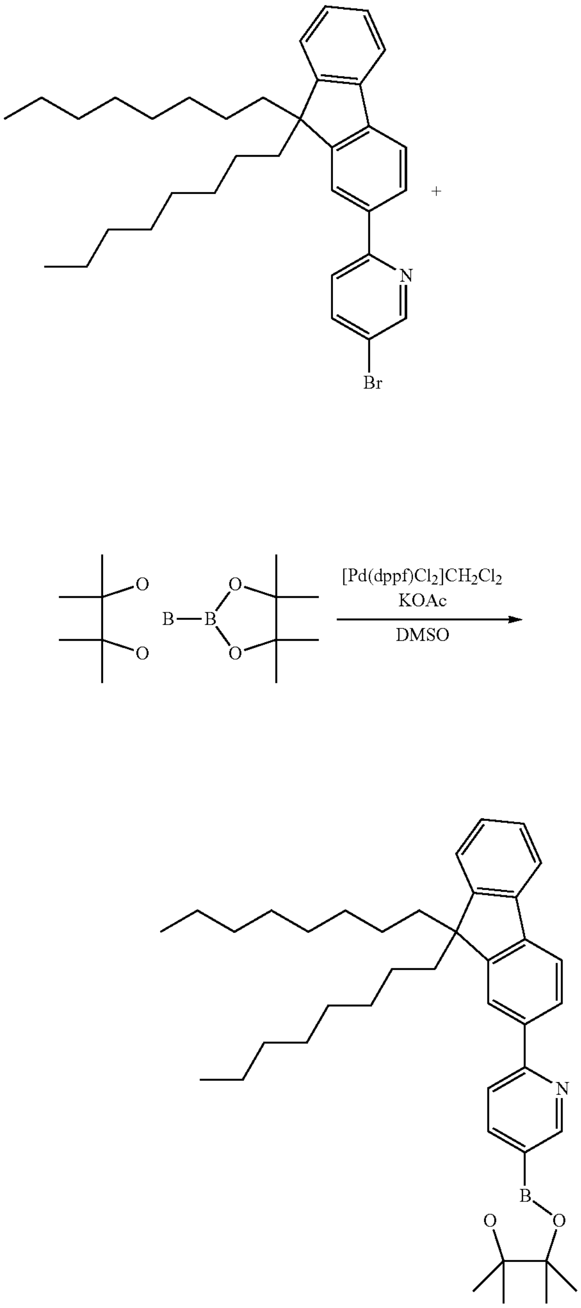

2-(5-bromopyridin-2-yl)-9,9-di(n-octyl)fluorene (9.8 g), bis(pinacolato)diboron (5.2 g), potassium acetate (5.5 g), a dichloro-(1,1'-bis(diphenylphosphino)ferrocene)palladium-dichloromethane adduct (0.6 g), and dimethyl sulfoxide (100 mL) were placed into a 1 L eggplant flask, followed by stirring at 90° C. for 9 hours. After cooling to room temperature, water (500 mL) and dichloromethane (300 mL) were added, followed by liquid separation and cleaning. The oil phase was recovered and concentrated under reduced pressure to obtain a residue. The residue was purified by silica gel column chromatography (neutral silica gel, ethyl acetate/hexane=15/85 to 3/7) to obtain 7.8 g of 2-[{9,9-di (n-octyl)fluorene-2-yl}pyridin-5-yl]-4,4,5,5-tetramethyl-1,3,2-dioxaborolane as a yellow solid.

[Reaction 5]

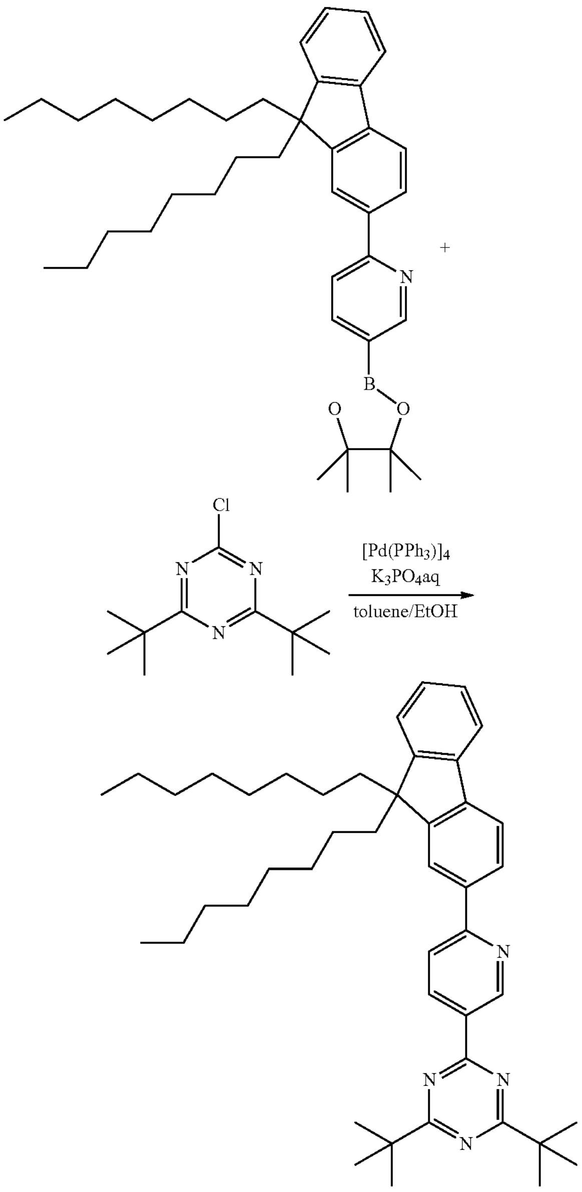

(Intermediate 1)

2-[{9,9-di(n-octyl)fluorene-2-yl}pyridin-5-yl]-4,4,5,5-tetramethyl-1,3,2-dioxaborolane (11.8 g), 2,4-di-tert-butyl-6-chloro-1,3,5-triazine (5.4 g, synthesized by the method described in JP-A-2016-160180), [tetrakis(triphenylphosphine)palladium (0)] (0.9 g), a 2M tripotassium phosphate aqueous solution (25 mL), toluene (60 mL), and ethanol (20 mL) were added into a 1 L eggplant flask, followed by stirring in an oil bath at 105° C. for 2 hours. After cooling to room temperature, the aqueous phase was removed, and the remaining liquid was concentrated under reduced pressure to obtain a residue. The residue was purified by silica gel column chromatography (neutral silica gel, dichloromethane/hexane=35/65) to obtain 13.5 g of Intermediate 1 as colorless amorphous.

[Reaction 6]

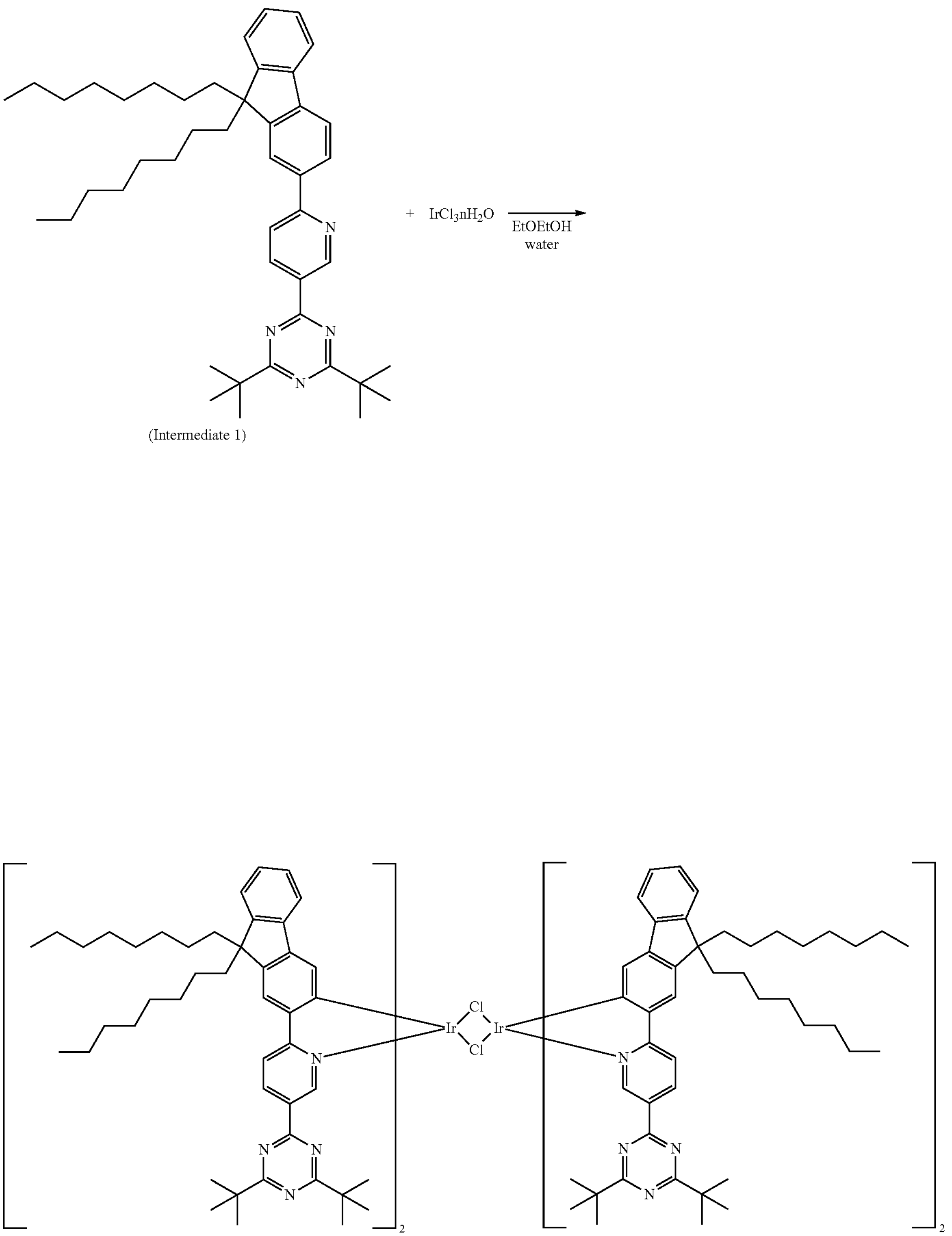

(Intermediate 1)

(Intermediate 2)

Intermediate 1 (7.1 g), iridium (III) chloride n-hydrate (1.8 g), 2-ethoxyethanol (61 mL), and water (14 mL) were added into a 200 mL eggplant flask, followed by stirring in an oil bath at 135° C. to 150° C. for 12 hours. The residue obtained by concentration under reduced pressure was purified by silica gel column chromatography (basic silica gel, dichloromethane) to obtain 7.5 g of Intermediate 2 as a red solid.

[Reaction 7]

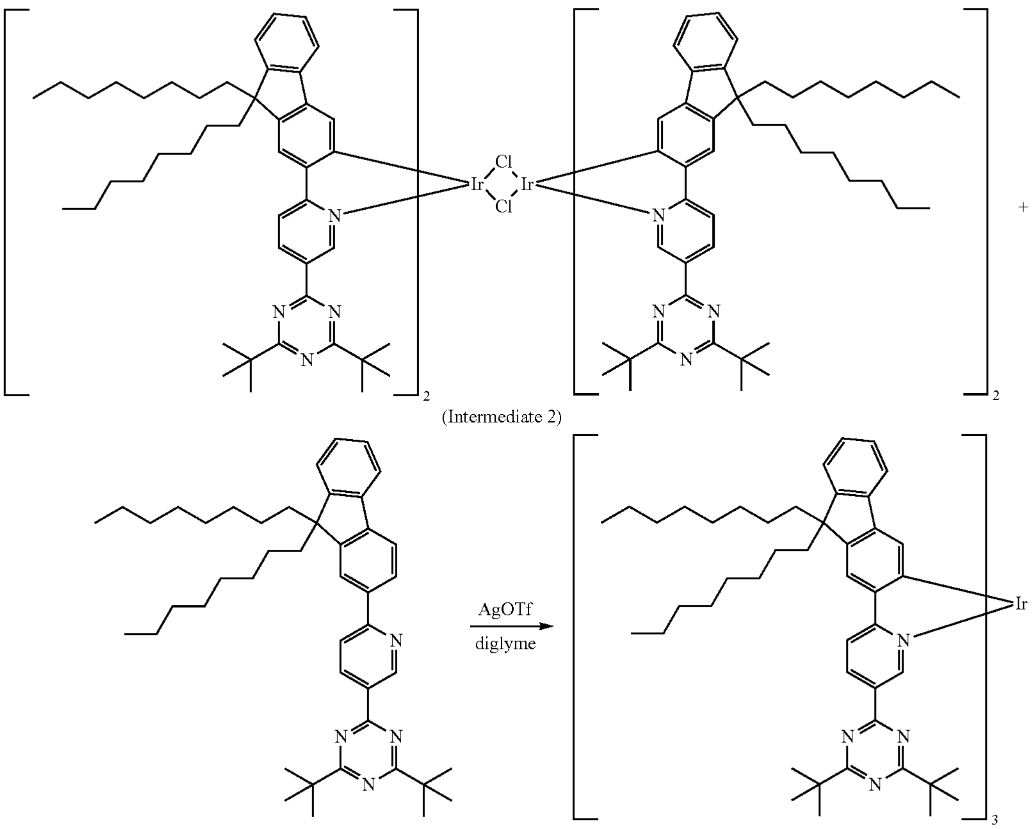

(Intermediate 2)
(Intermediate 1)
(Compound D-1)

Intermediate 2 (7.5 g), Intermediate 1 (6.4 g), silver (I) trifluoromethane sulfonate (1.3 g), and diglyme (25 mL) were added into a 1 L eggplant flask, followed by stirring in an oil bath at 145° C. for 3 hours. The residue obtained by concentration under reduced pressure was purified by silica gel column chromatography (neutral silica gel, hexane/dichloromethane=8/2) to obtain 6.2 g of Compound D-1 as a red solid.

Synthesis Example 2: Synthesis of Compound D-2

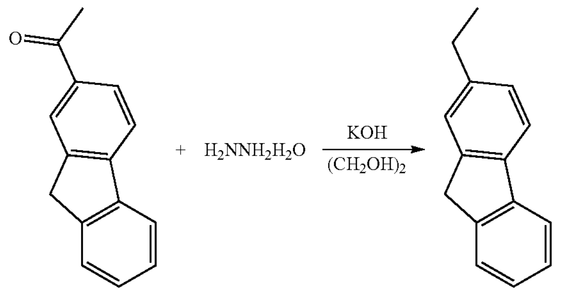

2-acetylfluorene (228.1 g) and ethylene glycol (2.0 L) were placed into a 10 L four-necked reactor, followed by performing nitrogen bubbling for 30 minutes, then potassium hydroxide (216.9 g) was added, and the temperature was raised to an internal temperature of 55° C. while stirring. Thereafter, hydrazine monohydrate (164.5 g) was added dropwise. The mixture was heated to an internal temperature of 109° C. over 1 hour and 40 minutes, subsequently heated to an internal temperature of 129° C. over 40 minutes, and then stirred at an internal temperature of 129° C. to 146° C. for 6 hours. After cooling to room temperature, water (2 L) and concentrated hydrochloric acid (600 mL) were sequentially added dropwise, and extraction was performed with dichloromethane (3 L×2 times). The recovered organic phase was sequentially cleaned with water (2 L) and saturated brine (1 L), and then the solvent was removed to obtain a residue. The residue was purified by silica gel column chromatography (dichloromethane/hexane=1/4) to obtain 109.6 g of 2-ethylfluorene as a white solid.

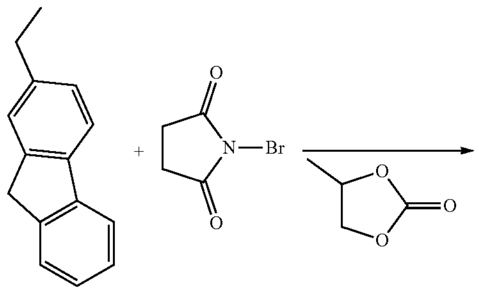

-continued

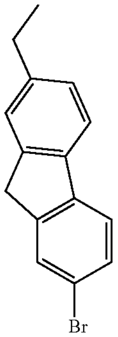

2-ethylfluorene (200.9 g) and propylene carbonate (2.5 L) were put into a 10 L four-necked reactor at room temperature, followed by performing nitrogen bubbling for 30 minutes, and then N-bromosuccinimide (191.5 g) was placed in a divided manner. Thereafter, the mixture was heated to an internal temperature of 56° C. over 35 minutes, and then stirred at an internal temperature of 56° C. to 62° C. for 2 hours and 40 minutes. After cooling to room temperature, the mixture was poured into water (6.3 L) and stirred for a while, and the precipitate was collected by filtration and cleaned with water (2.5 L×2 times). The obtained solid was purified by silica gel column chromatography (dichloromethane/hexane=1/4) to obtain 270.6 g of 2-bromo-7-ethylfluorene as a white solid.

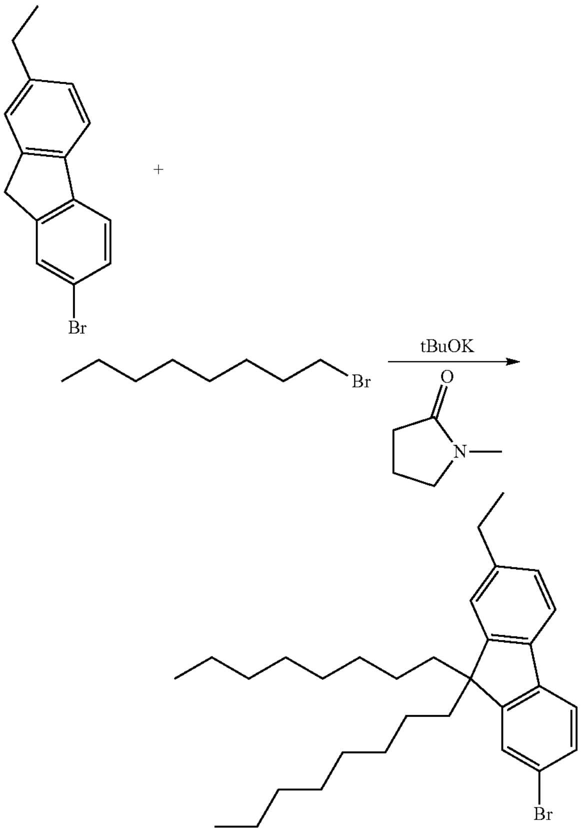

2-bromo-7-ethylfluorene (270.6 g) and N-methylpyrrolidone (6.8 L) were put into a L four-necked reactor, followed by performing nitrogen bubbling for 30 minutes, and then potassium tert-butoxide (277.9 g) was placed in a divided manner. The mixture was stirred at an internal temperature of 0.18° C. to 20° C. for 30 minutes and then cooled to an internal temperature of 10° C., 1-bromooctane (478.3 g) was added dropwise at an internal temperature of 37° C. or lower over 20 minutes, followed by stirring at an internal temperature of 30° C. to 37° C. for 2 hours. After cooling to an internal temperature of 4° C., water (7 L) was added, and extraction was performed with ethyl acetate (7 L×2 times). The combined organic phase was sequentially cleaned with water (4 L×2 times) and saturated brine (3 L), and then the solvent was removed under reduced pressure to obtain a residue. The residue was purified by silica gel column chromatography (hexane) to obtain 314.8 g of 2-bromo-7-ethyl-9,9-di(n-octyl)fluorene as a yellow oily substance.

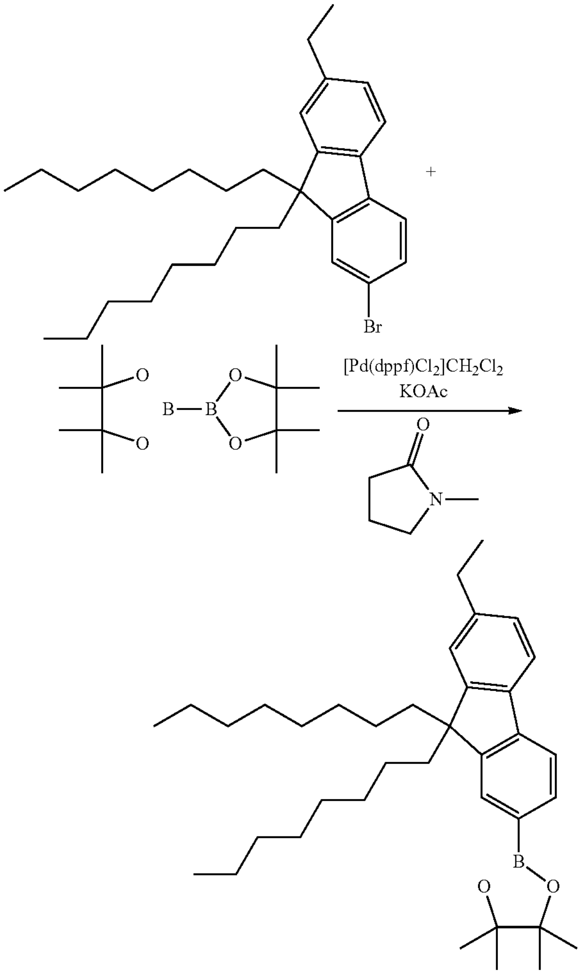

2-bromo-7-ethyl-9,9-di (n-octyl)fluorene (314.8 g) and N-methylpyrrolidone (3.1 L) were put into a 10 L four-necked reactor at room temperature, followed by stirring in an oil bath at 50° C. for 30 minutes. Thereafter, bis(pinacolato) diboron (192.8 g), potassium acetate (198.7 g), and a dichloro(1,1'-bis(diphenylphosphino)ferrocene)palladium-dichloromethane adduct (20.7 g) were added, and the internal temperature was raised to 100° C. over 1.5 hours, followed by stirring at 100° C. for 4 hours. After cooling to room temperature, ethyl acetate (3 L) and water (3 L) were added, followed by liquid separation and extraction. The oil phase was cleaned with water (2 L×2 times) and saturated brine (1 L) and then concentrated under reduced pressure to obtain a residue. The residue was purified by silica gel column chromatography (dichloromethane/hexane=1/1) to obtain 248.9 g of 2-[7-ethyl-9,9-di(n-octyl)fluorene-2-yl]-4,4,5,5-tetramethyl-1,3,2-dioxaborolane as a white solid.

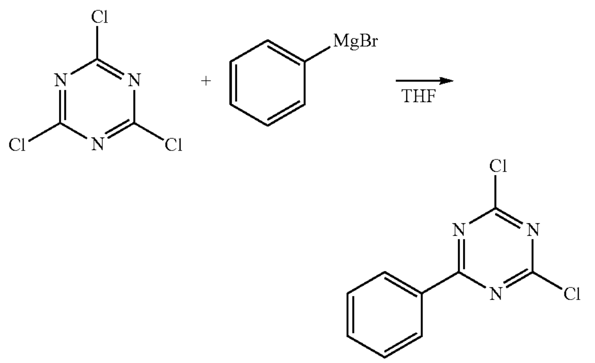

Cyanuric chloride (136.9 g) was dissolved in tetrahydrofuran (THF, 600 mL) in a 5 L four-necked reactor, and the solution was cooled to an internal temperature of −23° C. Thereafter, a 1M-phenylmagnesium bromide-THF solution (779 mL) was added dropwise over 50 minutes so as to be within an internal temperature of −23° C. to 0° C., followed by stirring overnight while gradually returning to room temperature. After cooling to an internal temperature of −20° C., 2M-hydrochloric acid (430 mL) was added dropwise over 15 minutes so as to be within an internal temperature of −20° C. to −5° C., followed by stirring for 20 minutes while returning to room temperature. After extraction is performed with ethyl acetate (1 L×2 times), washing is performed with saturated saline (500 mL×2 times), and the oil phase was concentrated under reduced pressure to obtain a residue. The residue was purified by silica gel column chromatography (dichloromethane/hexane=1/2) to obtain 117.9 g of 2,4-dichloro-6-phenyl-1,3,5-triazine as a white solid.

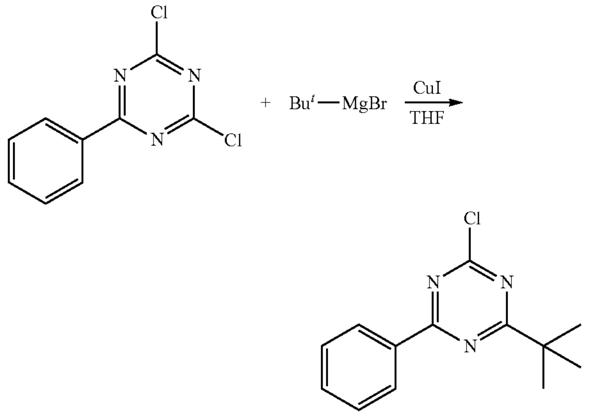

2,4-dichloro-6-phenyl-1,3,5-triazine (117.9 g) and THF (1.2 L) were put and dissolved in a 5 L four-necked reactor, and then copper (I) iodide (3.0 g) was added thereto. After cooling to an internal temperature of −35° C., a 2M-tert-butylmagnesium bromide-THF solution (261 mL) was added dropwise at an internal temperature of −35° C. to −4° C. over 15 minutes, and the internal temperature was brought to 16° C. over 1 hour. After cooling to the internal temperature of −35° C. again, a 2M-tert-butylmagnesium bromide-THF solution (78 mL) was added dropwise at an internal temperature of −35° C. to −14° C. over 15 minutes, and the internal temperature was brought to 15° C. over 30 minutes. After cooling to the internal temperature of −35° C. again, a 2M-tert-butylmagnesium bromide-THF solution (52 mL) was added dropwise at an internal temperature of −35° C. to −26° C. over 10 minutes, followed by stirring at an internal temperature of 15° C. to 20° C. for 1 hour. After cooling to thr internal temperature of −15° C., 2M-hydrochloric acid (500 mL) was added dropwise at an internal temperature of −15° C. to −6° C. over 7 minutes, followed by stirring for a while while returning to room temperature. After extraction is performed with ethyl acetate (1.5 L×2), the oil phase was cleaned with saturated brine (500 mL) and then concentrated under reduced pressure to obtain a residue. The residue was purified by silica gel column chromatography (dichloromethane/hexane=1/8) to obtain 80.6 g of 2-tert-butyl-4-chloro-6-phenyl-1,3,5-triazine as a white solid.

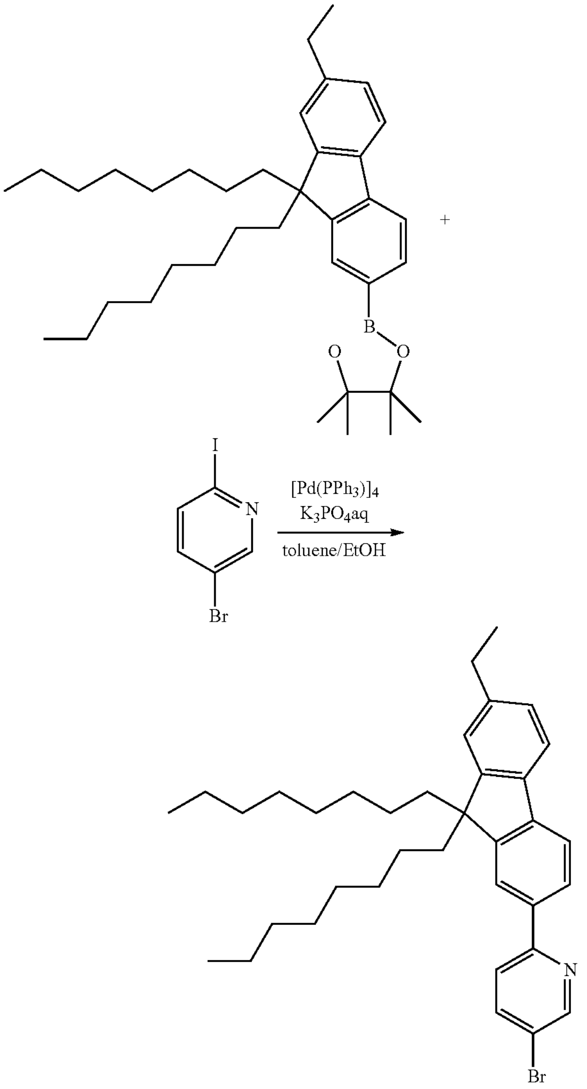

5-bromo-2-iodopyridine (10.9 g), 2-[7-ethyl-9,9-di(n-octyl)fluorene-2-yl]-4,4,5,5-tetramethyl-1,3,2-dioxaborolane (19.8 g), [tetrakis(triphenylphosphine)palladium (0)] (2.5 g), a 2M tripotassium phosphate aqueous solution (45 mL), toluene (100 mL), and ethanol (50 mL) were added into a 1 L eggplant flask, followed by stirring in an oil bath at 105° C. for 20 hours. After cooling to room temperature, the aqueous phase was removed, and the remaining liquid was concentrated under reduced pressure to obtain a residue. The residue was purified by silica gel column chromatography (neutral silica gel, ethyl acetate/hexane=1/1) to obtain 17.3 g of 2-ethyl-7-(5-bromopyridin-2-yl)-9,9-di(n-octyl)fluorene as a thin yellow solid.

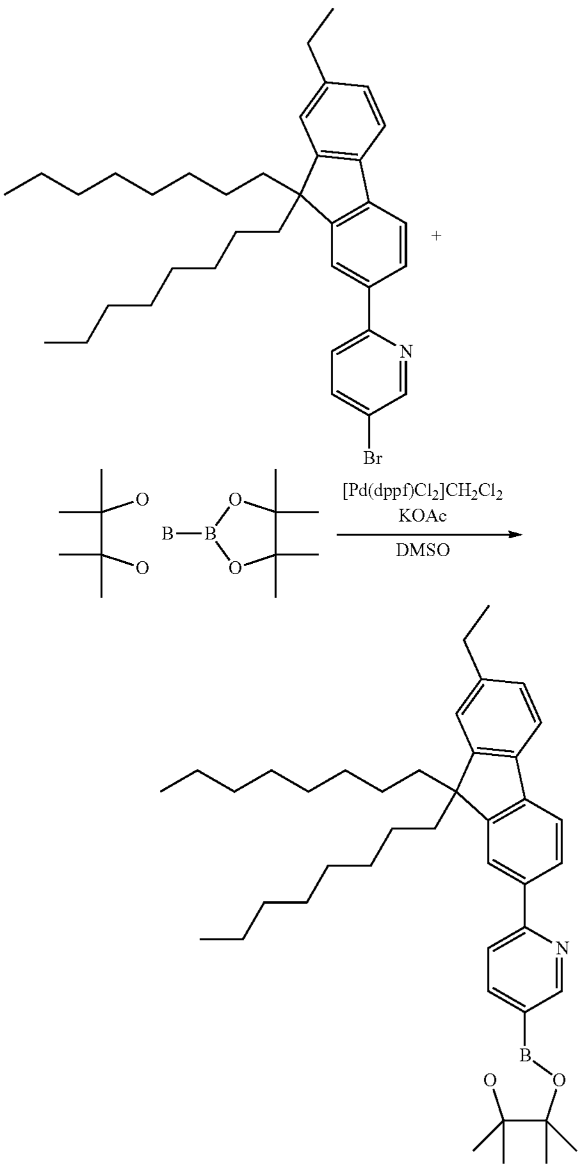

2-ethyl-7-(5-bromopyridin-2-yl)-9,9-di(n-octyl)fluorene (17.3 g), bis(pinacolato)diboron (9.1 g), potassium acetate (9.0 g), a dichloro-(1,1'-bis(diphenylphosphino)ferrocene) palladium-dichloromethane adduct (0.82 g), and dimethyl sulfoxide (100 mL) were put into a 1 L eggplant flask, followed by stirring at 90° C. for 15.5 hours. After cooling to room temperature, water (400 mL) and dichloromethane (300 mL) were added, followed by liquid separation and cleaning. The oil phase was recovered and concentrated under reduced pressure to obtain a residue. The residue was purified by silica gel column chromatography (neutral silica gel, dichloromethane/hexane=6/4 to 1/0, and subsequently ethyl acetate/dichloromethane=1/4 to 1/1) to obtain 13.3 g of 5-(4,4,5,5-tetramethyl-1,3,2-dioxaborolan-2-yl)-2-[7-ethyl-9,9-di(n-octyl)fluoren-2-yl}]pyridine as a dark brown solid.

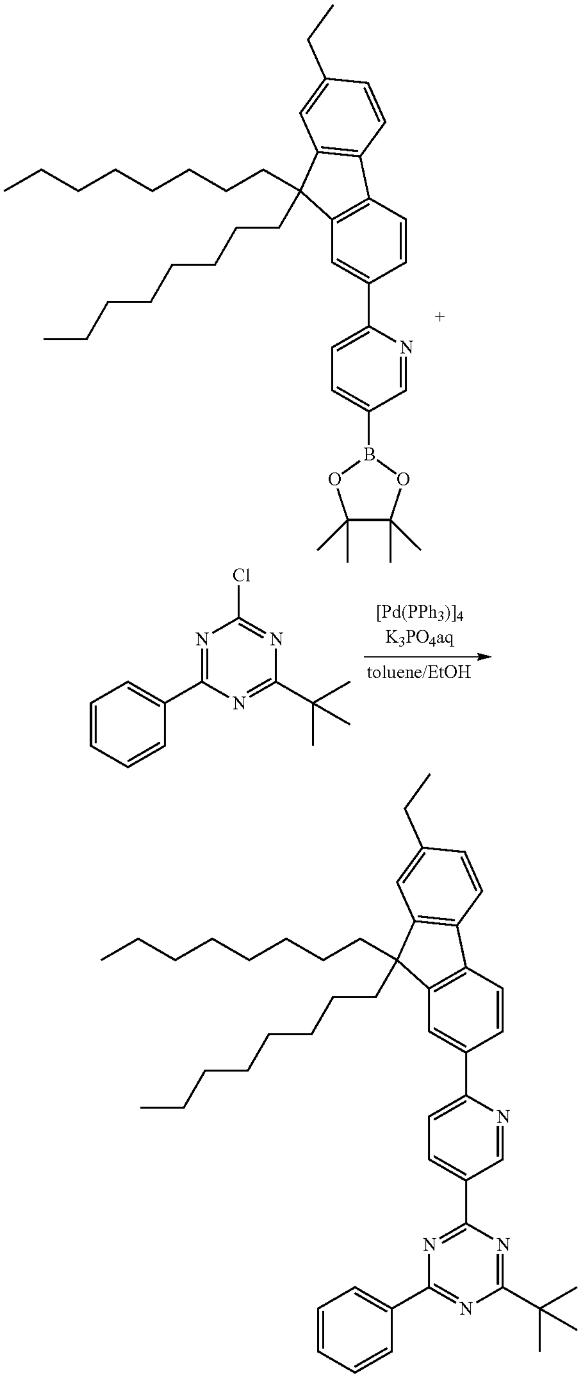

(Intermediate 3)

5-(4,4,5,5-tetramethyl-1,3,2-dioxaborolan-2-yl)-2-[7-ethyl-9,9-di(n-octyl)fluoren-2-yl]pyridine (8.6 g), 2-tert-butyl-4-chloro-6-phenyl-1,3,5-triazine (4.1 g), [tetrakis(triphenylphosphine)palladium (0)] (0.64 g), a 2M tripotassium phosphate aqueous solution (18 mL), toluene (40 mL), and tetrahydrofuran (20 mL) were added into a 300 mL eggplant flask, followed by stirring in an oil bath at 80° C. for 9 hours. After cooling to room temperature, the aqueous phase was removed, and the remaining liquid was concentrated under reduced pressure to obtain a residue. The residue was purified by silica gel column chromatography (neutral silica gel, dichloromethane/hexane=15/85 to 1/1) to obtain 6.7 g of Intermediate 3.

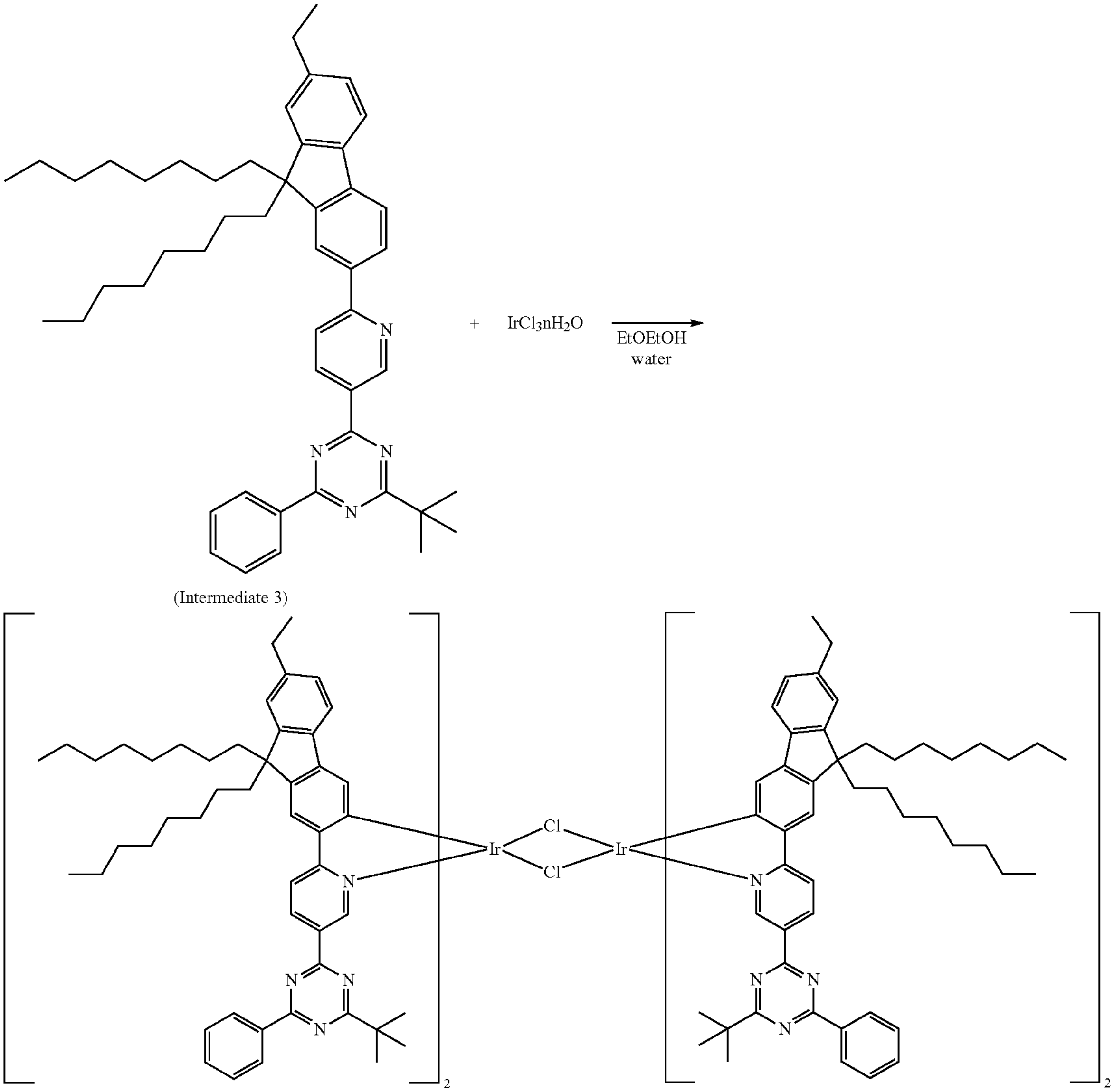

(Intermediate 3)

(Intermediate 4)

Intermediate 3 (3.8 g), iridium (III) chloride n-hydrate (0.92 g), 2-ethoxyethanol (80 mL), and water (10 mL) were added into a 200 mL eggplant flask, followed by stirring for 9 hours while being distilled in an oil bath at 145° C. The amount of the liquid extracted by distillation was 60 mL. The residue obtained by concentration under reduced pressure was purified by silica gel column chromatography (neutral.silica gel, dichloromethane/hexane=35/65) to obtain 3.4 g of Intermediate 4 as a red solid.

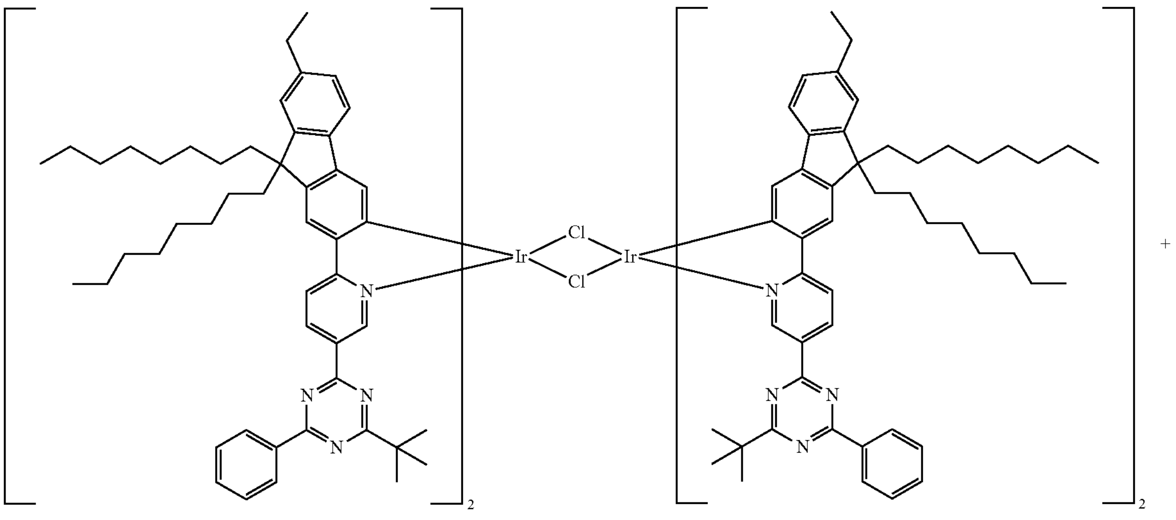

(Intermediate 4)

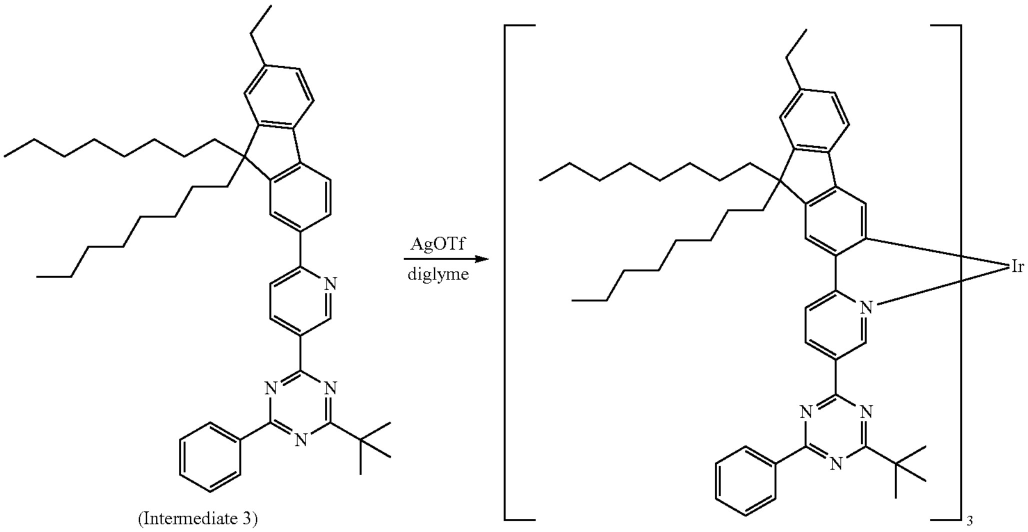

(Intermediate 3)

(Compound D-2)

Intermediate 4 (3.4 g), Intermediate 3 (3.0 g), silver (I) trifluoromethane sulfonate (0.54 g), and diglyme (11 mL) were added into a 100 mL eggplant flask, followed by stirring in an oil bath at 145° C. for 5 hours. The residue obtained by concentration under reduced pressure was purified by silica gel column chromatography (neutral silica gel, dichloromethane/hexane=4/6) to obtain 3.8 g of Compound D-2 as a red solid.

Synthesis Example 3: Synthesis of Compound D-3

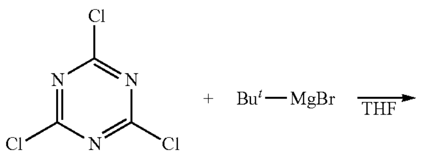

-continued

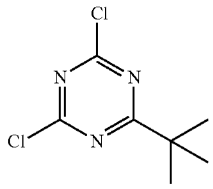

Cyanuric chloride (68.0 g) and THF (680 mL) were put and dissolved in a 3 L four-necked reactor, and then copper (I) iodide (2.1 g) was added thereto, followed by cooling to an internal temperature of −25° C. Thereafter, a 2M-tert-butylmagnesium bromido-THF solution (277 mL) was added dropwise at an internal temperature of −25° C. to −9° C. over 30 minutes, and the internal temperature was raised to 16° C. over 1 hour, followed by further stirring for 1 hour. After cooling to an internal temperature of −20° C., 2M-hydrochloric acid (430 mL) was added dropwise at an internal temperature of −20° C. to −5° C. over 15 minutes, then the temperature was returned to room temperature, extraction is performed with ethyl acetate (1 L×2 times), cleaning is performed with saturated brine (500 mL×2 times), and the oil phase was concentrated under reduced pressure to obtain a residue. The residue was purified by silica gel column chromatography (dichloromethane/hexane=1/4 to 1/2) to obtain 52.7 g of 2-tert-butyl-4,6-dichloro-1,3,5-triazine as a white solid.

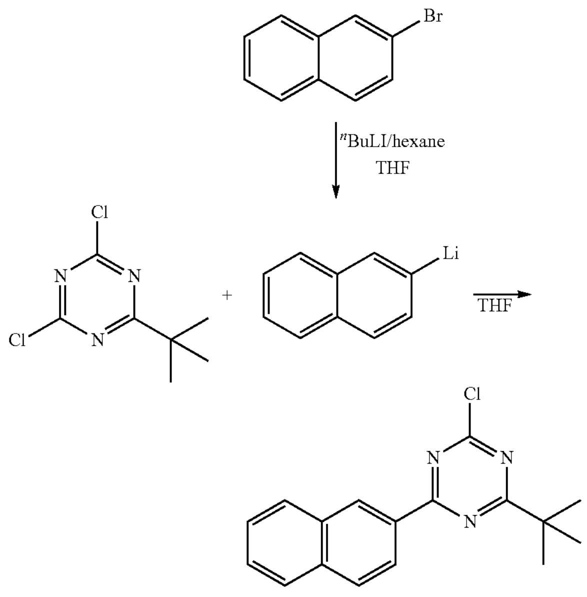

2-bromonaphthalene (55.3 g) and THF (550 mL) were put and dissolved in a 2 L four-necked reactor, and then cooled to an internal temperature of −74° C., and then a 1.6M-n-butyllithium-n-hexane solution (182 mL) was added dropwise at an internal temperature of −74° C. to −65° C. over 35 minutes, followed by further stirring for 1 hour. 2-tert-butyl-4,6-dichloro-1,3,5-triazine (50.0 g) and THF (500 mL) was put into another 3 L four-necked reactor and cooled to an internal temperature of −85° C., and then the lithiated solution prepared above was transferred at an internal temperature of −85° C. to 75° C. over 30 minutes. Thereafter, the internal temperature was raised to 0° C. over 2 hours while stirring. Water (600 mL) was added, followed by extraction with hexane (600 mL×2 times), and the combined oil phase was cleaned with water (500 mL) and saturated brine (500 mL) and then concentrated under reduced pressure to obtain a residue. The residue was purified by silica gel column chromatography (dichloromethane/hexane=1/9 to 1/4) to obtain 48.4 g of 2-tert-butyl-4-chloro-6-(2-naphthyl)-1,3,5-triazine as a white solid.

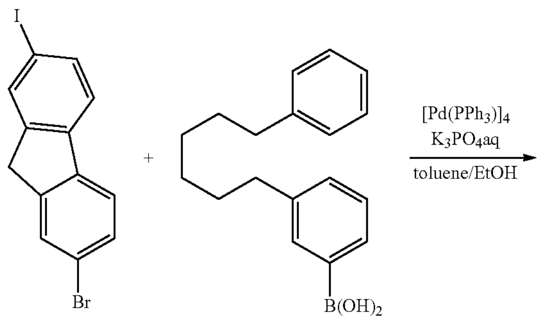

-continued

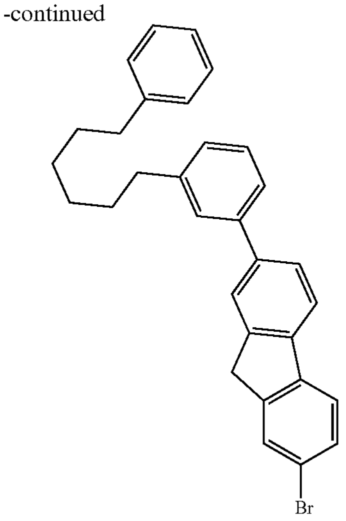

2-bromo-7-iodofluorene (manufactured by Tokyo Chemical Industry Co., Ltd., 46.3 g), 3-(6-phenyl-n-hexyl)phenylboronic acid (35.5 g), [tetrakis(triphenylphosphine)palladium (0)] (5.4 g), a 2M tripotassium phosphate aqueous solution (150 mL), toluene (300 mL), and ethanol (100 mL) were added into a 1 L eggplant flask, followed by stirring while refluxing in an oil bath at 105° C. for 3 hours. After cooling to room temperature, the aqueous phase was removed, and the remaining liquid was concentrated under reduced pressure to obtain a residue. The residue was purified by silica gel column chromatography (neutral silica gel, dichloromethane/hexane=15/85 to 2/8) to obtain 51.3 g of 2-bromo-7-{3-(6-phenyl-n-hexyl)phenyl}fluorene as a white solid.

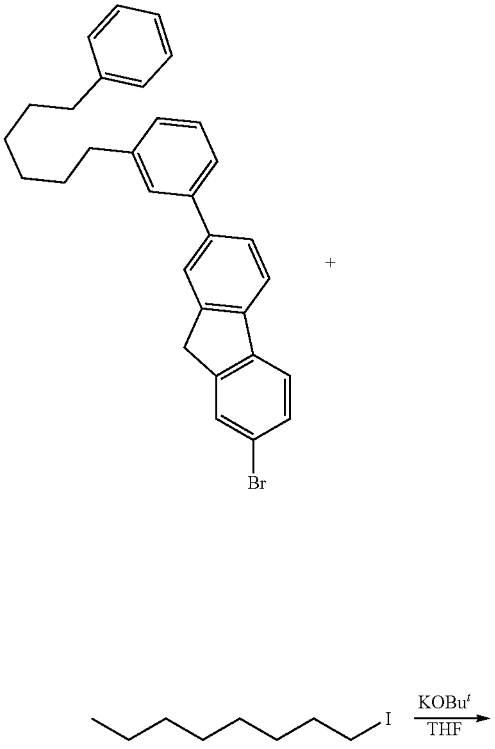

-continued

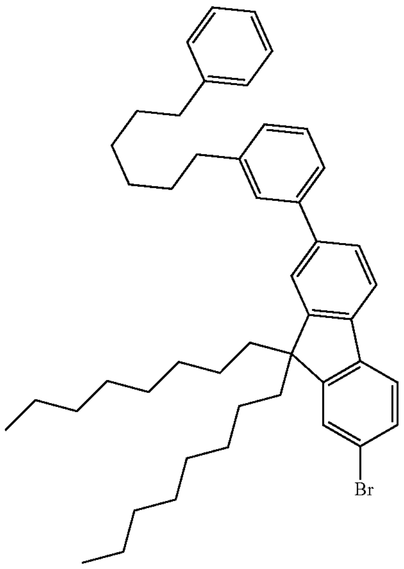

2-bromo-7-{3-(6-phenyl-n-hexyl)phenyl}fluorene (25.6 g) and dehydrated tetrahydrofuran (380 mL) were put into a 1 L eggplant flask, tert-butoxypotassium (13.4 g) was placed while cooling in an ice water bath, and then 1-iodo-n-octane (38.3 g) was added dropwise over 15 minutes. The mixture was removed from the ice water bath and stirred in an oil bath at 40° C. for 95 minutes. The solvent was distilled off under reduced pressure, and water (150 mL) and ethyl acetate (300 mL) were added, followed by liquid separation and cleaning. The oil phase was recovered and concentrated under reduced pressure to obtain a residue. The residue was purified by silica gel column chromatography (neutral silica gel, dichloromethane/hexane=8/2 to 7/3) to obtain 22.5 g of 2-bromo-7-{3-(6-phenyl-n-hexyl)phenyl}-9,9-di(n-octyl) fluorene as a thin yellow oily substance.

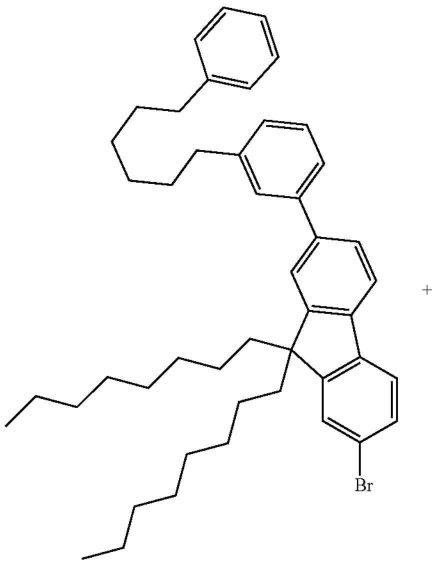

+

-continued

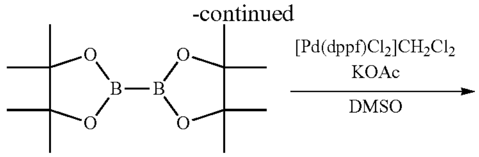

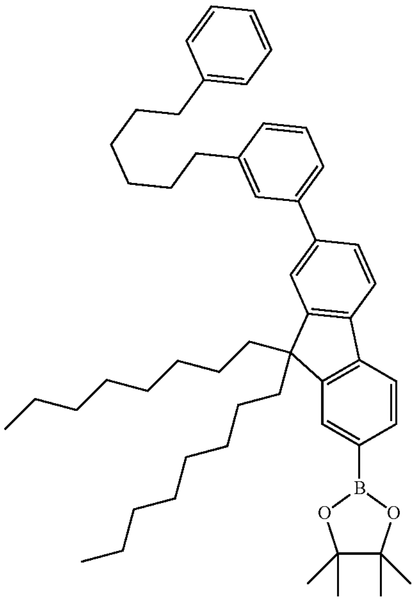

2-bromo-7-{3-(6-phenyl-n-hexyl) phenyl}-9,9-di(n-octyl)fluorene (22.5 g), bis(pinacolato)diboron (9.5 g), potassium acetate (9.3 g), a dichloro-(1,1'-bis(diphenylphosphino)ferrocene)palladium-dichloromethane adduct (0.79 g), and dimethyl sulfoxide (200 mL) were put into a 500 mL eggplant flask, followed by stirring at 90° C. for 8 hours. After cooling to room temperature, bis(pinacolato)diboron (4.6 g), potassium acetate (4.8 g), and a dichloro(1,1'-bis(diphenylphosphino)ferrocene)palladium-dichloromethane adduct (0.79 g) were further added, followed by further stirring in an oil bath at 90° C. for 5 hours. Thereafter, the mixture was cooled to room temperature, and water (200 mL) and dichloromethane (200 mL) were added, followed by liquid separation and cleaning. The oil phase was recovered and concentrated under reduced pressure to obtain a residue. The residue was purified by silica gel column chromatography (neutral silica gel, dichloromethane/hexane=3/7) to obtain 19.5 g of 2-[7-{3-(6-phenyl-n-hexyl) phenyl}-9,9-di(n-octyl)fluorene-2-yl]-4,4,5,5-tetramethyl-1,3,2-dioxaborolane as a light yellow oily substance.

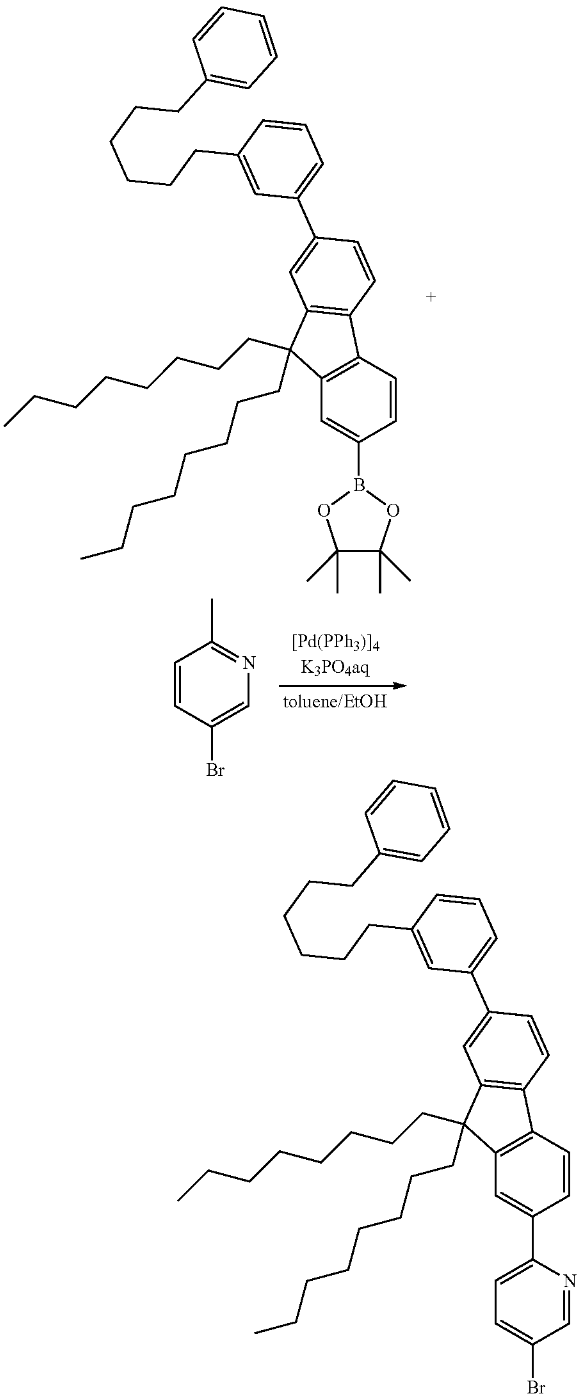

5-bromo-2-iodopyridine (9.1 g), 2-[9,9-di(n-octyl)-7-{3-(6-phenyl-n-hexyl)phenyl}fluorene-2-yl]-4,4,5,5-tetramethyl-1,3,2-dioxaborolane (19.5 g), [tetrakis(triphenylphosphine)palladium (0)] (1.5 g), a 2M tripotassium phosphate aqueous solution (31 mL), toluene (80 mL), and ethanol (40 mL) were added into a 1 L eggplant flask, followed by stirring in an oil bath at 105° C. for 7 hours. After cooling to room temperature, the aqueous phase was removed, and the remaining liquid was concentrated under reduced pressure to obtain a residue. The residue was purified by silica gel column chromatography (neutral silica gel, ethyl acetate/hexane=1/9) to obtain 15.7 g of 9,9-di(n-octyl)-2-{3-(6-phenyl-n-hexyl) phenyl}-7-(5-bromopyridin-2-yl)fluorene as a light yellow solid.

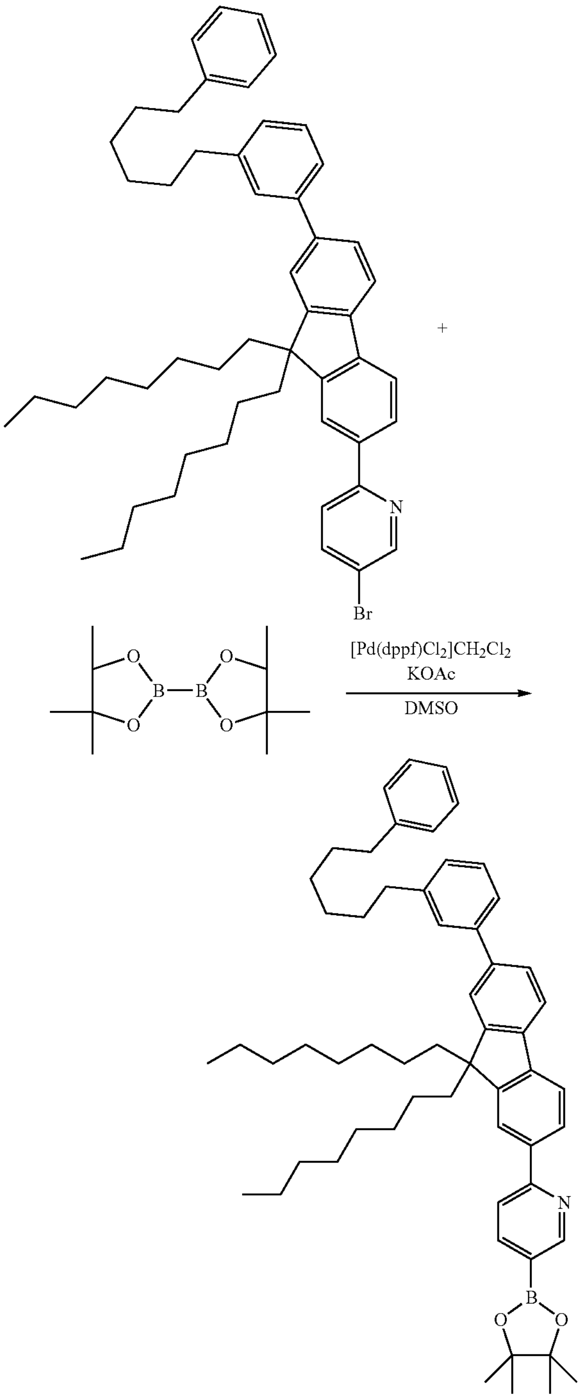

9,9-di(n-octyl)-2-{3-(6-phenyl-n-hexyl)phenyl}-7-(5-bromopyridin-2-yl)fluorene (15.7 g), bis(pinacolato)diboron (6.0 g), potassium acetate (6.0 g), a dichloro-(1,1'-bis(diphenylphosphino)ferrocene)palladium-dichloromethane adduct (0.50 g), and dimethyl sulfoxide (100 mL) were put into a 1 L eggplant flask, followed by stirring at 90° C. for 5 hours. Thereafter, bis(pinacolato)diboron (4.8 g), potassium acetate (3.0 g), and a dichloro(1,1'-bis(diphenylphosphino)ferrocene)palladium-dichloromethane adduct (0.92 g) were added, followed by stirring at 90° C. for 5 hours. After cooling to room temperature, water (200 mL) and dichloromethane (200 mL) were added, followed by liquid separation and cleaning. The oil phase was recovered and concentrated under reduced pressure to obtain a residue. The residue was purified by silica gel column chromatography (neutral silica gel, dichloromethane/hexane=3/7 to 6/4, and subsequently ethyl acetate/hexane=1/9 to 1/0) to obtain 14.1 g of 5-(4,4,5,5-tetramethyl-1,3,2-dioxaborolan-2-yl)-2-[9,9-di(n-octyl)-7-{3-(6-phenyl-n-hexyl)phenylfluoren-2-yl}]pyridine as a light yellow oily substance.

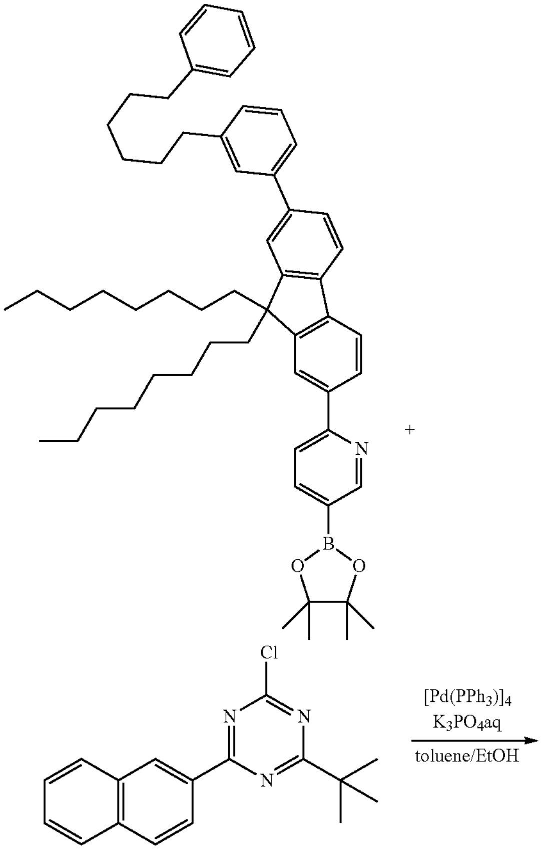

-continued

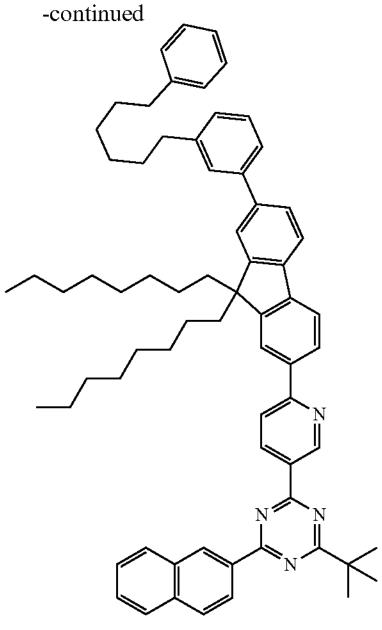

(Intermediate 5)

5-(4,4,5,5-tetramethyl-1,3,2-dioxaborolan-2-yl)-2-9,9-di(n-octyl)-7-{3-(6-phenyl-n-hexyl)phenylfluoren-2-yl}]pyridine (8.9 g), 2-tert-butyl-4-chloro-6-p-naphthyl-1,3,5-triazine (3.9 g), [tetrakis(triphenylphosphine)palladium (0)] (0.50 g), a 2M tripotassium phosphate aqueous solution (13 mL), toluene (40 mL), and ethanol (20 mL) were added into a 1 L eggplant flask, followed by stirring in an oil bath at 105° C. for 14 hours. After cooling to room temperature, the aqueous phase was removed, and the remaining liquid was concentrated under reduced pressure to obtain a residue. The residue was purified by silica gel column chromatography (neutral silica gel, dichloromethane/hexane=3/7 to 1/1) to obtain 8.0 g of Intermediate 5.

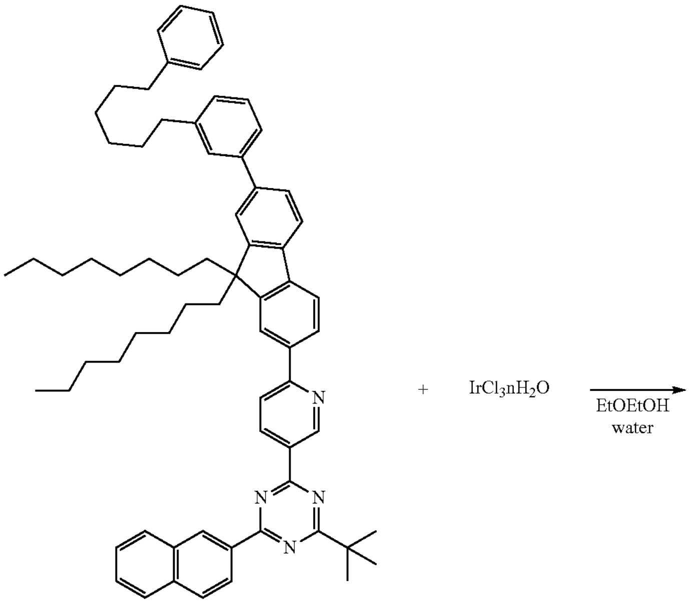

(Intermediate 5)

-continued

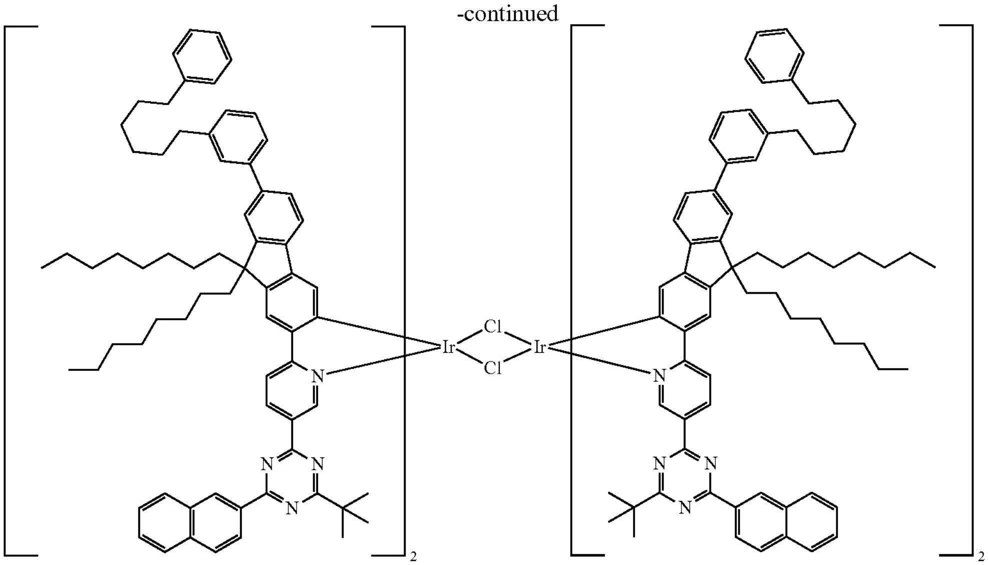

(Intermediate 6)

Intermediate 5 (4.8 g), iridium (III) chloride n-hydrate (0.82 g), 2-ethoxyethanol (40 mL), and water (10 mL) were added into a 100 mL eggplant flask, followed by stirring for 6.5 hours while being distilled in an oil bath at 135° C. to 145° C. The amount of the liquid extracted by distillation was 36 mL. The residue obtained by concentration under reduced pressure was purified by silica gel column chromatography (neutral silica gel, dichloromethane/hexane=3/7 to 1/1) to obtain 4.1 g of Intermediate 6 as a red solid.

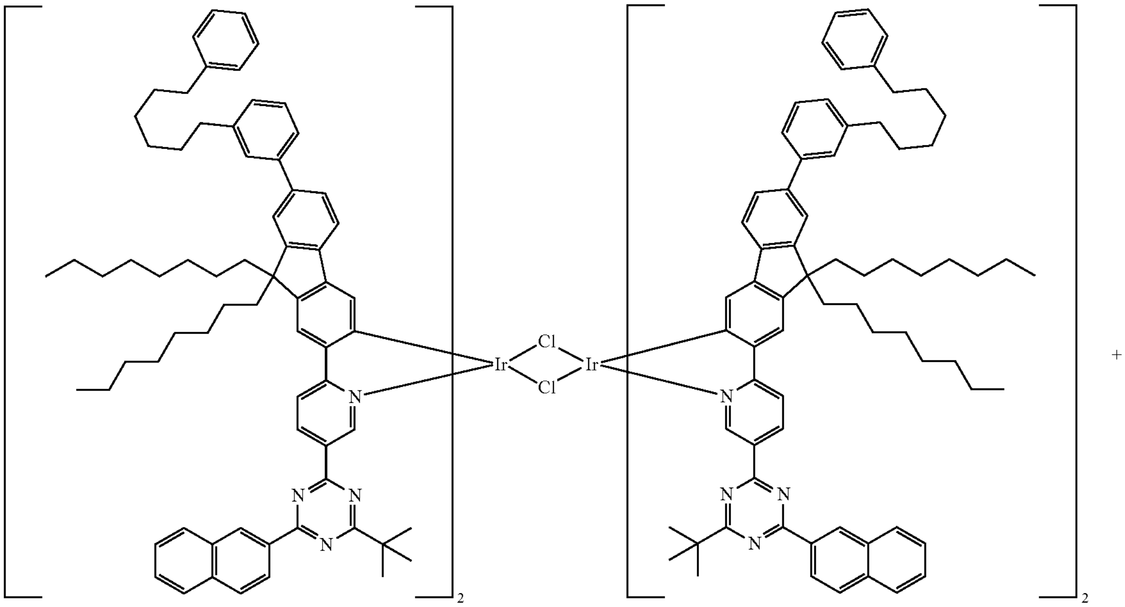

(Intermediate 6)

-continued

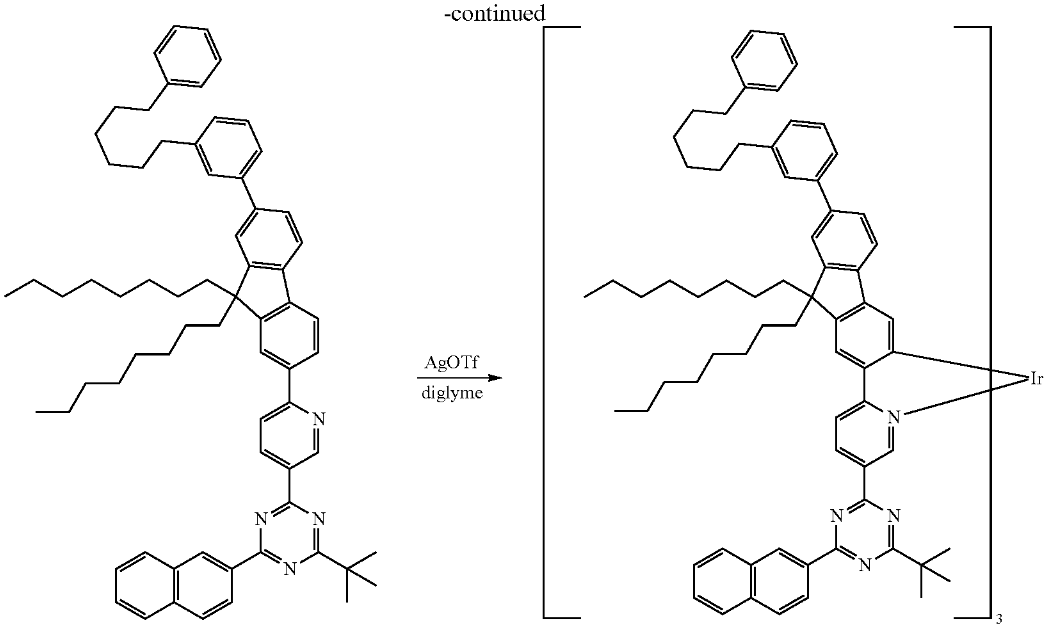

(Intermediate 5)

(Compound D-3)

Intermediate 6 (4.1 g), Intermediate 5 (3.6 g), silver (I) trifluoromethane sulfonate (0.50 g), and diglyme (14 mL) were added into a 100 mL eggplant flask, followed by stirring in an oil bath at 145° C. for 8 hours. The residue obtained by concentration under reduced pressure was purified by silica gel column chromatography (neutral silica gel, dichloromethane/hexane=2/8) to obtain 5.2 g of Compound D-3 as a red solid.

Synthesis Example 4: Synthesis of Compound D-4

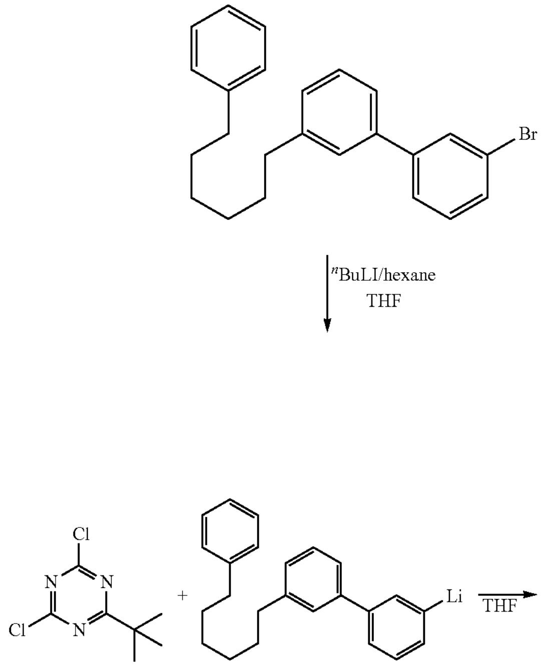

-continued

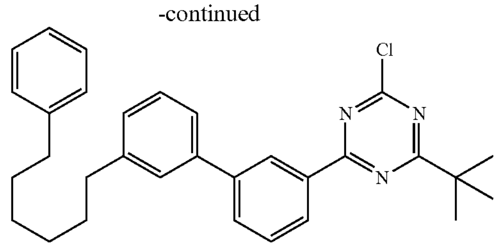

3-bromo-3'-(6-phenyl-n-hexyl)-1,1'-biphenyl (38.2 g, synthesized by a method described in International Publication WO 2016/194784) and THF (380 mL) were put and dissolved in a 2 L four-neck reactor and then cooled to an internal temperature of −76° C., and a 1.6M-n-butyllithium-n-hexane solution (64 mL) was added dropwise at an internal temperature of −76° C. to −66° C. over 30 minutes, followed by further stirring for 1 hour. 2-tert-butyl-4,6-dichloro-1,3,5-triazine (20.0 g) and THF (300 mL) were placed in another 2 L four-necked reactor and cooled to an internal temperature of −85° C., and then the lithiated solution prepared above was transferred thereto at an internal temperature of −85° C. to −80° C. over 20 minutes. Further, the internal temperature was raised to 6° C. over 2 hours while stirring. Water (300 mL) was added dropwise, followed by extraction with ethyl acetate (350 mL×2 times), and then the combined oil phase was sequentially cleaned with water (200 mL) and saturated brine (100 mL), and concentrated under reduced pressure to obtain a residue. The residue was purified by silica gel column chromatography (dichloromethane/hexane=1/4 to 1/2) to obtain 17.9 g of 2-tert-butyl-4-chloro-6-{3'-(6-phenyl-n-hexyl)-1,1'-biphenyl-3-yl}-1,3,5-triazine as a colorless oily substance.

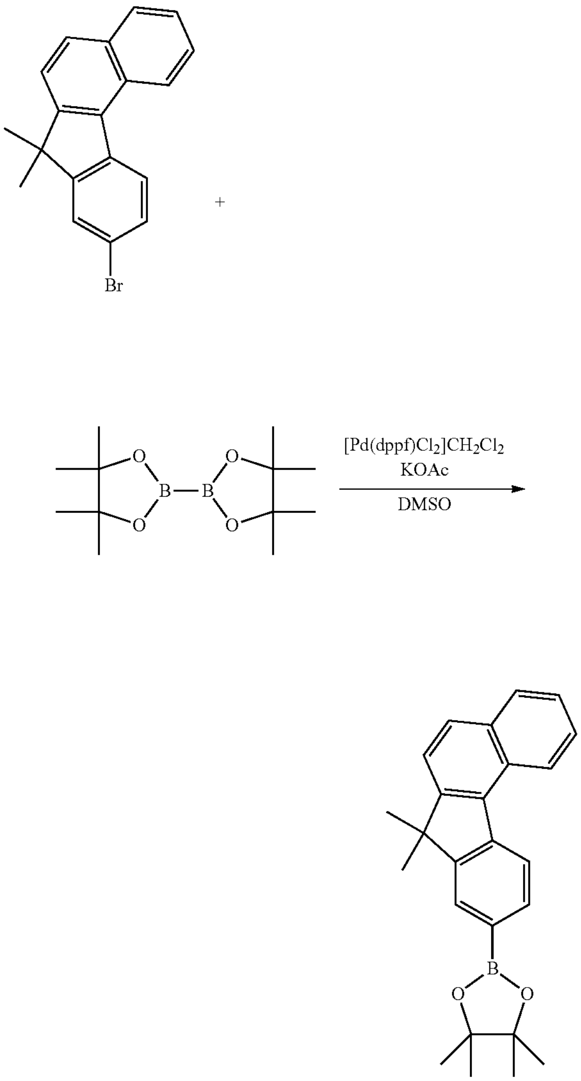

9-bromo-7,7-dimethyl-7H-benzo[c]fluorene (7.3 g, manufactured by Tokyo Chemical Industry Co., Ltd.), bis (pinacolato)diboron (6.6 g), potassium acetate (6.7 g), a dichloro(1,1'-bis(diphenylphosphino)ferrocene)palladium-dichloromethane adduct (0.60 g), and dimethyl sulfoxide (55 mL) were put into a 100 mL eggplant flask, followed by stirring at 90° C. for 3 hours. Thereafter, the mixture was cooled to room temperature, and water (300 mL) and dichloromethane (200 mL) were added thereto, followed by liquid separation and cleaning. The oil phase was recovered, magnesium sulfate was added thereto, and the mixture was dried and then concentrated under reduced pressure to obtain a residue. The residue was purified by silica gel column chromatography (neutral silica gel, ethyl acetate/hexane=15/85) to obtain 7.4 g of 2-(7,7-dimethyl-7H-benzo[c]fluorene-9-yl)-4,4,5,5-tetramethyl-1,3,2-dioxaborolane as a white amorphous solid.

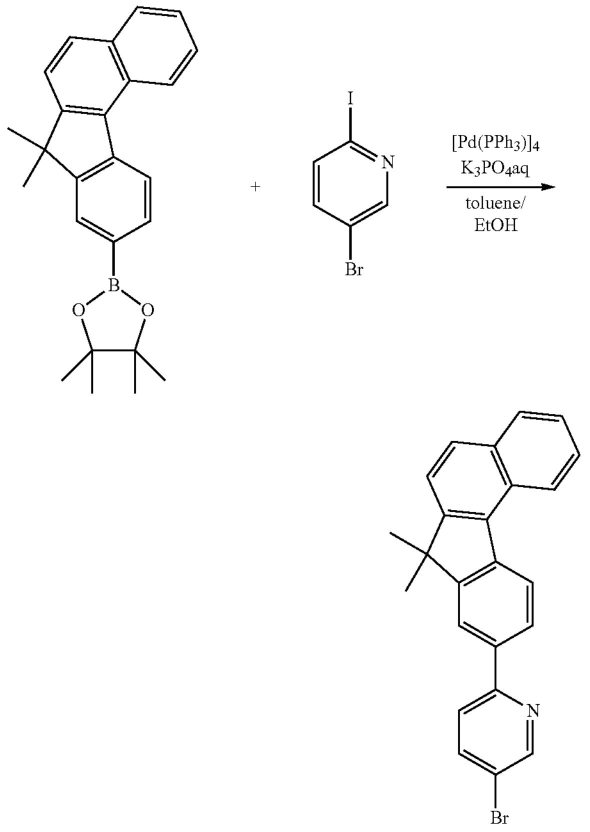

2-(7,7-dimethyl-7H-benzo[c]fluorene-9-yl)-4,4,5,5-tetramethyl-1,3,2-dioxaborolane (7.4 g), 5-bromo-2-iodopyridine (6.3 g), [tetrakis(triphenylphosphine)palladium (0)] (0.80 g), a 2M tripotassium phosphate aqueous solution (30 mL), toluene (40 mL), and ethanol (20 mL) were added into a 1 L eggplant flask, followed by stirring in an oil bath at 105° C. for 17 hours. After cooling to room temperature, the aqueous phase was removed, and the remaining liquid was concentrated under reduced pressure to obtain a residue. The residue was purified by silica gel column chromatography (neutral silica gel, dichloromethane/hexane=3/7) to obtain 7.9 g of 5-bromo-2-(7,7-dimethyl-7H-benzo[c]fluoren-9-yl) pyridine as a white solid.

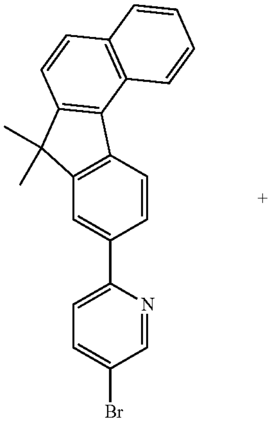

-continued

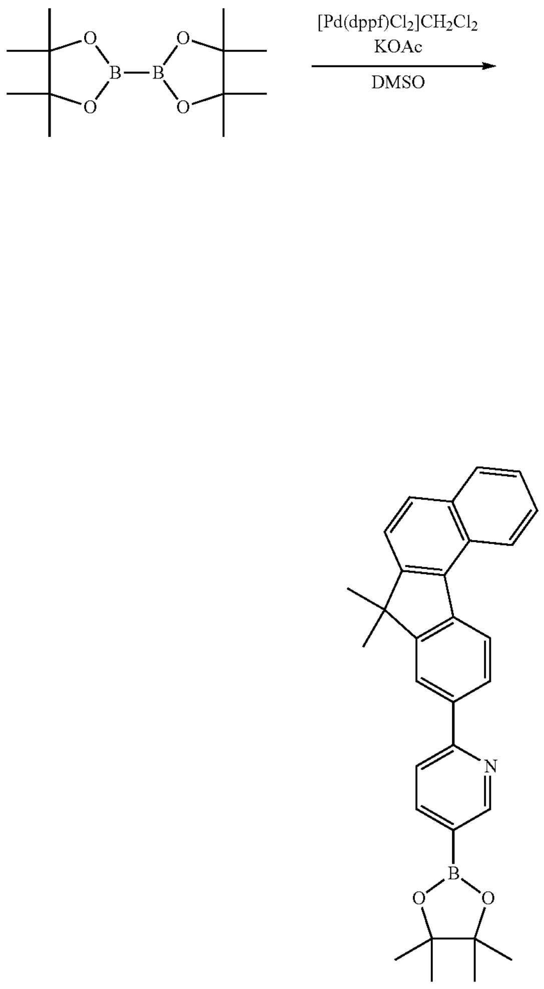

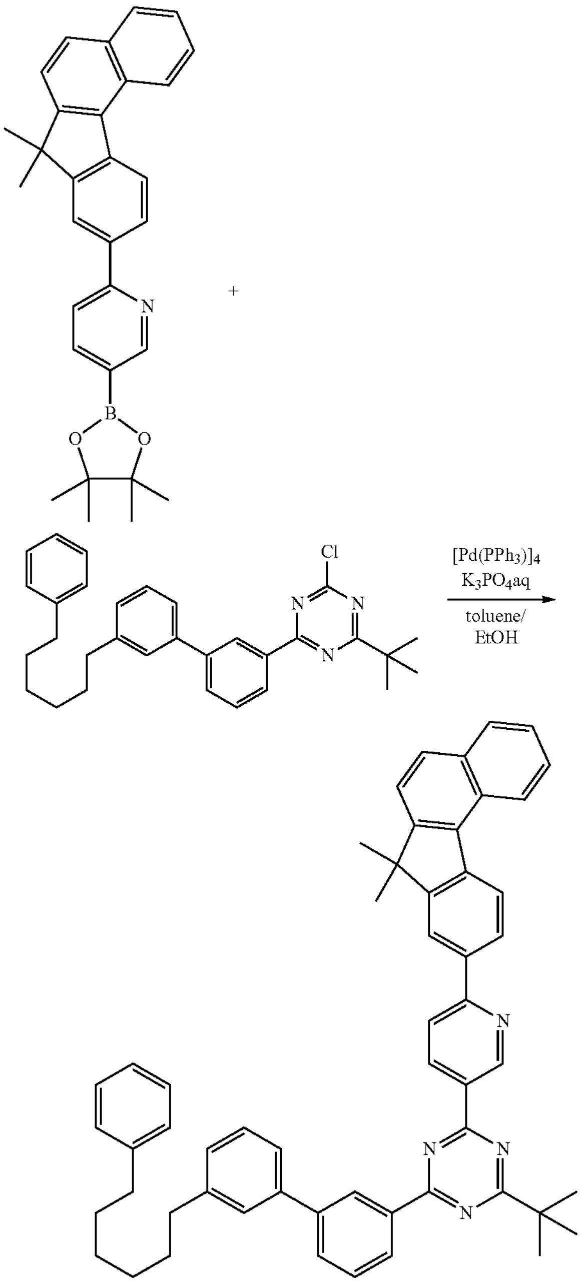

(Intermediate 7)

5-bromo-2-(7,7-dimethyl-7H-benzo[c]fluorene-9-yl) pyridine (7.9 g), bis(pinacolato)diboron (5.9 g), potassium acetate (6.8 g), a dichloro-(1,1'-bis(diphenylphosphino)ferrocene)palladium-dichloromethane adduct (0.74 g), and dimethyl sulfoxide (90 mL) were put into a 1 L eggplant flask, followed by stirring in an oil bath at 90° C. for 10 hours. After once cooling to room temperature, bis(pinacolato)diboron (1.2 g) and a dichloro(1,1'-bis(diphenylphosphino)ferrocene)palladium-dichloromethane adduct (0.22 g) were added thereto, followed by further stirring at 90° C. for 5.5 hours. After cooling to room temperature, water (300 mL) and dichloromethane (100 mL) were added, followed by liquid separation and cleaning. The oil phase was recovered and concentrated under reduced pressure to obtain a residue. The residue was purified by silica gel column chromatography (neutral silica gel, ethyl acetate/hexane=1/4 to 4/6) to obtain 2.8 g of 2-(7,7-dimethyl-7H-benzo[c] fluorene-9-yl)-5-(4,4,5,5-tetramethyl-1,3,2-dioxaborolan-2-yl)pyridine as a brown oily substance.

2-(7,7-dimethyl-7H-benzo[c]fluorene-9-yl)-5-(4,4,5,5-tetramethyl-1,3,2-dioxaborolan-2-yl)pyridine (2.8 g), 2-tert-butyl-4-chloro-6-{3'-(6-phenyl-n-hexyl)-1,1'-biphenyl-3-yl}-1,3,5-triazine (5.0 g), [tetrakis(triphenylphosphine) palladium (0)] (0.45 g), a 2M tripotassium phosphate aqueous solution (15 mL), toluene (30 mL), and ethanol (30 mL) were added into a 1 L eggplant flask, followed by stirring in an oil bath at 105° C. for 4 hours. After cooling to room temperature, the aqueous phase was removed, and the remaining liquid was concentrated under reduced pressure to obtain a residue. The residue was purified by silica gel column chromatography (neutral silica gel, dichloromethane/hexane=1/1) to obtain 2.8 g of Intermediate 7 as a yellow amorphous solid.

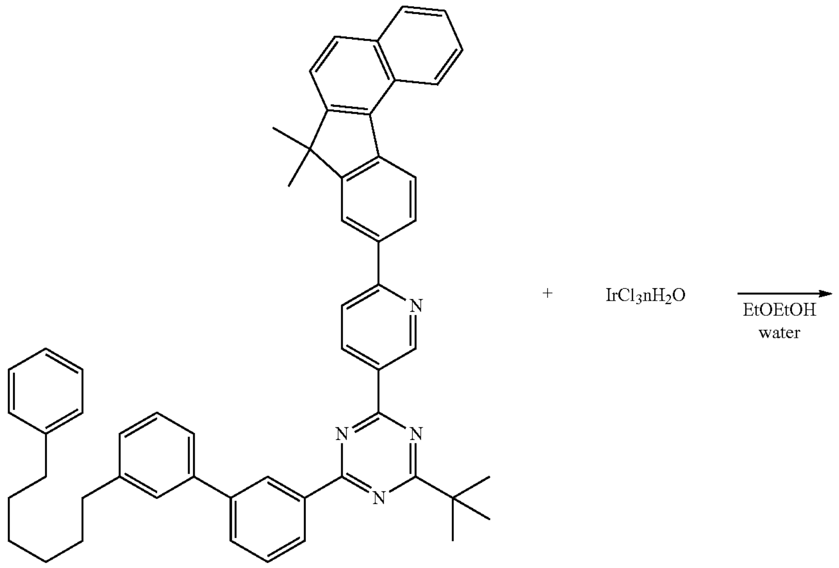

(Intermediate 7)

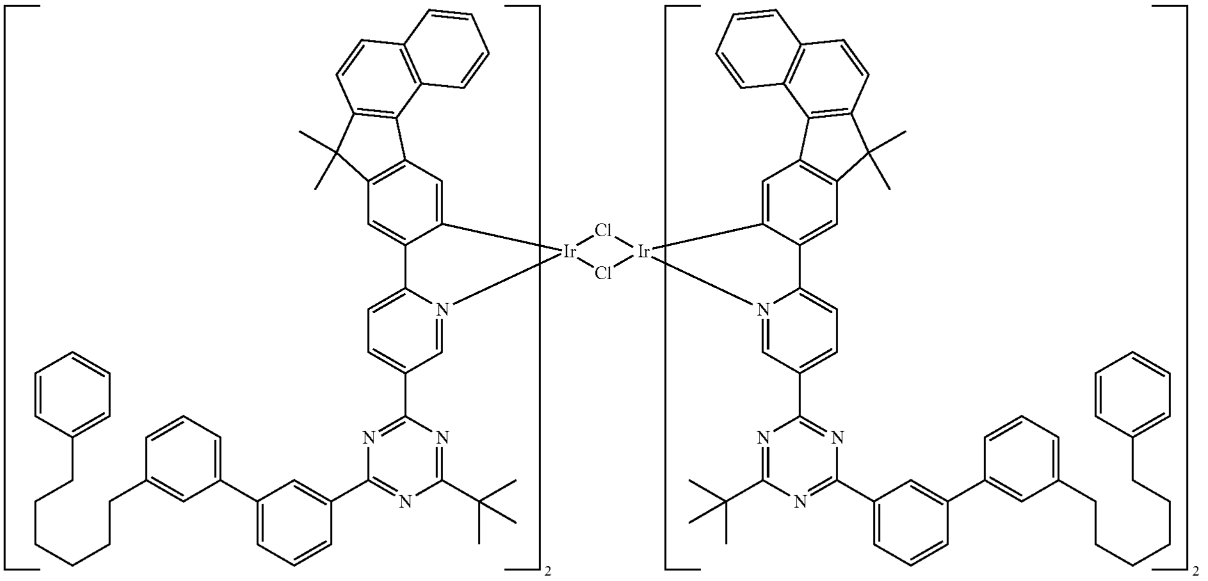

(Intermediate 8)

Intermediate 7 (1.5 g), iridium (III) chloride n-hydrate (0.34 g), 2-ethoxyethanol (26 mL), and water (6 mL) were added into a 100 mL eggplant flask, followed by stirring for 10 hours while being distilled in an oil bath at 135° C. to 145° C. After 3.5 hours during the reaction, 20 mL of 2-ethoxyethanol was added. Finally, the amount of the liquid extracted by distillation was 30 mL. After the completion of the reaction, the residue obtained by concentration under reduced pressure was purified by silica gel column chromatography (neutral silica gel, dichloromethane/hexane=1/1) to obtain 1.53 g of Intermediate 8 as a red solid.

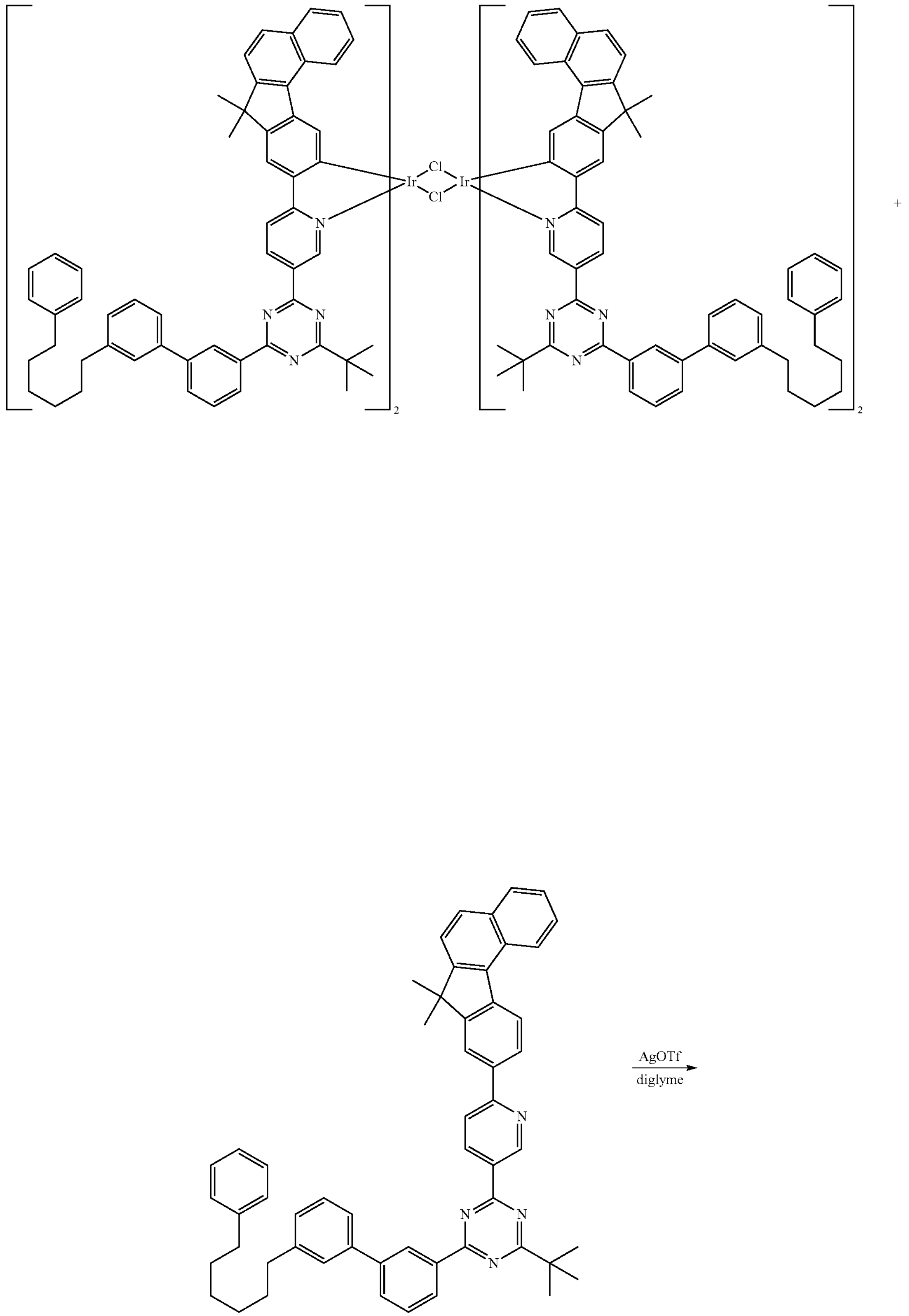
AgOTf
diglyme

-continued

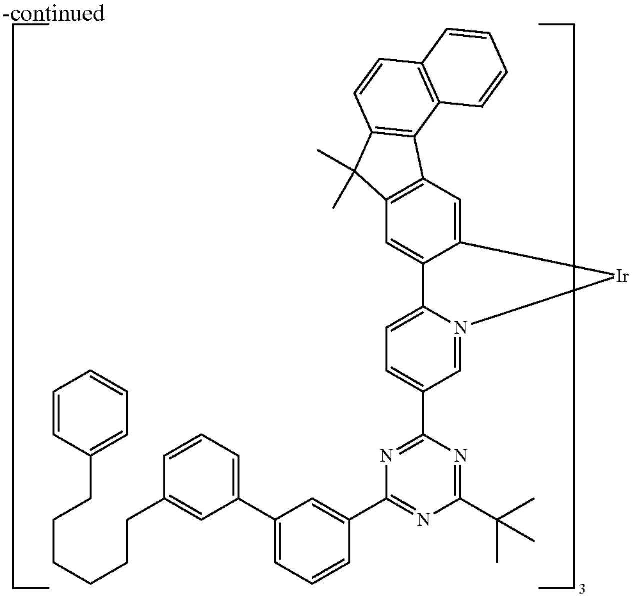

(Compound D-4)

Intermediate 8 (1.5 g), Intermediate 7 (1.2 g), silver (I) trifluoromethane sulfonate (0.28 g), and diglyme (5 mL) were added into a 100 mL eggplant flask, followed by stirring in an oil bath at 145° C. for 2.5 hours. The residue obtained by concentration under reduced pressure was purified by silica gel column chromatography (neutral silica gel, dichloromethane/hexane=2/8) to obtain 1.4 g of Compound D-4 as a red solid.

Synthesis Example 5: Synthesis of Compound D-5

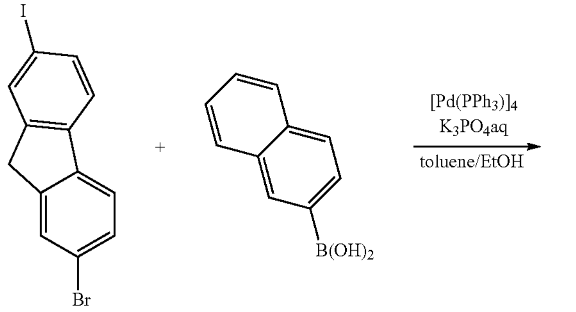

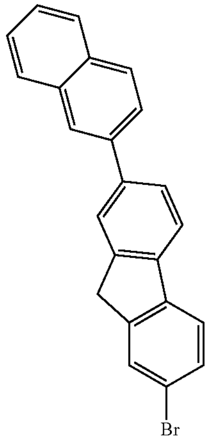

2-bromo-7-iodofluorene (manufactured by Tokyo Chemical Industry Co., Ltd., 26.2 g), 2-naphthylboronic acid (12.7 g), [tetrakis(triphenylphosphine)palladium (0)] (1.4 g), a 2M tripotassium phosphate aqueous solution (95 mL), toluene (100 mL), and ethanol (40 mL) were added into a 1 L eggplant flask, followed by stirring while refluxing in an oil bath at 105° C. for 5.5 hours. After cooling to room temperature, the aqueous phase was removed, methanol (200 mL) was added to the remaining liquid, and the precipitated solid was collected by filtration, cleaned by shaking methanol (100 mL), and dried to obtain 24.3 g of 2-bromo-7-(2-naphthyl)fluorene as a white solid.

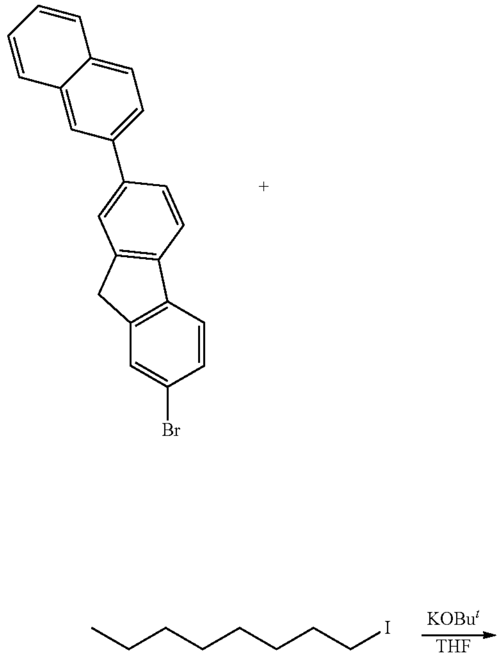

-continued

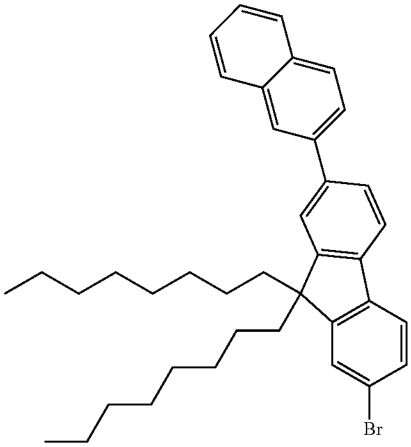

2-bromo-7-(2-naphthyl)fluorene (9.4 g), 1-iodo-n-octane (15 mL), and dehydrated tetrahydrofuran (65 mL) were put into a 300 mL eggplant flask, tert-butoxypotassium (8.6 g) was added thereto while cooling in an ice water bath, and then the mixture was removed from the ice water bath and stirred in an oil bath at 40° C. for 5 hours. The solvent was distilled off under reduced pressure to obtain a residue. The residue was purified by silica gel column chromatography (neutral silica gel, dichloromethane/hexane=15/85) to obtain 12.9 g of 2-bromo-7-(2-naphthyl)-9,9-di(n-octyl)fluorene as a yellow-green solid.

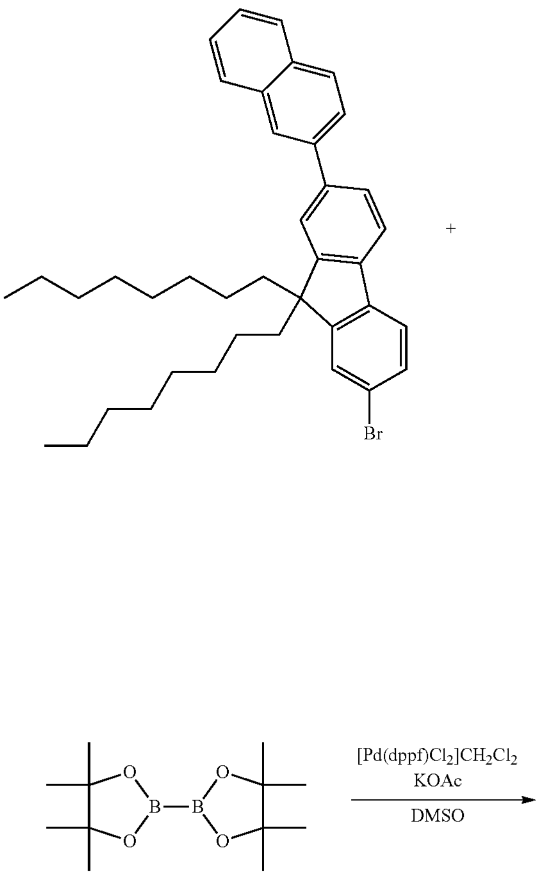

-continued

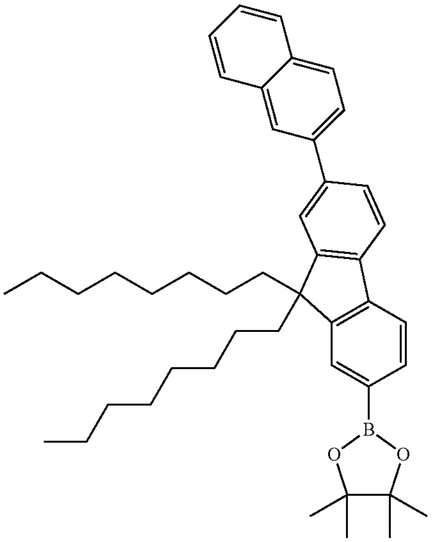

2-bromo-7-(2-naphthyl)-9,9-di(n-octyl)fluorene (12.9 g), bis(pinacolato)diboron (7.0 g), potassium acetate (6.5 g), a dichloro-(1,1'-bis(diphenylphosphino)ferrocene)palladium-dichloromethane adduct (0.67 g), and dimethyl sulfoxide (80 mL) were put into a 1 L eggplant flask, followed by stirring in an oil bath at 90° C. for 2.5 hours. 1,4-dioxane (20 mL) was added, followed by further stirring for 1 hour. Bis (pinacolato)diboron (3.5 g), potassium acetate (3.6 g), and a dichloro(1,1'-bis(diphenylphosphino)ferrocene)palladium-dichloromethane adduct (0.27 g) were added, followed by further stirring for 3.5 hours. After cooling to room temperature, water (200 mL) and dichloromethane (100 mL×3) were added, followed by liquid separation and cleaning. The oil phase was recovered and concentrated under reduced pressure to obtain a residue. The residue was purified by silica gel column chromatography (neutral silica gel, ethyl acetate/hexane=1/4 to 4/6) to obtain 7.4 g of 7-(2-naphthyl)-9,9-di(n-octyl)-2-(4,4,5,5-tetramethyl-1,3,2-dioxaborolan-2-yl)fluorene as a light yellow oily substance.

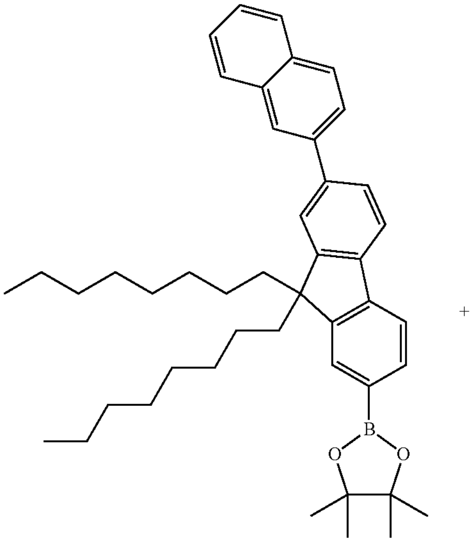

-continued

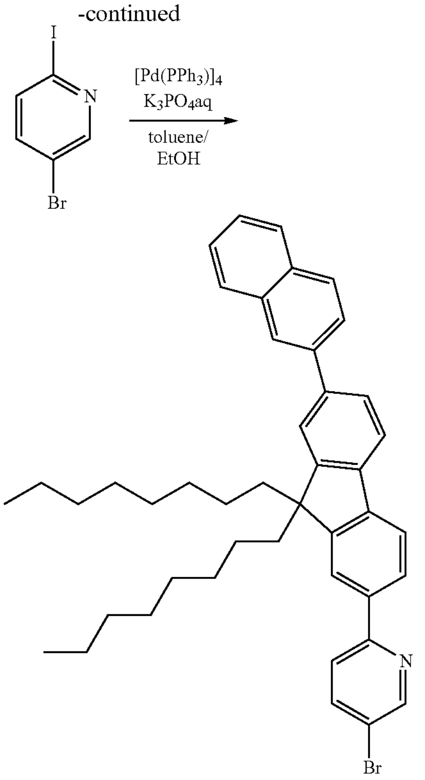

7-(2-naphthyl)-9,9-di(n-octyl)-2-(4,4,5,5-tetramethyl-1,3,2-dioxaborolan-2-yl)fluorene (7.4 g), 5-bromo-2-iodopyridine (3.9 g), [tetrakis(triphenylphosphine)palladium (0)] (0.70 g), a 2M tripotassium phosphate aqueous solution (14 mL), toluene (30 mL), and ethanol (15 mL) were added into a 1 L eggplant flask, followed by stirring in an oil bath at 105° C. for 8 hours. After cooling to room temperature, the aqueous phase was removed, and the remaining liquid was concentrated under reduced pressure to obtain a residue. The residue was purified by silica gel column chromatography (neutral silica gel, a product obtained by ethyl acetate/hexane=1/9 was further purified by dichloromethane/hexane=4/6) to obtain 6.4 g of 5-bromo-2-(7-naphthyl-9,9-di(n-octyl)fluoren-2-yl)pyridine.

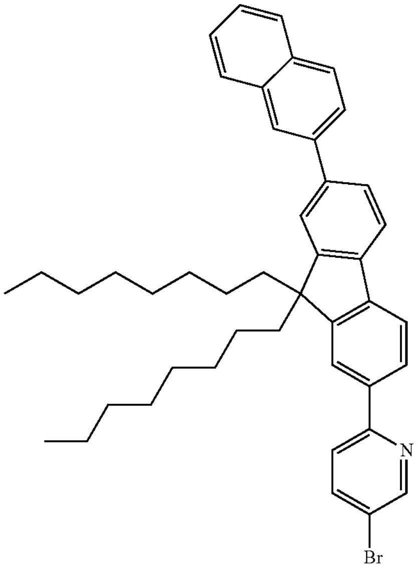

+

-continued

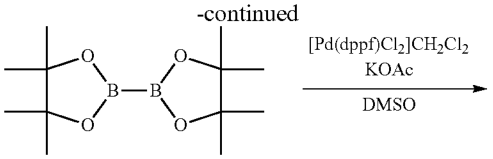

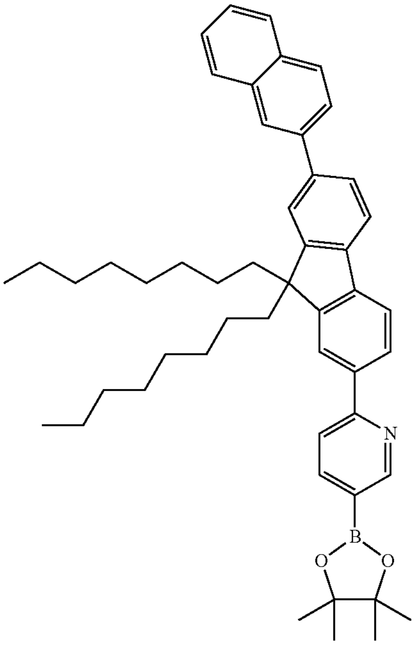

5-bromo-2-(7-naphthyl-9,9-di(n-octyl)fluoren-2-yl)pyridine (6.3 g), bis(pinacolato)diboron (2.8 g), potassium acetate (2.8 g), a dichloro-(1,1'-bis(diphenylphosphino)ferrocene)palladium-dichloromethane adduct (0.24 g), and dimethyl sulfoxide (45 mL) were put into a 500 mL eggplant flask, followed by stirring in an oil bath at 90° C. for 4.5 hours. After once cooling to room temperature, bis(pinacolato)diboron (1.4 g), potassium acetate (1.5 g), and a dichloro(1,1'-bis(diphenylphosphino)ferrocene)palladium-dichloromethane adduct (0.15 g) were added, followed by further stirring at 90° C. for 4.5 hours. After cooling to room temperature, water (200 mL) and dichloromethane (200 mL) were added, followed by liquid separation and cleaning. The oil phase was recovered and concentrated under reduced pressure to obtain a residue. The residue was purified by silica gel column chromatography (neutral silica gel, ethyl acetate/hexane=1/9 to 1/1) to obtain 6.4 g of 2-(7-naphthyl-9,9-di(n-octyl)fluorene-2-yl)-5-(4,4,5,5-tetramethyl-1,3,2-dioxaborolan-2-yl)pyridine as a brown oily substance.

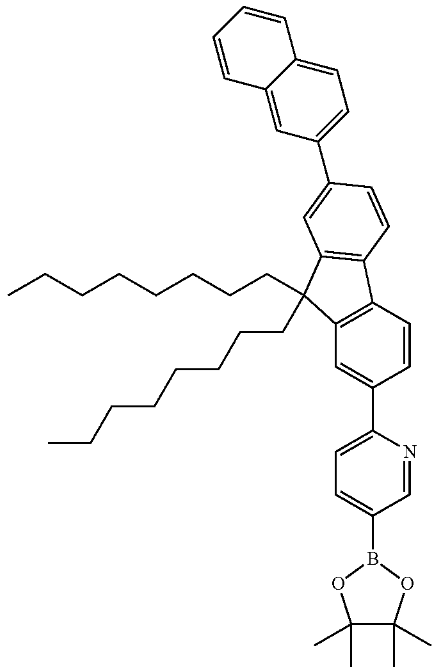

+

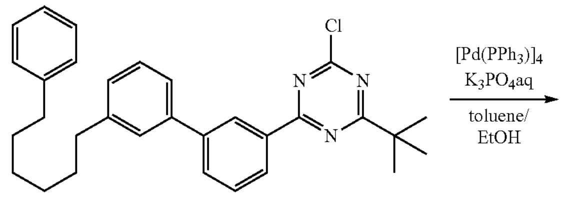

-continued

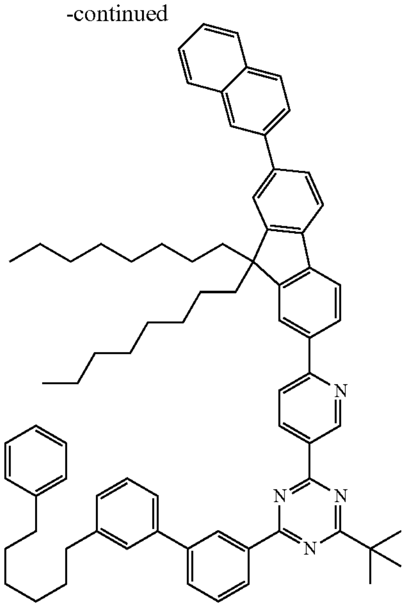

(Intermediate 9)

2-(7-naphthyl-9,9-di(n-octyl)fluorene-2-yl)-5-(4,4,5,5-tetramethyl-1,3,2-dioxaborolan-2-yl)pyridine (6.2 g), 2-tert-butyl-4-chloro-6-{3'-(6-phenyl-n-hexyl)-1,1'-biphenyl-3-yl}-1,3,5-triazine (5.0 g), [tetrakis(triphenylphosphine) palladium (0)] (0.41 g), a 2M tripotassium phosphate aqueous solution (11 mL), toluene (36 mL), and ethanol (18 mL) were added into a 1 L eggplant flask, followed by stirring in an oil bath at 105° C. for 9 hours. After cooling to room temperature, the aqueous phase was removed, and the remaining liquid was concentrated under reduced pressure to obtain a residue. The residue was purified by silica gel column chromatography (neutral silica gel, dichloromethane/hexane=3/7 to 4/6) to obtain 5.9 g of Intermediate 9 as a yellow amorphous solid.

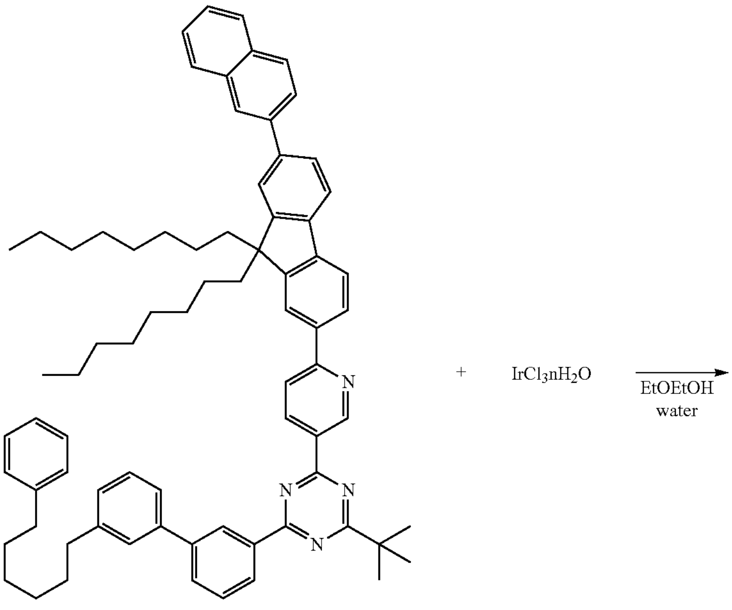

(Intermediate 9)

-continued

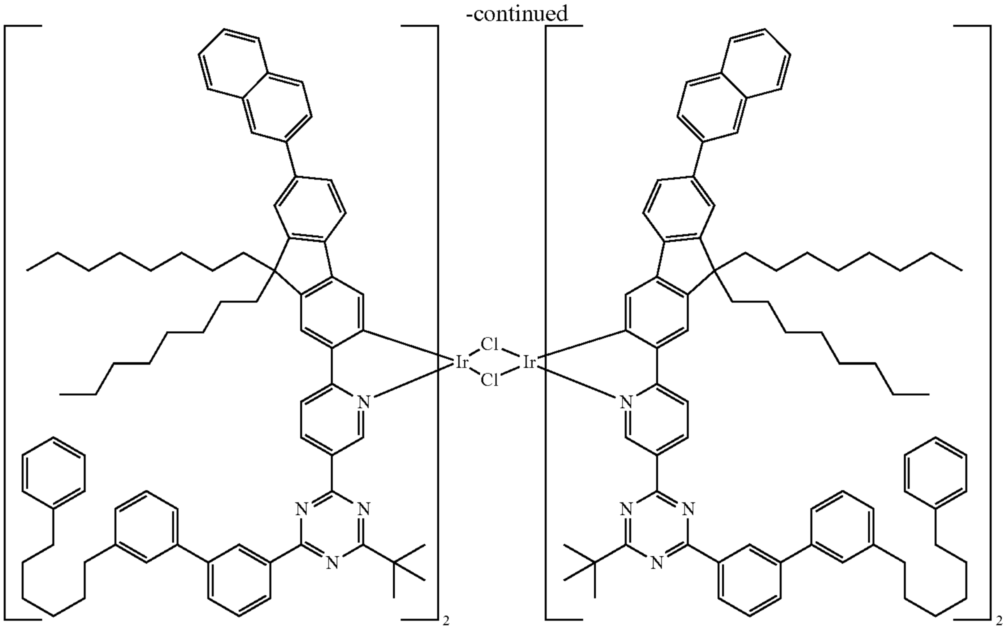

(Intermediate 10)

Intermediate 9 (5.6 g), iridium (III) chloride n-hydrate (0.94 g), 2-ethoxyethanol (50 mL), and water (12 mL) were added into a 100 mL eggplant flask, followed by stirring for 5.5 hours while being distilled in an oil bath at 135° C. to 150° C. Finally, the amount of the liquid extracted by distillation was 47 mL. After the completion of the reaction, the residue obtained by concentration under reduced pressure was purified by silica gel column chromatography (neutral silica gel, dichloromethane/hexane=4/6 to 1/1) to obtain 4.9 g of Intermediate 10 as a red solid.

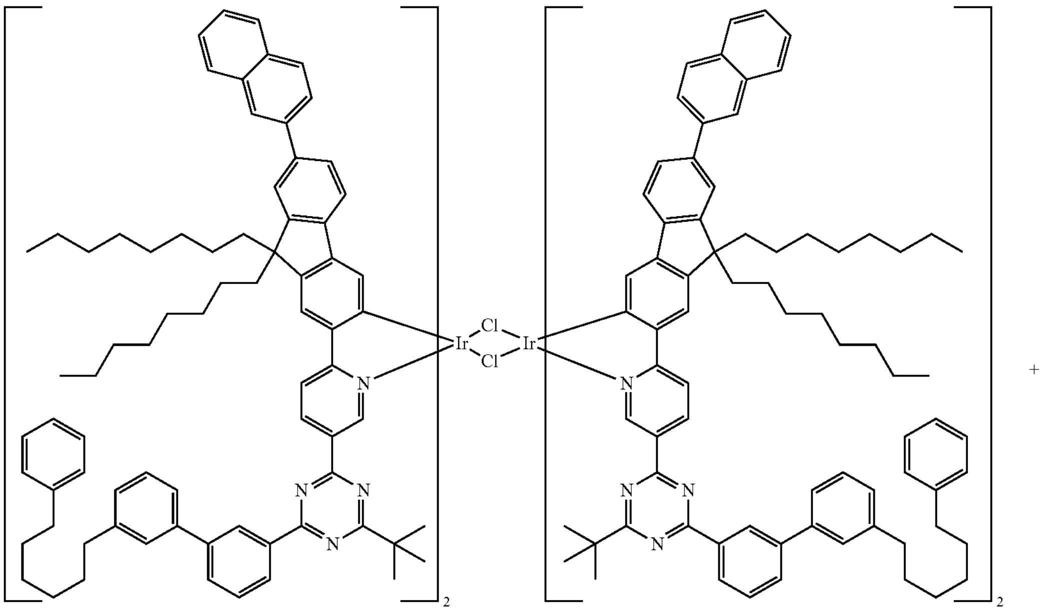

(Intermediate 10)

-continued

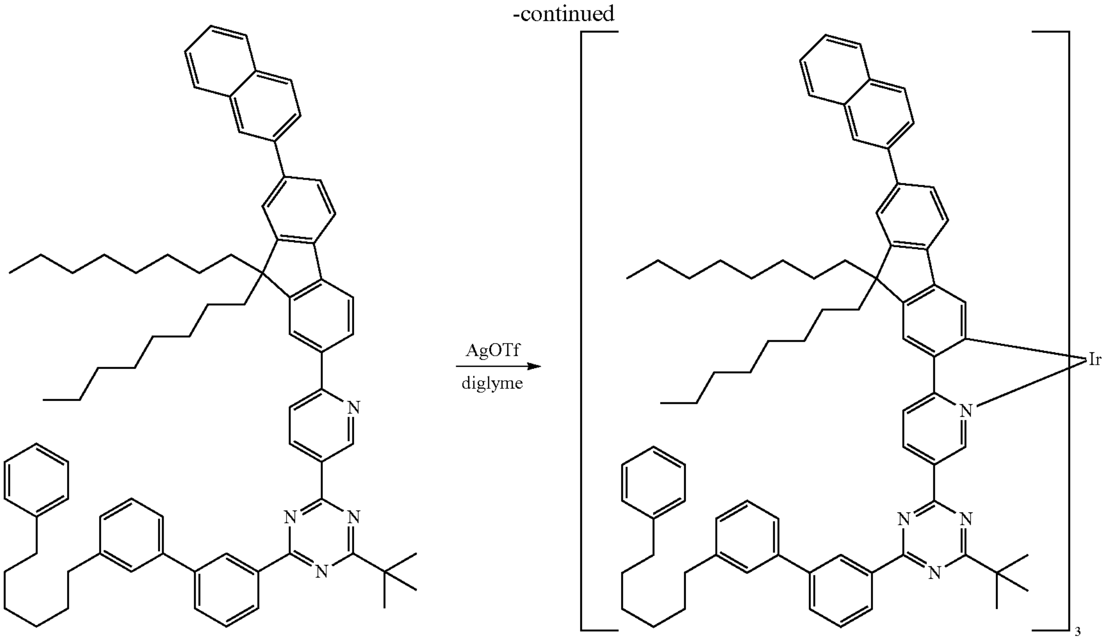

(Intermediate 9)

(Compound D-5)

Intermediate 10 (4.9 g), Intermediate 9 (3.6 g), silver (I) trifluoromethane sulfonate (0.59 g), and diglyme (16 mL) were added into a 100 mL eggplant flask, followed by stirring in an oil bath at 145° C. for 5.5 hours. The residue obtained by concentration under reduced pressure was purified by silica gel column chromatography (neutral silica gel, dichloromethane/hexane=4/6) to obtain 4.4 g of Compound D-5 as a red solid.

Synthesis Example 6: Synthesis of Compound D-6

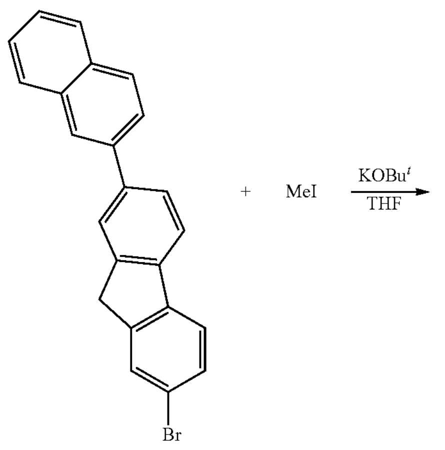

-continued

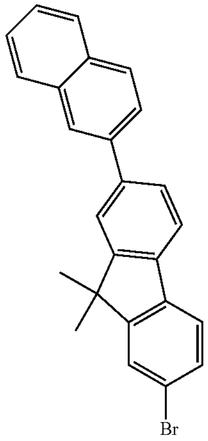

2-bromo-7-(2-naphthyl)fluorene (9.4 g), iodomethane (7.5 mL), and dehydrated tetrahydrofuran (100 mL) were put into a 300 mL eggplant flask, tert-butoxypotassium (13.2 g) was added thereto while cooling in an ice water bath, and then the mixture was removed from the ice water bath and stirred in an oil bath at 40° C. for 3 hours. The solvent was distilled off under reduced pressure to obtain a residue. The residue was purified by silica gel column chromatography (neutral silica gel, dichloromethane/hexane=15/85 to 25/75) to obtain 11.9 g of 2-bromo-9,9-dimethyl-7-(2-naphthyl)-fluorene as a white solid.

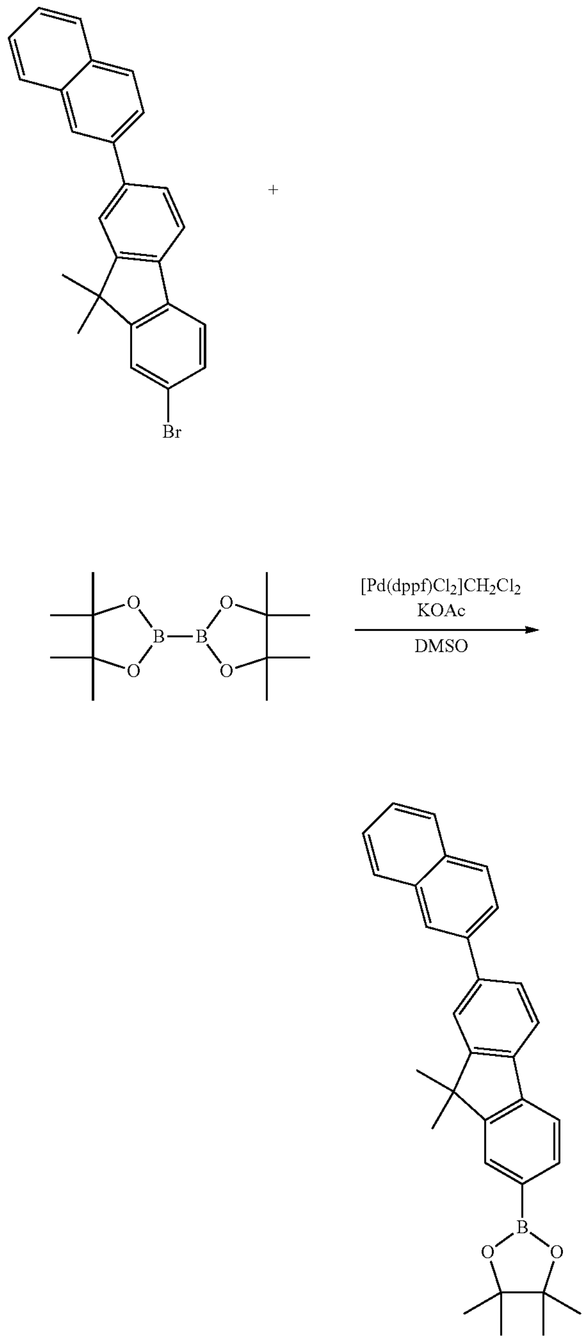

2-bromo-9,9-dimethyl-7-(2-naphthyl)fluorene (11.9 g), bis(pinacolato)diboron (8.9 g), potassium acetate (9.4 g), a dichloro-(1,1'-bis(diphenylphosphino)ferrocene)palladium-dichloromethane adduct (1.0 g), and dimethyl sulfoxide (60 mL) were put into a 1 L eggplant flask, followed by stirring in an oil bath at 90° C. for 4 hours. After cooling to room temperature, water (500 mL) and dichloromethane (300 mL) were added, followed by liquid separation and cleaning. The oil phase was recovered and concentrated under reduced pressure to obtain a residue. The residue was purified by silica gel column chromatography (neutral silica gel, ethyl acetate/hexane=2/8) to obtain 11.1 g of 9,9-dimethyl-7-(2-naphthyl)-2-(4,4,5,5-tetramethyl-1,3,2-dioxaborolan-2-yl) fluorene as a white solid.

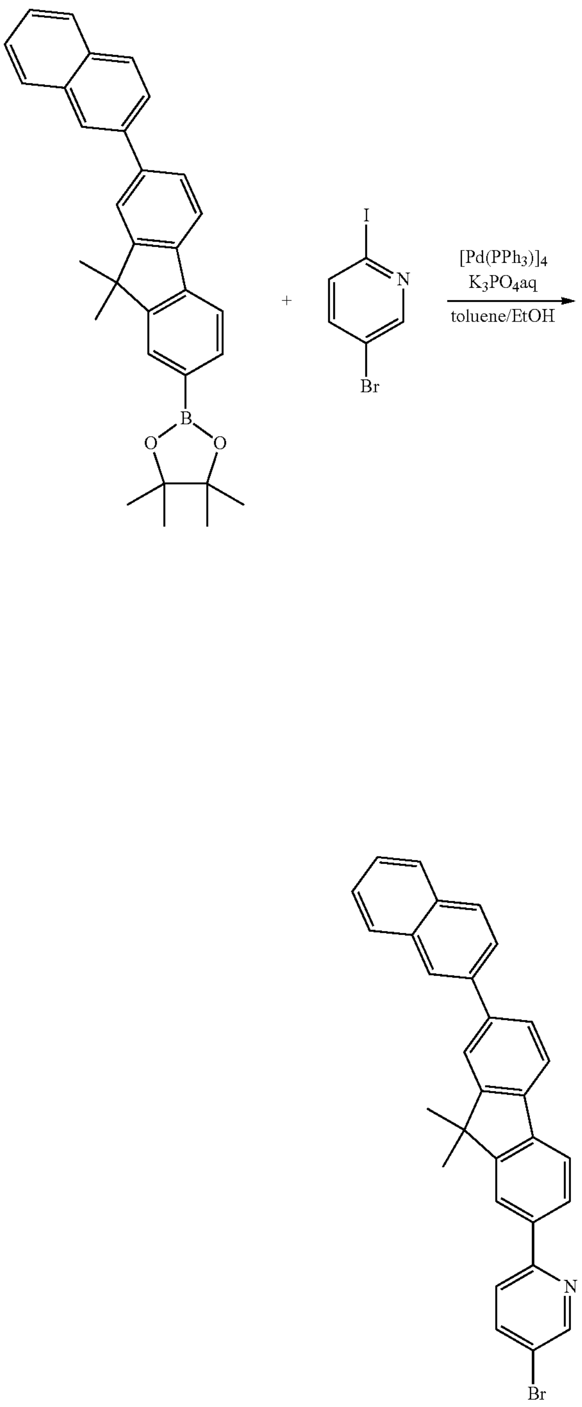

9,9-dimethyl-7-(2-naphthyl)-2-(4,4,5,5-tetramethyl-1,3,2-dioxaborolan-2-yl)fluorene (11.1 g), 5-bromo-2-iodopyridine (8.1 g), [tetrakis(triphenylphosphine)palladium (0)] (1.2 g), a 2M tripotassium phosphate aqueous solution (35 mL), toluene (60 mL), and ethanol (35 mL) were added into a 1 L eggplant flask, followed by stirring in an oil bath at 105° C. for 8.5 hours. After cooling to room temperature, the aqueous phase was removed, and the remaining liquid was filtered to obtain a solid, which was cleaned with ethanol (200 mL) and then dried to obtain 8.5 g of 5-bromo-2-(9,9-dimethyl-7-naphthylfluorene-2-yl)pyridine.

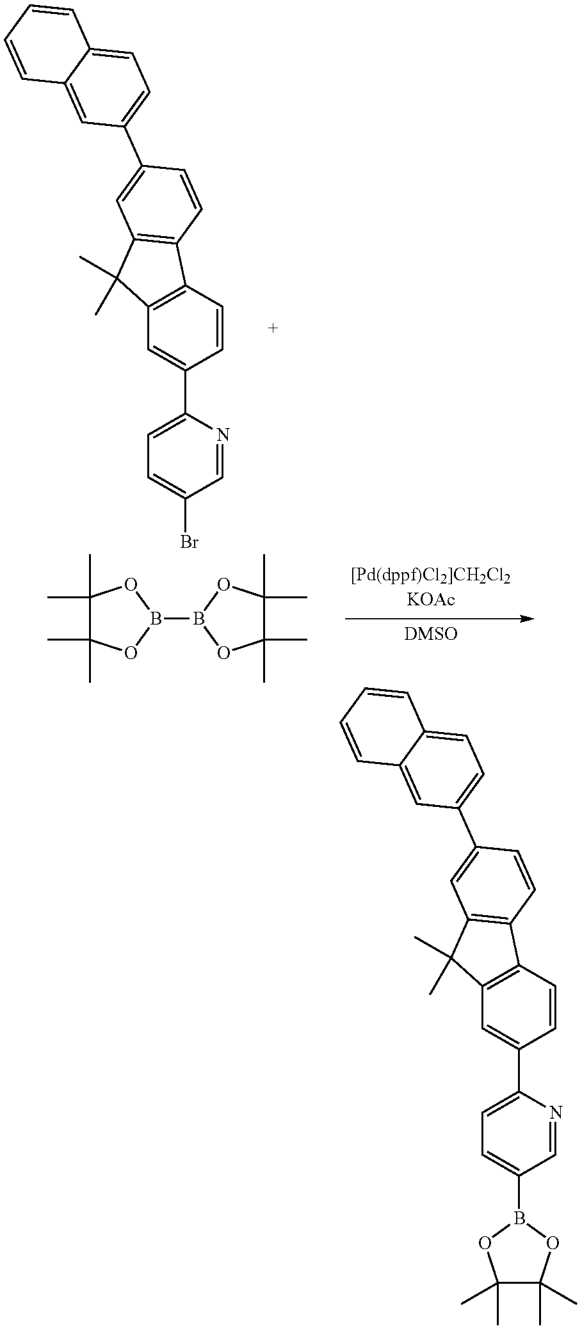

5-bromo-2-(9,9-dimethyl-7-naphthylfluorene-2-yl)pyridine (8.5 g), bis(pinacolato)diboron (6.1 g), potassium acetate (6.3 g), a dichloro-(1,1'-bis(diphenylphosphino)ferrocene)palladium-dichloromethane adduct (0.61 g), dimethyl sulfoxide (70 mL), and 1,4-dioxane (25 mL) were put into a 500 mL eggplant flask, followed by stirring in an oil bath at 90° C. for 4 hours. After 2 hours during the reaction, 1,4-dioxane (30 mL) was added. After cooling to room temperature, water (500 mL) and dichloromethane (300 mL) were added, followed by liquid separation and cleaning. The oil phase was recovered and concentrated under reduced pressure to obtain a residue, the residue was purified by silica gel column chromatography (neutral silica gel, dichloromethane/tetrahydrofuran=1/0 to 8/2) to obtain 6.4 g of 2-(9,9-dimethyl-7-naphthylfluorene-2-yl)-5-(4,4,5,5-tetramethyl-1,3,2-dioxaborolan-2-yl)pyridine as a beige solid.

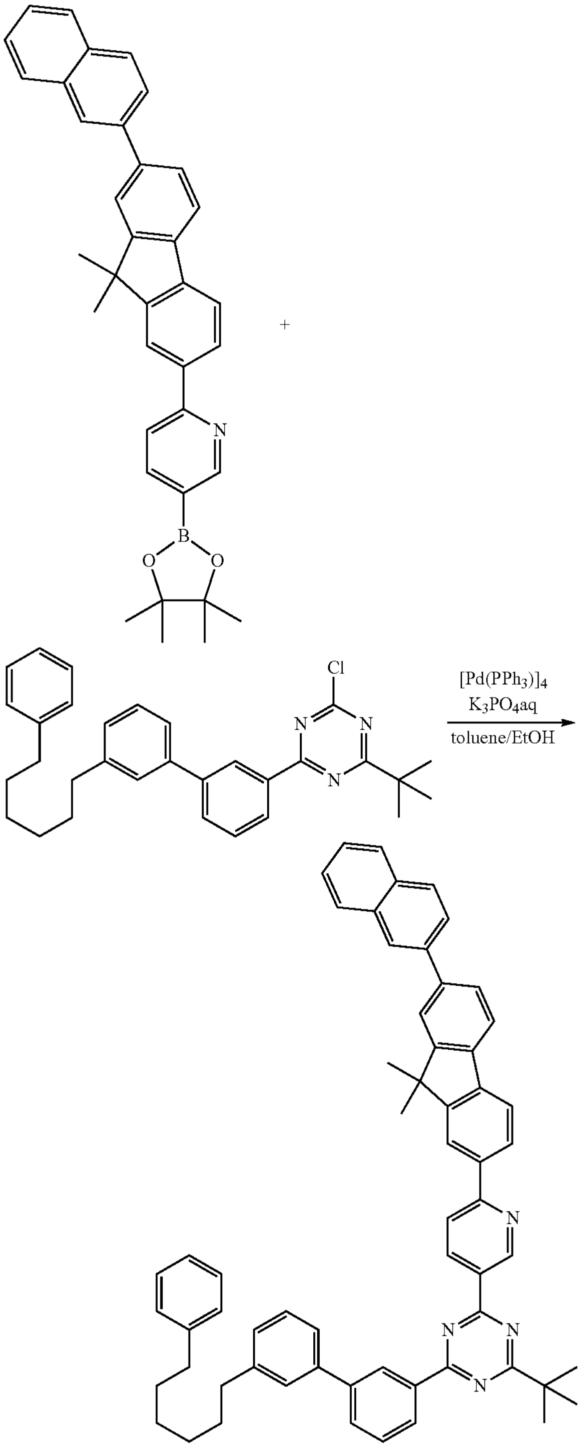

(Intermediate 11)

2-(9,9-dimethyl-7-naphthylfluorene-2-yl)-5-(4,4,5,5-tetramethyl-1,3,2-dioxaborolan-2-yl)pyridine (6.4 g), 2-tert-butyl-4-chloro-6-{3'-(6-phenyl-n-hexyl)-1,1'-biphenyl-3-yl}-1,3,5-triazine (5.9 g), [tetrakis(triphenylphosphine) palladium (0)] (0.52 g), a 2M tripotassium phosphate aqueous solution (20 mL), toluene (40 mL), and ethanol (15 mL) were added into a 1 L eggplant flask, followed by stirring in an oil bath at 105° C. for 5 hours. After cooling to room temperature, the aqueous phase was removed, and the remaining liquid was concentrated under reduced pressure to obtain a residue. The residue was purified by silica gel column chromatography (neutral silica gel, dichloromethane/hexane=3/7 to 6/4) to obtain 7.1 g of Intermediate 11 as a yellow-green amorphous solid.

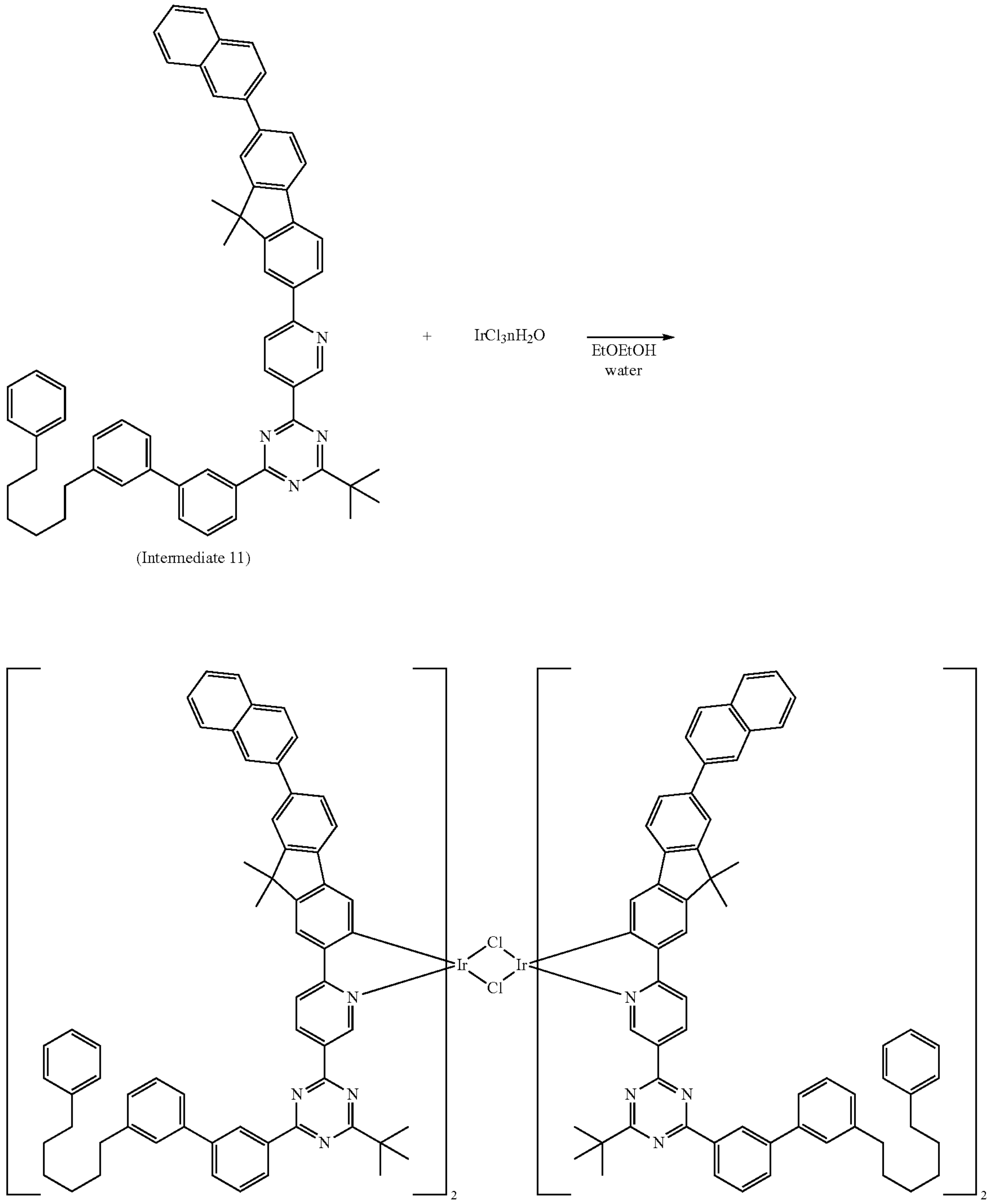

(Intermediate 11)

(Intermediate 12)

Intermediate 11 (5.1 g), iridium (III) chloride n-hydrate (1.0 g), 2-ethoxyethanol (60 mL), and water (10 mL) were added into a 100 mL eggplant flask, followed by stirring for 7 hours while being distilled in an oil bath at 140° C. to 150° C. After 1.5 hours during the reaction, 2-ethoxyethanol (16 mL) was added. Finally, the amount of the liquid extracted by distillation was about 50 mL. After the completion of the reaction, the residue obtained by concentration under reduced pressure was purified by silica gel column chromatography (neutral silica gel, dichloromethane/hexane=1/1) to obtain 5.0 g of Intermediate 12 as a red solid.

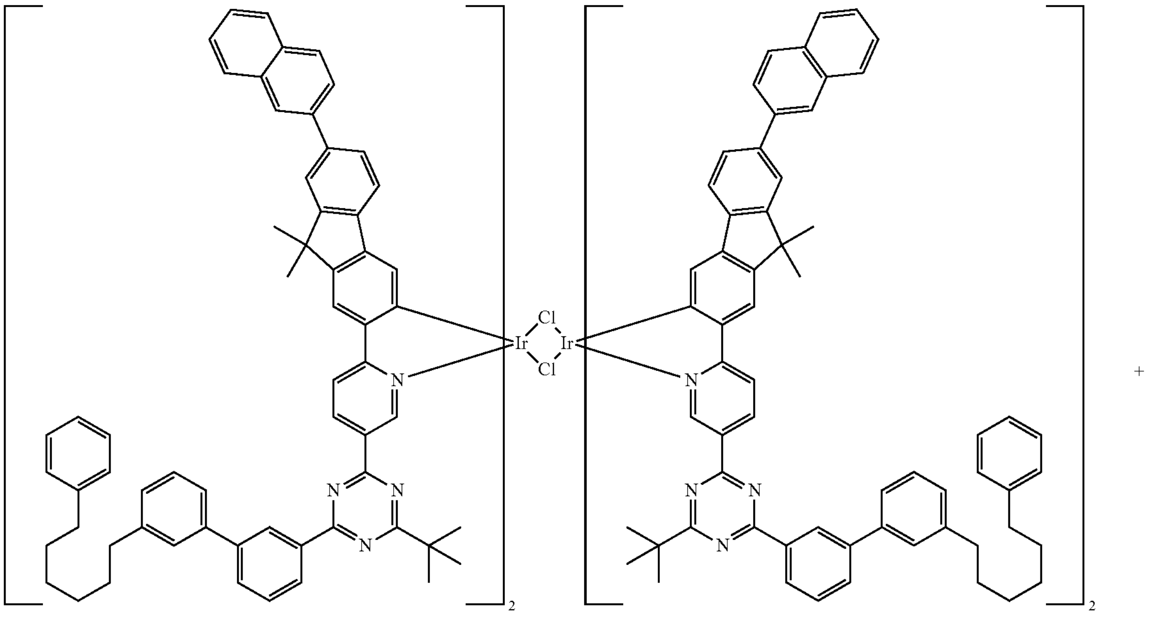
(Intermediate 12)
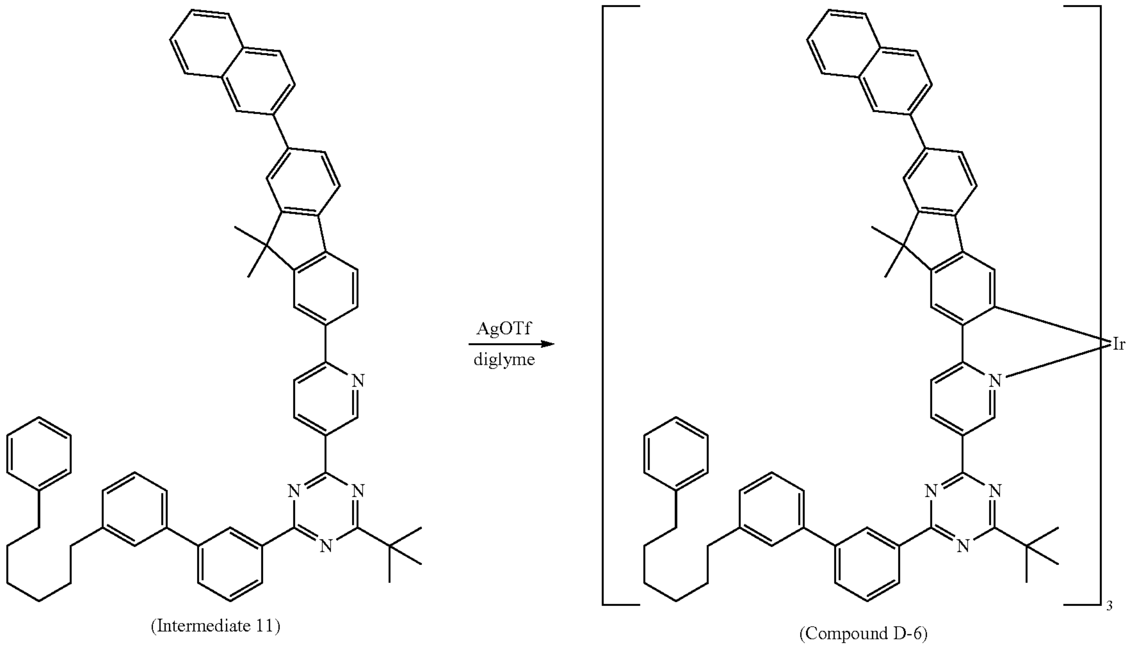
(Intermediate 11)
(Compound D-6)

Intermediate 12 (5.0 g), Intermediate 11 (2.0 g), silver (I) trifluoromethane sulfonate (0.77 g), and diglyme (12 mL) were added to a 100 mL eggplant flask, followed by stirring in an oil bath at 145° C. for 1.5 hours, and subsequently stirring at 150° C. for 2 hours. The residue obtained by concentration under reduced pressure was purified by silica gel column chromatography (neutral silica gel, toluene/hexane=1/1 to 2/1) to obtain 2.7 g of Compound D-6 as a red solid.

Synthesis Example 7: Synthesis of Compound D-7

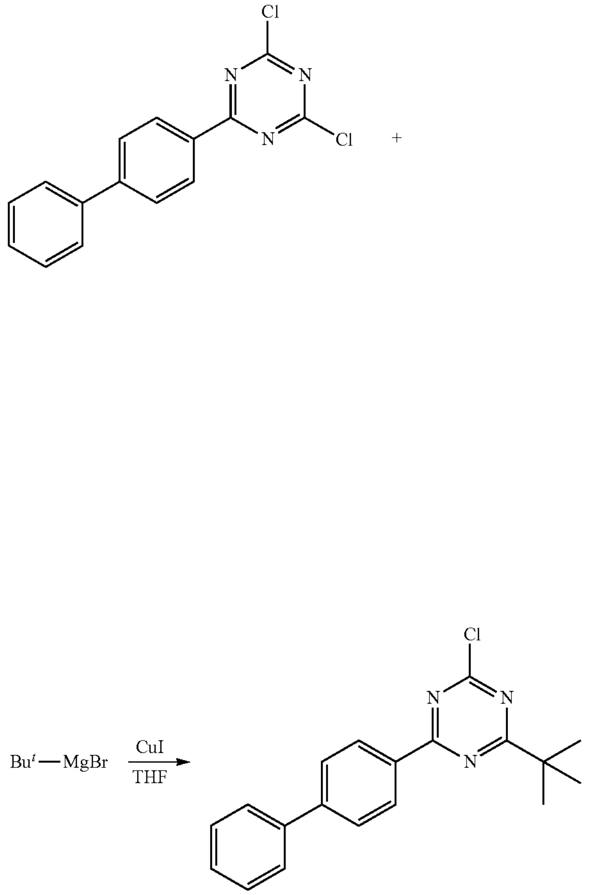

2-(4-biphenylyl)-4,6-dichloro-1,3,5-triazine (10.0 g, manufactured by Tokyo Chemical Industry Co., Ltd.), copper (I) iodide (0.21 g), and dehydrated tetrahydrofuran (100 mL) were put into a 300 mL four-necked flask, and a 2M-THF(tetrahydrofuran) solution of tert-butylmagnesium bromide (18.5 mL, manufactured by Tokyo Chemical Industry Co., Ltd.) was added dropwise at an internal temperature of −63° C., followed by stirring for 2.5 hours while the temperature was raised to −10° C. After 1N-hydrochloric acid (120 mL) was added, extraction was performed with ethyl acetate (200 mL), and the oil phase was cleaned with brine (200 mL). The solvent in the oil phase was removed under reduced pressure to obtain a residue. The residue was purified by silica gel column chromatography (dichloromethane/hexane=35/65) to obtain 6.8 g of the target 2-(4-biphenylyl)-4-tert-butyl-6-chloro-1,3,5-triazine.

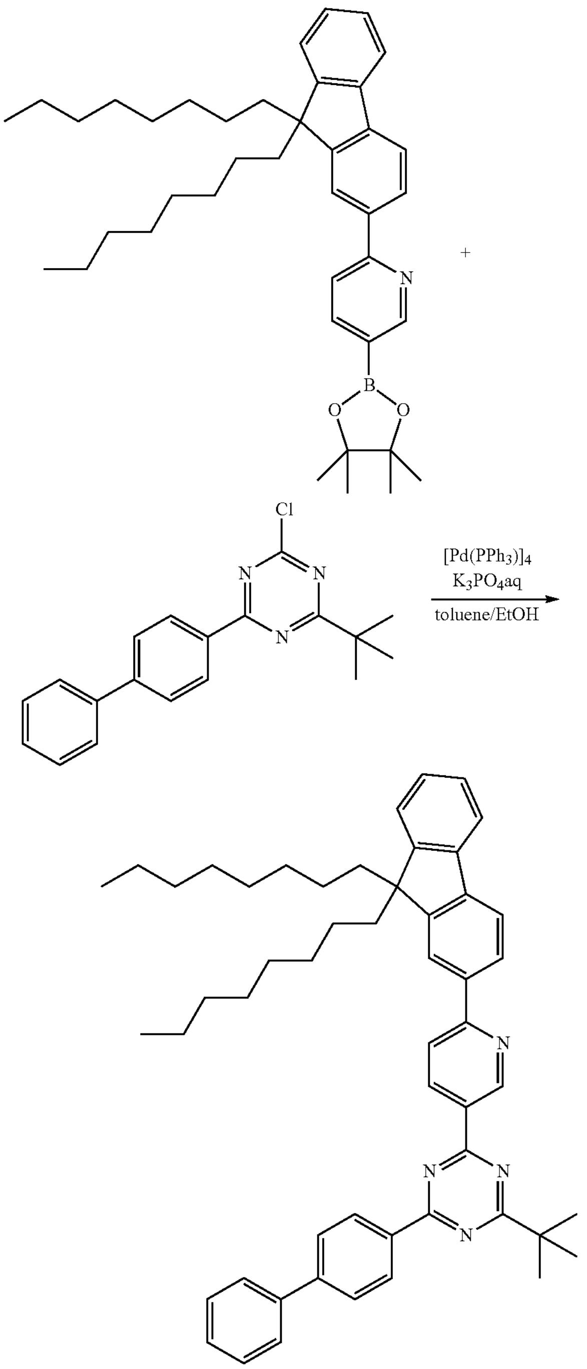

(Intermediate 13)

[2-{9,9-di(n-octyl)fluorene-2-yl}pyridin-5-yl]4,4,5,5-tetramethyl-1,3,2-dioxaborolane (12.2 g), 2-(4-biphenylyl)-4-tert-butyl-6-chloro-1,3,5-triazine (7.7 g), [tetrakis(triphenylphosphine)palladium (0)] (1.0 g), a 2M-tripotassium phosphate aqueous solution (30 mL), toluene (75 mL), and ethanol (50 mL) were added into a 1 L eggplant flask, followed by stirring in an oil bath at 105° C. for 9.5 hours. After cooling to room temperature, the aqueous phase was removed, and the remaining liquid was concentrated under reduced pressure to obtain a residue. The residue was purified by silica gel column chromatography (neutral silica gel, dichloromethane/hexane=4/6) to obtain 14.5 g of Intermediate 13 as colorless amorphous.

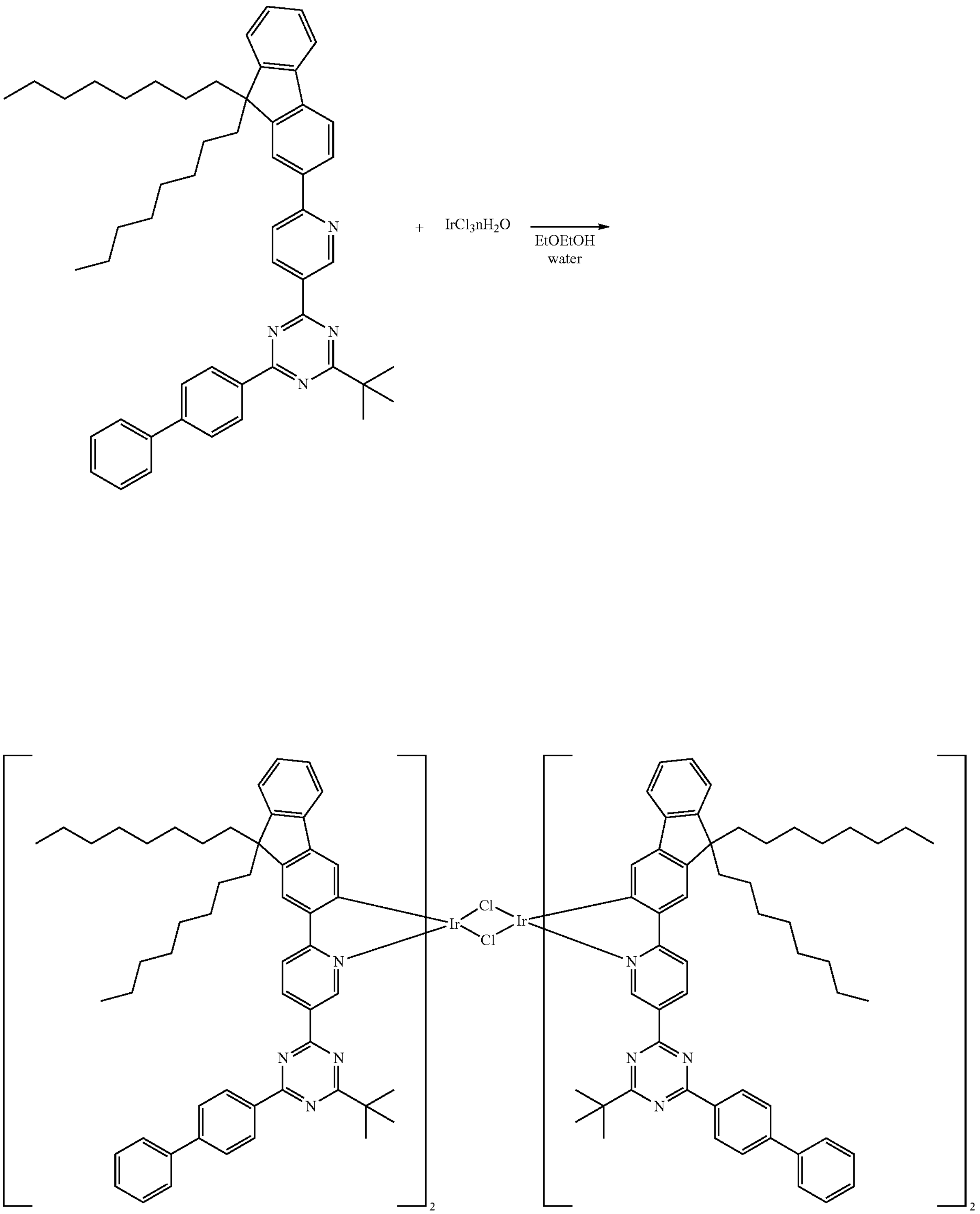

(Intermediate 13) (Intermediate 14)

(Intermediate 13) (Intermediate 14)

Intermediate 13 (9.4 g), iridium (III) chloride n-hydrate (2.06 g), 2-ethoxyethanol (90 mL), and water (21 mL) were added into a 300 mL eggplant flask, and the temperature of the oil bath was raised to 135° C. to 150° C. while distilling, followed by stirring for 13 hours. The residue obtained by concentration under reduced pressure was purified by silica gel column chromatography (neutral silica gel, dichloromethane/hexane=6/4) to obtain 9.6 g of Intermediate 14 as a red solid.

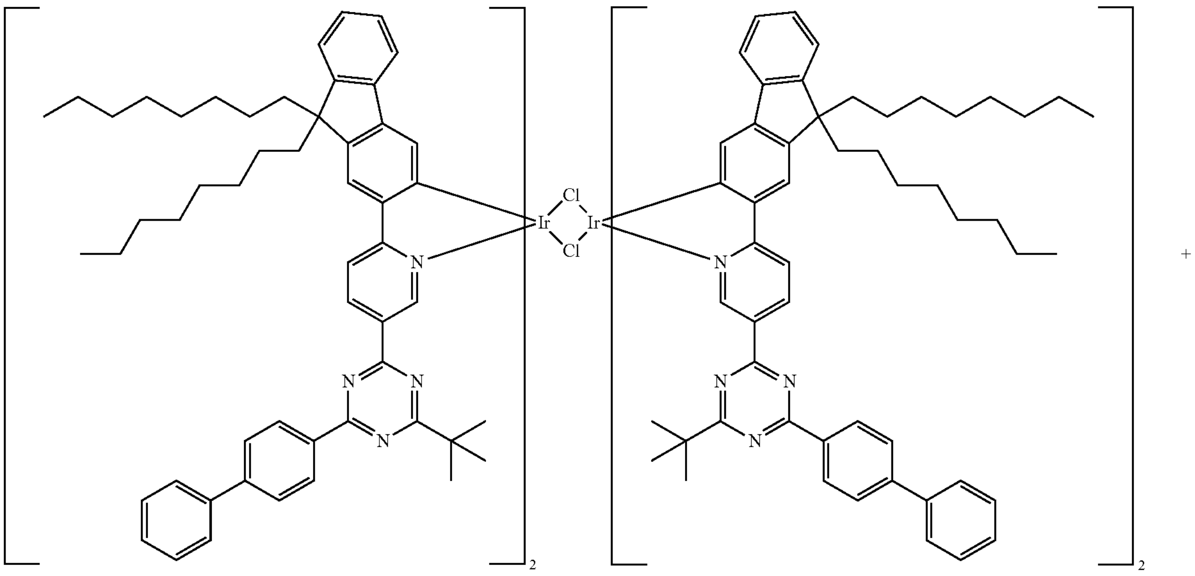

(Intermediate 14)

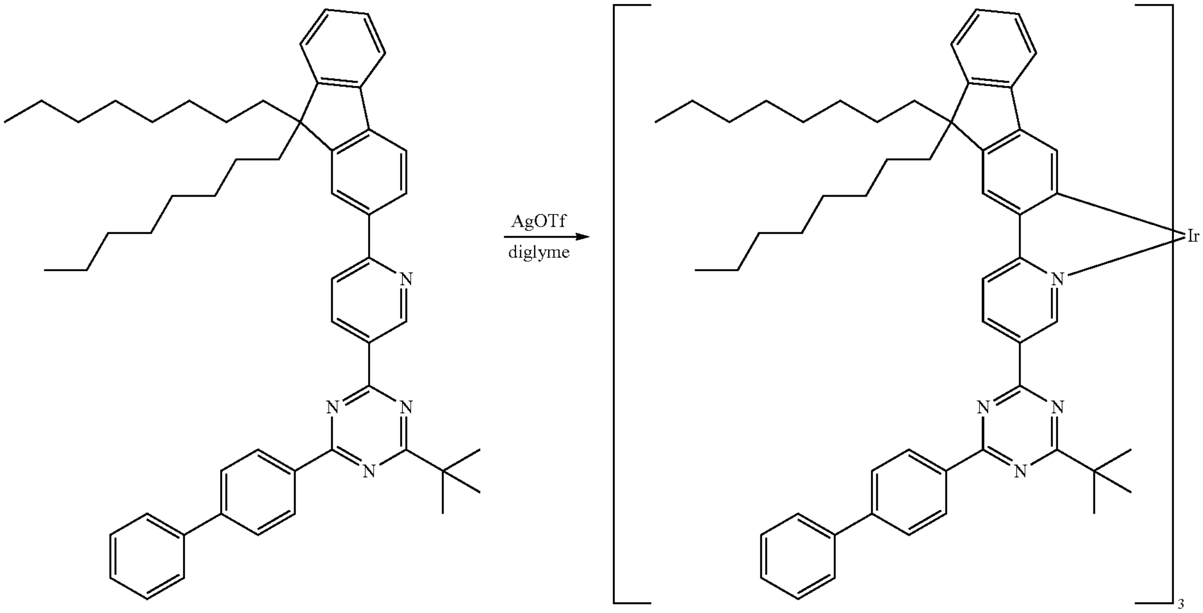

(Intermediate 13) (Compound D-7)

Intermediate 14 (9.6 g), Intermediate 13 (5.1 g), silver (I) trifluoromethane sulfonate (1.5 g), and diglymne (32 mL) were added into a 1 L eggplant flask, followed by stirring in an oil bath at 145° C. for 4.5 hours. The residue obtained by concentration under reduced pressure was purified by silica gel column chromatography (neutral silica gel, dichloromethane/hexane=1/1) to obtain 2.7 g of Compound D-7 as a red solid.

Synthesis Example 8: Synthesis of Compound D-8

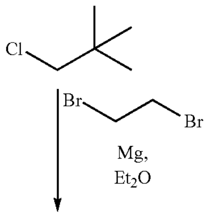

-continued

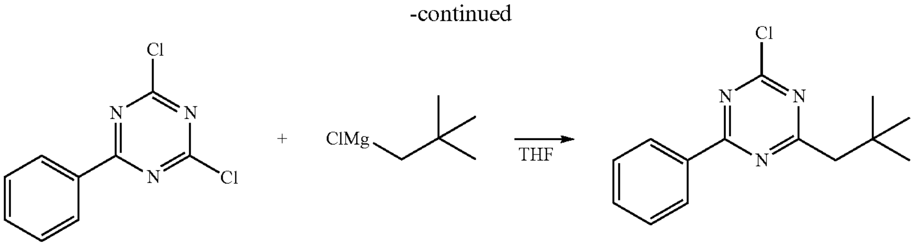

Shaved magnesium (26.5 g) and diethyl ether (180 mL) were put in to a 2 L four-necked reactor, and 2 mL of 1-chloro-2,2-dimethylpropane (84.9 g) was added thereto. After 1,2-dibromoethane (450 μL) was added to initiate the reaction, a solution obtained by dissolving the remaining 1-chloro-2,2-dimethylpropane in diethyl ether (430 mL) was added dropwise at an internal temperature of 30° C. to 40° C. over 3 hours and 40 minutes, further stirred under reflux for 2 hours, and then cooled to room temperature. 2,4-dichloro-6-phenyl-1,3,5-triazine (120.0 g) and THF (900 mL) were put into another 3 L four-necked reactor to prepare a solution, and then copper (I) iodide (3.0 g) was added thereto, followed by cooling to an internal temperature of −23° C. Next, a Grignard reagent solution prepared above was added dropwise over 25 minutes at an internal temperature of −23° C. to −4° C., and the internal temperature was raised to 20° C. over 1 hour. After the internal temperature was cooled to −20° C. again, 2M-hydrochloric acid (800 mL) was added dropwise over 10 minutes so as to be within an internal temperature of −20° C. to 0° C., followed by stirring for 15 minutes while returning to room temperature. Extraction was performed with ethyl acetate (500 mL×2 times), and the oil phase cleaned with a mixed solution of water (250 mL) and saturated brine (250 mL) were concentrated under reduced pressure to obtain a residue. The residue was purified by silica gel column chromatography (dichloromethane/hexane=1/9 to 1/5) to obtain 62.4 g of 2-chloro-4-neopentyl-6-phenyl-1,3,5-triazine as a white solid.

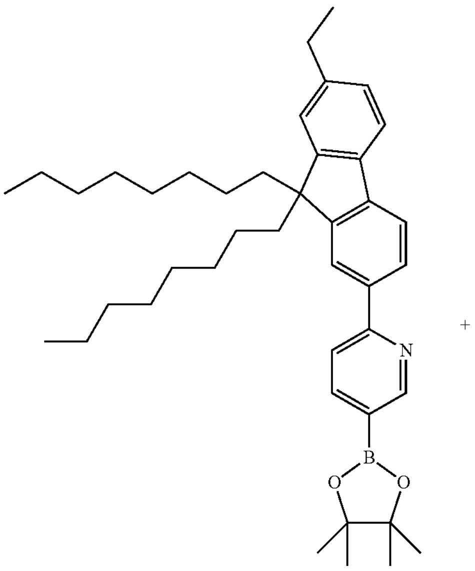

+

-continued

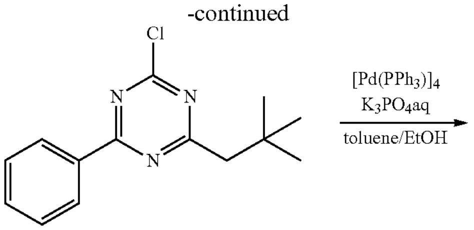

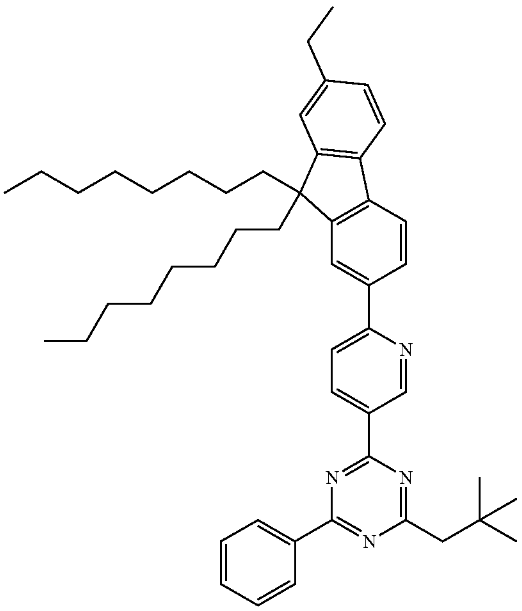

(Intermediate 15)

2-(7-ethyl-9,9-di(n-octyl)fluorene-2-yl)-5-(4,4,5,5-tetramethyl-1,3,2-dioxaborolan-2-yl)pyridine (6.9 g), 2-chloro-4-neopentyl-6-phenyl-1,3,5-triazine (4.0 g), [tetrakis(triphenylphosphine)palladium (0)] (0.68 g), a 2M tripotassium phosphate aqueous solution (20 mL), toluene (40 mL), and ethanol (20 mL) were added into a 1 L eggplant flask, followed by stirring in an oil bath at 105° C. for 3 hours. After cooling to room temperature, the aqueous phase was removed, and the remaining liquid was concentrated under reduced pressure to obtain a residue. The residue was purified by silica gel column chromatography (neutral silica gel, ethyl acetate/hexane=15/85) to obtain 6.6 g of Intermediate 15 as a white solid.

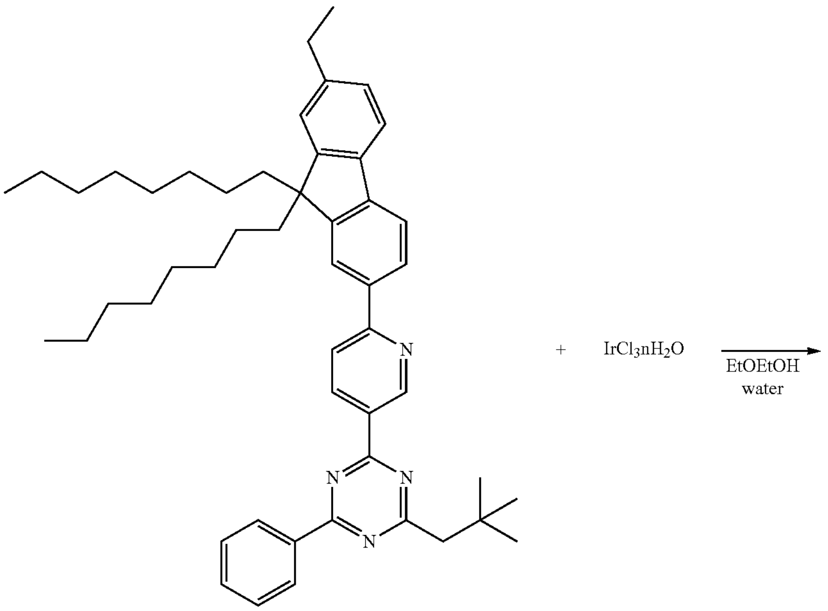

(Intermediate 15)

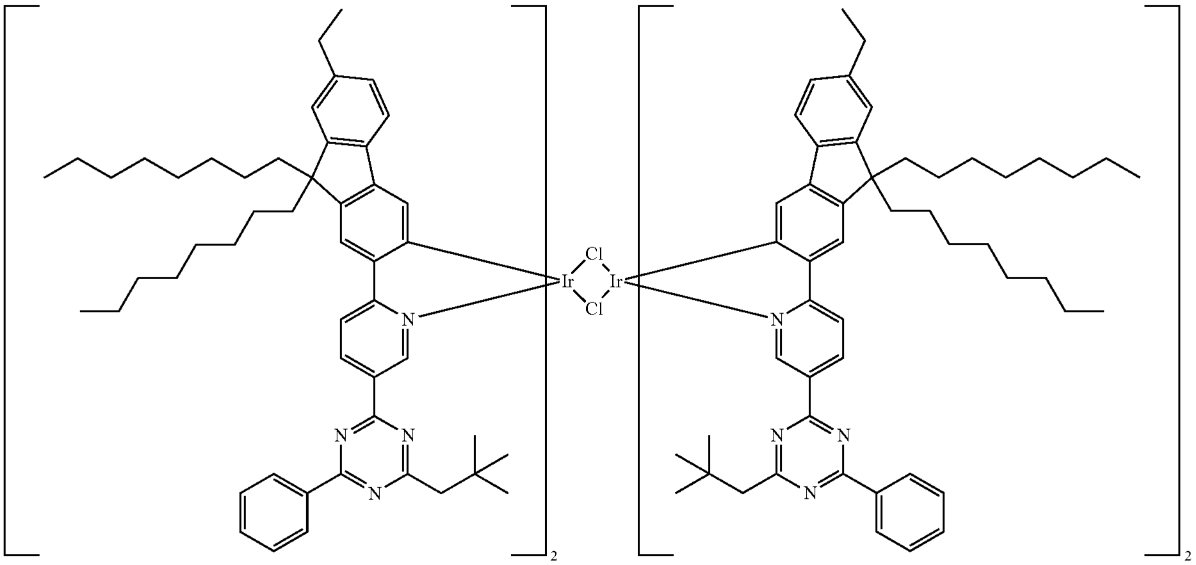

(Intermediate 16)

Intermediate 15 (4.2 g), iridium (III) chloride n-hydrate (0.97 g), 2-ethoxyethanol (40 mL), and water (10 mL) were added into a 300 mL eggplant flask, and the temperature of the oil bath was raised to 140° C. to 170° C. while distilling, followed by stirring for 16 hours. The residue obtained by concentration under reduced pressure was purified by silica gel column chromatography (neutral silica gel, dichloromethane/hexane=6/4) to obtain 9.6 g of Intermediate 16 as a red solid.

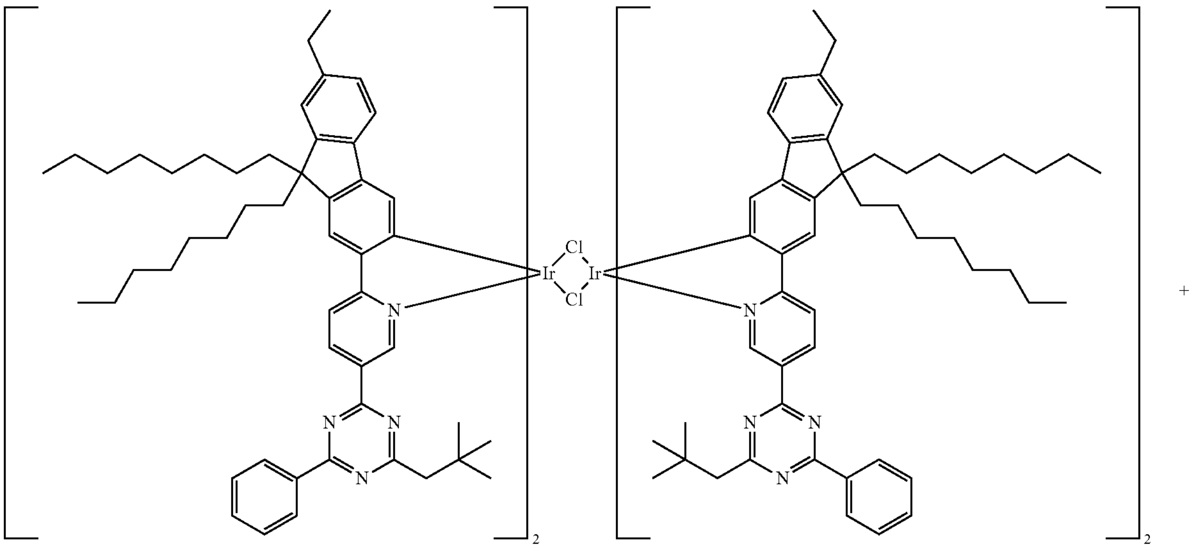
(Intermediate 16)
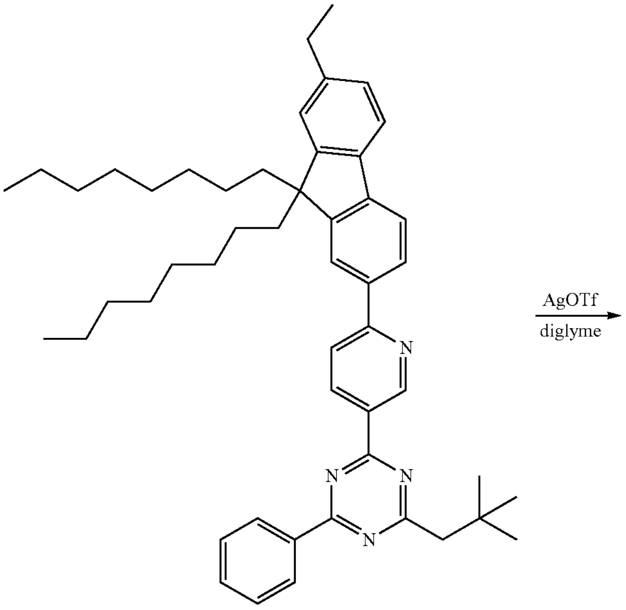
(Intermediate 15)

-continued

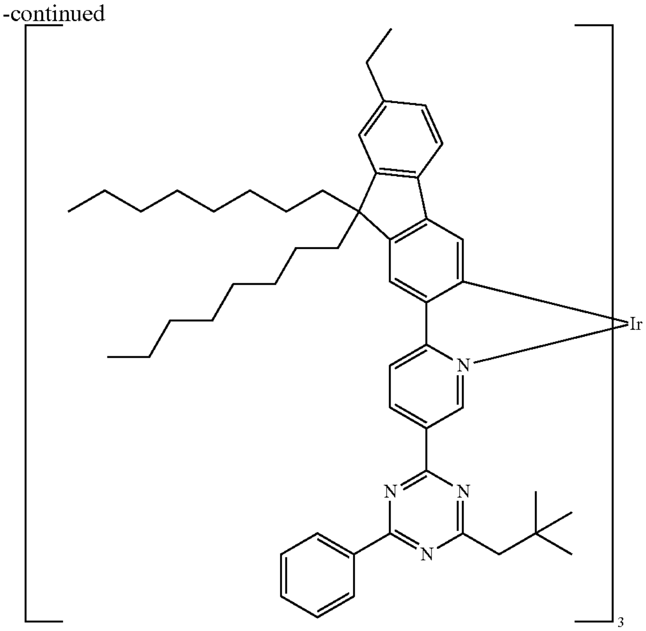

(Compound D-8)

Intermediate 16 (1.4 g), Intermediate 15 (2.4 g), silver (I) trifluoromethane sulfonate (0.22 g), and diglyme (3 mL) were added into a 1 L eggplant flask, followed by stirring in an oil bath at 145° C. for 2 hours. The residue obtained by concentration under reduced pressure was purified by silica gel column chromatography (neutral silica gel, dichloromethane/hexane=2/8 to 1/1) to obtain 1.7 g of Compound D-8 as a red solid.

Synthesis Example 9: Synthesis of Compound D-9

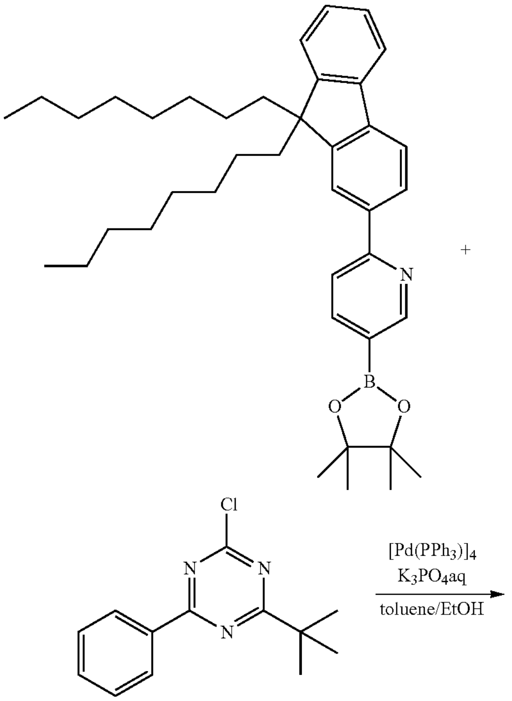

-continued

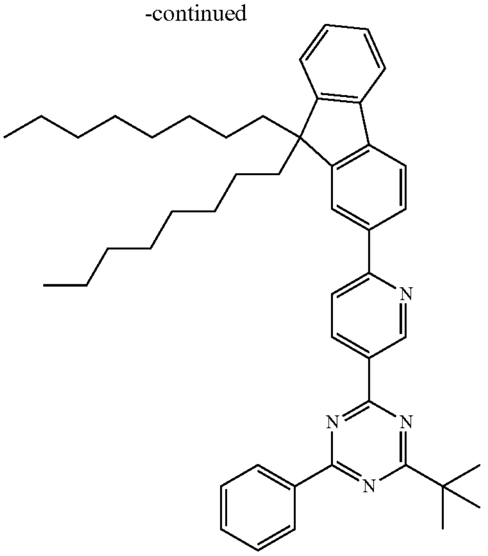

(Intermediate 17)

5-(4,4,5,5-tetramethyl-1,3,2-dioxaborolan-2-yl)-2-[9,9-di(n-octyl)fluorene-2-yl]pyridine (37.2 g), 2-tert-butyl-4-chloro-6-phenyl-1,3,5-triazine (18.7 g), [tetrakis(triphenylphosphine)palladium (0)] (2.9 g), a 2M tripotassium phosphate aqueous solution (78 mL), toluene (200 mL), and tetrahydrofuran (100 mL) were added into a 1 L eggplant flask, followed by stirring in an oil bath at 105° C. for 5 hours. After cooling to room temperature, the aqueous phase was removed, and the remaining liquid was concentrated under reduced pressure to obtain a residue. The residue was purified by silica gel column chromatography (neutral silica gel, dichloromethane/hexane=1/1) to obtain 29.1 g of Intermediate 17 as a yellow oily substance.

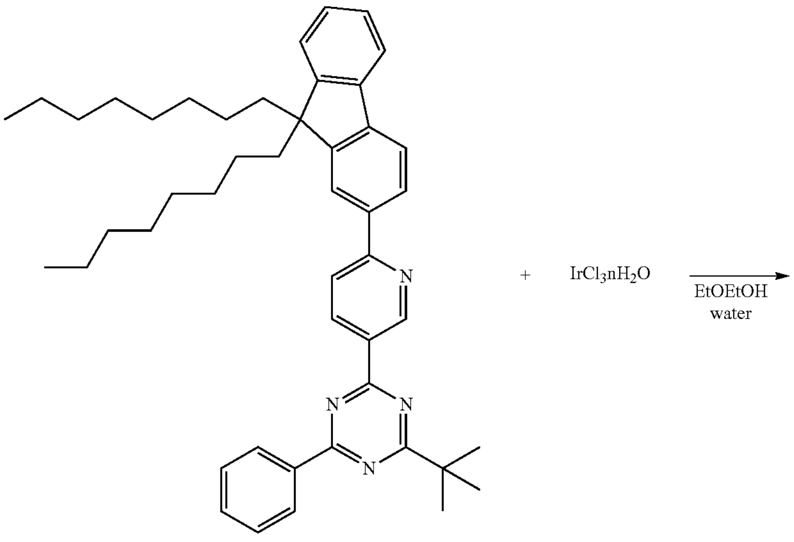

(Intermediate 17)

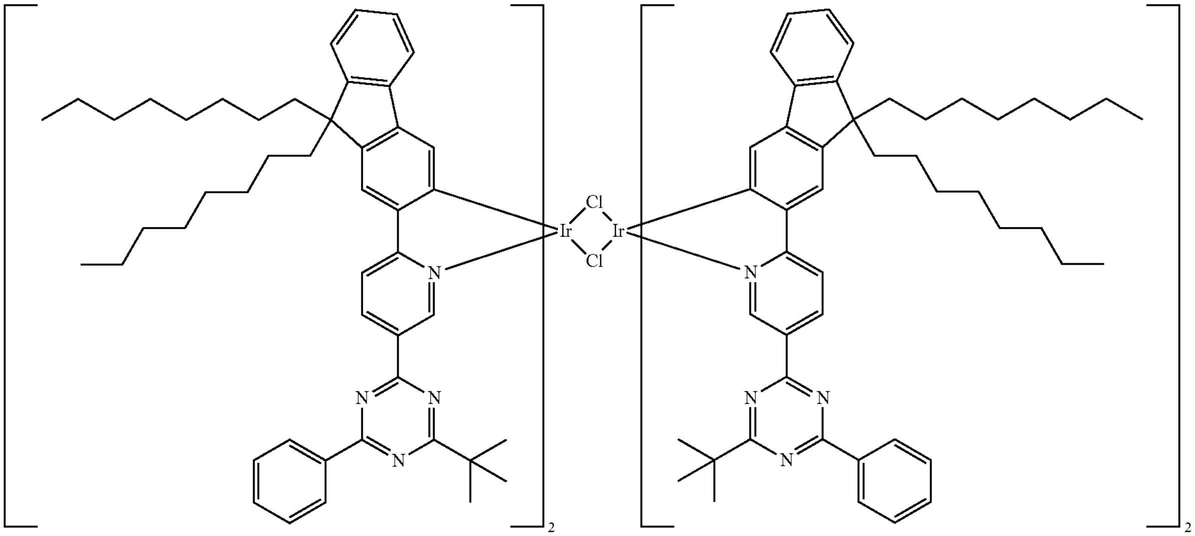

(Intermediate 18)

Intermediate 17 (16.4 g), iridium (III) chloride n-hydrate (4.0 g), 2-ethoxyethanol (140 mL), and water (33 mL) were added into a 300 mL eggplant flask, and the temperature of the oil bath was raised to 135° C. to 140° C. while distilling, followed by stirring for 6.5 hours. Thereafter, the residue obtained by concentration under reduced pressure was purified by silica gel column chromatography (neutral silica gel, dichloromethane/hexane=6/4) to obtain 17.4 g of Intermediate 18 as a red solid.

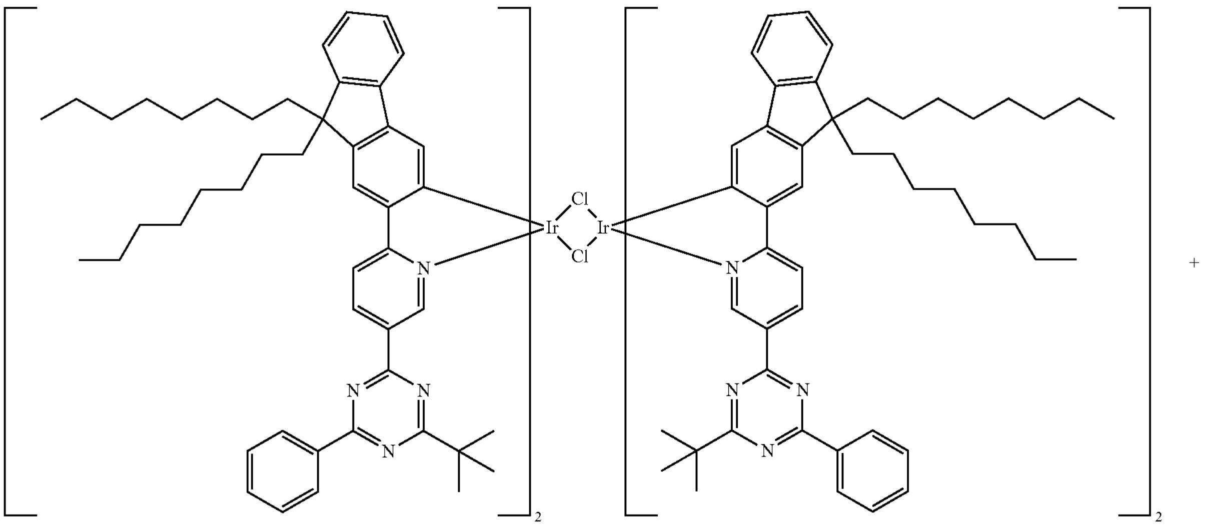

(Intermediate 18)

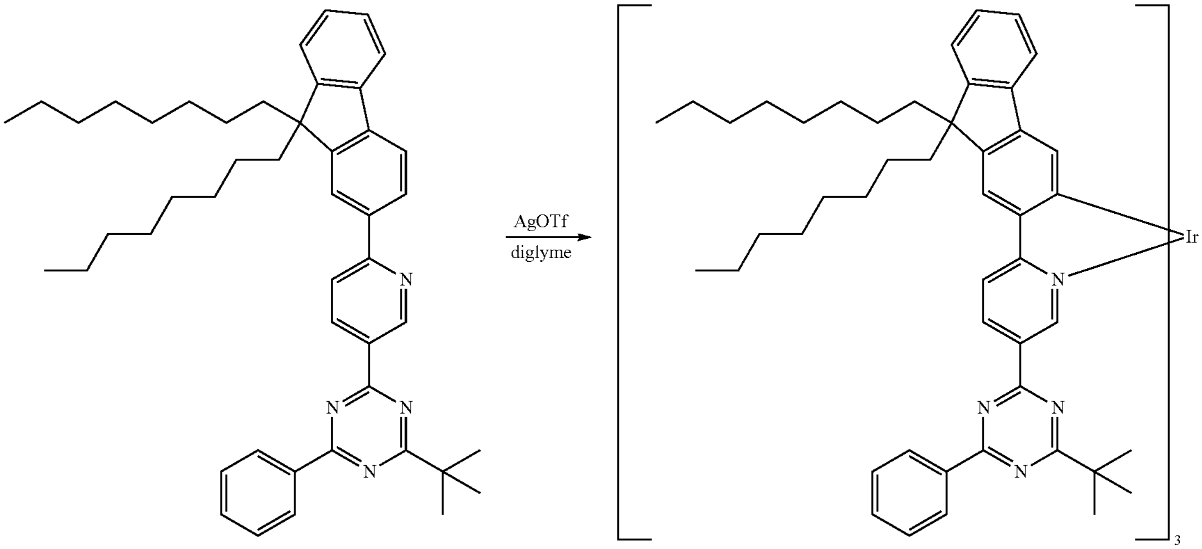

(Intermediate 17)

(Compound D-9)

Intermediate 18 (17.4 g), Intermediate 17 (6.5 g), silver (I) trifluoromethanesulfonate (2.8 g), and diglyme (58 mL) were added into a 1 L eggplant flask, followed by stirring in an oil bath at 145° C. for 5 hours. The residue obtained by concentration under reduced pressure was purified by silica gel column chromatography (neutral silica gel, dichloromethane/hexane=2/8) to obtain 10.3 g of Compound D-9 as a red solid.

<Comparative Compound D-C1>

Comparative Compound D-C1 represented by the following formula was synthesized according to the method described in Patent Literature 1.

(Comparative Compound D-C1)

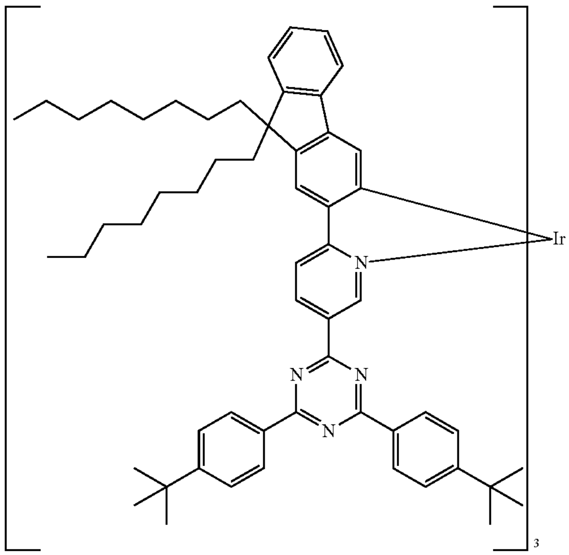

<Comparative Compound D-C2>

Comparative Compound D-C2 represented by the following formula was synthesized according to the method described in Patent Literature 3 and the method described in Synthesis Example of Compound D-2.

(Comparative Compound D-C2)

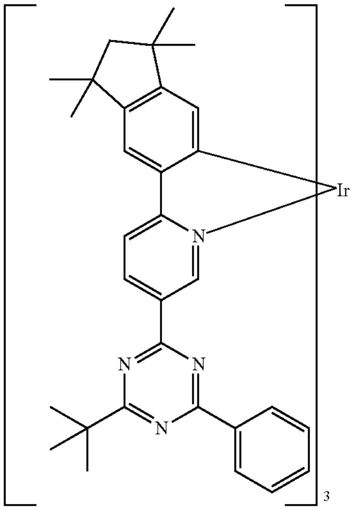

[Measurement of Maximum Emission Wavelength and Half Width]

Compound 1 was dissolved in 2-methyltetrahydrofuran (manufactured by Aldrich, dehydrated, no stabilizer added) at room temperature to prepare a solution of $1\times10^{-5}$ mol/L. The solution was put in a quartz cell equipped with a Teflon (registered trademark) cock, followed by performing nitrogen bubbling for 20 minutes or more, and then a phosphorescence spectrum was measured at room temperature. The wavelength showing the maximum value of the obtained phosphorescence spectrum intensity was defined as the maximum emission wavelength. In addition, the width of the spectral intensity of a half of the maximum emission wavelength was defined as the half width. The half width represented by $cm^{-1}$ was obtained by reading the shorter wavelength exceeding the height of 0.5 and the longer wavelength below the height of 0.5 from the data of the spectrum normalized to the converted height of 1, converting nm into $cm^{1}$, and setting the difference as the half width of $cm^{-1}$.

For the measurement of the luminescence spectrum, the following devices were used.

Device: Organic EL quantum yield measurement device C9920-02, which is manufactured by Hamamatsu Photonics K.K., Light source: monochrome light source L9799-01, Detector: multichannel detector PMA-11, Excitation light: 380 nm.

[Measurement of PL Quantum Yield]

As the luminescent efficiency, the PL quantum yield was measured. The PL quantum yield is an index indicating the efficiency of obtaining luminescence with respect to light (energy) absorbed by the material, and was measured using the following instrument in the same manner as described above.

Device: Organic EL quantum yield measurement device C9920-02, which is manufactured by Hamamatsu Photonics K.K., Light source: monochrome light source L9799-01, Detector: multichannel detector PMA-11, Excitation light: 380 nm.

With respect to Comparative Compound 1, the half width, the maximum wavelength, and the PL quantum yield were measured in the same manner.

TABLE 1

| | Maximum emission wavelength/nm | PL quantum yield | Half width/nm | Half width/$cm^{-1}$ |
|---|---|---|---|---|
| Compound D-1 | 621 | 0.73 | 48 | 1219 |
| Comparative Compound D-C1 | 639 | 0.64 | 57 | 1361 |

From the above, it was clear that Compound D-1 has a narrower half width than that of Comparative Compound D-C1.

[Measurement 2 of Maximum Emission Wavelength and Half Width]

Compound D-1 was dissolved in toluene (manufactured by FUJIFILM Wako Pure Chemical Industries, Ltd., for spectroscopic analysis) at room temperature to prepare a solution of $1\times10^{-5}$ mol/L. The solution was put in a quartz cell equipped with a Teflon (registered trademark) cock, followed by performing nitrogen bubbling for 20 minutes or more, and then a phosphorescence spectrum was measured at room temperature. The wavelength showing the maximum value of the obtained phosphorescence spectrum intensity was defined as the maximum emission wavelength. In addition, the width of the spectral intensity of a half of the maximum emission wavelength was defined as the half width. The half width represented by $cm^{1}$ was obtained by reading the shorter wavelength exceeding the height of 0.5 and the longer wavelength below the height of 0.5 from the data of the spectrum normalized to the converted height of 1, converting nm into $cm^{-1}$, and setting the difference as the half width of $cm^{1}$.

For the measurement of the luminescence spectrum, the following devices were used.

Device: Organic EL quantum yield measurement device C9920-02, which is manufactured by Hamamatsu Photonics K.K., Light source: monochrome light source L9799-01, Detector: multichannel detector PMA-11, Excitation light: 380 nm.

[Measurement of PL Quantum Yield]

As the luminescent efficiency, the PL quantum yield was measured. The PL quantum yield is an index indicating the efficiency of obtaining luminescence with respect to light (energy) absorbed by the material, and was measured using the following instrument in the same manner as described above.

Device: Organic EL quantum yield measurement device C9920-02, which are manufactured by Hamamatsu Photonics K.K., Light source: monochrome light source L9799-01, Detector: multichannel detector PMA-11, Excitation light: 380 nm.

With respect to Compounds D-1, D-3 to D-5, D-8, and D-9 and Comparative Compounds D-C1 and D-C2, the half width, the maximum wavelength, and the PL quantum yield were measured in the same manner.

TABLE 2

| Compound | Maximum emission wavelength /nm | PL quantum yield | Half width /nm | Half width /cm$^{-1}$ |
|---|---|---|---|---|
| D-1 | 615 | 0.797 | 33 | 881 |
| D-3 | 623 | 0.780 | 35 | 882 |
| D-4 | 634 | 0.715 | 30 | 753 |
| D-5 | 625 | 0.778 | 33 | 847 |
| D-8 | 623 | 0.783 | 36 | 922 |
| D-9 | 620 | 0.782 | 36 | 934 |
| D-C1 | 623 | 0.789 | 37 | 942 |
| D-C2 | 618 | 0.789 | 54 | 1382 |

The values of PL quantum yield are considered to be almost the same except for Compound D-4. Since compound D-4 has a longer wavelength than that of other compounds, it is considered that Compound D-4 exhibits a slightly low quantum yield value due to the so-called energy gap law. It was found that all of Compounds D-1, D-3 to D-5, D-8, and D-9 had a half width value equal to or narrower than the value of Comparative Compound D-C1 and significantly narrower than the value of Comparative Compound D-C2.

Example 1

An organic electroluminescent element was produced by the following method.

A substrate constituted of a glass substrate and, formed thereon, a transparent conductive film of iridium-tin oxide (ITO) deposited in a thickness of 50 nm (sputtering-coated product, manufactured by Geomatec Co., Ltd.) was subjected to patterning into stripes having a width of 2 mm using an ordinary technique of photolithography with hydrochloric acid. Thus, an anode was formed. The ITO substrate which had undergone the patterning in this manner was cleaned by subjecting the substrate to ultrasonic cleaning with a surfactant aqueous solution, cleaning with ultrapure water, ultrasonic cleaning with ultrapure water, and cleaning with ultrapure water, subsequently dried by compressed air, and finally subjected to ultraviolet/ozone cleaning.

As a composition for forming a hole injection layer, a composition was prepared by dissolving 3.0 wt % of a hole transporting polymer compound having a repeating structure represented by the following formula (P-1) and 0.6 wt % of an oxidizing agent (HI-1) in ethyl benzoate.

(P-1)

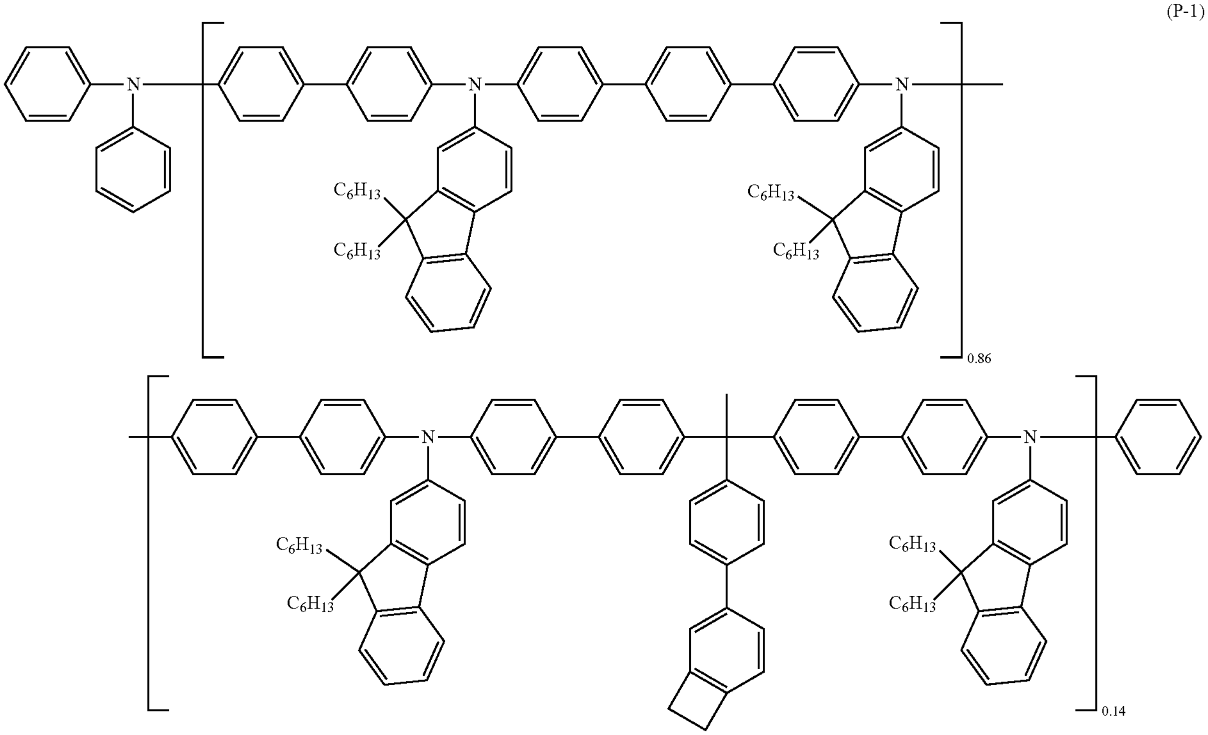

-continued (HI-1)

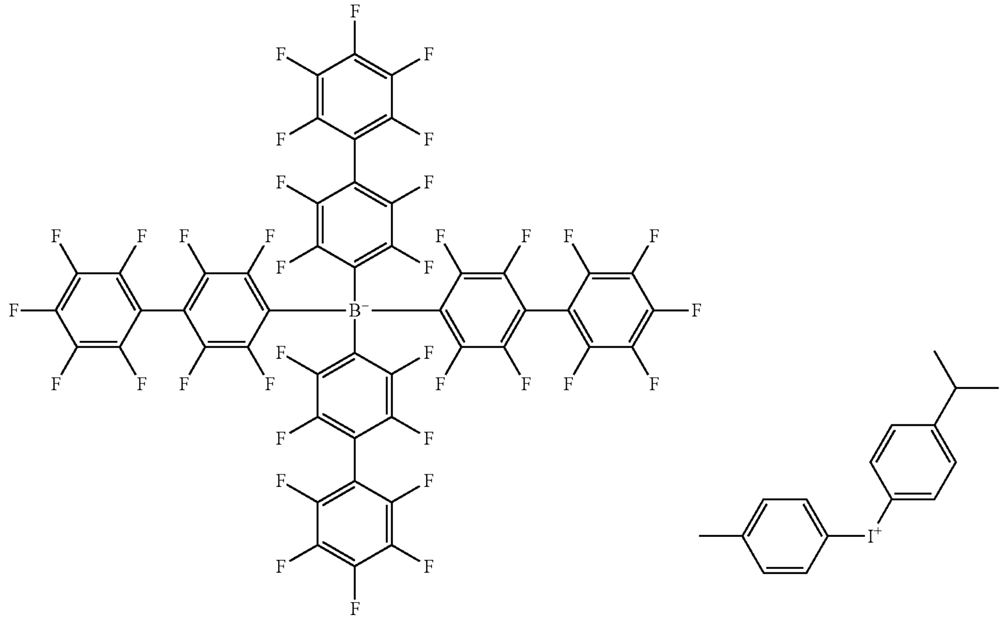

This solution was applied on the substrate by spin coating in the air, and dried on a hot plate in the air at 240° C. for 30 minutes to form a uniform thin film having a thickness of 39 nm, thereby forming a hole injection layer.

Next, 100 parts by mass of a charge-transporting polymer compound having the following structural formula (HT-1) was dissolved in cyclohexylbenzene to prepare a 3.0 wt % solution.

This solution was applied, by spin coating, on the substrate on which the hole injection layer was coated and formed in a nitrogen glove box, and dried on a hot plate in the nitrogen glove box at 230° C. for 30 minutes to form a uniform thin film having a thickness of 42 nm, thereby forming a hole transport layer.

(HT-1)

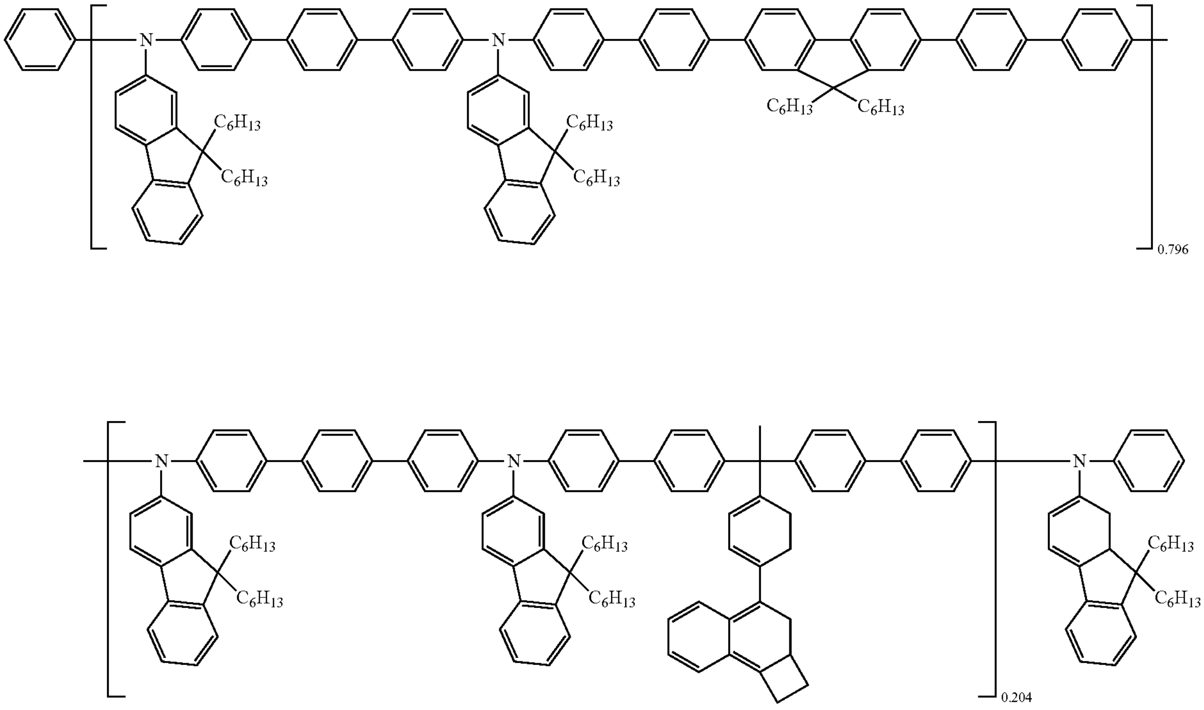

Subsequently, as a material of the emission layer, 50 parts by mass of the following structural formula (H-1), 50 parts by mass of the following structural formula (H-2), 15 parts by mass of the following structural formula (D-A1), and 15 parts by mass of the following structural formula (D-2) were weighed and dissolved in cyclohexylbenzene to prepare a 5.0 wt % solution.

(H-1)

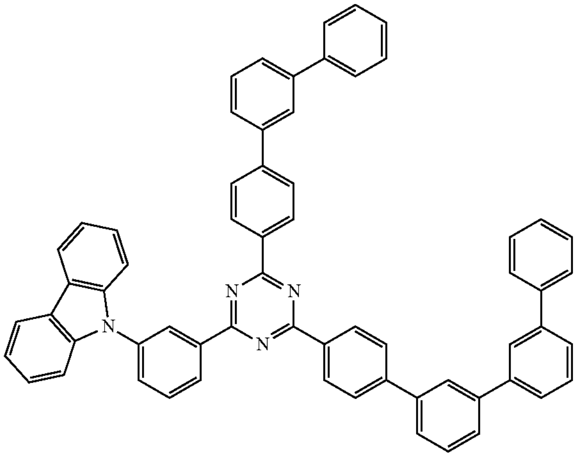

(H-2)

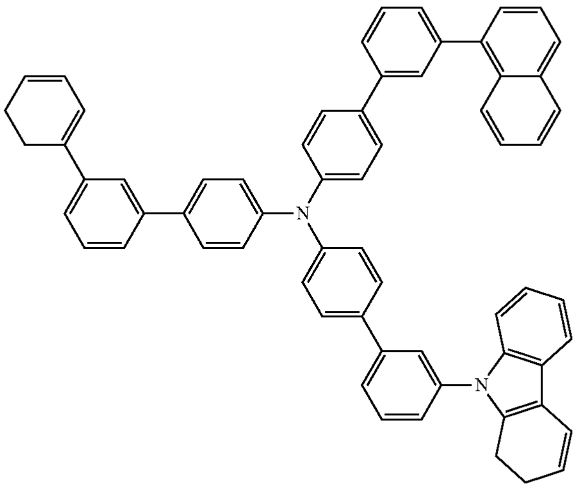

(D-A1)

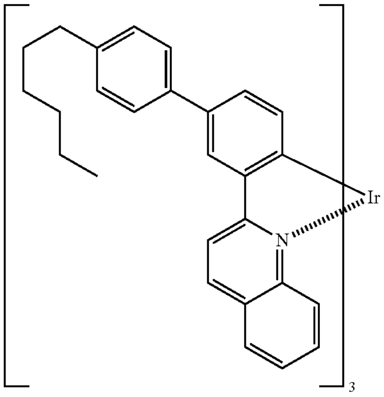

-continued (D-2)

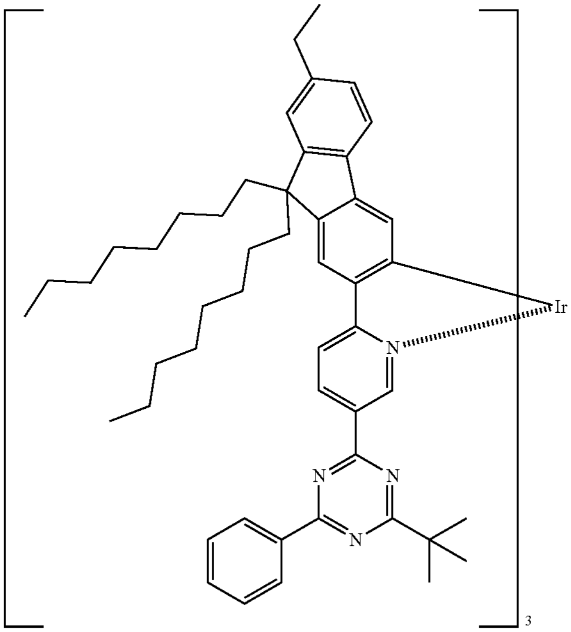

This solution was applied, by spin coating, on the substrate on which the hole transport layer was coated and formed in a nitrogen glove box, and dried on a hot plate in the nitrogen glove box at 120° C. for 20 minutes to form a uniform thin film having a thickness of 60 nm, thereby forming an emission layer.

The substrate on which the layers up to the emission layer were formed was placed in a vacuum deposition device, and the inside of the device was evacuated to $2\times10^{-4}$ Pa or lower.

Next, the following structural formula (ET-1) and 8-hydroxyquinolinolato lithium were co-deposited on the emission layer at a thickness ratio of 2:3 by vacuum deposition to form a hole blocking layer having a thickness of 30 nm.

(ET-1)

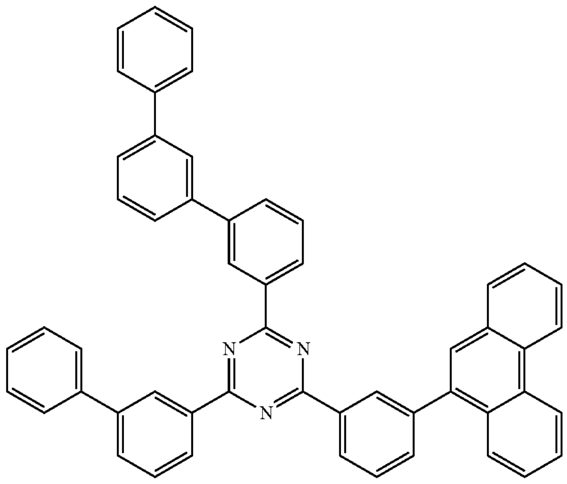

Subsequently, a shadow-mask in the form of stripes with a width of 2 mm was brought, as a mask for cathode deposition, into close contact with the substrate so that these stripes were perpendicular to the ITO stripes of the anode, and aluminum was heated by a molybdenum boat to form an aluminum layer having a thickness of 80 nm, thereby forming a cathode. As described above, an organic electroluminescent element having a luminescence area portion of a size of 2 mm×2 mm was obtained.

(Evaluation of Element)

The obtained organic electroluminescent element was energized to emit light, and the peak wavelength and the half width of the luminescence spectrum were measured.

In addition, external quantum efficiency (EQE (%)) when the element was caused to emit light at a luminance of 1000 cd/m$^2$ was obtained.

Further, as the evaluation of the driving life of the element, the element was continuously energized at a current density of 60 mA/cm$^2$, a time (LT95 (hr)) during which the luminance of the element decreased to 95% of the initial luminance was measured, and the lifetime of LT95 of Examples 1 to 5 when LT95 of Comparative Example 1 was defined as 1 was shown as a relative lifetime in Table 4.

Example 2

An organic electroluminescent element was produced in the same manner as in Example 1 except that a composition of an emission layer was changed to the following structural formula (D-3) instead of the above structural formula (D-2).

(D-3)

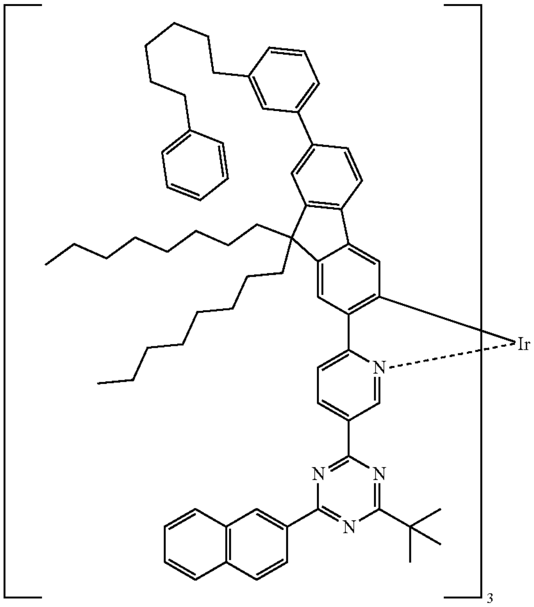

Example 3

An organic electroluminescent element was produced in the same manner as in Example 1 except that a composition of an emission layer was changed to the following structural formula (D-4) instead of the above structural formula (D-2).

(D-4)

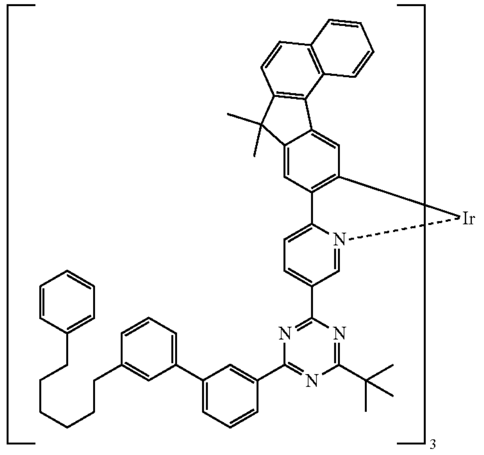

Example 4

An organic electroluminescent element was produced in the same manner as in Example 1 except that a composition of an emission layer was changed to the following structural formula (D-5) instead of the above structural formula (D-2).

(D-5)

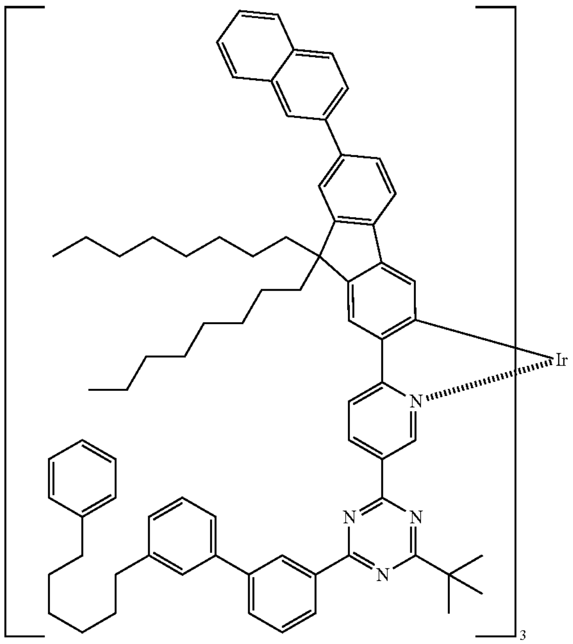

Example 5

An organic electroluminescent element was produced in the same manner as in Example 1 except that a composition of an emission layer was changed to the following structural formula (D-6) instead of the above structural formula (D-2).

(D-6)

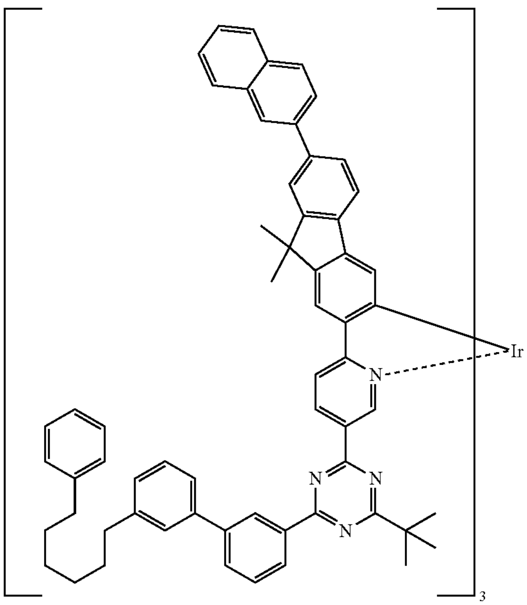

Example 6

An organic electroluminescent element was produced in the same manner as in Example 1 except that a composition of an emission layer was changed to the following structural formula (D-7) instead of the above structural formula (D-2).

(D-7)

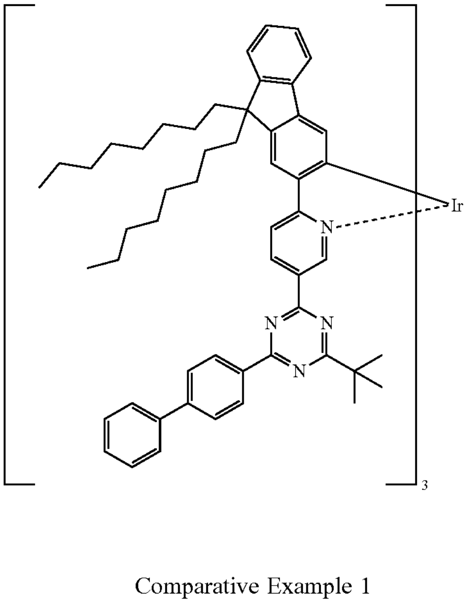

Comparative Example 1

An organic electroluminescent element was produced in the same manner as in Example 1 except that a composition of an emission layer was changed to the following structural formula (D-C1) instead of the above structural formula (D-2).

(D-C1)

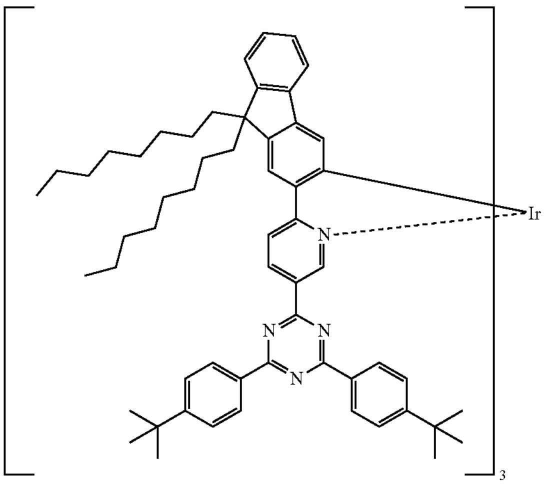

[Solution Spectrum]

The maximum emission wavelength was determined from the solution spectrum of each luminescent material.

A solution in which a compound was dissolved in toluene at a concentration of $1\times10^{-4}$ mol/L was prepared at room temperature, followed by performing nitrogen bubbling for 20 minutes or more, and then the photoluminescence spectrum was measured with a spectrophotometer (Organic EL quantum yield measuring device C9920-02 manufactured by Hamamatsu Photonics K.K.). The wavelength showing the maximum value of the obtained spectral intensity is defined as the maximum emission wavelength, and was shown in Table 3.

TABLE 3

| | Luminescent material | Maximum emission wavelength (nm) |
|---|---|---|
| Assist dopant | D-A1 | 589 |
| Example 1 | D-2 | 622 |
| Example 2 | D-3 | 623 |
| Example 3 | D-4 | 634 |
| Example 4 | D-5 | 625 |
| Example 5 | D-6 | 626 |
| Example 6 | D-7 | 620 |
| Comparative Example 1 | D-C1 | 623 |

[Evaluation of Element]

From the results of Table 4, in the organic electroluminescent element according to the present embodiment, the luminescent efficiency was equivalent to that of the related art, and the half width was narrow and good.

In addition, the element using the luminescent material including the organic electroluminescent element according to the present embodiment has a long driving lifetime and is excellent.

TABLE 4

| | Peak wavelength (nm) | Half width (nm) | EQE (%) | Relative lifetime |
|---|---|---|---|---|
| Example 1 | 621 | 43 | 11.4 | 1.1 |
| Example 2 | 622 | 41 | 10.8 | 1.8 |
| Example 3 | 632 | 37 | 11.3 | 1.5 |

TABLE 4-continued

| | Peak wavelength (nm) | Half width (nm) | EQE (%) | Relative lifetime |
|---|---|---|---|---|
| Example 4 | 623 | 40 | 10.9 | 2.0 |
| Example 5 | 624 | 45 | 12.6 | 2.4 |
| Example 6 | 618 | 44 | 11.8 | |
| Comparative Example 1 | 622 | 47 | 11.5 | 1.0 |

Comparative Example 2

An organic electroluminescent element was produced in the same manner as in Example 1 except that a composition of an emission layer was changed to the following structural formula (D-C2) instead of the above structural formula (D-2).

(D-C2)

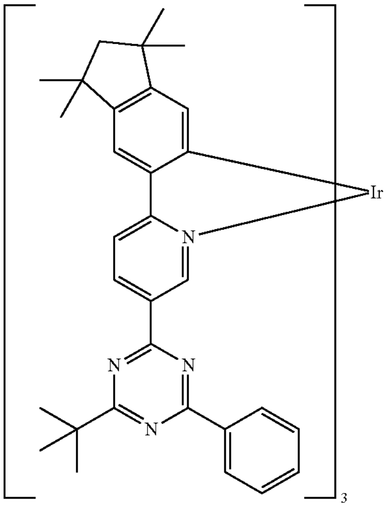

The peak wavelength and the half width of the luminescence spectrum when the element was caused to emit light were 617 nm and 61 nm, respectively, and the half width was wide and poor.

It was confirmed that the half width can be narrowed by the iridium complex compound represented by formula (1). In addition, it was confirmed that in the structural formulae (D-2), (D-3), (D-5), and (D-6) in which fluorene has a substituent, and the structural formula (D-4) in which fluorene was condensed, the half width was narrowed, and the lifetime was further improved.

Although the present invention has been described in detail with reference to the specific embodiments, it is obvious to those skilled in the art that various changes and modifications may be made without departing from the gist and the scope of the present invention. The present application is based on Japanese Patent Application No. 2020-021319 filed on Feb. 12, 2020, the contents of which are incorporated herein by reference.

REFERENCE SIGNS LIST

1 Substrate
2 Anode
3 Hole injection layer
4 Hole transport layer
5 Emission layer
6 Hole blocking layer
7 Electron transport layer
8 Electron injection layer
9 Cathode
10 Organic electroluminescent element

The invention claimed is:

1. An iridium complex compound represented by the following formula (1):

(1)

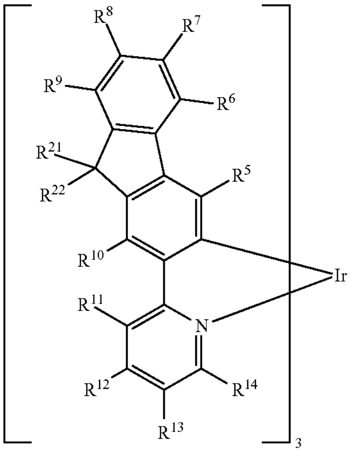

wherein in the formula (1), Ir represents an iridium atom, $R^5$ to $R^{14}$, $R^{21}$, and $R^{22}$ each independently represent a hydrogen atom, D, F, Cl, Br, I, or a substituent, the groups adjacent to each other may be further bonded to each other to form a ring, and any one of $R^{12}$ or $R^{13}$ is a substituent represented by the following formula (2):

(2)

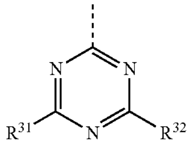

wherein in the formula (2), a broken line represents a bond to the formula (1), $R^{31}$ represents an aralkyl group, group, and $R^{32}$ represents an aromatic group, and $R^{31}$ and $R^{32}$ may be further substituted.

2. The iridium complex compound according to claim 1, wherein $R^5$ to $R^{14}$, $R^{21}$ and $R^{22}$ in the formula (1) each independently represent a hydrogen atom, D, F, Cl, Br, I, —N(R')$_2$, —CN, —NO$_2$, —OH, —COOR', —C(═O)R', —C(═O)NR', P(═O)(R')$_2$, —S(═O)R', —S(═O)$_2$R', —OS(═O)$_2$R', a linear or branched alkyl group having 1 or more and 30 or fewer carbon atoms, a cyclic alkyl group having 3 or more and 30 or fewer carbon atoms, a linear or branched alkoxy group having 1 or more and 30 or fewer carbon atoms, a cyclic alkoxy group having 2 or more and 30 or fewer carbon atoms, a linear or branched alkylthio group having 1 or more and 30 or fewer carbon atoms, a cyclic alkylthio group having 2 or more and 30 or fewer carbon atoms, a linear or branched alkenyl group having 2 or more and 30 or fewer carbon atoms, a cyclic alkenyl group having 3 or more and 30 or fewer carbon atoms, a linear or branched alkynyl group having 2 or more and 30 or fewer carbon atoms, a cyclic alkynyl group having 3 or more and 30 or fewer carbon atoms, an aromatic group having 5 or more and 60 or fewer carbon atoms, a heteroaromatic group having 1 or more and 60 or fewer carbon atoms, an aryloxy group having 5 or more and 40 or fewer carbon atoms, an arylthio group having 5 or more and 40 or fewer carbon atoms, an aralkyl group having 5 or more and 60 or fewer carbon atoms, a heteroaralkyl group having 2 or more and 60 or fewer carbon atoms, a diarylamino group having 10 or more and 40 or fewer carbon atoms, an arylheteroarylamino group having 10 or more and 40 or fewer carbon atoms, or a diheteroarylamino group having 10 or more and 40 or fewer carbon atoms;

at least one hydrogen atoms of the alkyl group, the alkoxy group, the alkylthio group, the alkenyl group and the alkynyl group may be further substituted with R' excluding a hydrogen atom, and one —$CH_2$— group or two or more non-adjacent —$CH_2$— groups in these groups may be substituted with —C(—R')═C(—R')—, —C≡C—, —Si(R')$_2$, —C(═O)—, —NR'—, —O—, —S—, —CONR'—, or a divalent aromatic group, one or more hydrogen atoms in these groups may be substituted with D, F, Cl, Br, I or —CN;

at least one hydrogen atoms of the aromatic group, the heteroaromatic group, the aryloxy group, the arylthio group, the aralkyl group, the heteroaralkyl group, the diarylamino group, the arylheteroarylamino group, and the diheteroarylamino group may be each independently further substituted with R' excluding a hydrogen atom;

R's are each independently selected from a hydrogen atom, D, F, Cl, Br, I, —N(R")$_2$, —CN, —$NO_2$, —Si(R")$_3$, —B(OR")$_2$, —C(═O)R", —P(═O)(R")$_2$, —S(═O)$_2$R", —$OSO_2$R", a linear or branched alkyl group having 1 or more and 30 or fewer carbon atoms, a cyclic alkyl group having 3 or more and 30 or fewer carbon atoms, a linear or branched alkoxy group having 1 or more and 30 or fewer carbon atoms, a cyclic alkoxy group having 2 or more and 30 or fewer carbon atoms, a linear or branched alkylthio group having 1 or more and 30 or fewer carbon atoms, a cyclic alkylthio group having 2 or more and 30 or fewer carbon atoms, a linear or branched alkenyl group having 2 or more and 30 or fewer carbon atoms, a cyclic alkenyl group having 3 or more and 30 or fewer carbon atoms, a linear or branched alkynyl group having 2 or more and 30 or fewer carbon atoms, a cyclic alkynyl group having 3 or more and 30 or fewer carbon atoms, an aromatic group having 5 or more and 60 or fewer carbon atoms, a heteroaromatic group having 1 or more and 60 or fewer carbon atoms, an aryloxy group having 5 or more and 40 or fewer carbon atoms, an arylthio group having or more and 40 or fewer carbon atoms, an aralkyl group having 5 or more and 60 or fewer carbon atoms, a heteroaralkyl group having 2 or more and 60 or fewer carbon atoms, a diarylamino group having 10 or more and 40 or fewer carbon atoms, an arylheteroarylamino group having 10 or more and 40 or fewer carbon atoms or a diheteroarylamino group having 10 or more and 40 or fewer carbon atoms;

at least one hydrogen atoms of the alkyl group, the alkoxy group, the alkylthio group, the alkenyl group and the alkynyl group may be further substituted with R" excluding a hydrogen atom, and one —$CH_2$— group or two or more non-adjacent —$CH_2$— groups in these groups may be substituted with —C(—R")═C(—R")—, —C≡C, —Si(—R")$_2$—, —C(═O)—, —NR"—, —O—, —S—, —CONR" or a divalent aromatic group, one or more hydrogen atoms in these groups may be substituted with D, F, Cl, Br, I or —CN;

at least one hydrogen atoms of the aromatic group, the heteroaromatic group, the aryloxy group, the arylthio group, the aralkyl group, the heteroaralkyl group, the diarylamino group, the arylheteroarylamino group, and the diheteroarylamino group may be each independently further substituted with R" excluding a hydrogen atom, two or more adjacent R"s may be bonded to each other to form an aliphatic, aromatic, or heteroaromatic monocyclic ring or condensed ring;

R"s are each independently selected from a hydrogen atom, D, F, —CN, an aliphatic hydrocarbon group having 1 or more and 20 or fewer carbon atoms, an aromatic group having 5 or more and 20 or fewer carbon atoms, and a heteroaromatic group having 1 or more and 20 or fewer carbon atoms; and two or more adjacent R"s may be bonded to each other to form an aliphatic, aromatic, or heteroaromatic monocyclic ring or condensed ring.

3. The iridium complex compound according to claim 1, wherein $R^{31}$ in the formula (2) is an aralkyl group having 5 or more and 60 or fewer carbon atoms;

at least one hydrogen atoms of aralkyl group may be further substituted with R' (excluding a hydrogen atom), and one —$CH_2$— group or two or more non-adjacent —$CH_2$— groups in these groups may be substituted with —C(—R')═C(—R')—, —C≡C—, —Si(R')$_2$, —C(═O)—, —NR'—, —O—, —S—, —CONR'—, or a divalent aromatic group, one or more hydrogen atoms in these groups may be substituted with D, F, Cl, Br, I or —CN; and R's are each independently selected from a hydrogen atom, D, F, Cl, Br, I, —N(R")$_2$, —CN, —$NO_2$, —Si(R")$_3$, —B(OR")$_2$, —C(═O)R", —P(═O)(R")$_2$, —S(═O)$_2$R", —$OSO_2$R", a linear or branched alkyl group having 1 or more and 30 or fewer carbon atoms, a cyclic alkyl group having 3 or more and 30 or fewer carbon atoms, a linear or branched alkoxy group having 1 or more and 30 or fewer carbon atoms, a cyclic alkoxy group having 2 or more and 30 or fewer carbon atoms, a linear or branched alkylthio group having 1 or more and 30 or fewer carbon atoms, a cyclic alkylthio group having 2 or more and 30 or fewer carbon atoms, a linear or branched alkenyl group having 2 or more and 30 or fewer carbon atoms, a cyclic alkenyl group having 3 or more and 30 or fewer carbon atoms, a linear or branched alkynyl group having 2 or more and 30 or fewer carbon atoms, a cyclic alkynyl group having 3 or more and 30 or fewer carbon atoms, an aromatic group having 5 or more and 60 or fewer carbon atoms, a heteroaromatic group having 1 or more and 60 or fewer carbon atoms, an aryloxy group having 5 or more and 40 or fewer carbon atoms, an arylthio group having or more and 40 or fewer carbon atoms, an aralkyl group having 5 or more and 60 or fewer carbon atoms, a heteroaralkyl group having 2 or more and 60 or fewer carbon atoms, a diarylamino group having 10 or more and 40 or fewer carbon atoms, an arylheteroarylamino group having 10 or more and 40 or fewer carbon atoms or a diheteroarylamino group having 10 or more and 40 or fewer carbon atoms.

4. The iridium complex compound according to claim 1, wherein $R^{32}$ in the formula (2) is an aromatic group having 5 or more and 60 or fewer carbon atoms;

at least one hydrogen atoms of the aromatic group may be further substituted with R' excluding a hydrogen atom; and R's are each independently selected from a hydrogen atom, D, F, Cl, Br, I, —N(R")$_2$, —CN, —NO$_2$, —Si(R")$_3$, —B(OR")$_2$, —C(═O)R", —P(═O)(R")$_2$, —S(═O)$_2$R", —OSO$_2$R", a linear or branched alkyl group having 1 or more and 30 or fewer carbon atoms, a cyclic alkyl group having 3 or more and 30 or fewer carbon atoms, a linear or branched alkoxy group having 1 or more and 30 or fewer carbon atoms, a cyclic alkoxy group having 2 or more and 30 or fewer carbon atoms, a linear or branched alkylthio group having 1 or more and 30 or fewer carbon atoms, a cyclic alkylthio group having 2 or more and 30 or fewer carbon atoms, a linear or branched alkenyl group having 2 or more and 30 or fewer carbon atoms, a cyclic alkenyl group having 3 or more and 30 or fewer carbon atoms, a linear or branched alkynyl group having 2 or more and 30 or fewer carbon atoms, a cyclic alkynyl group having 3 or more and 30 or fewer carbon atoms, an aromatic group having 5 or more and 60 or fewer carbon atoms, a heteroaromatic group having 1 or more and 60 or fewer carbon atoms, an aryloxy group having 5 or more and 40 or fewer carbon atoms, an arylthio group having or more and 40 or fewer carbon atoms, an aralkyl group having 5 or more and 60 or fewer carbon atoms, a heteroaralkyl group having 2 or more and 60 or fewer carbon atoms, a diarylamino group having 10 or more and 40 or fewer carbon atoms, an arylheteroarylamino group having 10 or more and 40 or fewer carbon atoms or a diheteroarylamino group having 10 or more and 40 or fewer carbon atoms.

5. The iridium complex compound according to claim 1, wherein at least one of $R^{21}$ or $R^{22}$ in the formula (1) is a linear or branched alkyl group having 1 or more and 30 or fewer carbon atoms.

6. The iridium complex compound according to claim 1, wherein $R^{13}$ in the formula (1) is a substituent represented by the formula (2).

7. The iridium complex compound according to claim 1, wherein at least one of $R^6$ to $R^9$ in the formula (1) has, as a substituent, a linear or branched alkyl group having 1 or more and or fewer carbon atoms, a cyclic alkyl group having 3 or more and 30 or fewer carbon atoms, an aromatic group having 5 or more and 60 or fewer carbon atoms, or an aralkyl group having 5 or more and 60 or fewer carbon atoms.

8. The iridium complex compound according to claim 1, wherein adjacent groups among $R^6$ to $R^9$ in the formula (1) are bonded to each other to form a ring.

9. An iridium-complex-compound-containing composition, comprising:

the iridium complex compound according to claim 1, and an organic solvent.

10. The iridium-complex-compound-containing composition according to claim 9, further comprising:

a compound represented by the following formula (3) and having a maximum emission wavelength shorter than a maximum emission wavelength of the iridium complex compound:

(3)

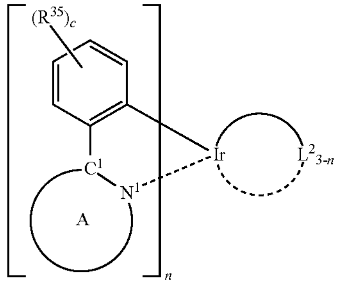

wherein in the formula (3), $R^{35}$ is an alkyl group having 1 or more and 20 or fewer carbon atoms, a (hetero)aralkyl group having 7 or more and 40 or fewer carbon atoms, an alkoxy group having 1 or more and 20 or fewer carbon atoms, a (hetero)aryloxy group having 3 or more and 20 or fewer carbon atoms, an alkylsilyl group having 1 or more and 20 or fewer carbon atoms, an arylsilyl group having 6 or more and 20 or fewer carbon atoms, an alkylcarbonyl group having 2 or more and 20 or fewer carbon atoms, an arylcarbonyl group having 7 or more and 20 or fewer carbon atoms, an alkylamino group having 1 or more and 20 or fewer carbon atoms, an arylamino group having 6 or more and 20 or fewer carbon atoms, or a (hetero)aryl group having 3 or more and 30 or fewer carbon atoms, the $R^{35}$ substituents may be further substituted, when there are a plurality of $R^{35}$s, $R^{35}$s may be the same as or different from each other;

c is an integer of 0 or more and 4 or less;

a ring A is any one of a pyridine ring, a pyrazine ring, a pyrimidine ring, an imidazole ring, an oxazole ring, a thiazole ring, a quinoline ring, an isoquinoline ring, a quinazoline ring, a quinoxaline ring, an azatriphenylene ring, a carboline ring, a benzothiazole ring, or a benzoxazole ring;

the ring A may have a substituent, and the substituent is F, Cl, Br, an alkyl group having 1 or more and 20 or fewer carbon atoms, a (hetero)aralkyl group having 7 or more and 40 or fewer carbon atoms, an alkoxy group having 1 or more and 20 or fewer carbon atoms, a (hetero)aryloxy group having 3 or more and 20 or fewer carbon atoms, an alkylsilyl group having 1 or more and or fewer carbon atoms, an arylsilyl group having 6 or more and 20 or fewer carbon atoms, an alkylcarbonyl group having 2 or more and 20 or fewer carbon atoms, an arylcarbonyl group having 7 or more and 20 or fewer carbon atoms, an alkylamino group having 2 or more and 20 or fewer carbon atoms, an arylamino group having 6 or more and 20 or fewer carbon atoms, or a (hetero)aryl group having 3 or more and 20 or fewer carbon atoms, adjacent substituents bonded to the ring A may be bonded to each other to form a ring, when there are a plurality of rings A, the rings A may be the same as or different from each other; and $L^2$ represents an organic ligand, and n is an integer of 1 or more and 3 or less.

11. The iridium-complex-compound-containing composition according to claim 9, further comprising:

a compound represented by the following formula (20):

(20)

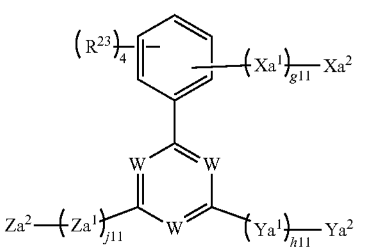

wherein in the formula (20), each W independently represents CH or N, and at least one W is N;

$Xa^1$, $Ya^1$, and $Za^1$ each independently represent a divalent aromatic hydrocarbon group having 6 or more and 30 or fewer carbon atoms, which may have a substituent, or a divalent aromatic heterocyclic group having 3 or more and 30 or fewer carbon atoms, which may have a substituent;

$Xa^2$, $Ya^2$, and $Za^2$ each independently represent a hydrogen atom, an aromatic hydrocarbon group having 6 or more and 30 or fewer carbon atoms, which may have a substituent, or an aromatic heterocyclic group having 3 or more and 30 or fewer carbon atoms, which may have a substituent;

g11, h11, and j11 each independently represent an integer of 0 or more and 6 or;

at least one of g11, h11, or j11 is an integer of 1 or more;

when g11 is 2 or more, a plurality of $Xa^1$s may be the same as or different from each other;

when h11 is 2 or more, a plurality of $Ya^1$s may be the same as or different from each other;

when j11 is 2 or more, a plurality of $Za^1$s may be the same or different from each other;

$R^{23}$ represents a hydrogen atom or a substituent, and four of $R^{23}$ may be the same as or different from each other; and when g11, h11, or j11 is 0, the corresponding $Xa^2$, $Ya^2$, or $Za^2$ is not a hydrogen atom.

12. A method for producing an organic electroluminescent element, the organic electroluminescent element including, an anode, a cathode, and at least one organic layer located between the anode and the cathode, on a substrate, the method comprising:

forming the at least one organic layer by a wet-process film formation method using the iridium-complex-compound-containing composition according to claim 9.

13. An organic electroluminescent element, comprising:

an anode, a cathode, and at least one organic layer located between the anode and the cathode, on a substrate, wherein at least one organic layer is an emission layer containing the iridium complex compound according to claim 1.

14. The organic electroluminescent element according to claim 13, further comprising:

a compound represented by the following formula (3) and having a maximum emission wavelength shorter than a maximum emission wavelength of the iridium complex compound:

(3)

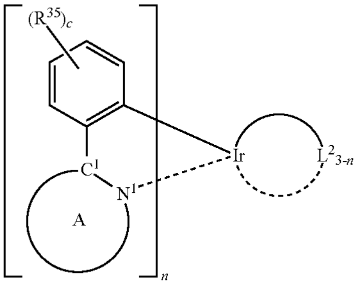

wherein in the formula (3), $R^{35}$ is an alkyl group having 1 or more and 20 or fewer carbon atoms, a (hetero) aralkyl group having 7 or more and 40 or fewer carbon atoms, an alkoxy group having 1 or more and 20 or fewer carbon atoms, a (hetero)aryloxy group having 3 or more and 20 or fewer carbon atoms, an alkylsilyl group having 1 or more and 20 or fewer carbon atoms, an arylsilyl group having 6 or more and 20 or fewer carbon atoms, an alkylcarbonyl group having 2 or more and 20 or fewer carbon atoms, an arylcarbonyl group having 7 or more and 20 or ess fewer carbon atoms, an alkylamino group having 1 or more and 20 or fewer carbon atoms, an arylamino group having 6 or more and 20 or fewer carbon atoms, or a (hetero)aryl group having 3 or more and 30 or fewer carbon atoms, these groups may further have substituents, when there are a plurality of $R^{35}$s, $R^{35}$s may be the same as or different from each other;

c is an integer of 0 or more and 4 or;

a ring A is any one of a pyridine ring, a pyrazine ring, a pyrimidine ring, an imidazole ring, an oxazole ring, a thiazole ring, a quinoline ring, an isoquinoline ring, a quinazoline ring, a quinoxaline ring, an azatriphenylene ring, a carboline ring, a benzothiazole ring, or a benzoxazole ring;

the ring A may have a substituent, and the substituent is F, Cl, Br, an alkyl group having 1 or more and 20 or fewer carbon atoms, a (hetero)aralkyl group having 7 or more and 40 or fewer carbon atoms, an alkoxy group having 1 or more and 20 or fewer carbon atoms, a (hetero)aryloxy group having 3 or more and 20 or fewer carbon atoms, an alkylsilyl group having 1 or more and 20 or fewer carbon atoms, an arylsilyl group having 6 or more and 20 or fewer carbon atoms, an alkylcarbonyl group having 2 or more and 20 or fewer carbon atoms, an arylcarbonyl group having 7 or more and 20 or fewer carbon atoms, an alkylamino group having 2 or more and 20 or fewer carbon atoms, an arylamino group having 6 or more and 20 or fewer carbon atoms, or a (hetero)aryl group having 3 or more and 20 or fewer carbon atoms, adjacent substituents bonded to the ring A may be bonded to each other to form a ring, when there are a plurality of rings A, the rings A may be the same as or different from each other; and $L^2$ represents an organic ligand, and n is an integer of 1 or more and 3 or less.

15. The organic electroluminescent element according to claim 13, wherein the emission layer further includes a compound represented by the following formula (20):

(20)

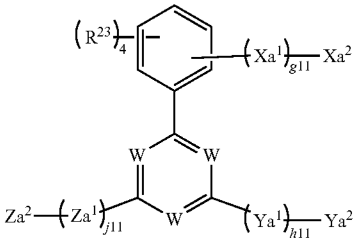

wherein in the formula (20), each W independently represents CH or N, and at least one W is N;

$Xa^1$, $Ya^1$, and $Za^1$ each independently represent a divalent aromatic hydrocarbon group having 6 or more and 30 or fewer carbon atoms, which may have a substituent, or a divalent aromatic heterocyclic group having 3 or more and 30 or fewer carbon atoms, which may have a substituent;

$Xa^2$, $Ya^2$, and $Za^2$ each independently represent a hydrogen atom, an aromatic hydrocarbon group having 6 or more and 30 or fewer carbon atoms, which may have a substituent, or an aromatic heterocyclic group having 3 or more and 30 or fewer carbon atoms, which may have a substituent;

g11, h11, and j11 each independently represent an integer of 0 or more and 6 or;

at least one of g11, h11, or j11 is an integer of 1 or more;

when g11 is 2 or more, a plurality of Xa's may be the same as or different from each other;

when h11 is 2 or more, a plurality of $Ya^1$s may be the same as or different from each other;

when j11 is 2 or more, a plurality of $Za^1$s may be the same or different from each other;

$R^{23}$ represents a hydrogen atom or a substituent, and four of $R^{23}$ may be the same as or different from each other; and when g11, h11, or j11 is 0, the corresponding $Xa^2$, $Ya^2$, or $Za^2$ is not a hydrogen atom.

16. An organic EL display device, comprising:

the organic electroluminescent element according to claim 13.

17. An organic EL illuminator, comprising:

the organic electroluminescent element according to claim 13.

* * * * *